US012503645B2

(12) United States Patent
Zhang et al.

(10) Patent No.: US 12,503,645 B2
(45) Date of Patent: Dec. 23, 2025

(54) OLED AND ORGANIC LIGHT-EMITTING DEVICE

(71) Applicant: ZHEJIANG HUAXIAN PHOTOELECTRICITY TECHNOLOGY CO., LTD., Jiaxing (CN)

(72) Inventors: Lei Zhang, Jiaxing (CN); Yunqi Liu, Jiaxing (CN); Huaxing Zhang, Jiaxing (CN); Kongwu Wu, Jiaxing (CN); Xiaoyu Zhao, Jiaxing (CN)

(73) Assignee: ZHEJIANG HUAXIAN PHOTOELECTRICITY TECHNOLOGY CO., LTD., Jiaxing (CN)

( * ) Notice: Subject to any disclaimer, the term of this patent is extended or adjusted under 35 U.S.C. 154(b) by 0 days.

(21) Appl. No.: 19/027,431

(22) Filed: Jan. 17, 2025

(65) Prior Publication Data

US 2025/0361437 A1 Nov. 27, 2025

(30) Foreign Application Priority Data

May 24, 2024 (CN) ......................... 202410649268.1

(51) Int. Cl.

*C09K 11/06* (2006.01)
*H10K 50/11* (2023.01)
*H10K 50/16* (2023.01)
*H10K 85/60* (2023.01)

(52) U.S. Cl.

CPC .............. *C09K 11/06* (2013.01); *H10K 50/11* (2023.02); *H10K 50/16* (2023.02); *H10K 85/626* (2023.02); *H10K 85/6574* (2023.02); *C09K 2211/1059* (2013.01)

(58) Field of Classification Search

CPC ............ C09K 11/06; C09K 2211/1059; H10K 50/11; H10K 50/16; H10K 85/626; H10K 85/6574

See application file for complete search history.

(56) References Cited

U.S. PATENT DOCUMENTS 10,950,796 B2 * 3/2021 Liu ...................... C07D 251/24
2002/0034659 A1 * 3/2002 Nishi ..................... H10K 85/40 313/506
2007/0116984 A1 * 5/2007 Park ....................... H05B 33/14 313/506
2018/0226587 A1 * 8/2018 Parham ................ C07D 471/04
2019/0051834 A1 * 2/2019 Liu ...................... H10K 85/654
2020/0385412 A1 * 12/2020 Wei ........................... C07F 7/08
2023/0320205 A1 * 10/2023 Ma ....................... C07D 409/14 257/40
2023/0337534 A1 * 10/2023 Ma ..................... H10K 85/6572
2024/0217956 A1 * 7/2024 Yue .................... H10K 85/6572

FOREIGN PATENT DOCUMENTS

CN 106910831 A 6/2017
CN 107021926 A 8/2017
CN 107056783 A 8/2017
CN 110776496 A 2/2020
CN 115894446 A 4/2023
CN 116425688 A 7/2023

OTHER PUBLICATIONS

Peng Wu, "Nitrogen introduction of spirobifluorene to form α-, β-, γ-, and δ-aza-9,9'-spirobifluorenes: New bipolar system for efficient blue organic light-emitting diodes", vol. 156, Sep. 2018, pp. 185-191 (Year: 2018).*
First office Action dated Jul. 2, 2024 received in Chinese Patent Application No. 202410649268.1.

* cited by examiner

*Primary Examiner* — Caleb E Henry
(74) *Attorney, Agent, or Firm* — Scully, Scott, Murphy & Presser, P.C.

(57) ABSTRACT

A novel organic compound, an OLED containing the compound, and an organic light-emitting device are provided. By defining the modification of triazines performed by aromatic substituents containing heteroatoms, the organic compound according to the present disclosure has a good thermal stability, excellent luminous efficiency and good purity. A combination of the organic compound as an electron transport material and a specific light-emitting auxiliary material can allow the organic light-emitting device to have a lower driving voltage, to keep stable voltage, to gain higher luminous efficiency, to have significantly longer working life, and to have good application prospects.

5 Claims, No Drawings

OLED AND ORGANIC LIGHT-EMITTING DEVICE

CROSS REFERENCE

The present disclosure claims the priority to Chinese Patent Application No. 202410649268.1 filed with CNIPA on May 24, 2024, the entire contents of which are incorporated herein by reference.

TECHNICAL FIELD

The present disclosure relates to the technical field of preparing organic optoelectronic materials, specifically to a novel organic compound, an OLED containing the compound, and an organic light-emitting device.

BACKGROUND

An organic light-emitting diode (OLED), also known as an organic electroluminescent device, refers to a technology of luminescence caused by excitons, where voltage is applied to an organic electroluminescent element to inject holes from an anode and electrons from a cathode into a light-emitting layer, and the injected holes and electrons recombine to form the excitons. The OLED can convert electrical energy into light energy through organic light-emitting materials.

In consideration of the structures of organic electroluminescent devices, the organic electroluminescent materials can be divided into electrode materials, electrode modification materials, carrier transport materials, and luminescent materials. The carrier transport materials are currently a hot research direction among experts and scholars. By efficiently transporting electrons or holes to a luminescent region, electrons and holes recombine more easily, thereby improving the performance of the carrier transport materials. However, existing electron transmission materials still have shortcomings in improving device performance. Even when a variety of materials are used together, the display technology still faces problems such as high driving voltage and short display lifespan, which seriously affect the further practical application of this technology.

Therefore, continuous efforts are needed to develop organic light-emitting devices with low driving voltage, high brightness and long lifespan, and to find suitable OLED optoelectronic functional materials for OLED devices to solve the above problems.

SUMMARY

In order to solve the above technical problems, the present disclosure provides an organic compound, an OLED containing the compound, and a display or lighting apparatus. The triazines provided herein have an asymmetric structure after modification with specific functional groups, can greatly reduce the aggregation of molecules in a solid state or the formation of excitons, prevent luminescence quenching, and have a good thermal stability and film-forming property. Therefore, the triazines are used in organic electroluminescent devices to enable the devices to have both high luminous efficiency and purity.

An organic compound according to the present disclosure is achieved through the following technical solution:

An organic compound has a structure shown in formula (I) below:

formula (I)

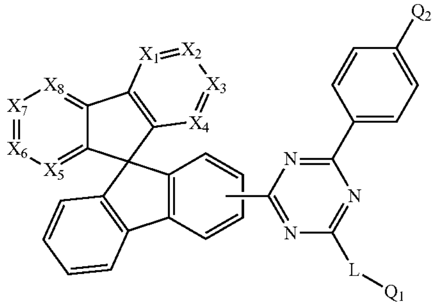

Wherein, in formula (I), $X_1$-$X_8$ are each independently selected from $CR_a$ or a nitrogen atom, $X_1$-$X_8$ are not simultaneously selected from a nitrogen atom, and at least one of $X_1$-$X_8$ is a nitrogen atom; $R_a$ is independently selected from hydrogen or C6-C30 aryls; L is a single bond or C6-C30 aryls; $Q_1$ and $Q_2$ are each independently selected from cyano or cyano-substituted or unsubstituted C6-C30 aryls; hydrogen atoms in the compound shown in formula (I) may be partially or completely deuterated.

Preferably, in formula (I), any one of $X_1$-$X_8$ is selected from a nitrogen atom; $R_a$ is independently selected from hydrogen or phenyl.

Preferably, in formula (I), $Q_1$ and $Q_2$ are each independently selected from any one of cyano, phenyl, naphthyl, phenanthryl, biphenyl, naphthylphenyl, cyanophenyl, and cyano-substituted biphenyl.

Preferably, in formula (I), L is any one of a single bond, phenyl, and biphenyl.

According to one or more embodiments, the organic compound according to the present disclosure is selected from any one of the following chemical structures, where "D" represents deuterium:

E001

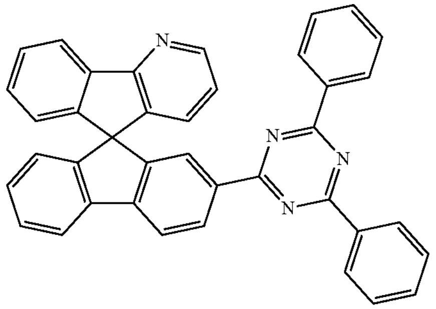

E002

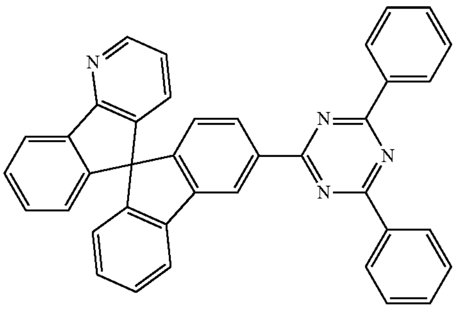

E003
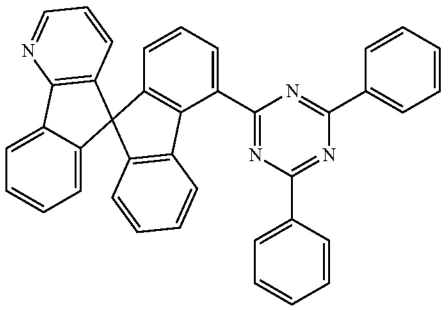
E004
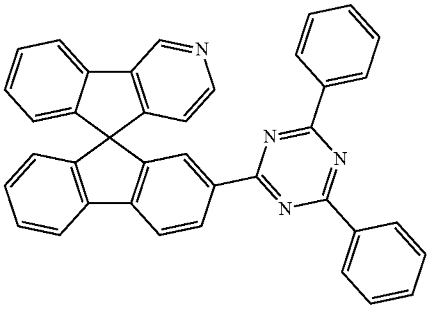
E005
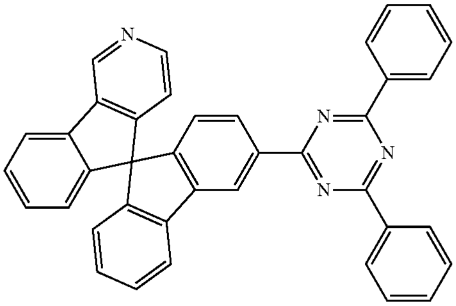
E006
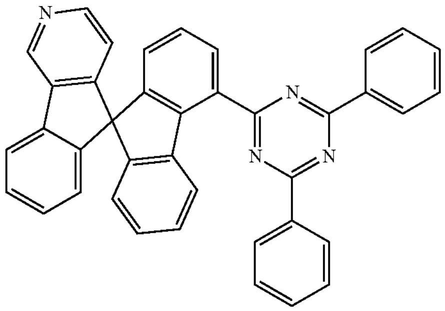
E007
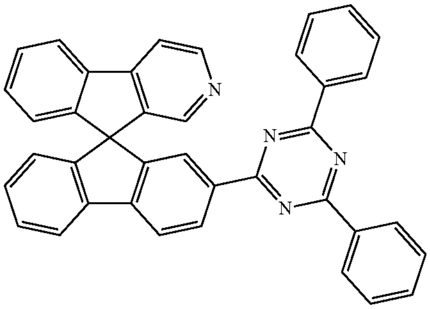
E008
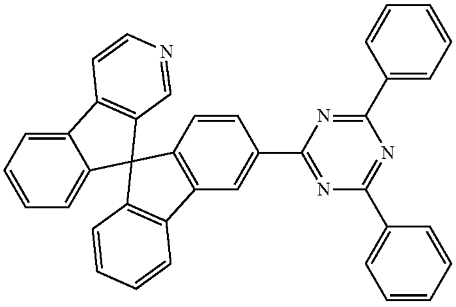
E009
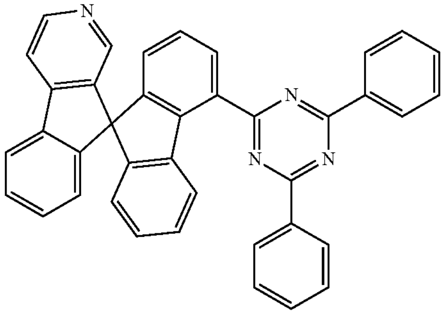
E010
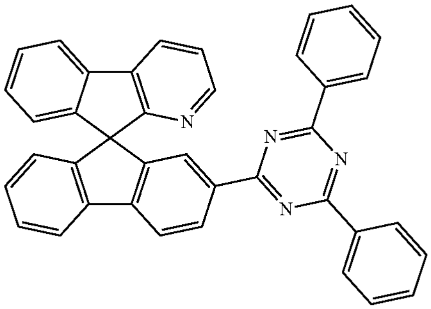
E011
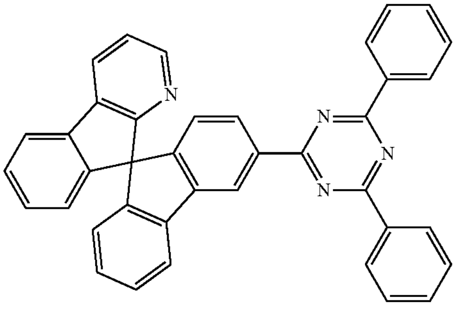
E012
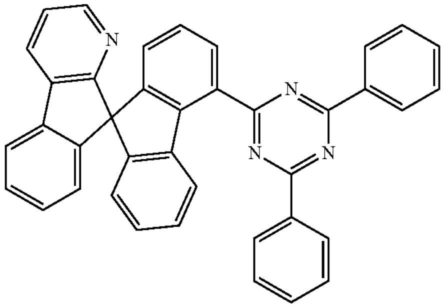

E013
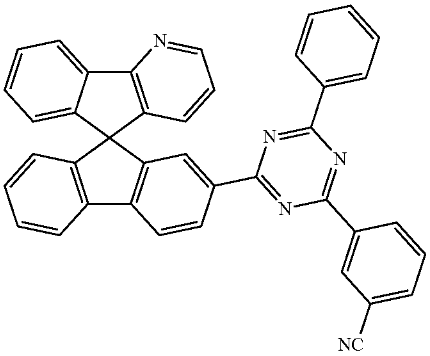
E014
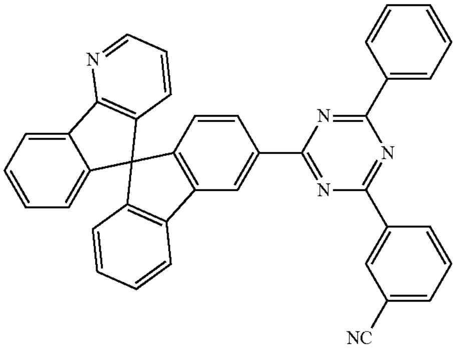
E015
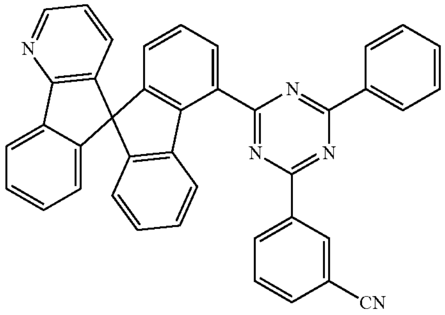
E016
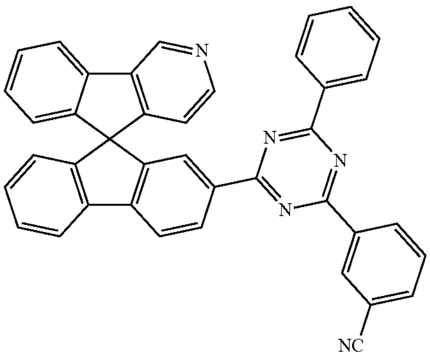
E017
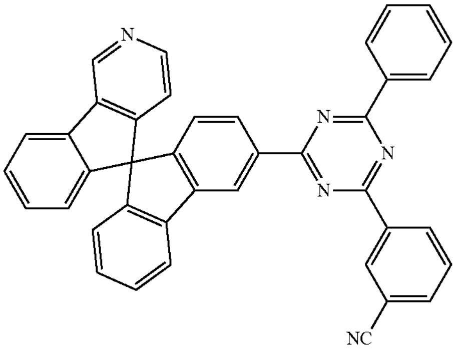
E018
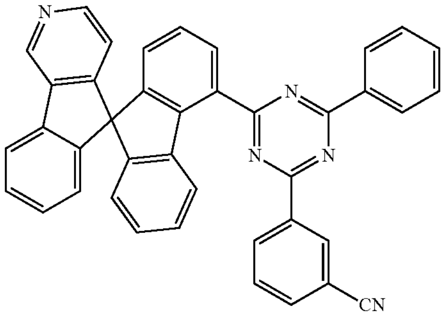
E019
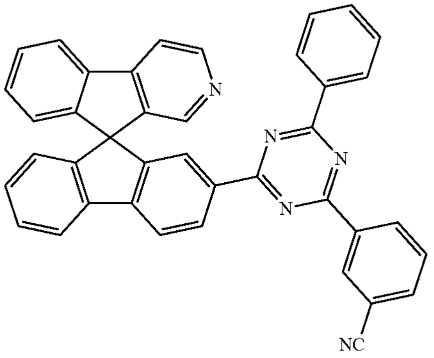
E020
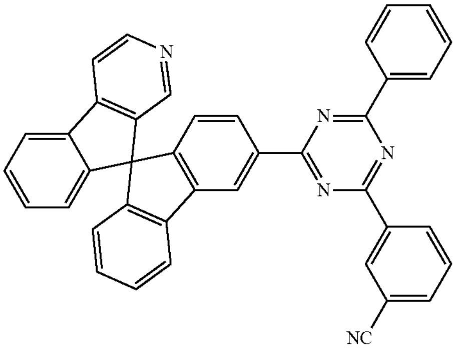

-continued
E021
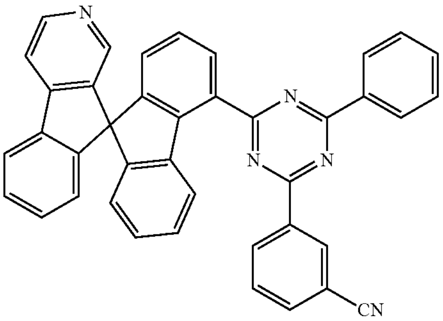
E022
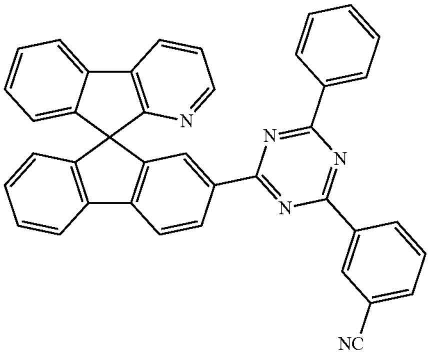
E023
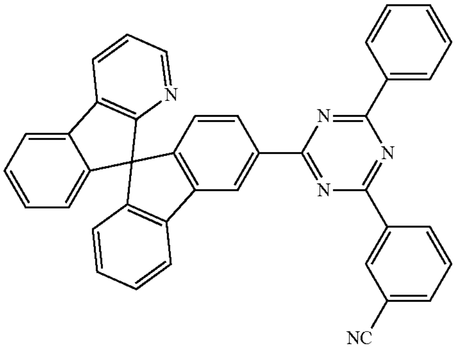
E024
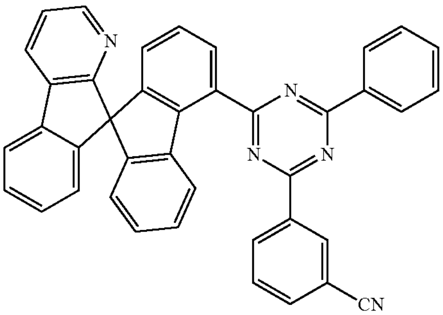
-continued
E025
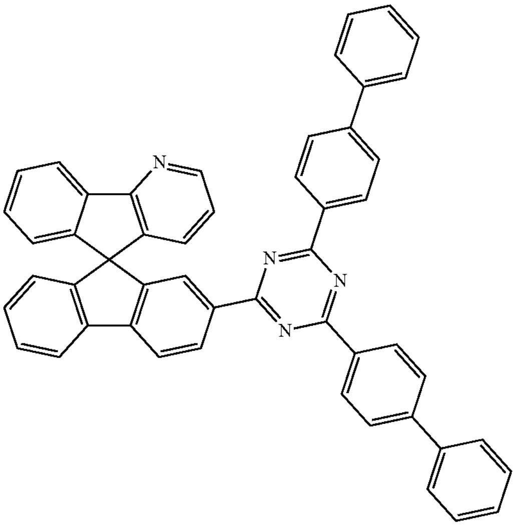
E026
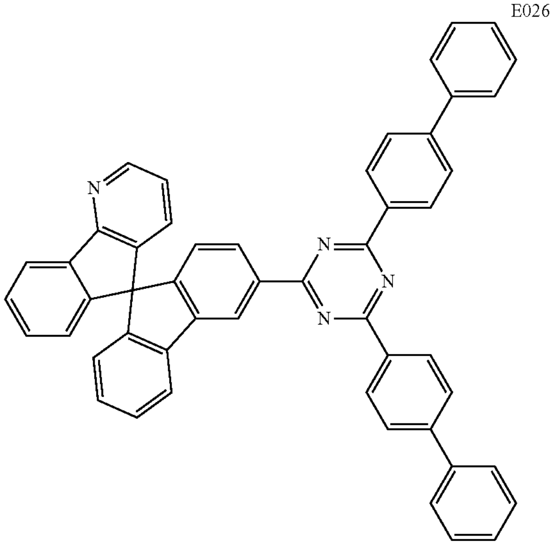
E027
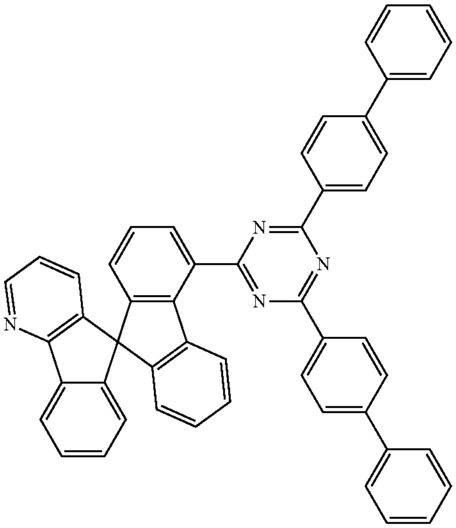

-continued
E028
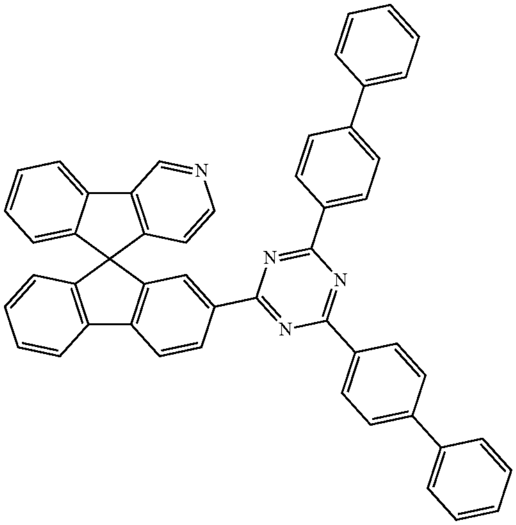
E029
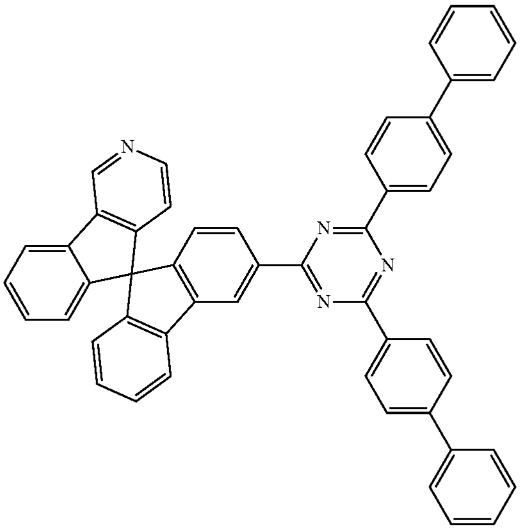
E030
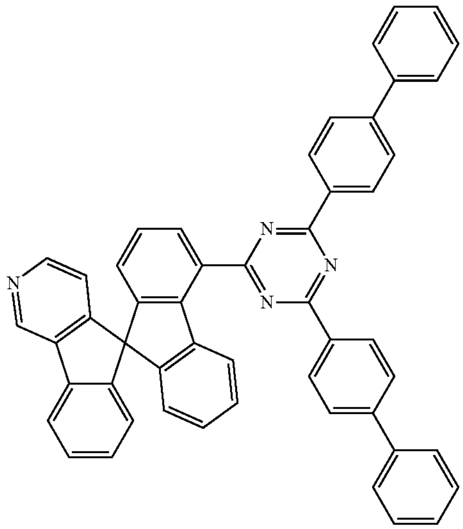
-continued
E031
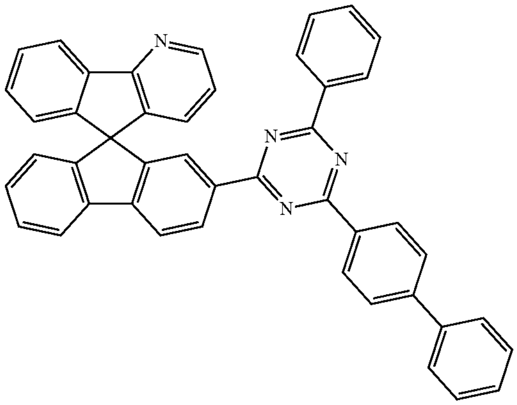
E032
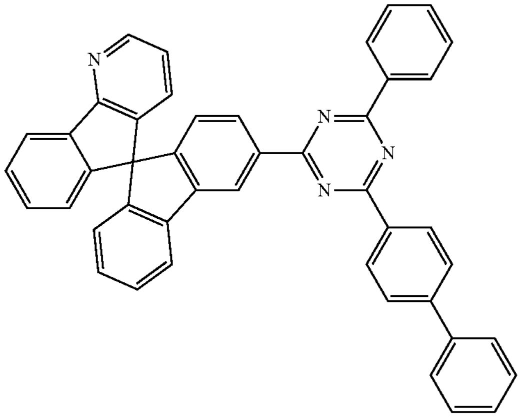
E033
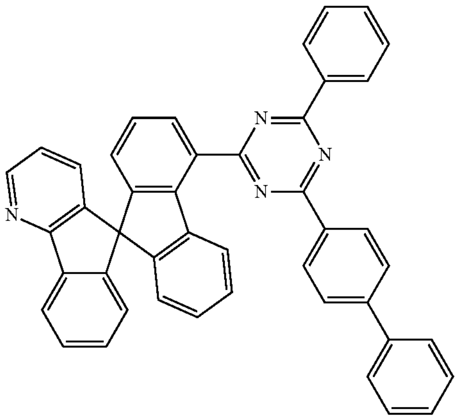

-continued
E034
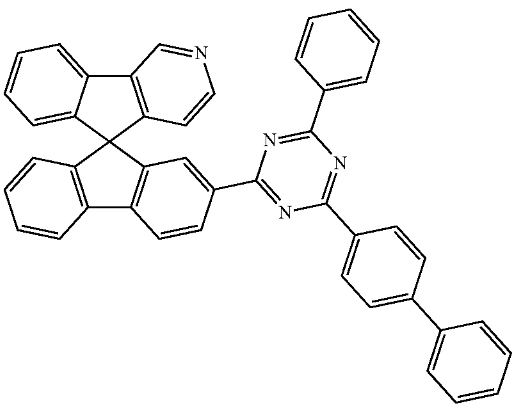
E035
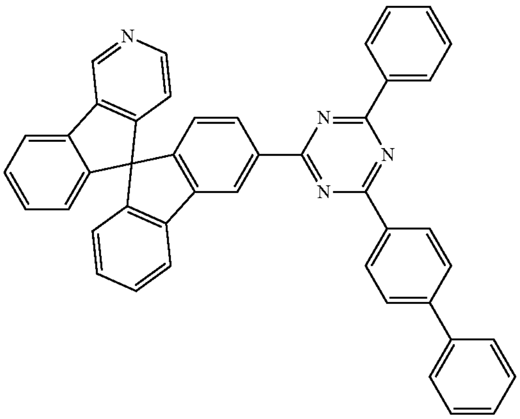
E036
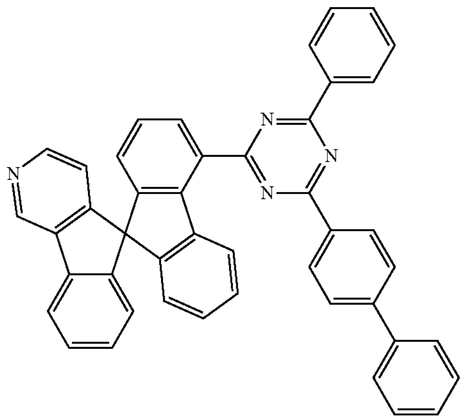
-continued
E037
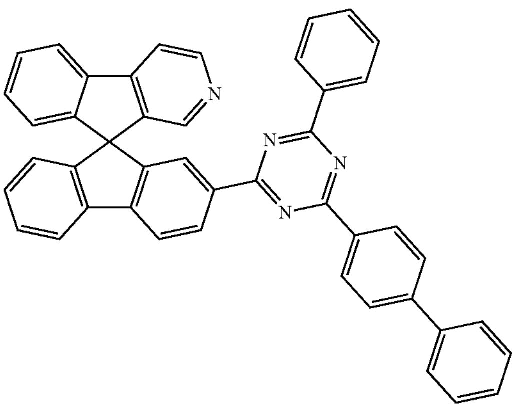
E038
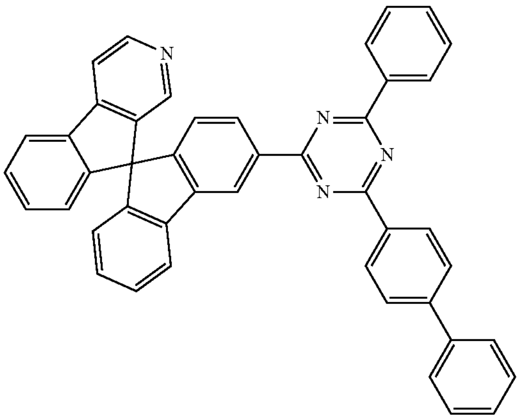
E039
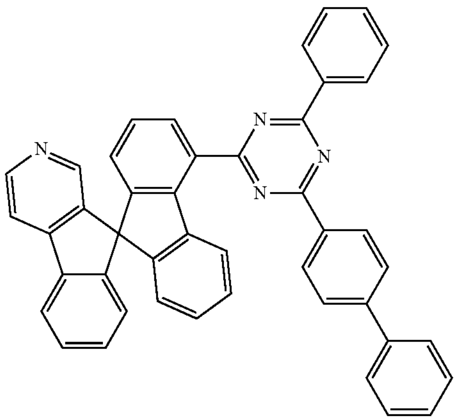

-continued
E040
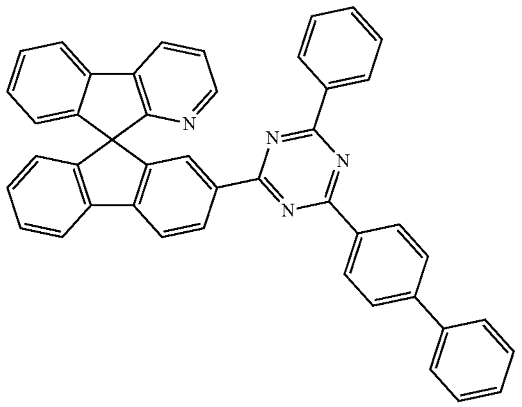
E041
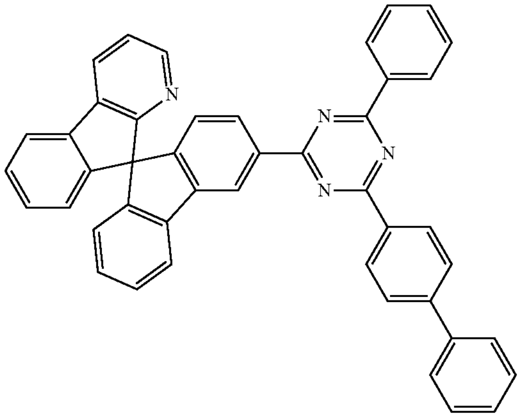
E042
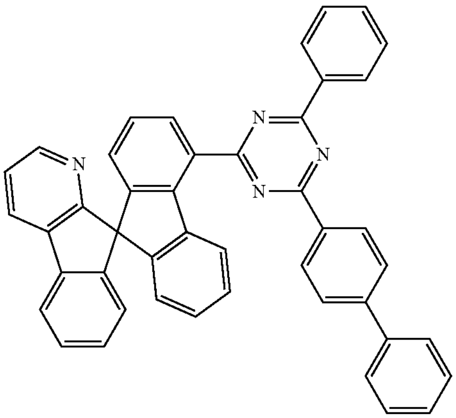
-continued
E043
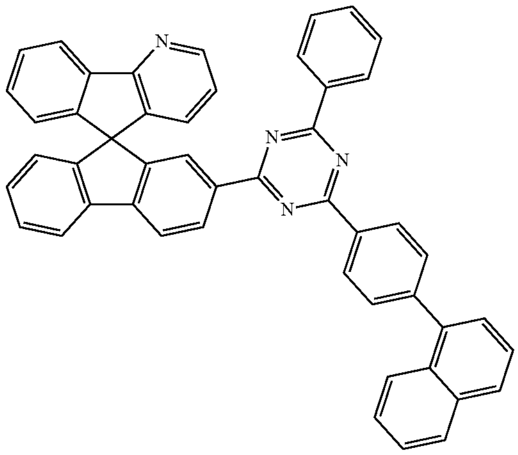
E044
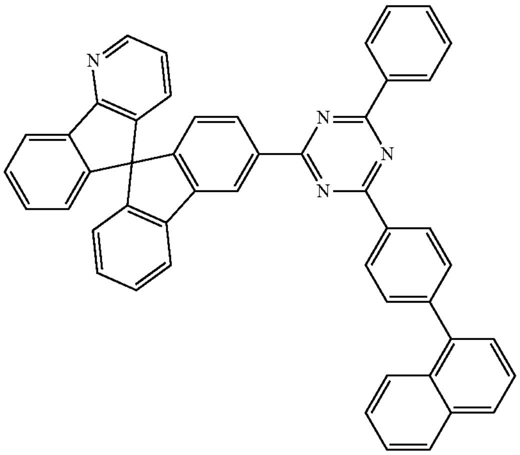
E045
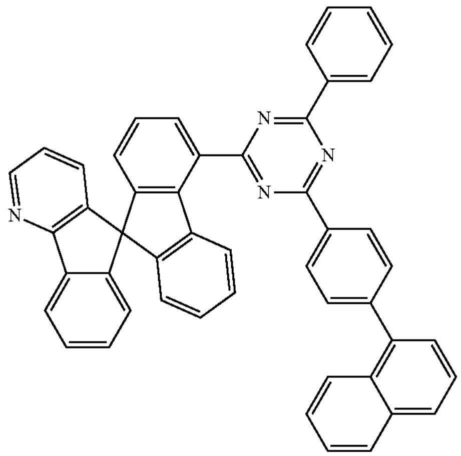

E046
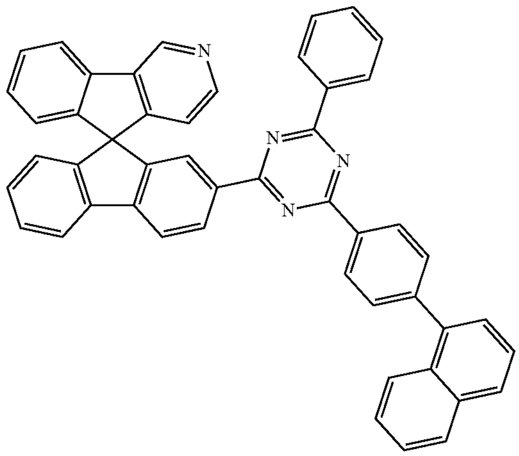
E047
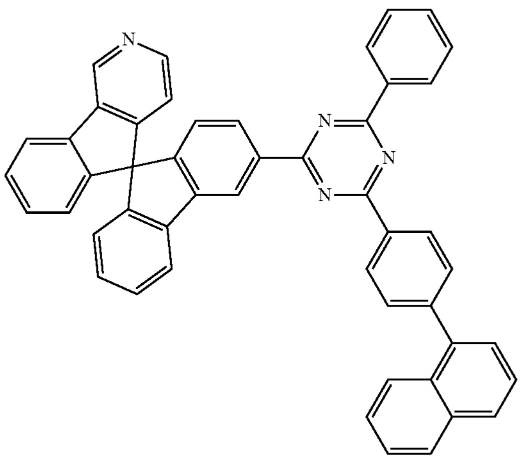
E048
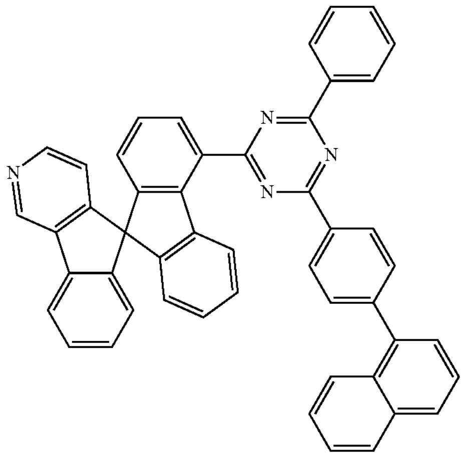
E049
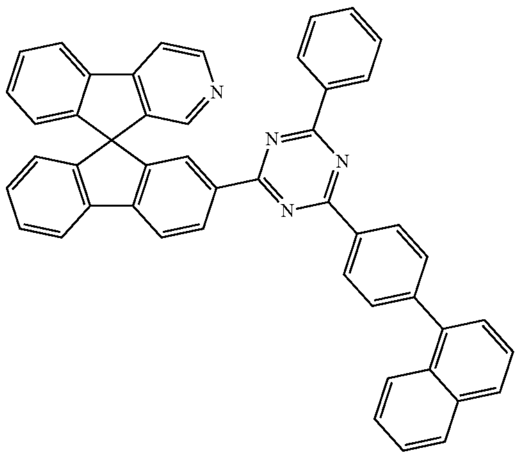
E050
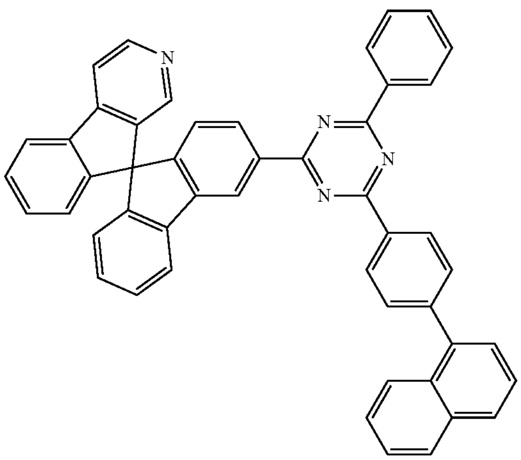
E051
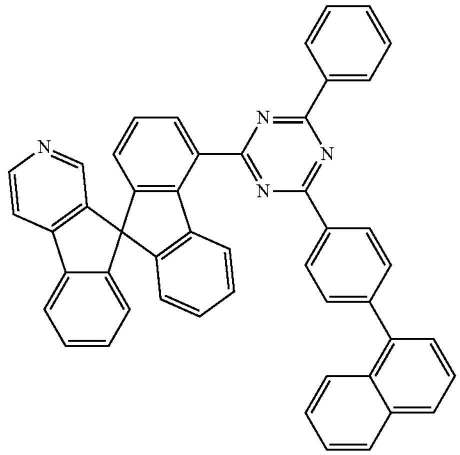

-continued
E052
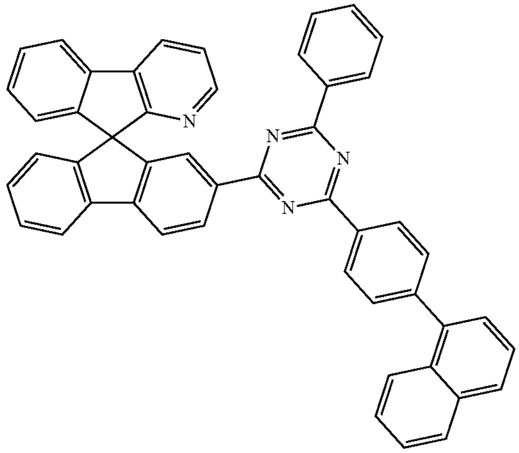
E053
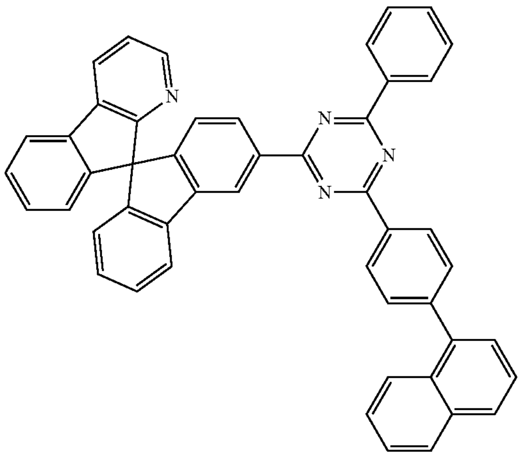
E054
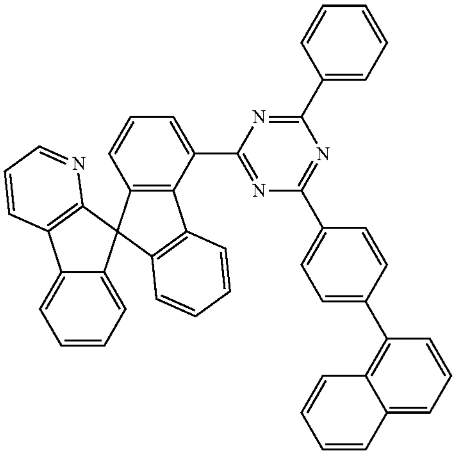
-continued
E055
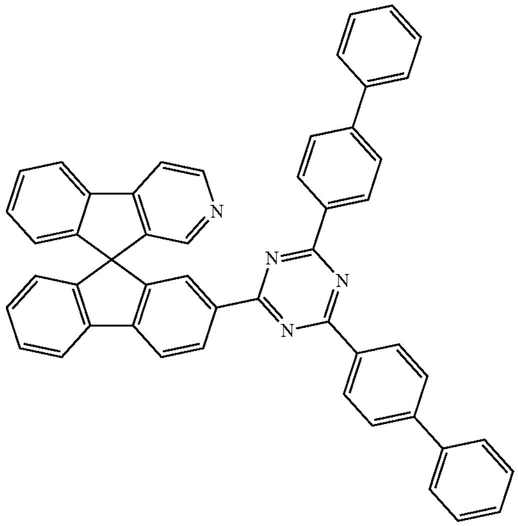
E056
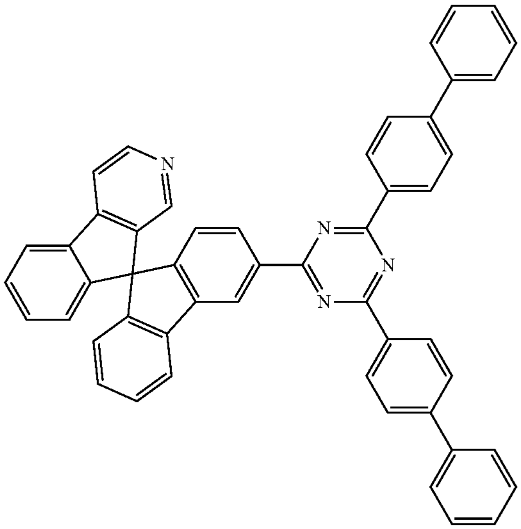
E057
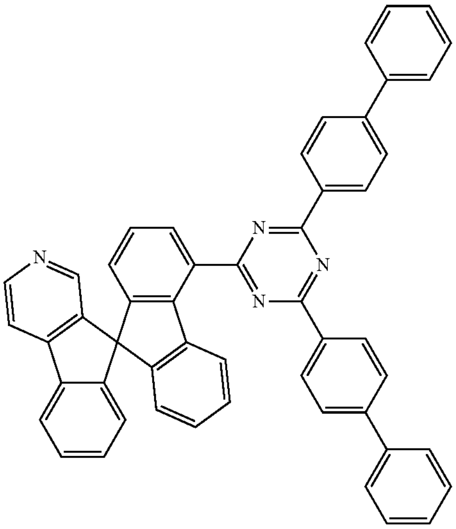

-continued
E058
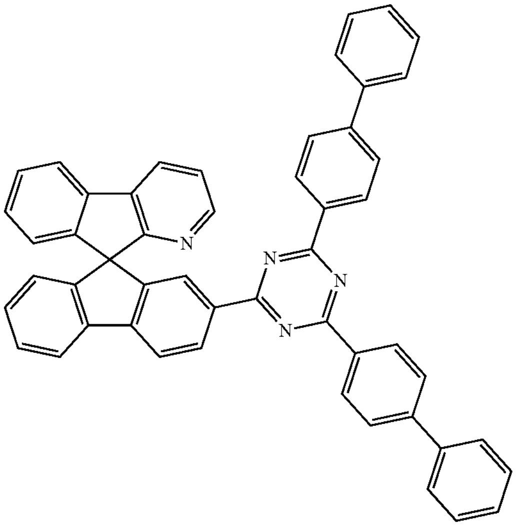
E059
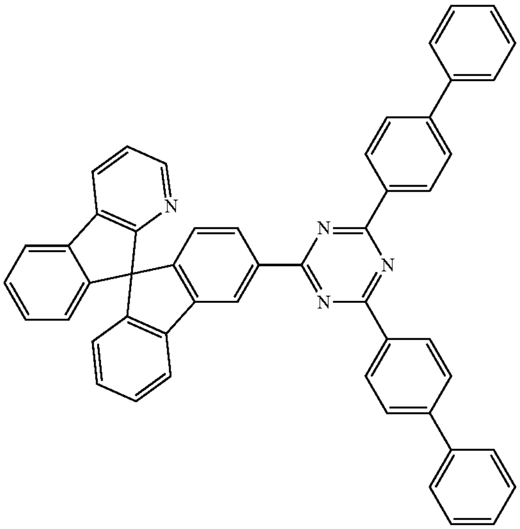
E060
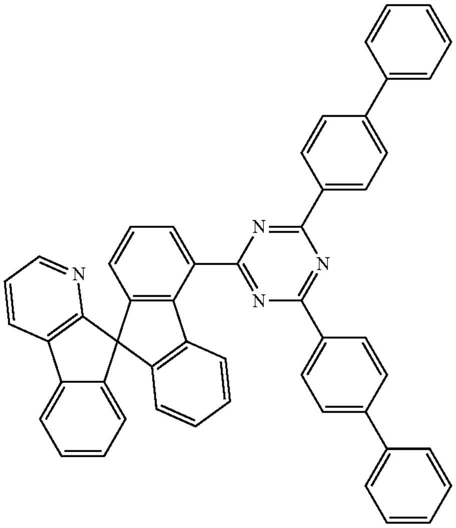
-continued
E061
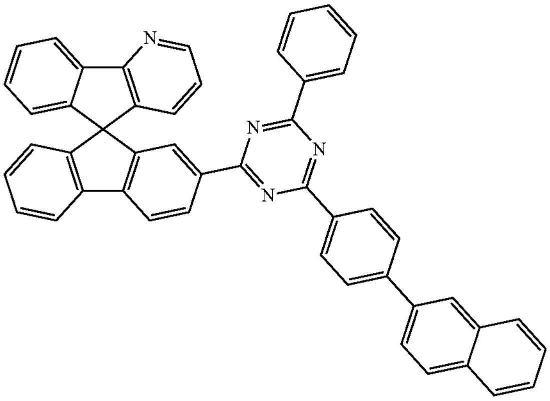
E062
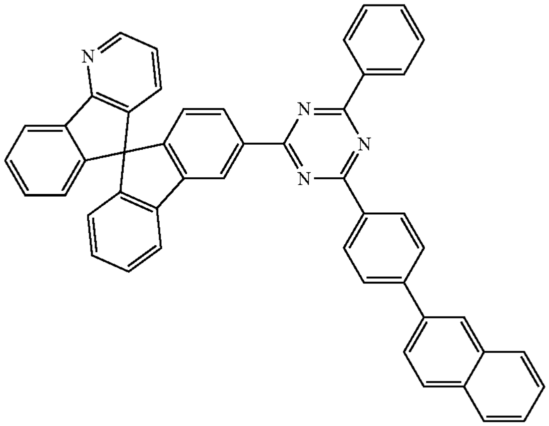
E063
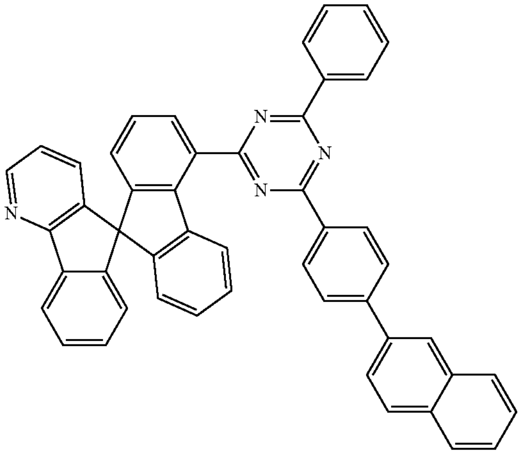

-continued
E064
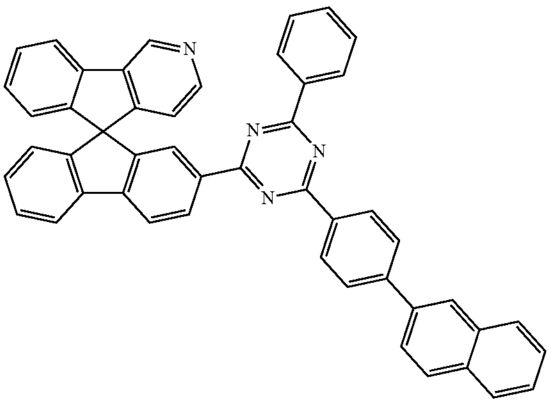
E065
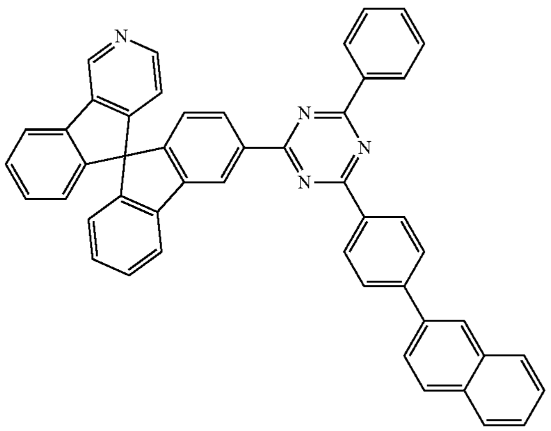
E066
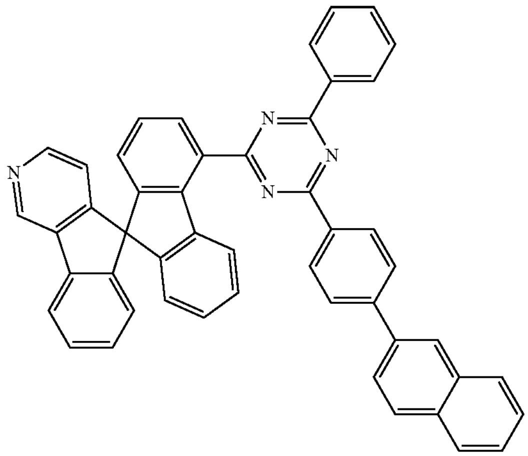
-continued
E067
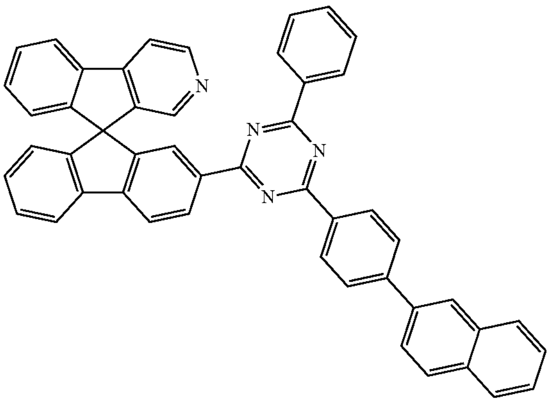
E068
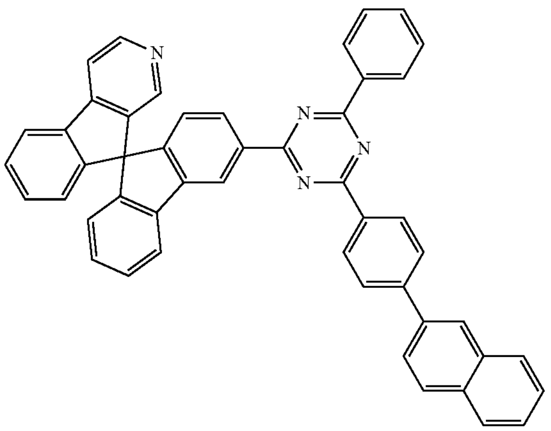
E069
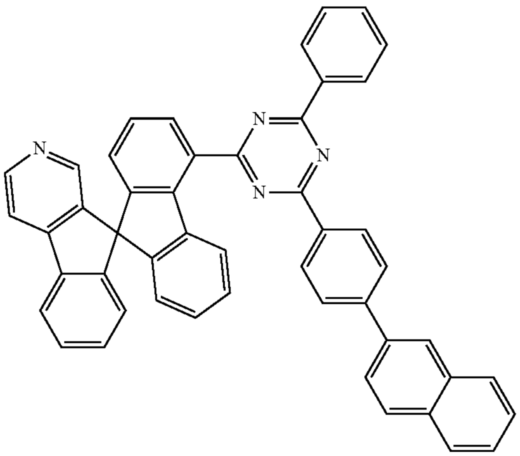

-continued
E070
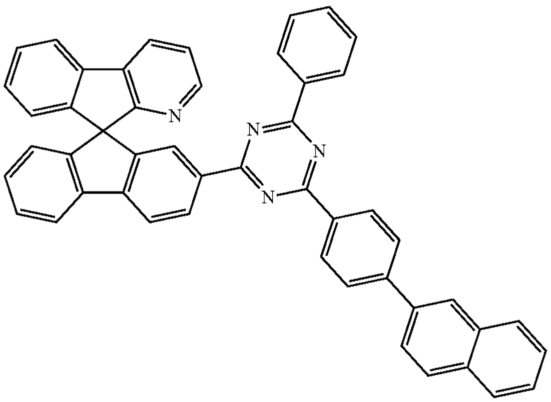
E071
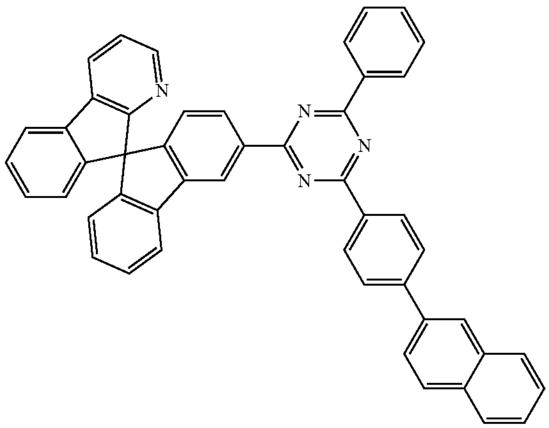
E072
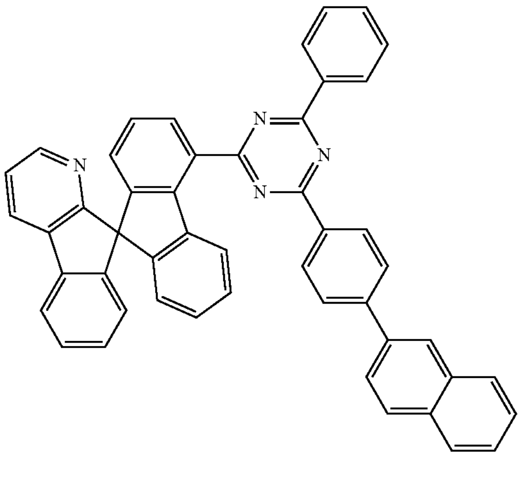
E073
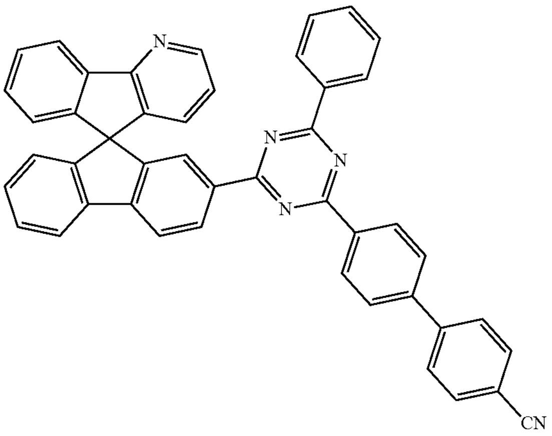
E074
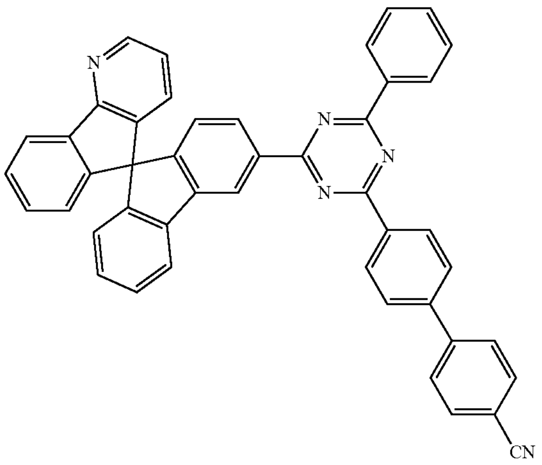
E075
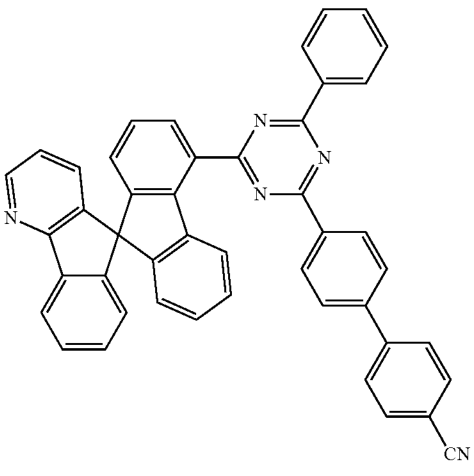

-continued
E076
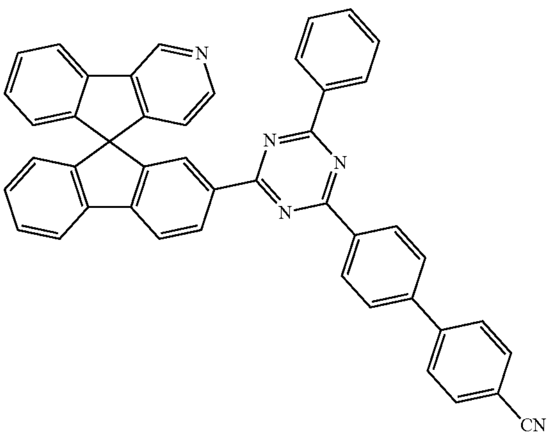
E077
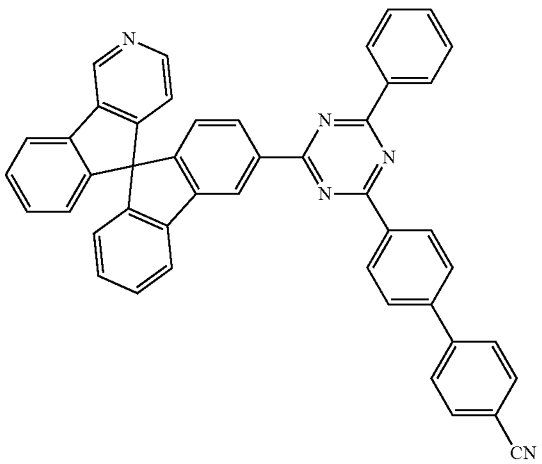
E078
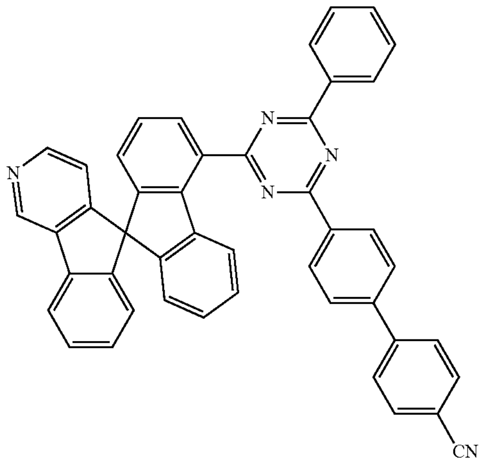
-continued
E079
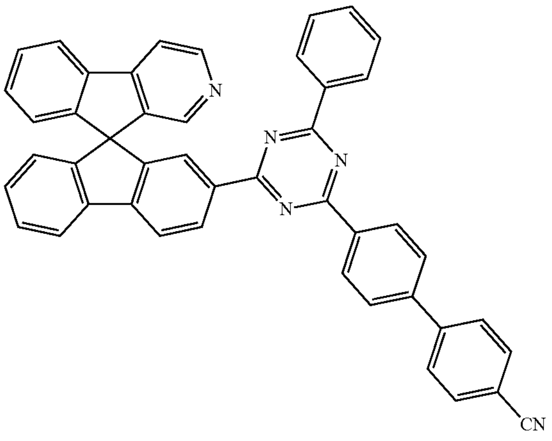
E080
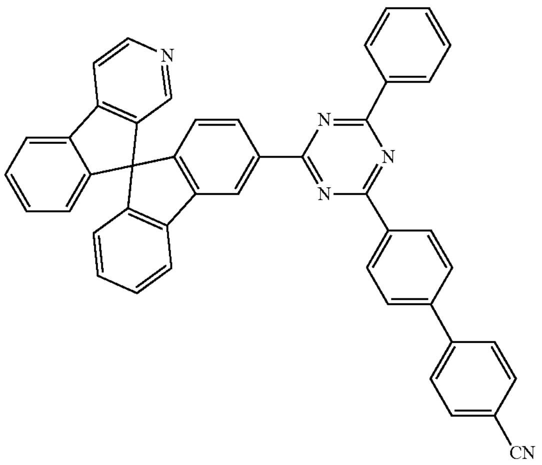
E081
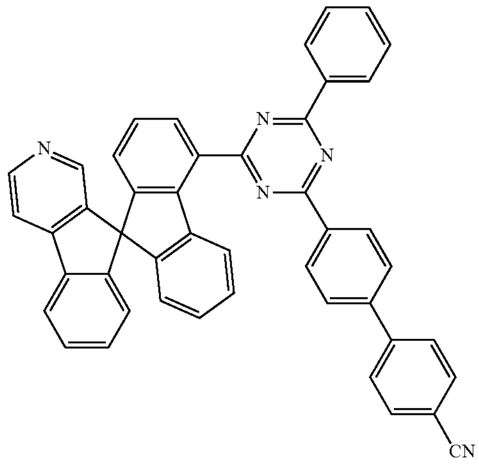

-continued
E082
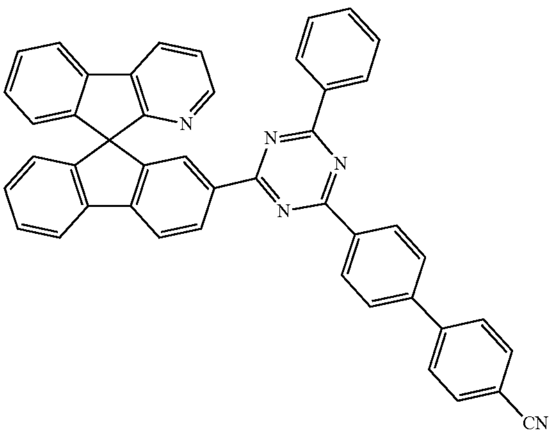
E083
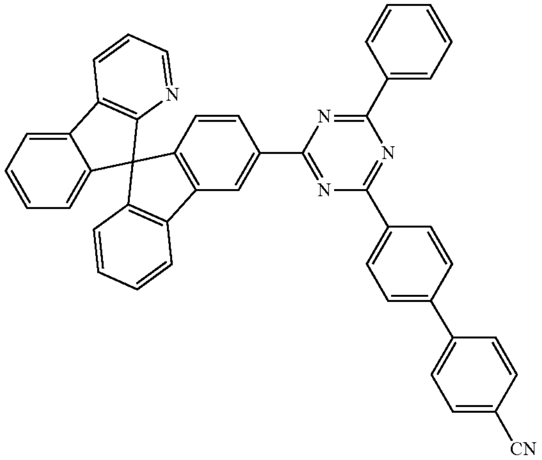
E084
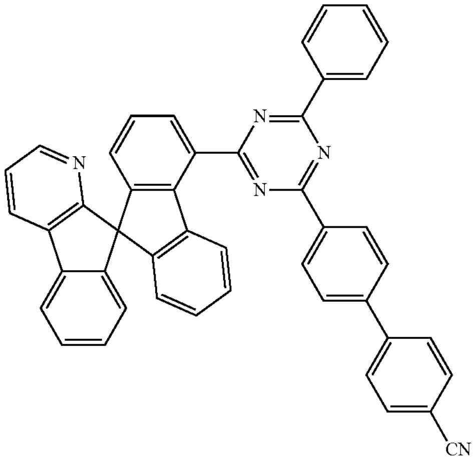
-continued
E085
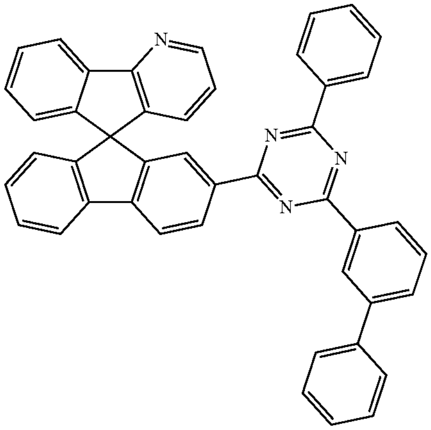
E086
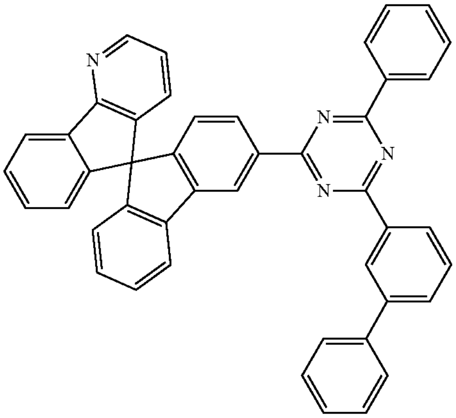
E087
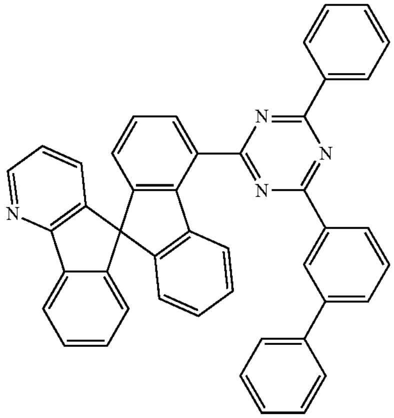

-continued
E088
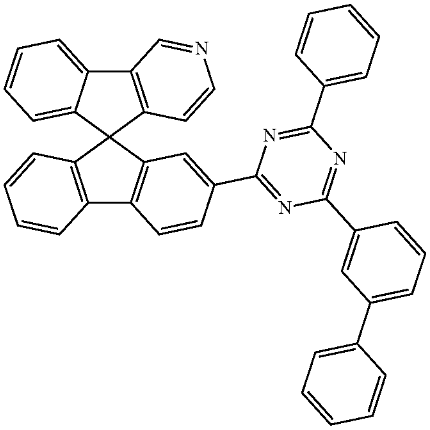
E089
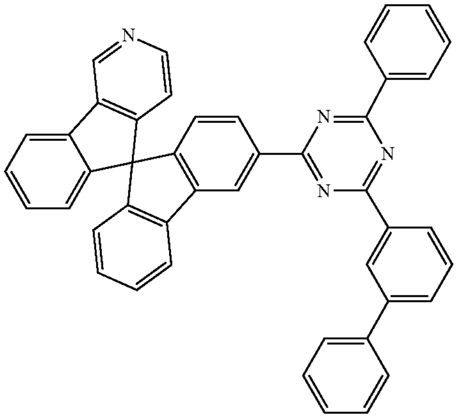
E090
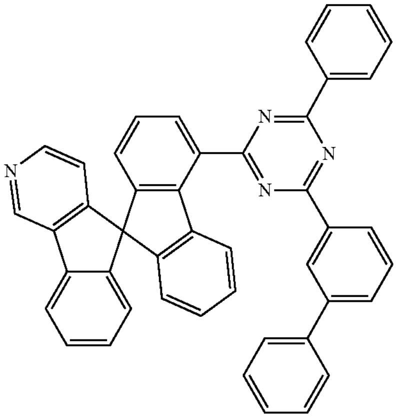
-continued
E091
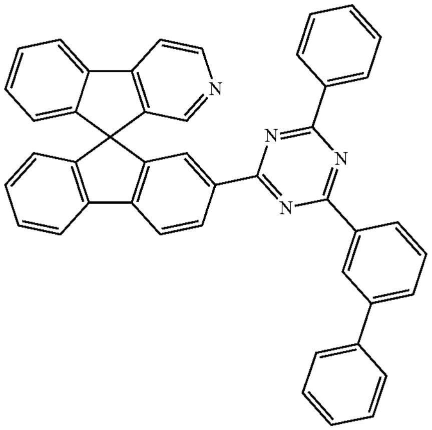
E092
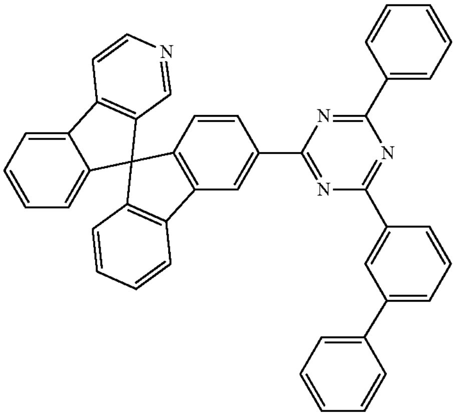
E093
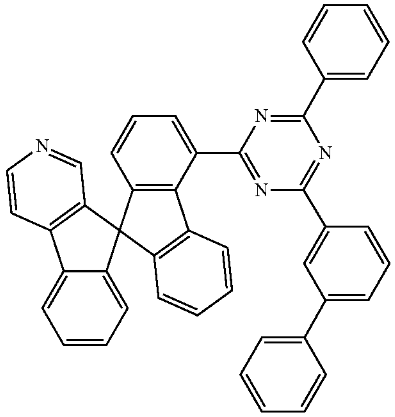

-continued
E094
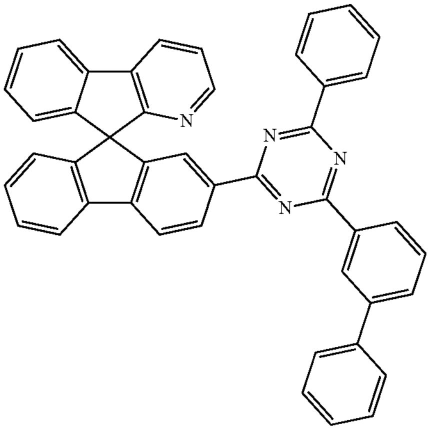
E095
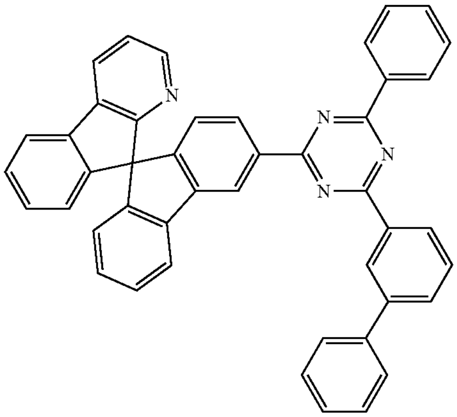
E096
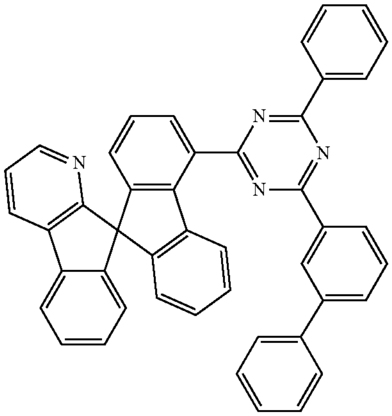
-continued
E097
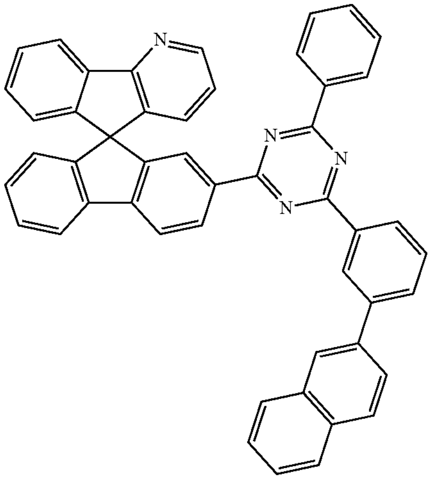
E098
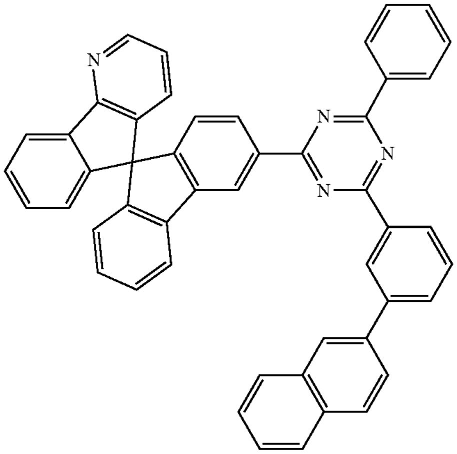
E099
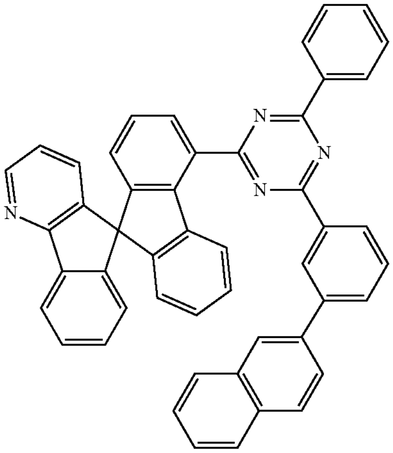

-continued
E100
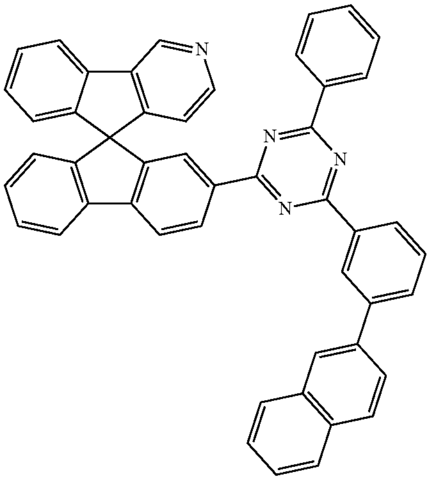
E101
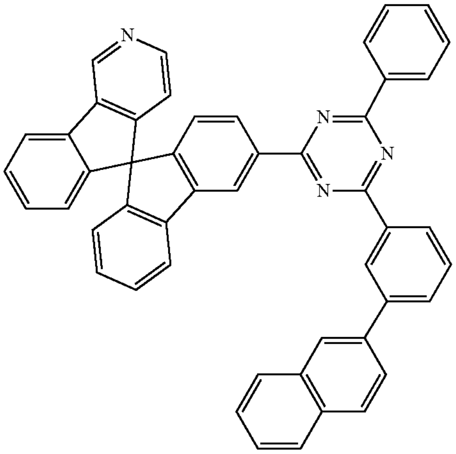
E102
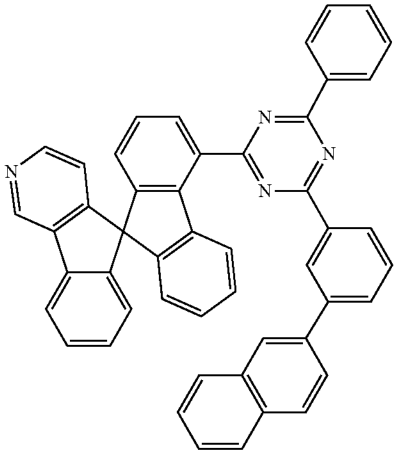
-continued
E103
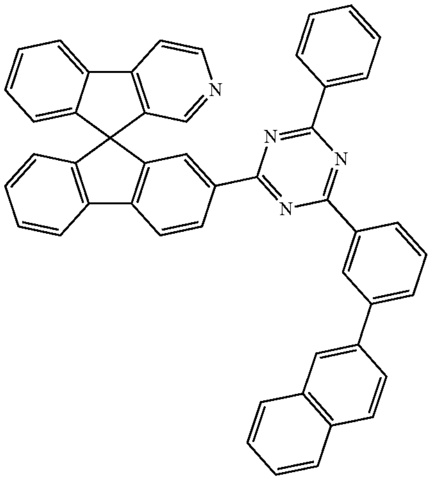
E104
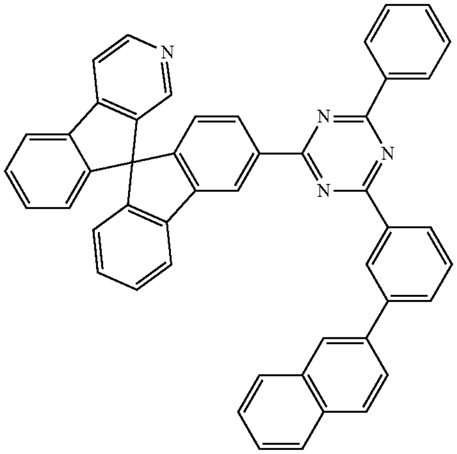
E105
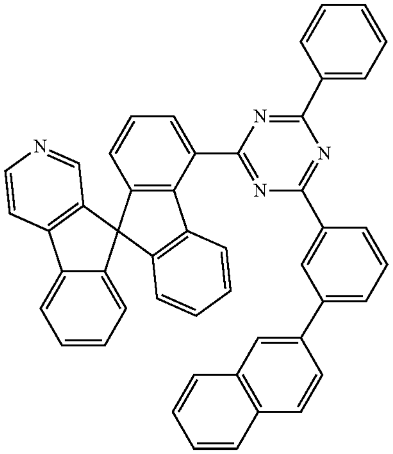

-continued
E106
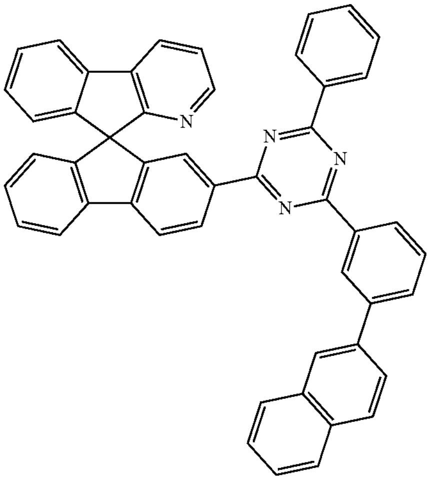
E107
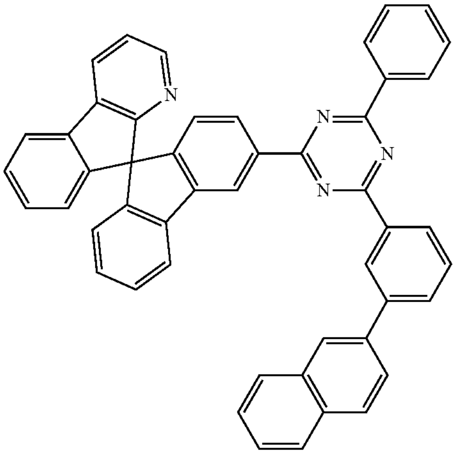
E108
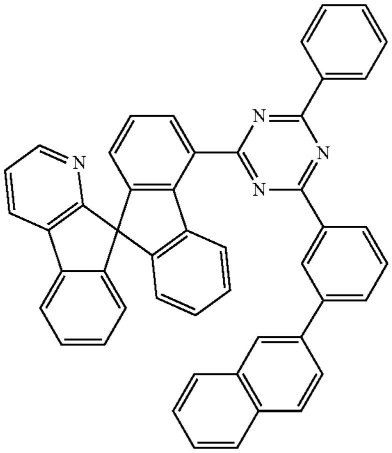
-continued
E109
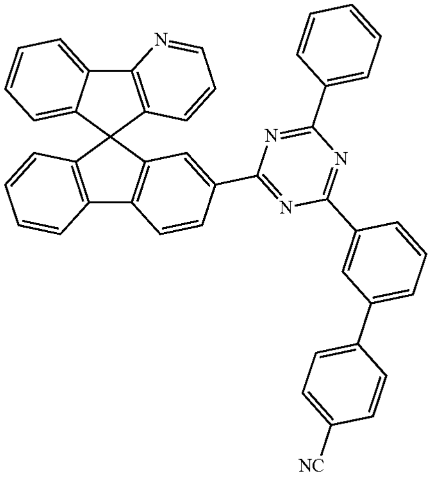
E110
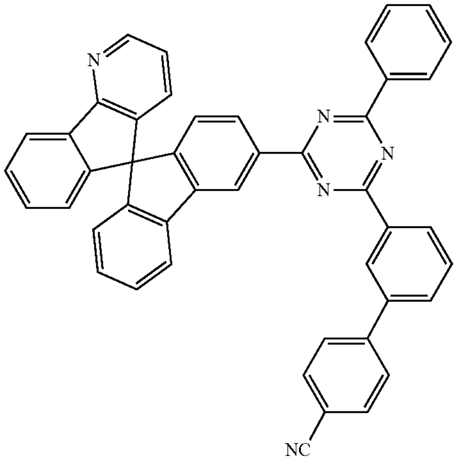
E111
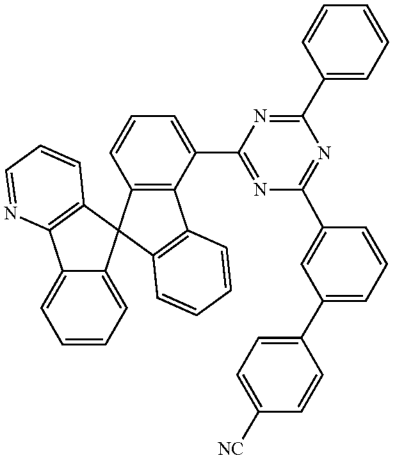

-continued
E112
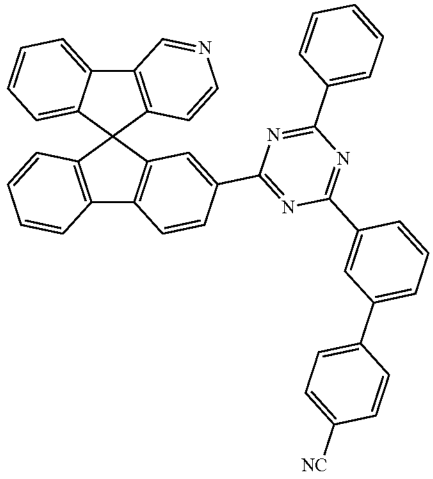
E113
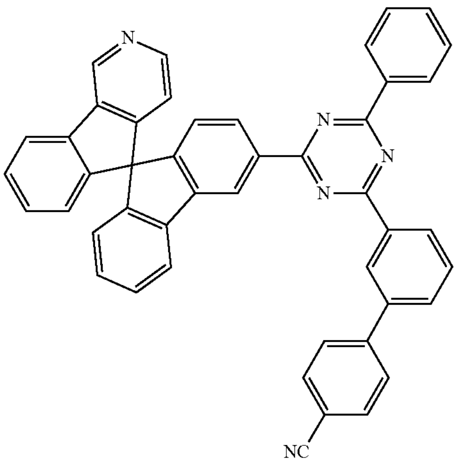
E114
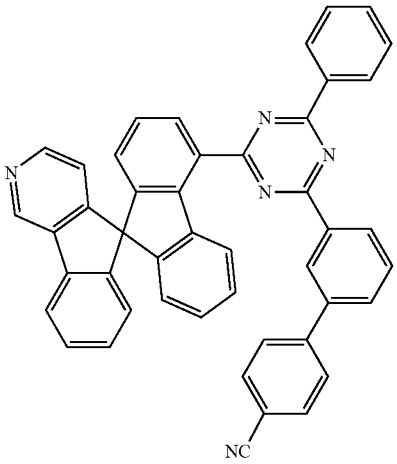
-continued
E115
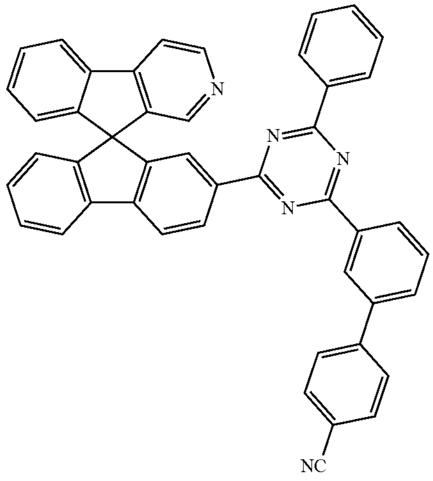
E116
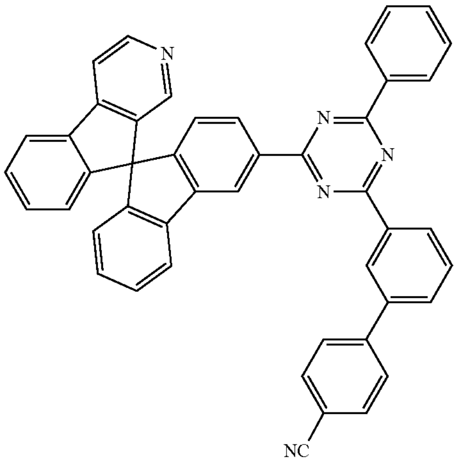
E117
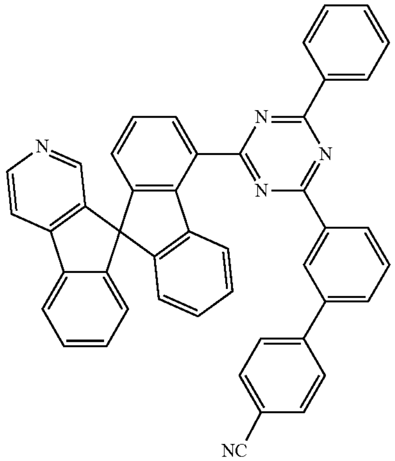

E118
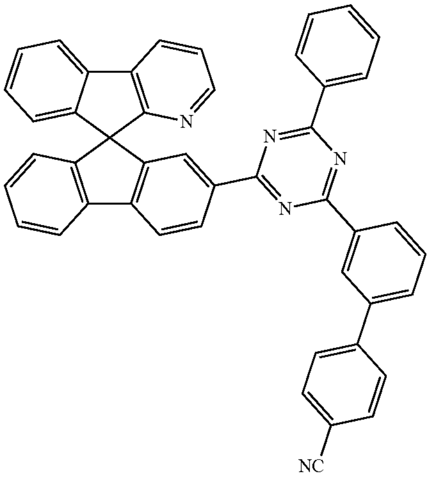
E119
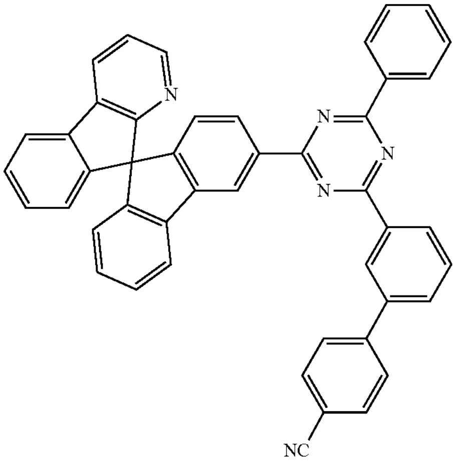
E120
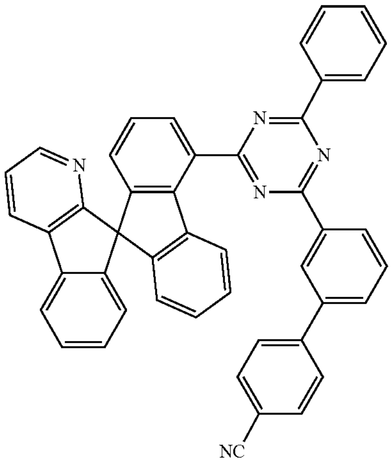
E121
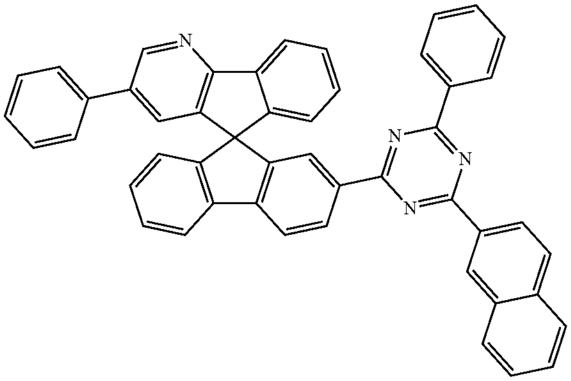
E122
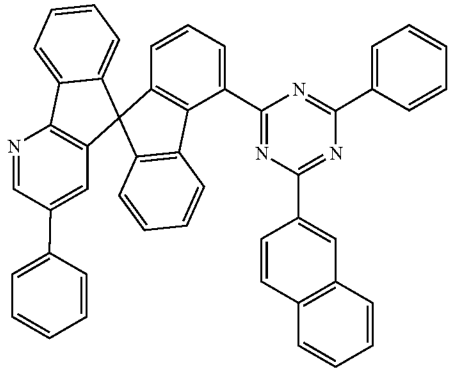
E123
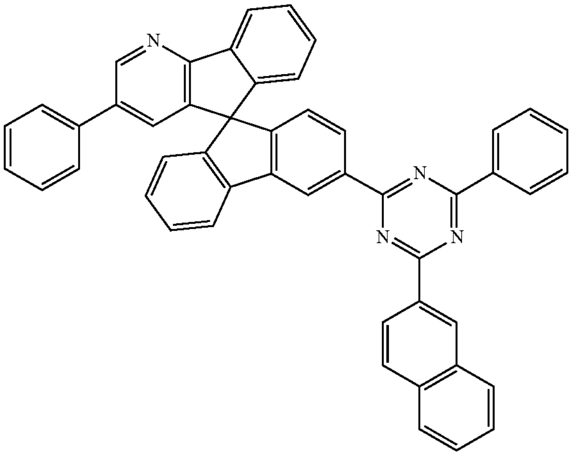
E124
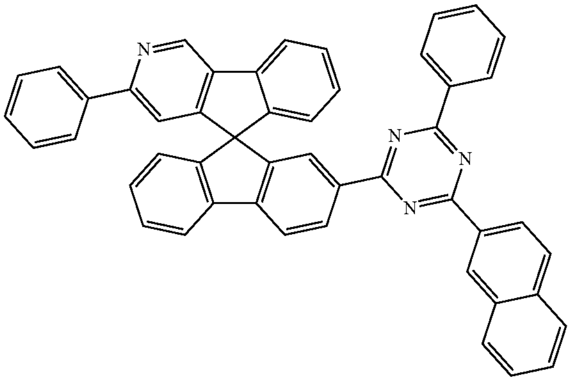

-continued
E125
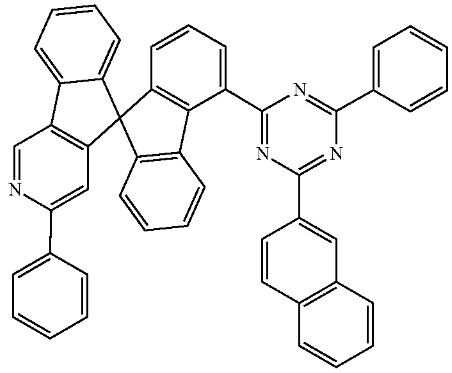
E126
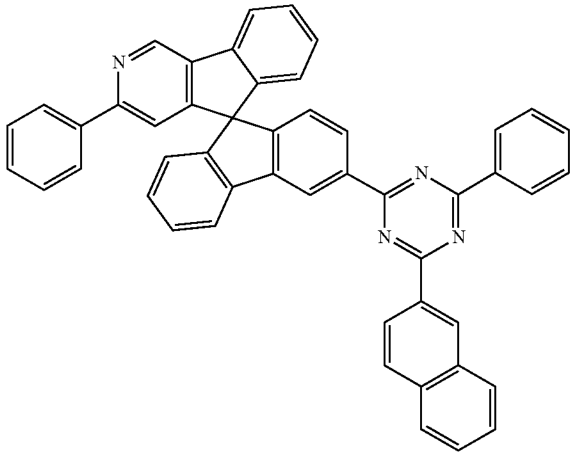
E127
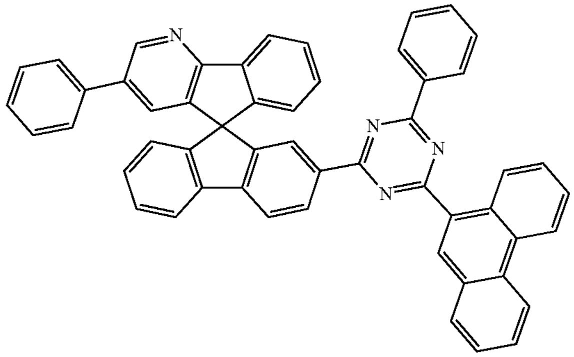
E128
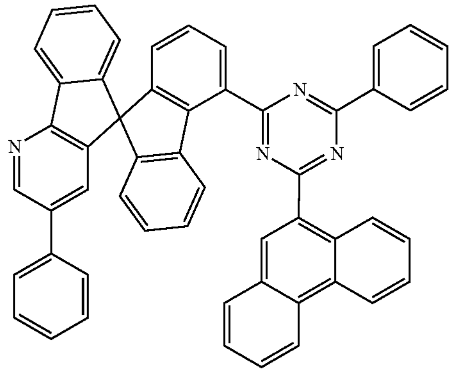
-continued
E129
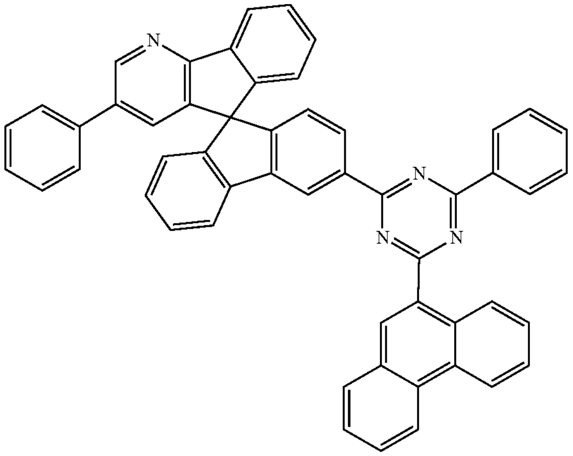
E130
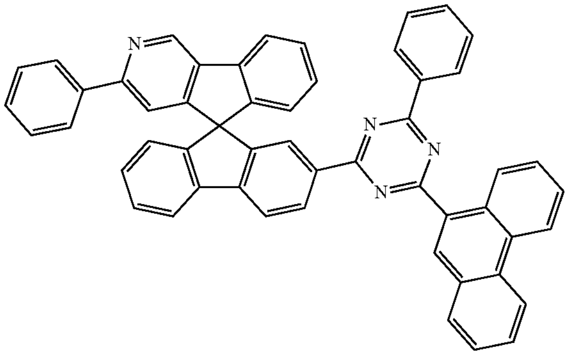
E131
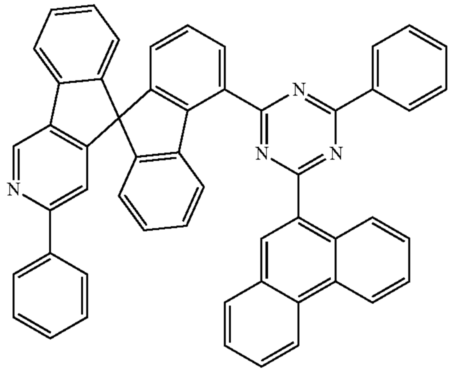

-continued
E132
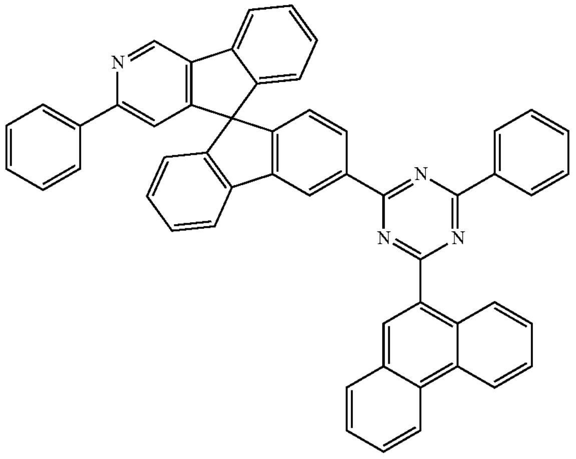
E133
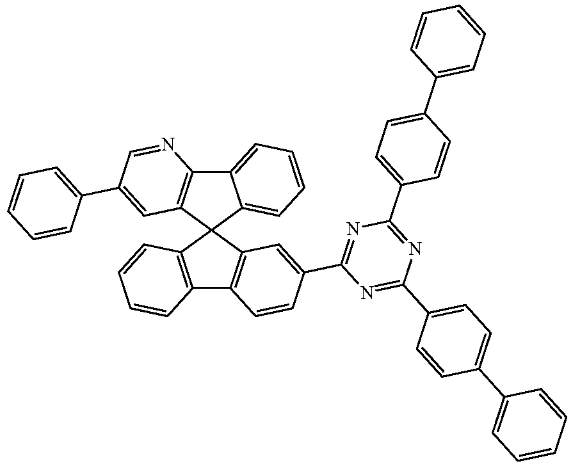
E134
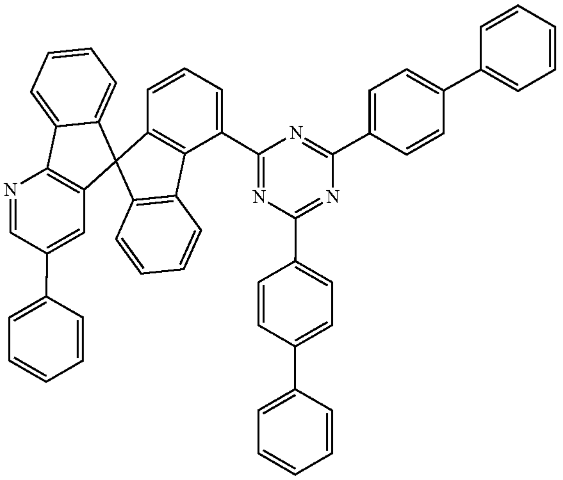
-continued
E135
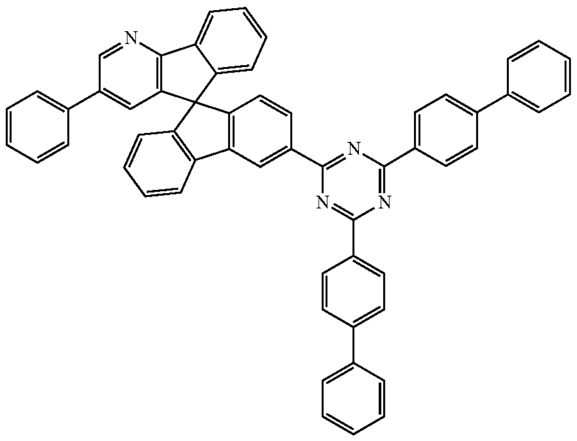
E136
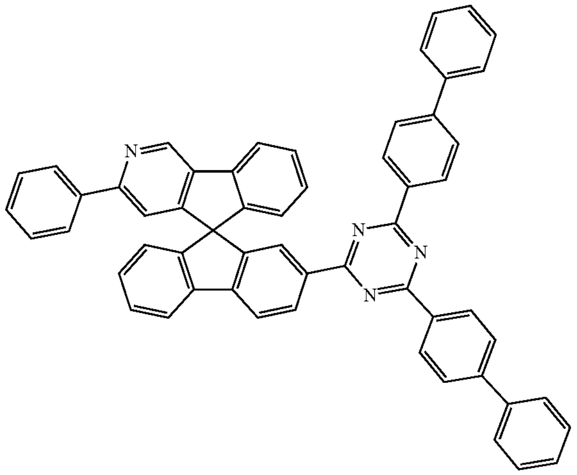
E137
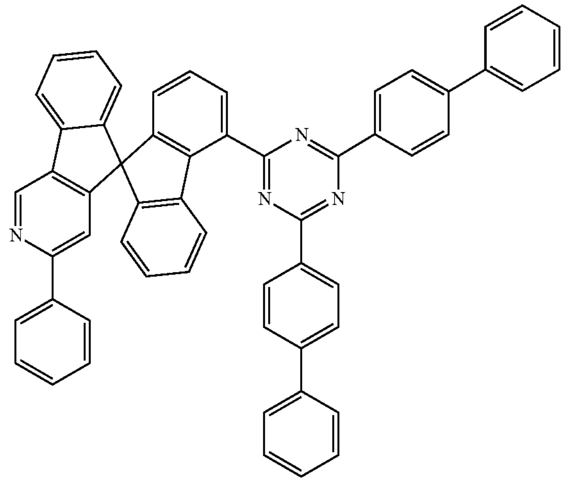

E138
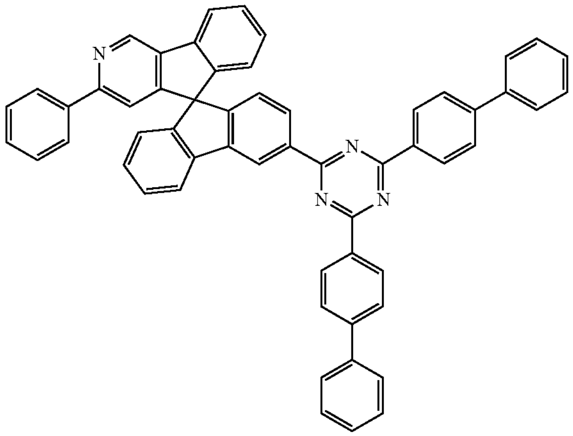
E139
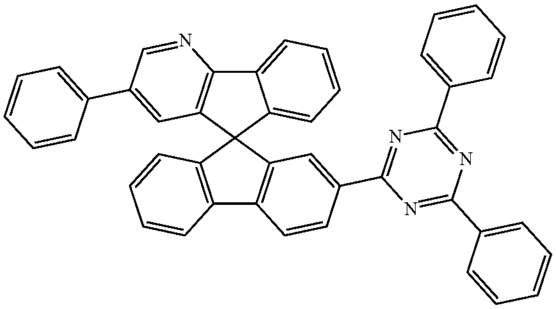
E140
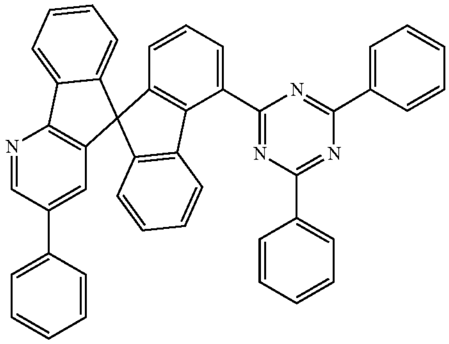
E141
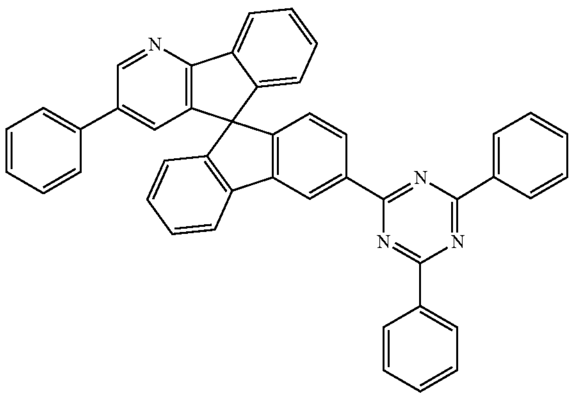
E142
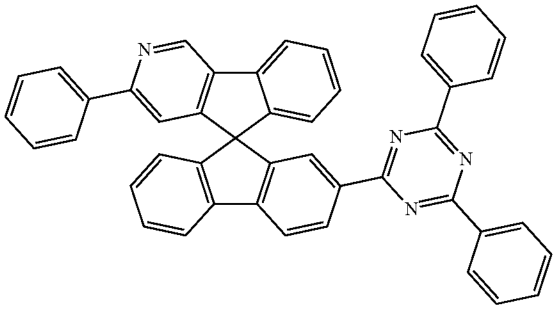
E143
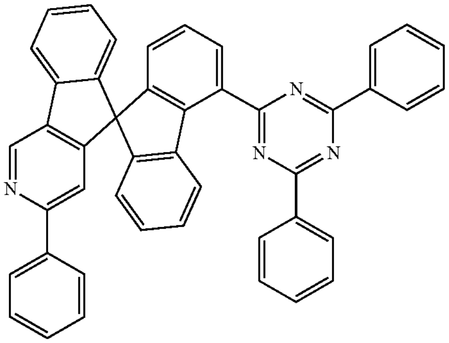
E144
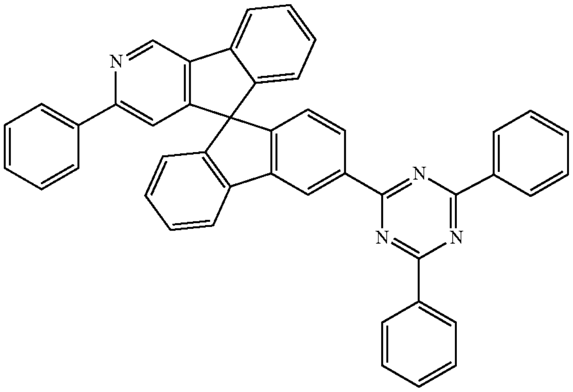
E145
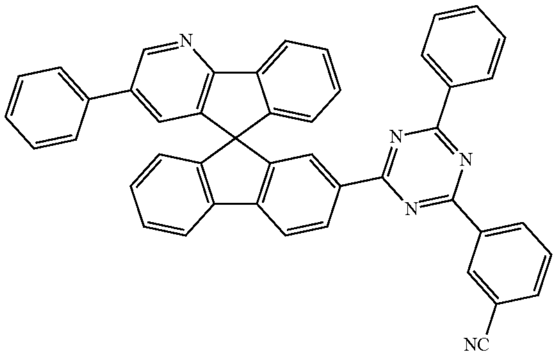

-continued
E146
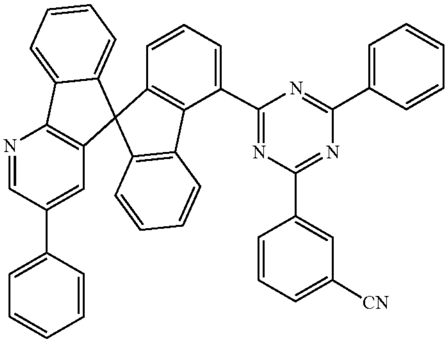
E147
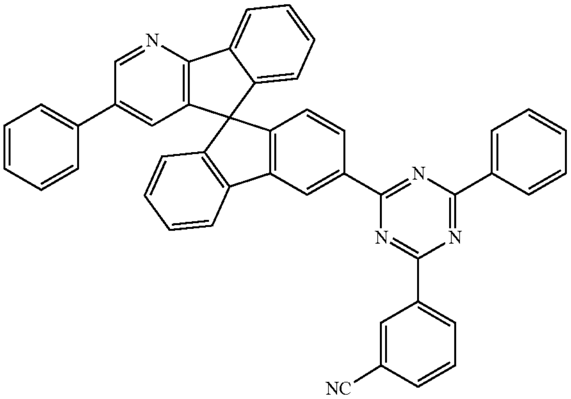
E148
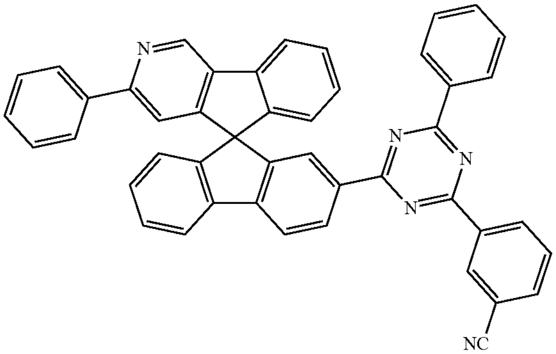
E149
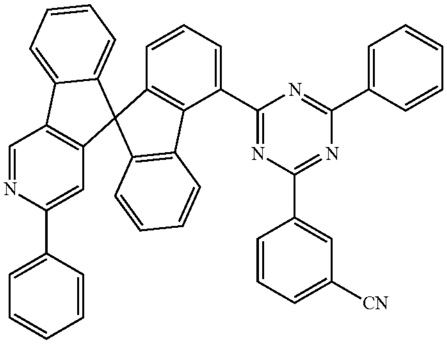
-continued
E150
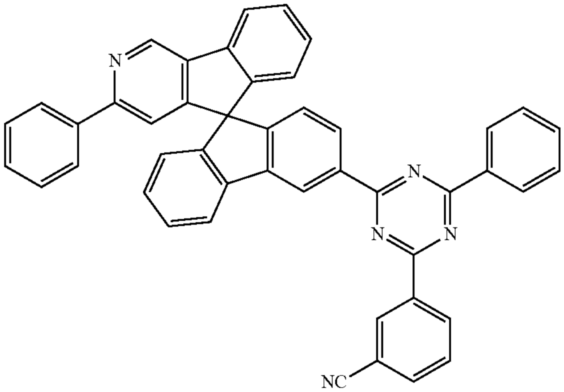
E151
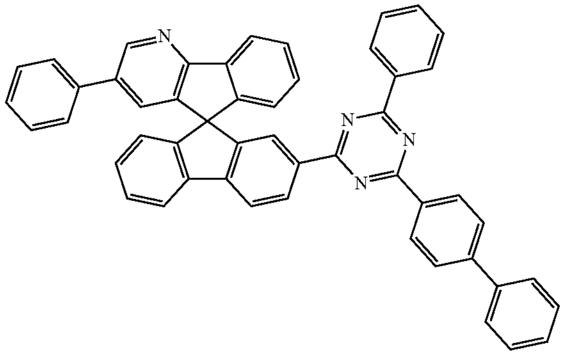
E152
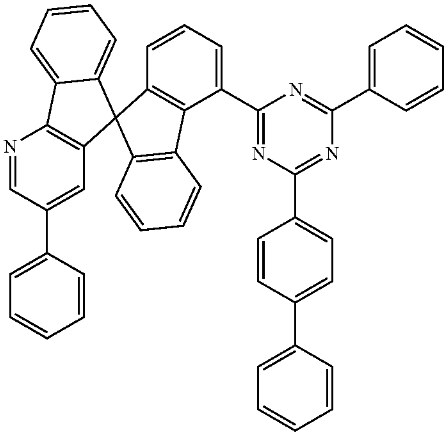

-continued
E153
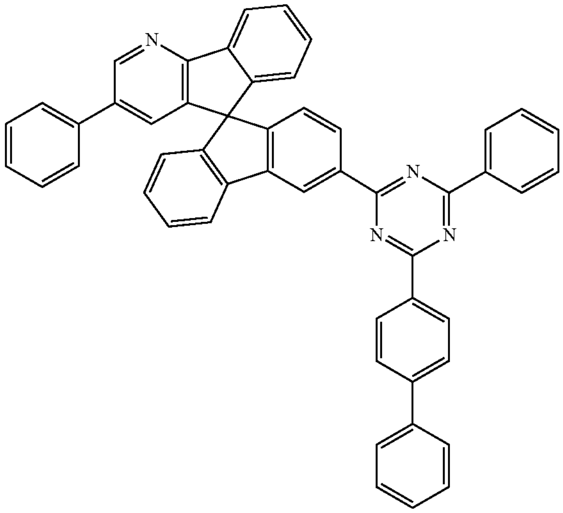
E154
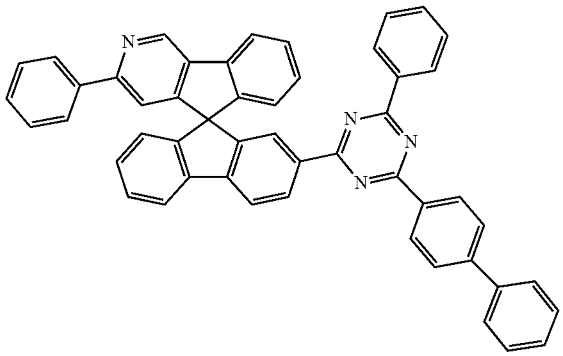
E155
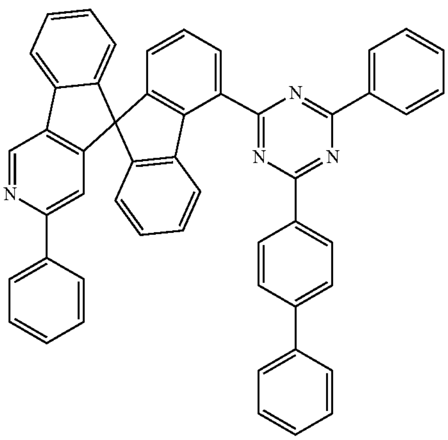
-continued
E156
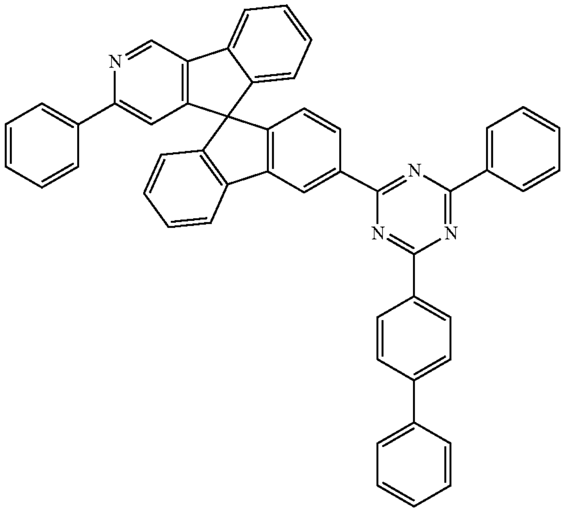
E157
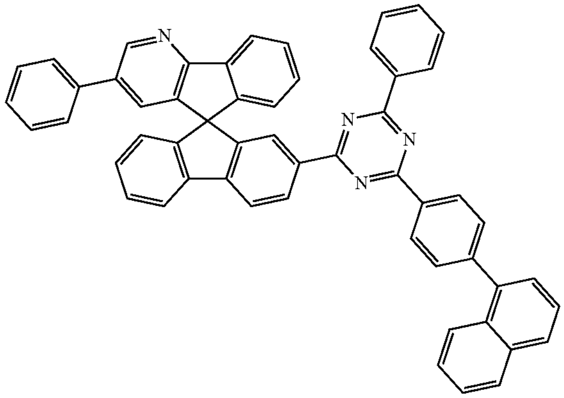
E158
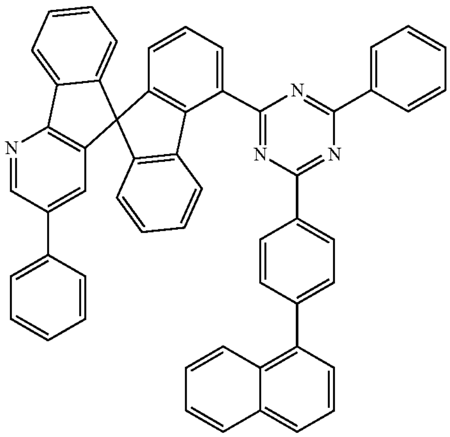

-continued
E159
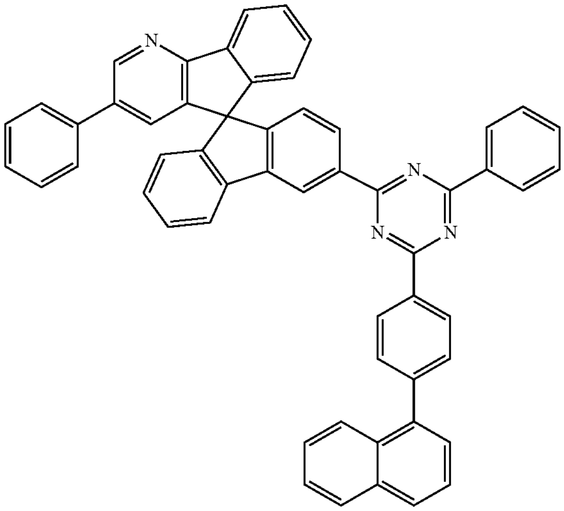
E160
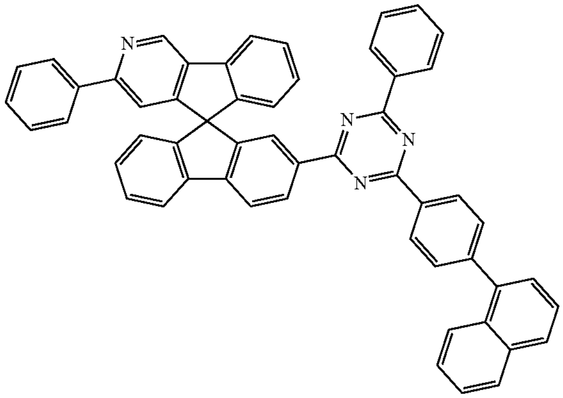
E161
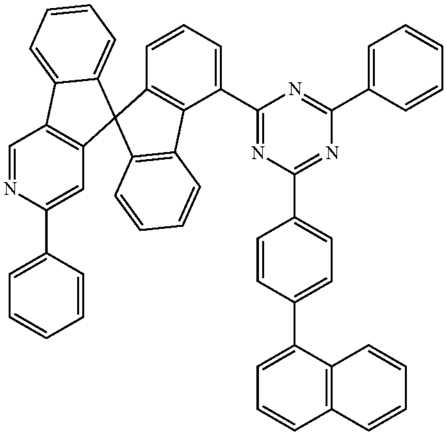
-continued
E162
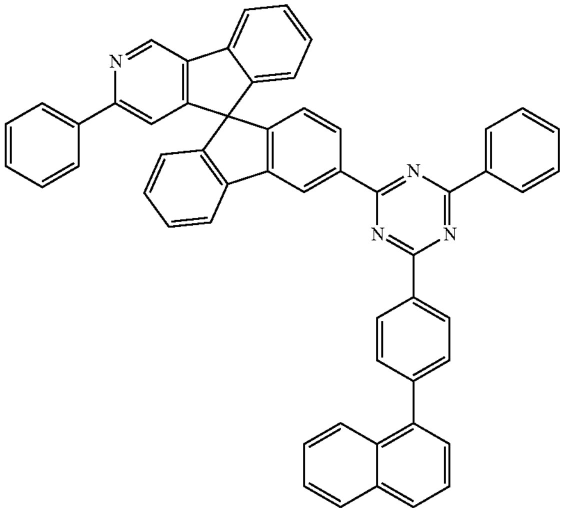
E163
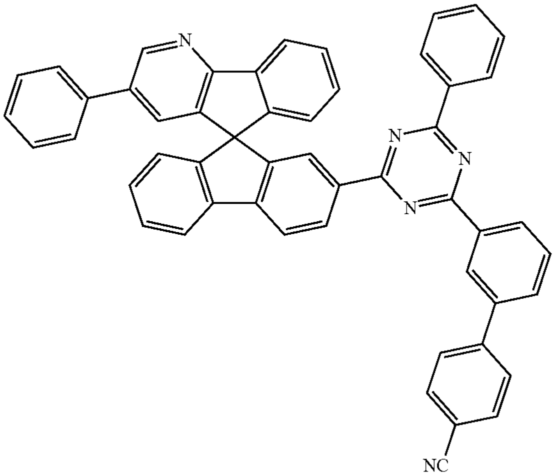
E164
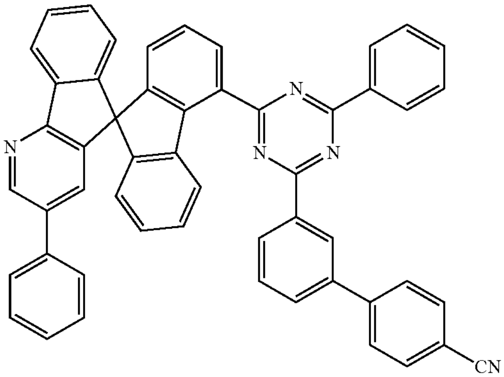

-continued
E165
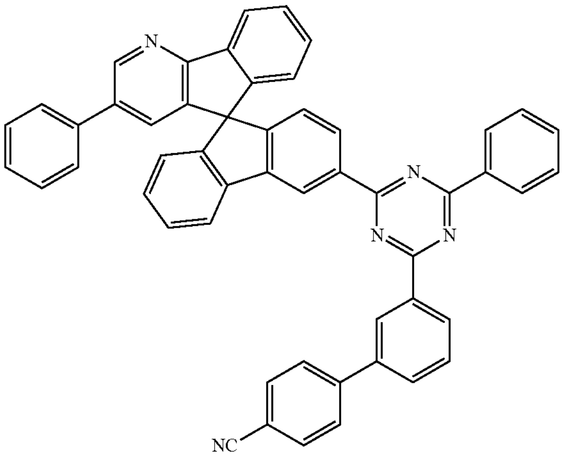
E166
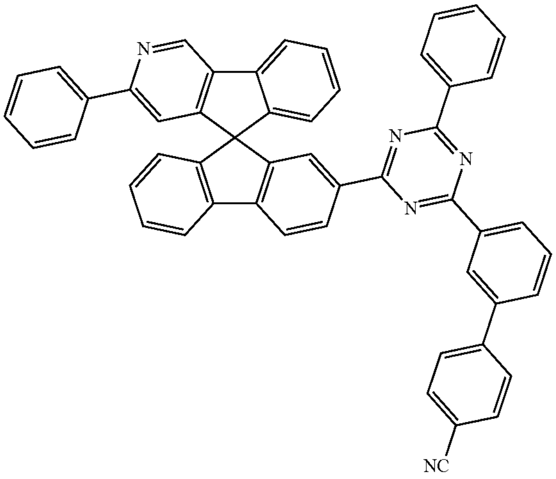
E167
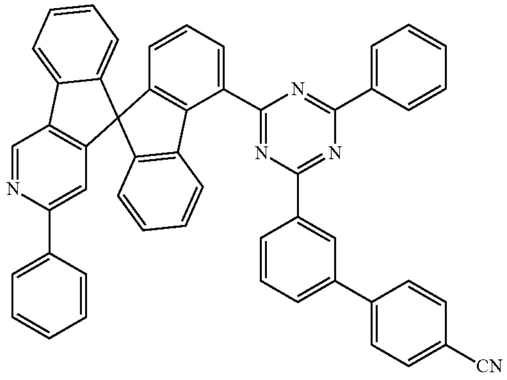
-continued
E168
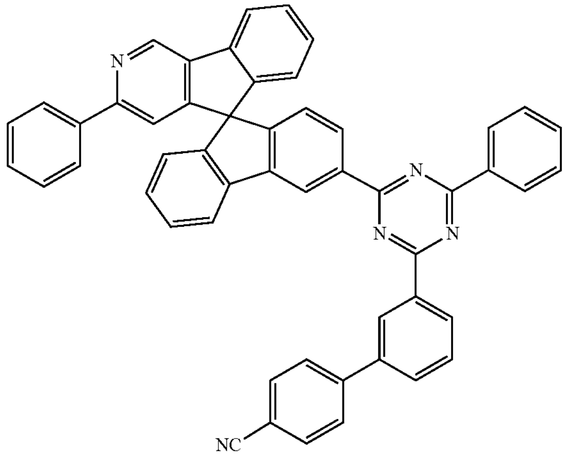
E169
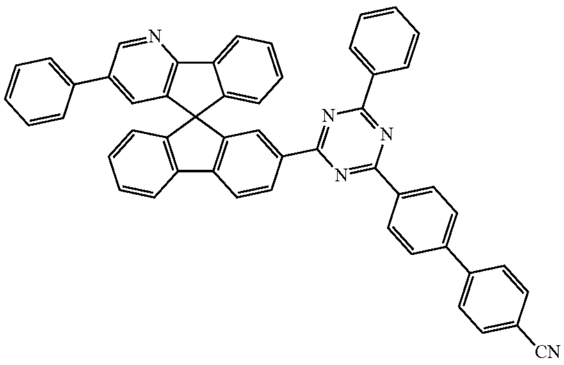
E170
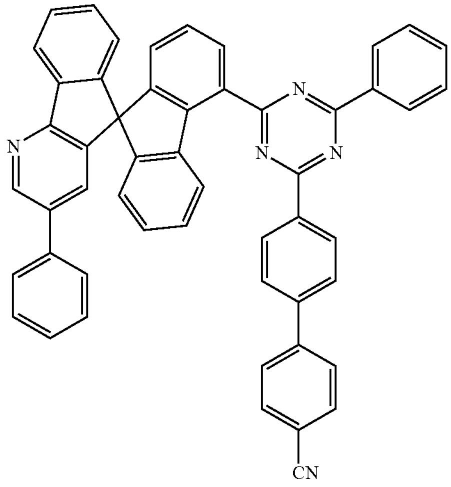

E171
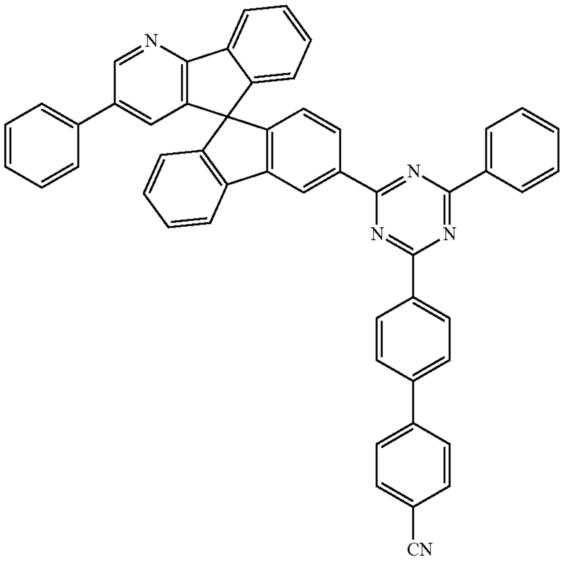
E172
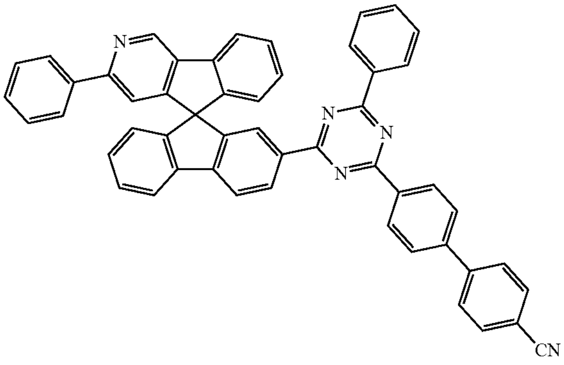
E173
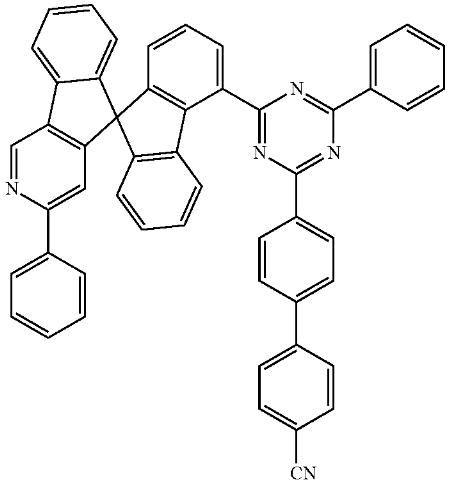
E174
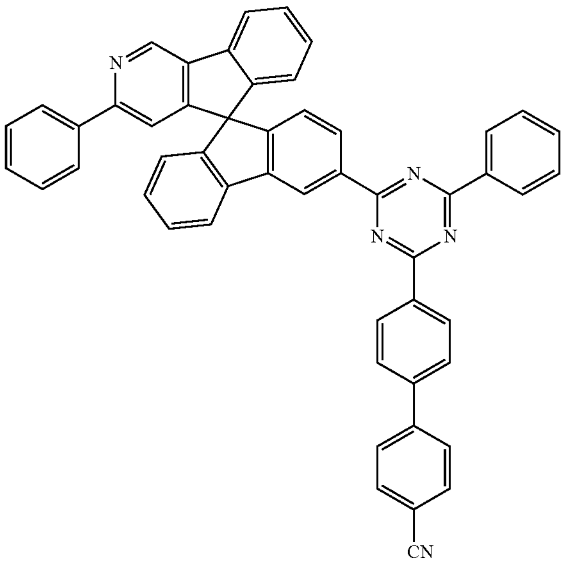
E175
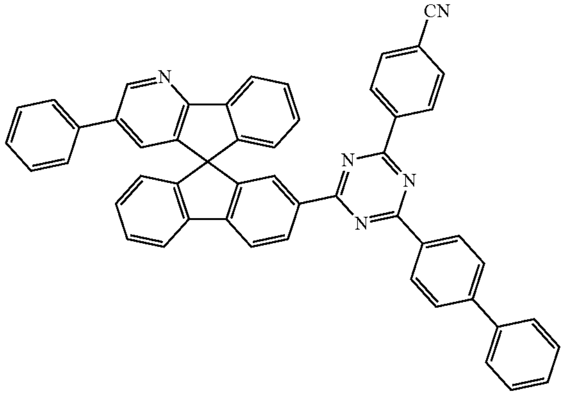
E176
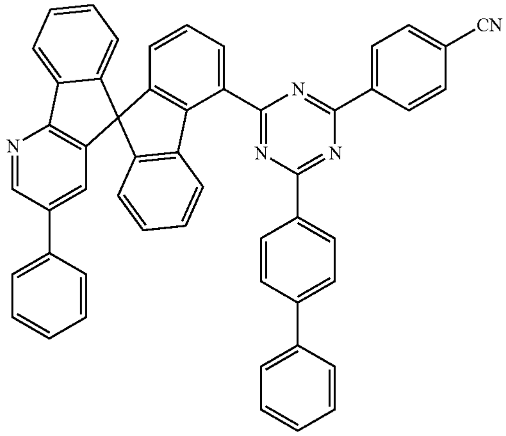

-continued
E177
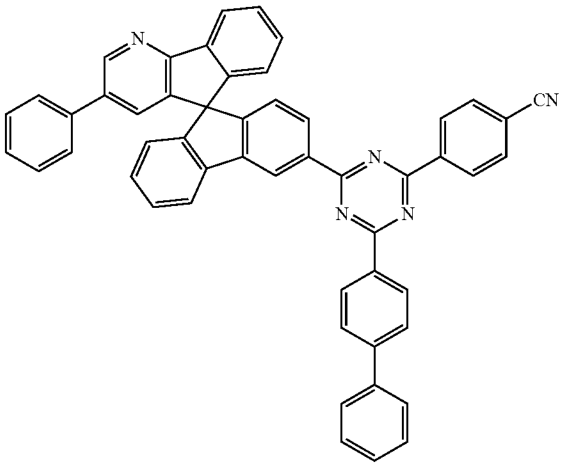
E178
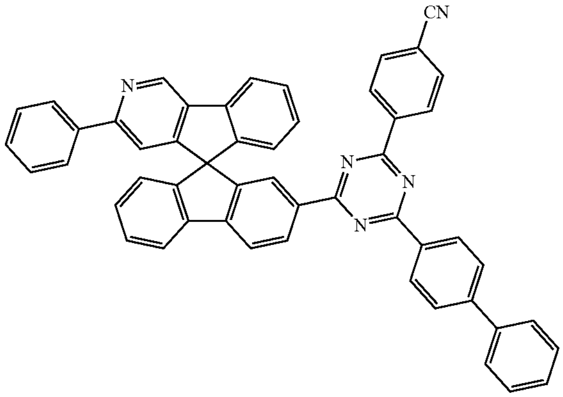
E179
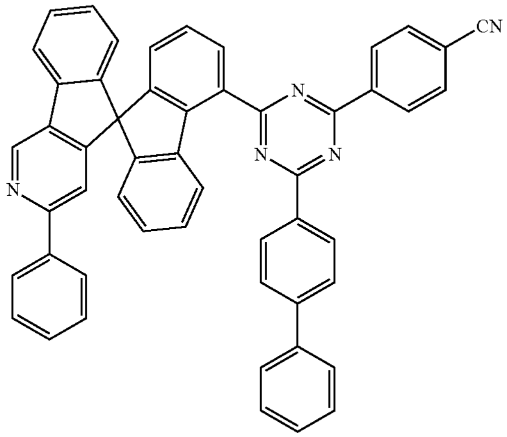
-continued
E180
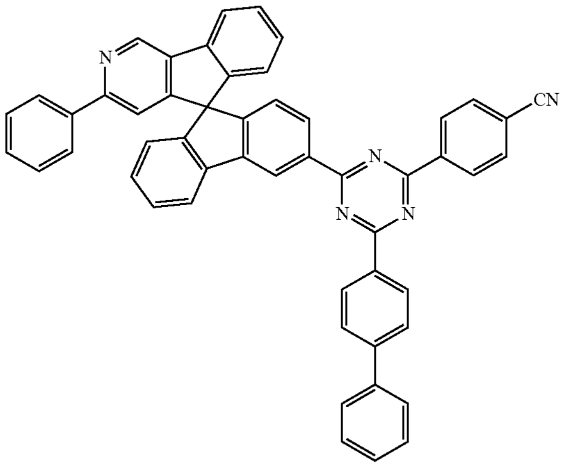
E181
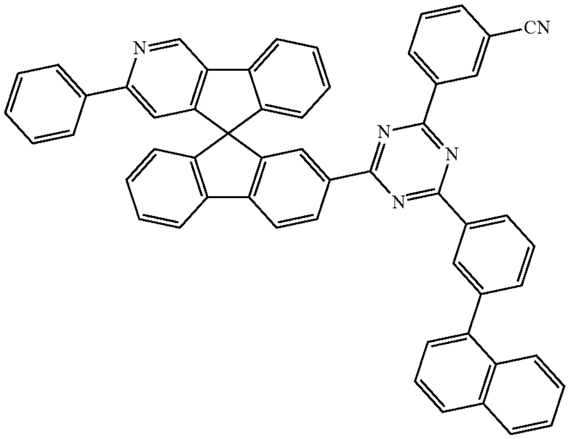
E182
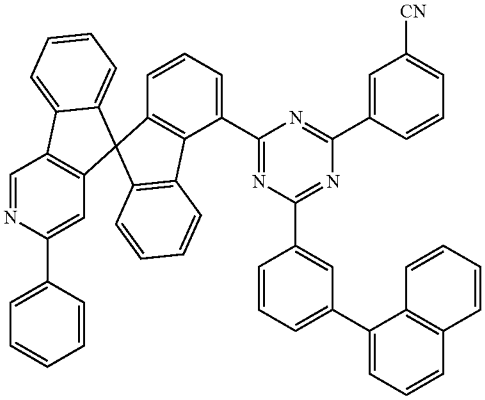

-continued
E183
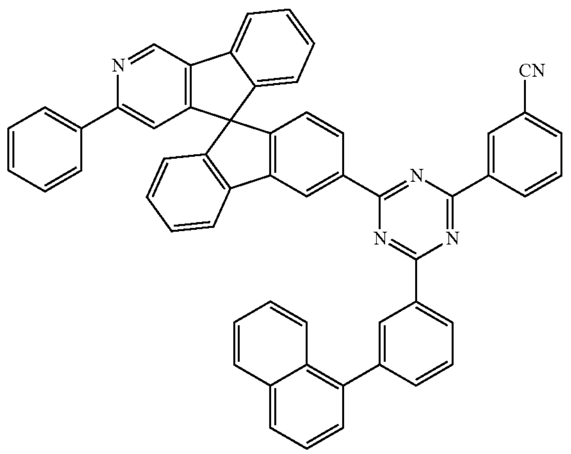
E184
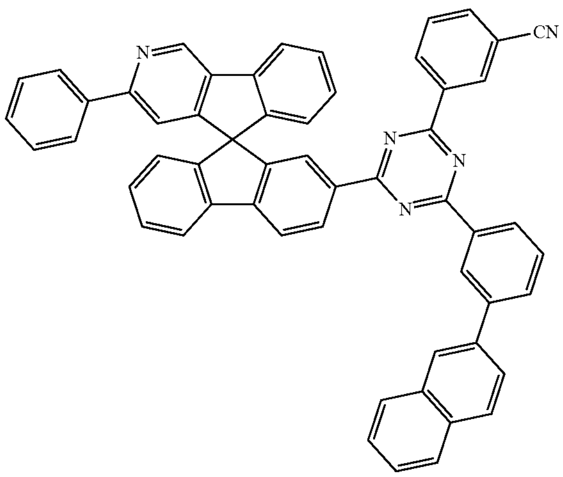
E185
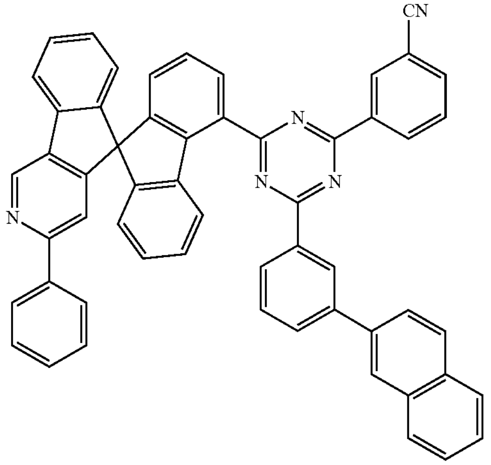
-continued
E186
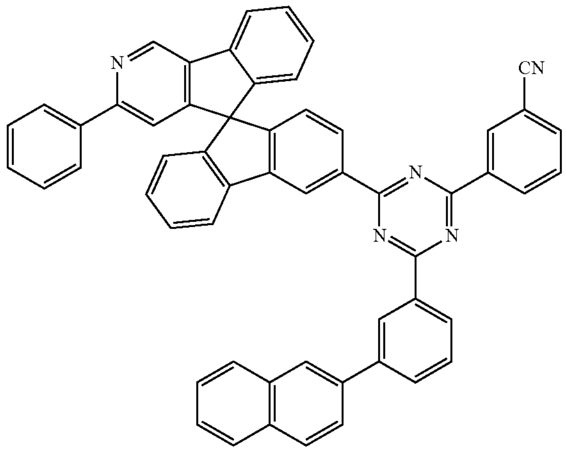
E187
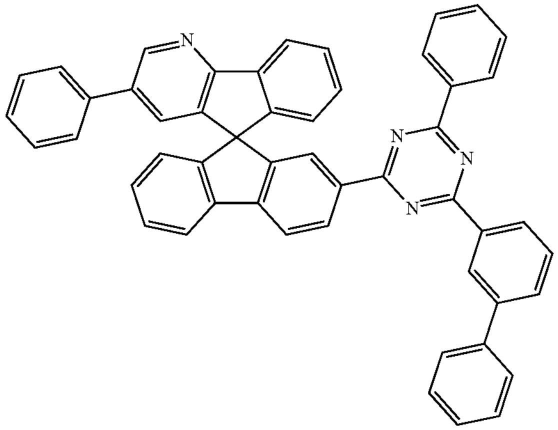
E188
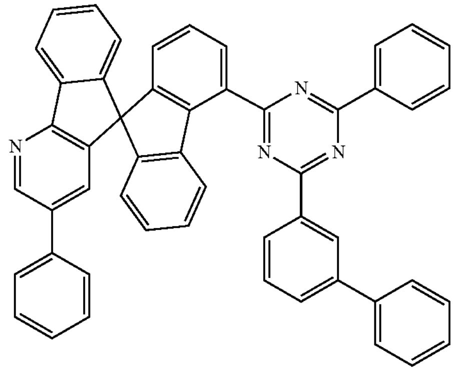

-continued
E189
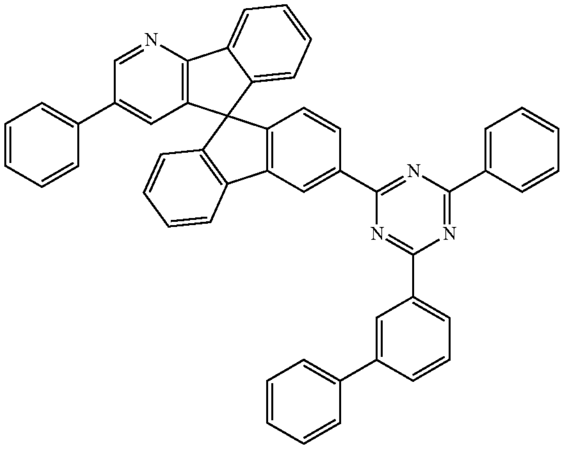
E190
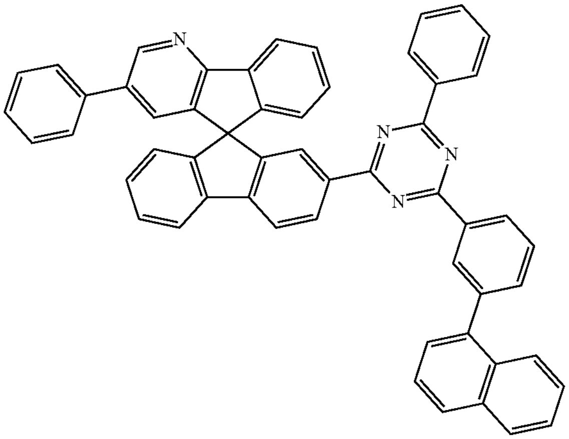
E191
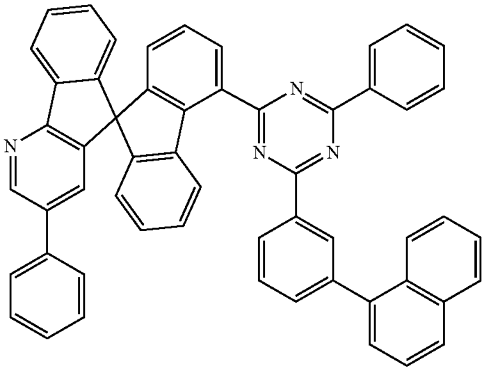
-continued
E192
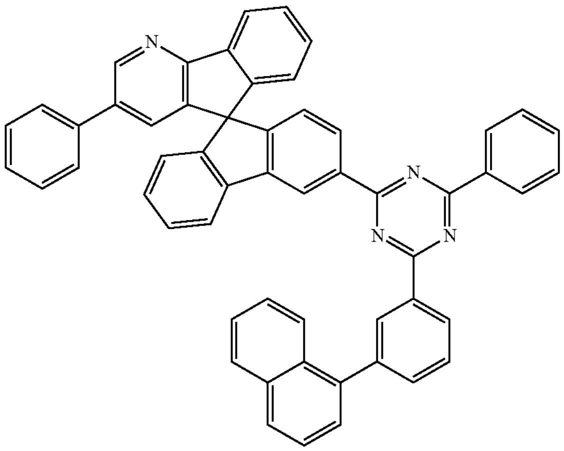
E193
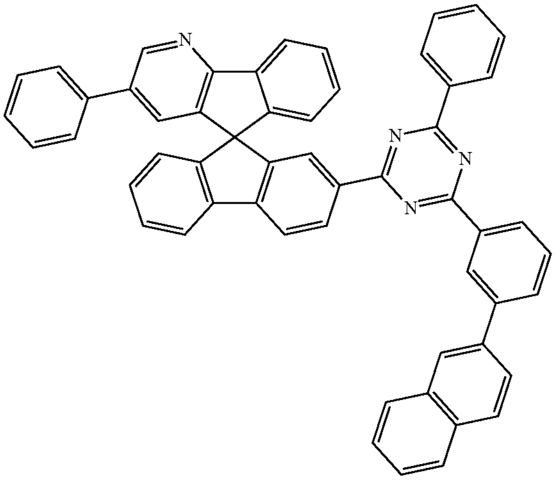
E194
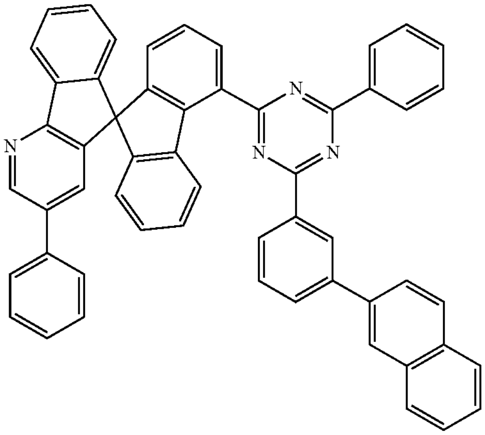

-continued
E195
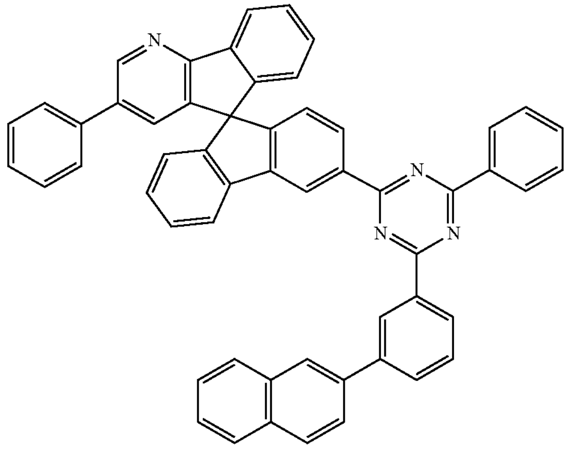
E196
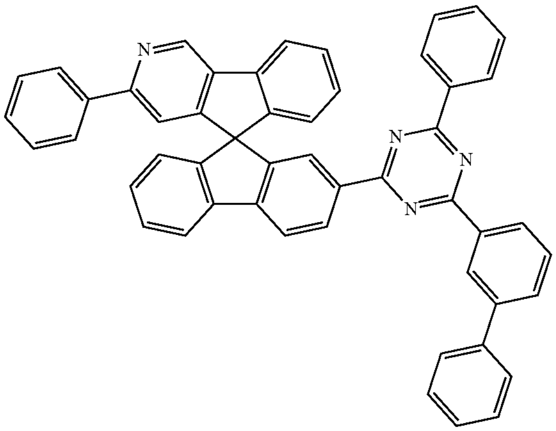
E197
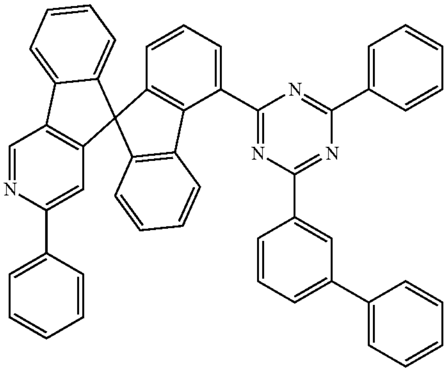
-continued
E198
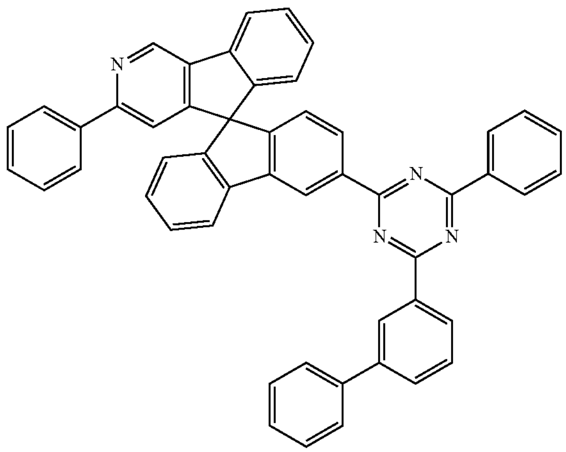
E199
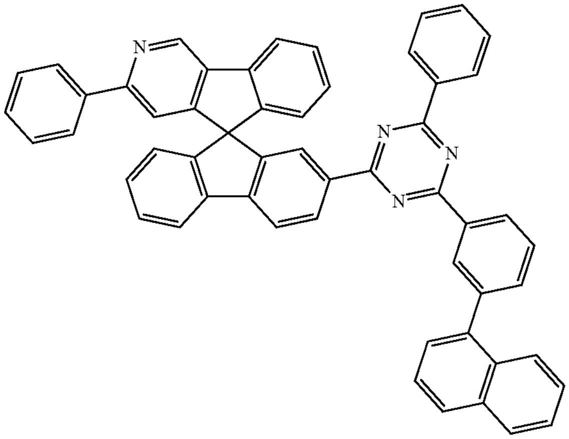
E200
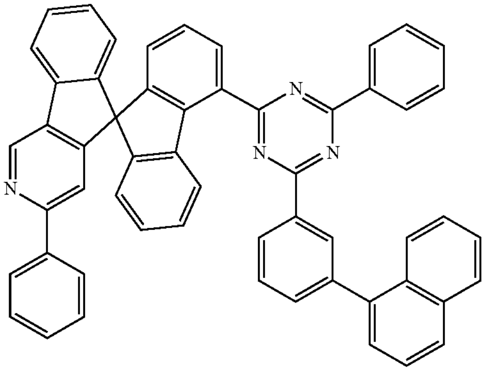

-continued
E201
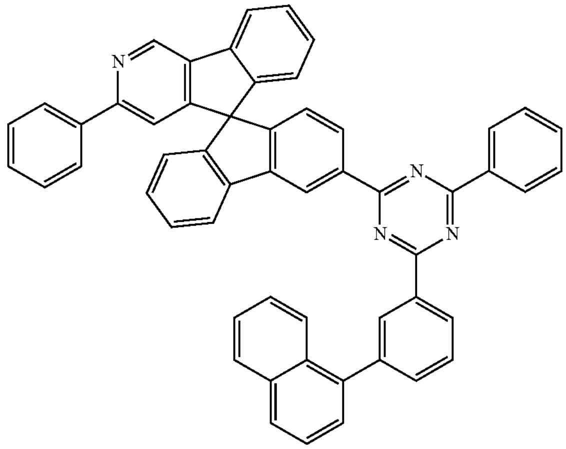
E202
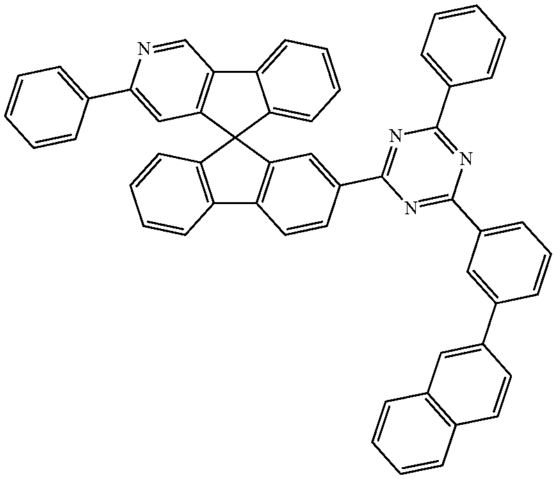
E203
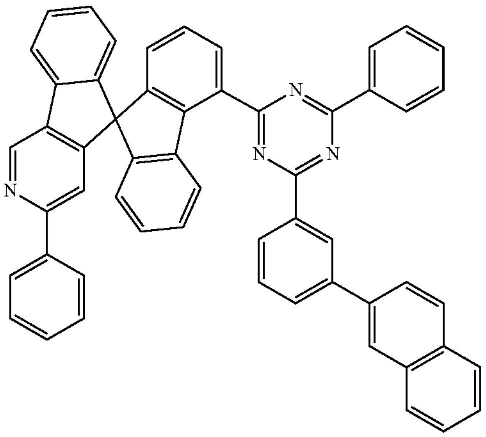
-continued
E204
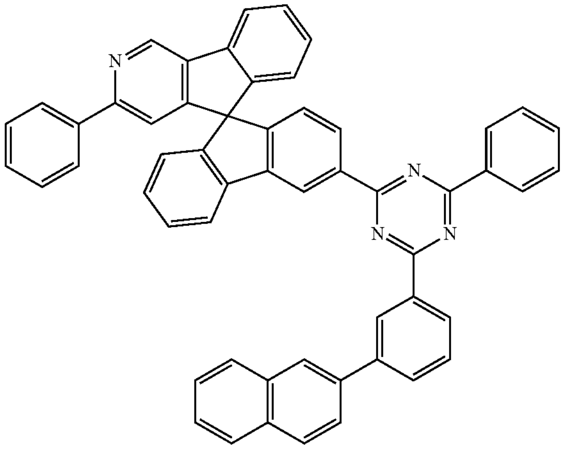
E205
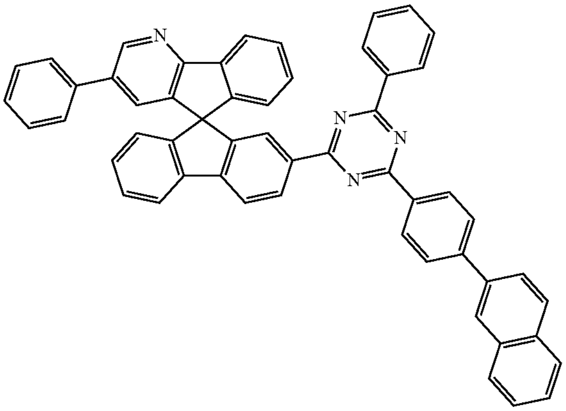
E206
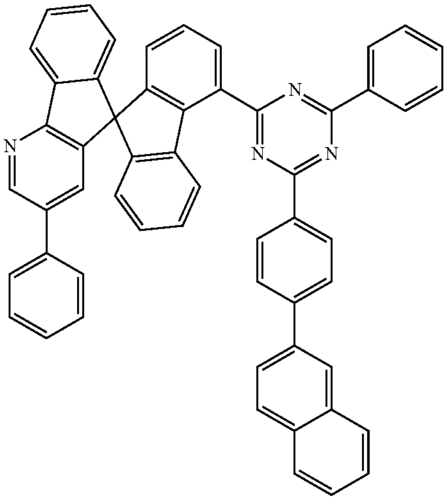

-continued

E207

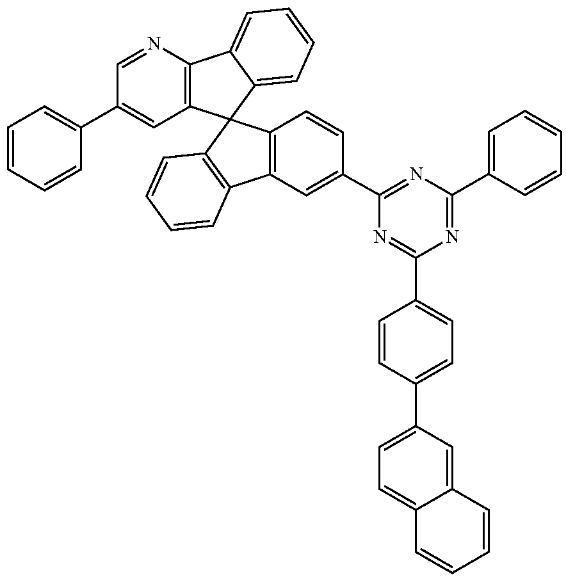

E208

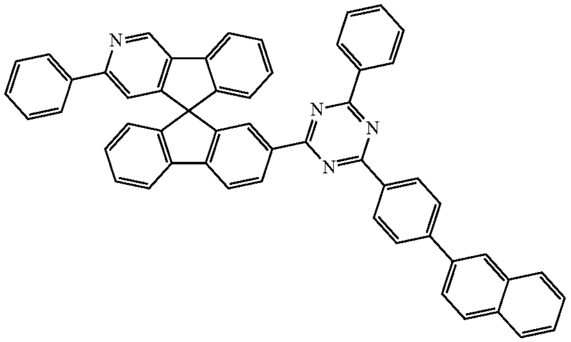

E209

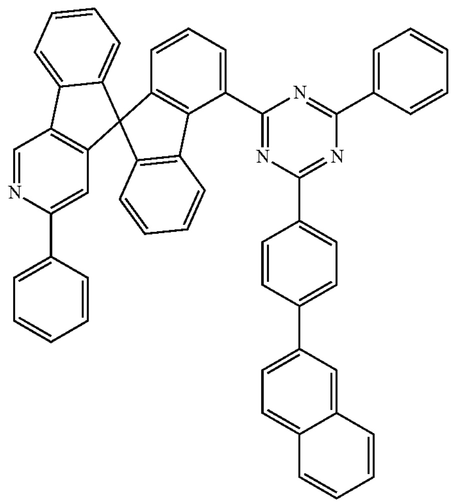

-continued

E210

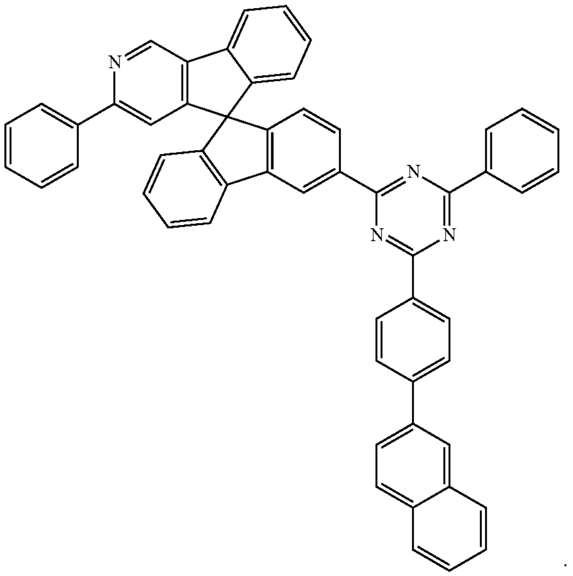

The present disclosure further provides use of the aforementioned organic compound in an organic electroluminescent device.

The present disclosure further provides an organic electroluminescent device, including:

a substrate;

a first electrode on the substrate;

an organic light-emitting functional layer on the first electrode; and a second electrode on the organic light-emitting functional layer;

where the organic light-emitting functional layer includes a light-emitting auxiliary layer; the light-emitting auxiliary layer includes the aforementioned organic compound.

Preferably, the organic light-emitting functional layer further includes a light-emitting auxiliary layer, and the light-emitting auxiliary layer includes a compound having a structure shown in formula (II) below:

formula (II)

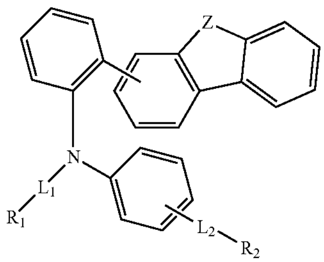

Where, in the formula (II), Z is selected from O or S atom; $L_1$ and $L_2$ are each independently selected from a single bond or C6-C30 aryls, $R_1$ and $R_2$ are each independently selected from substituted or unsubstituted C6-C30 aryls or substituted or unsubstituted C6-C30 heteroaryls, and the substituents are each independently selected from deuterium or C1-C24 alkyls; hydrogen atoms in the compound shown in formula (II) may be partially or completely deuterated.

Preferably, the degree of deuteration in the structure shown in formula (II) is 10% to 100%.

Preferably, in formula (II), $L_1$ and $L_2$ are each independently selected from a single bond, phenyl, or naphthyl; $R_1$ and $R_2$ are each independently selected from one or more of phenyl, naphthyl, phenanthryl, dibenzofuryl, dibenzothienyl, biphenyl, naphthylphenyl, benzophenanthryl, dimethylfluorenyl, and 9, 9'-spirobifluorenyl.

Preferably, the compound is selected from any one of the following chemical structures, where "D" represents deuterium:

001

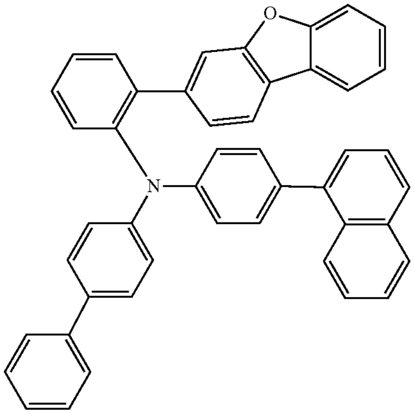

002

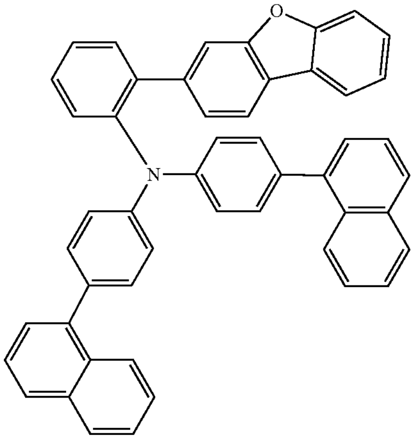

003

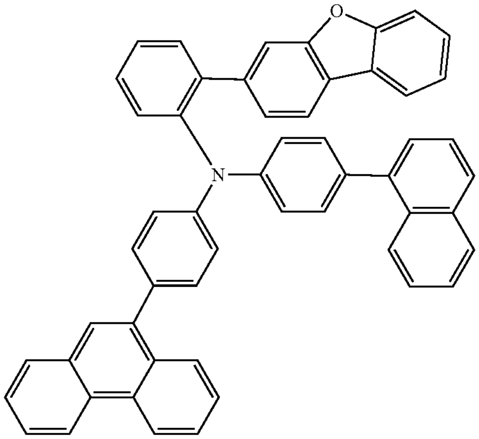

-continued

004

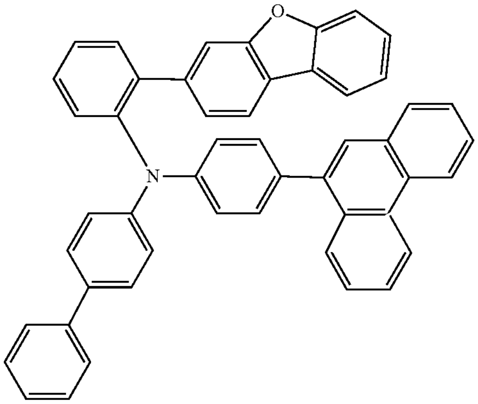

005

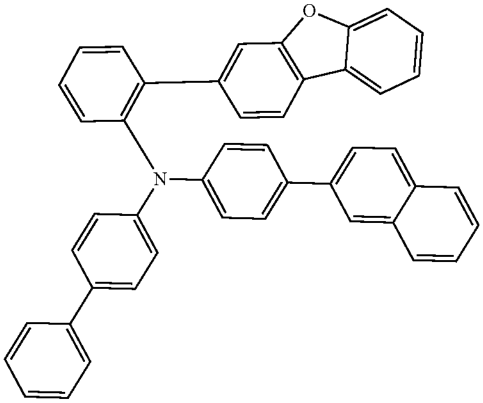

006

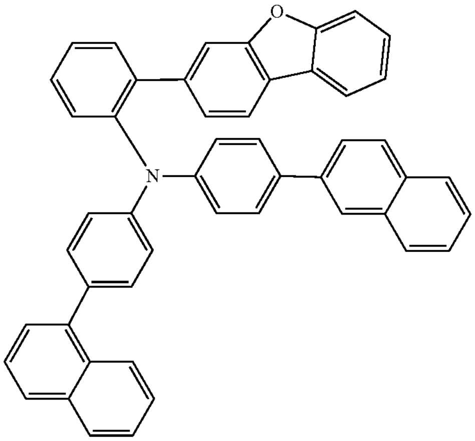

-continued
007
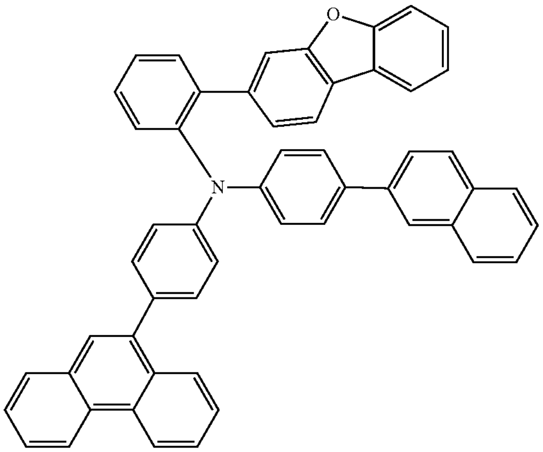
008
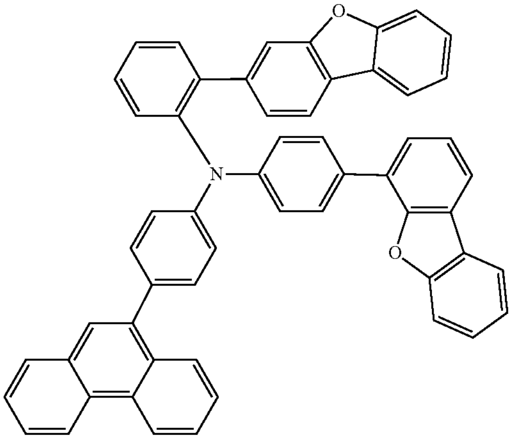
009
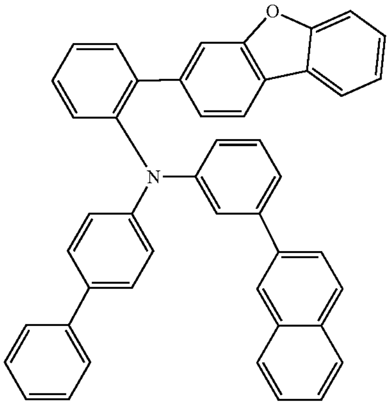
-continued
010
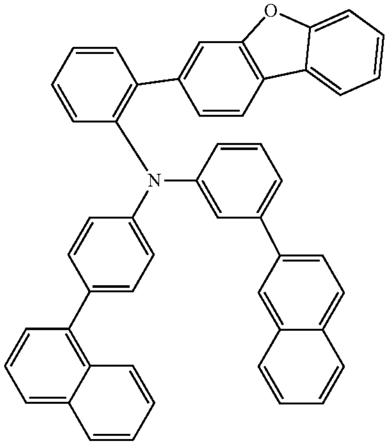
011
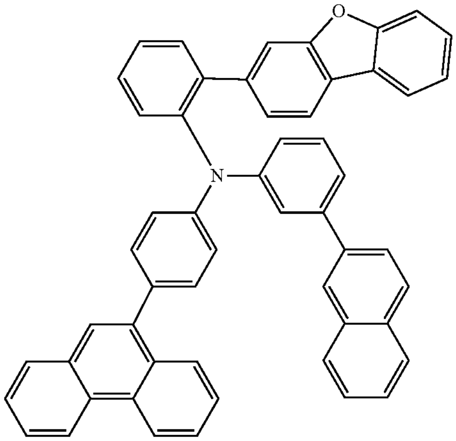
012
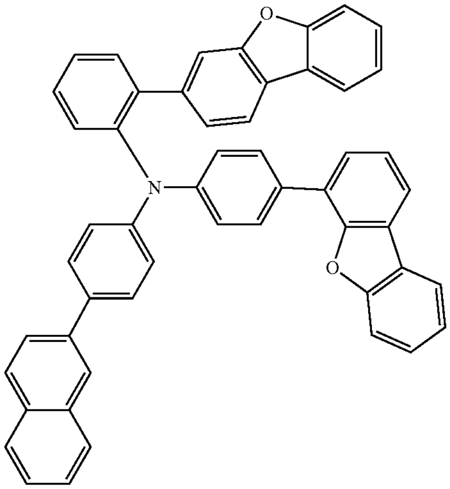

-continued
013
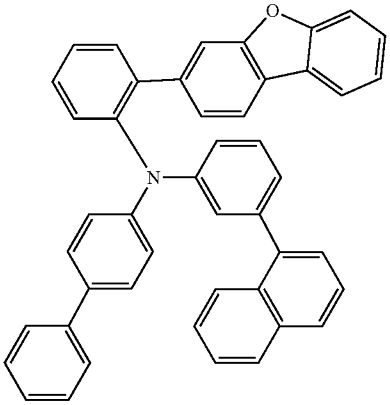
014
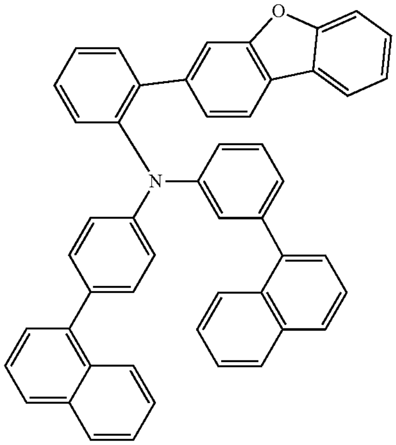
015
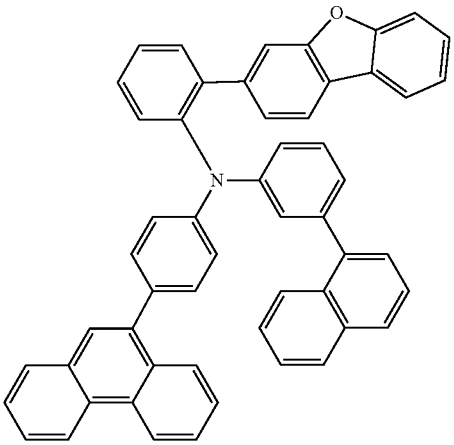
-continued
016
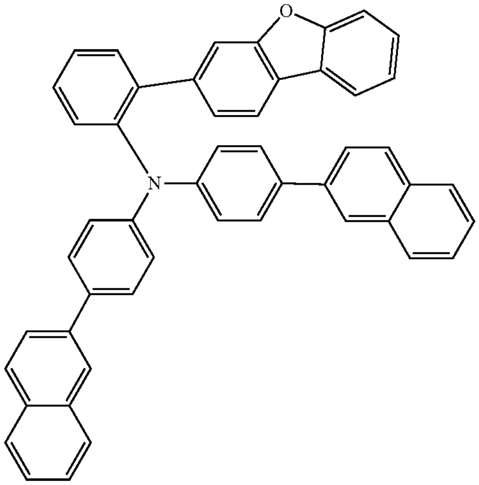
017
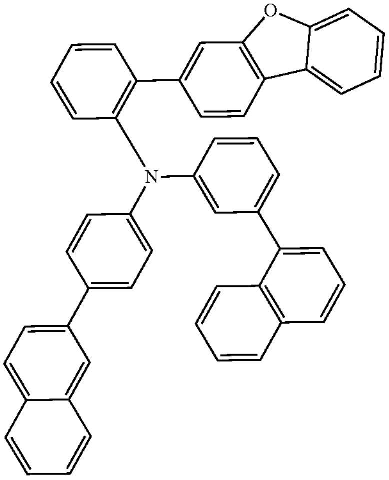
018
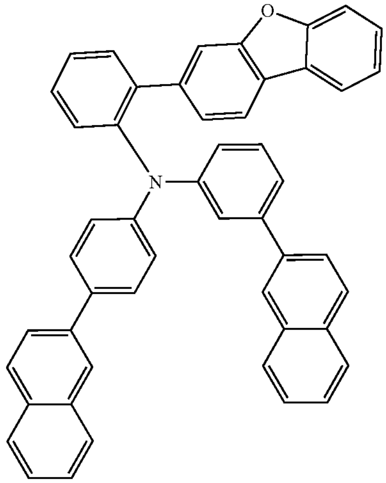

-continued
019
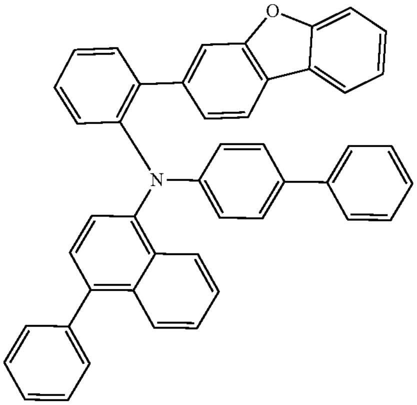
020
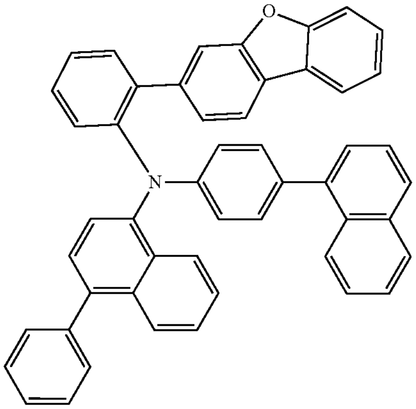
021
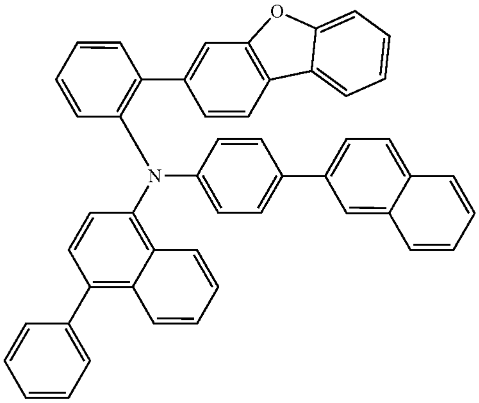
022
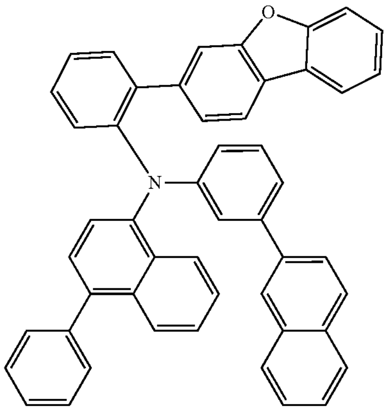
-continued
023
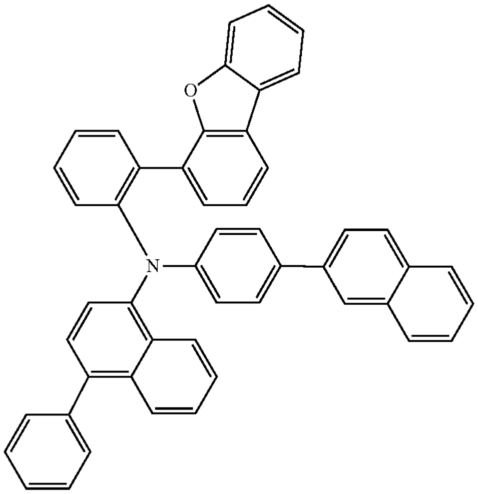
024
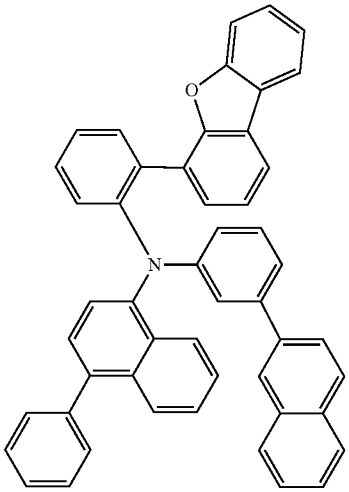
025
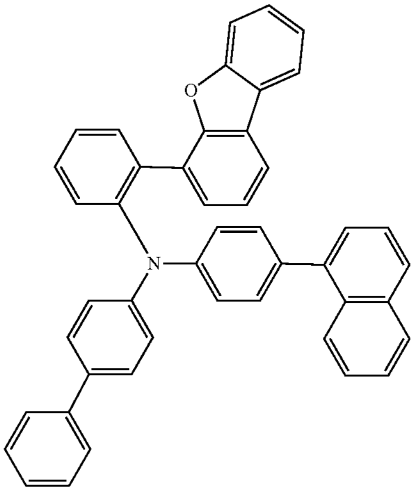

-continued
026
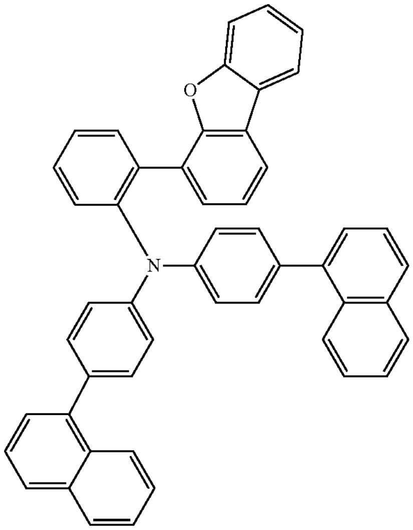
027
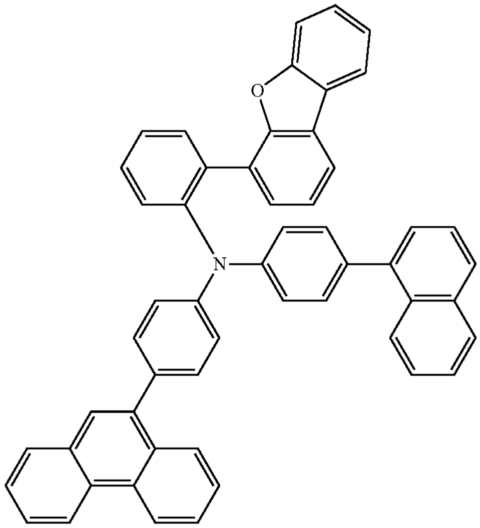
028
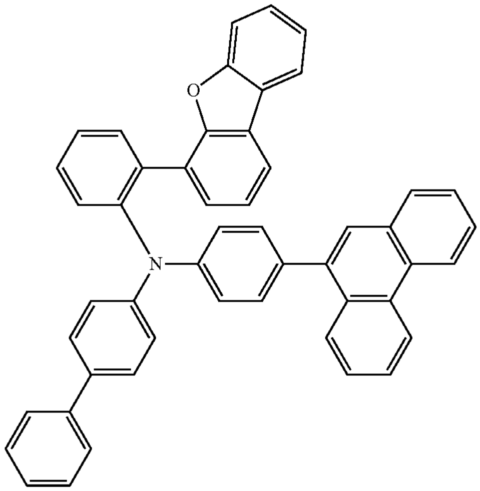
-continued
029
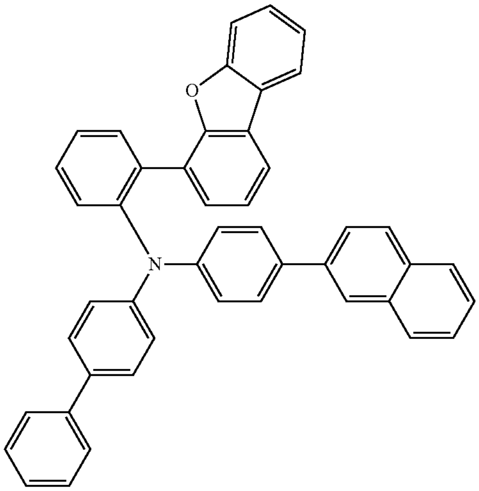
030
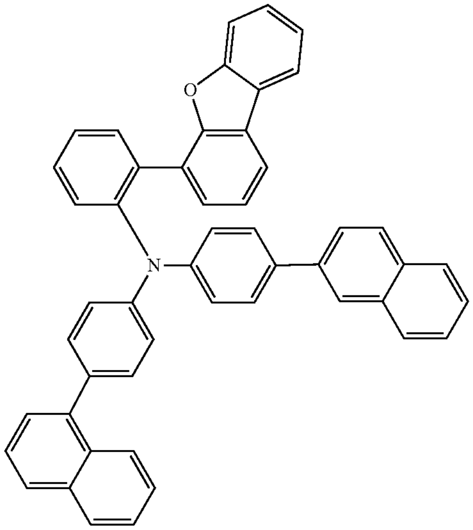
031
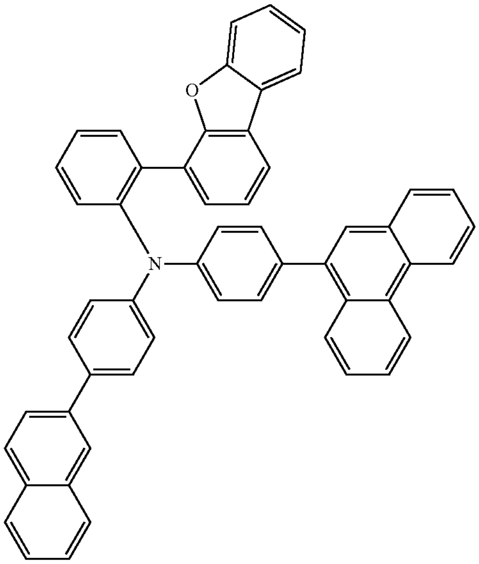

-continued
032
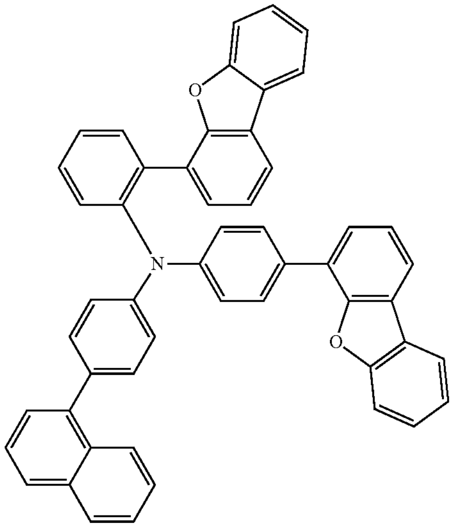
033
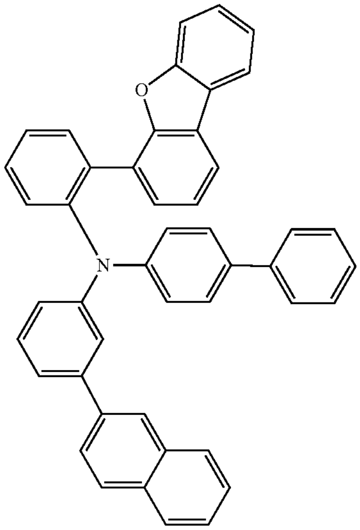
034
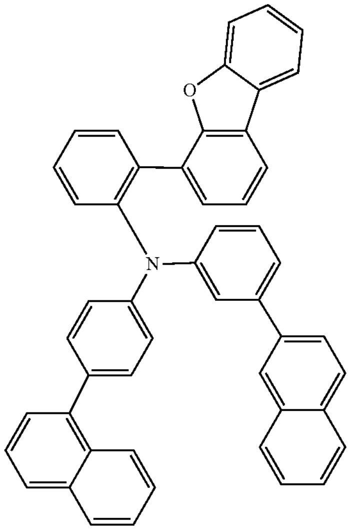
-continued
035
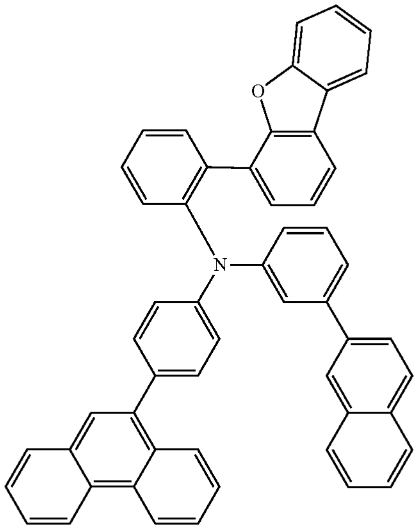
036
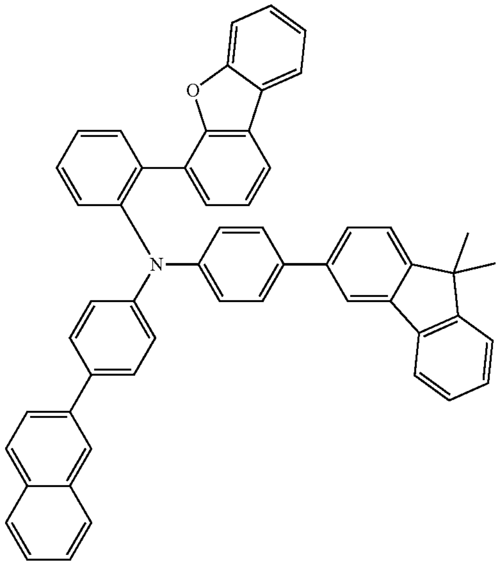
037
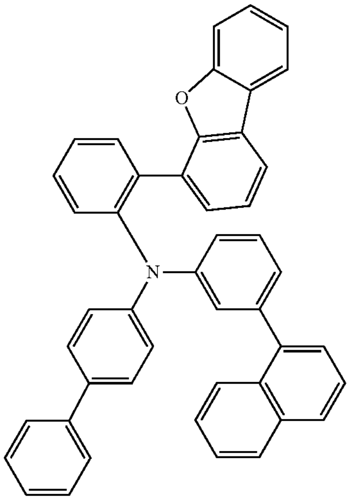

-continued
038
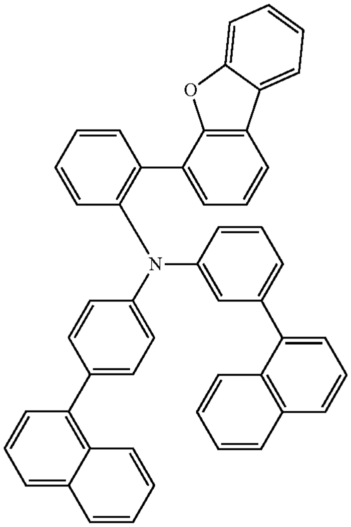
039
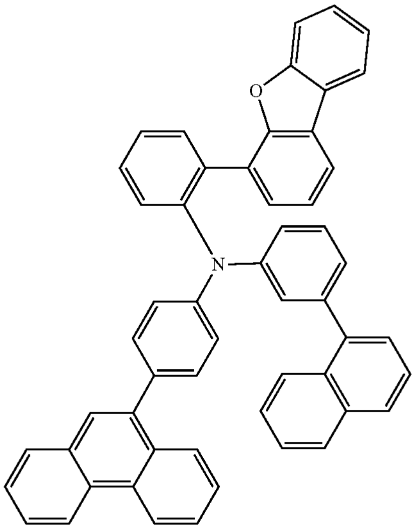
040
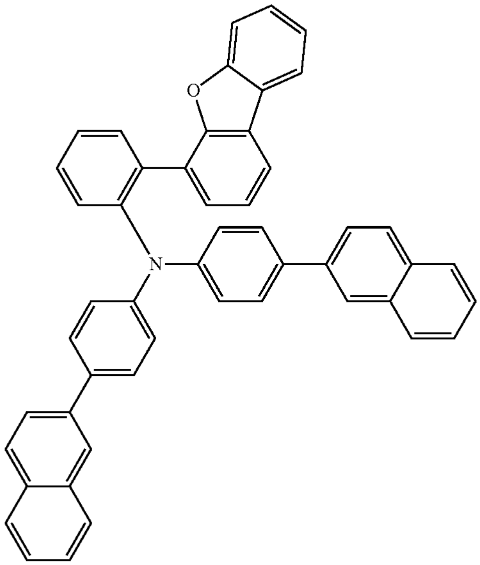
-continued
041
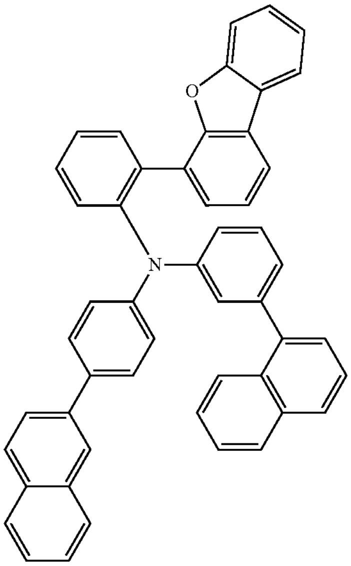
042
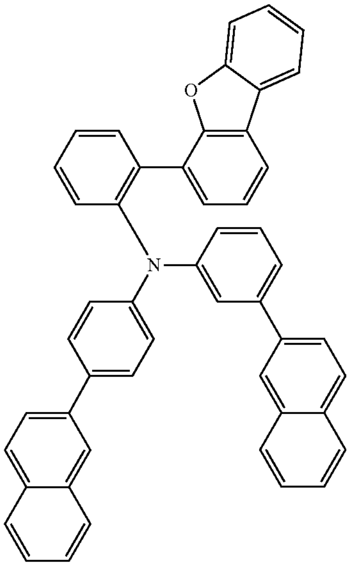
043
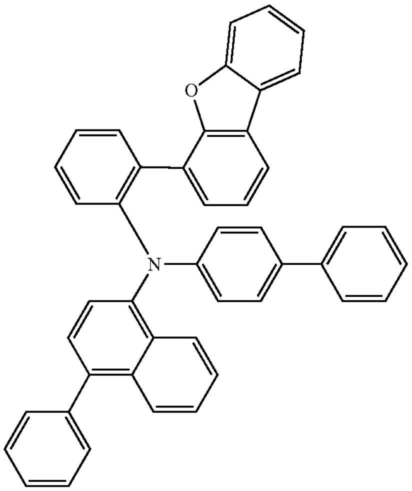

-continued
044
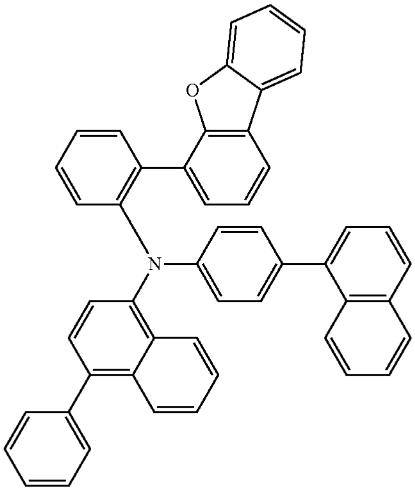
045
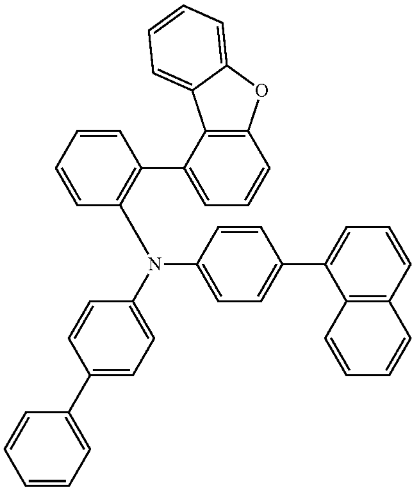
046
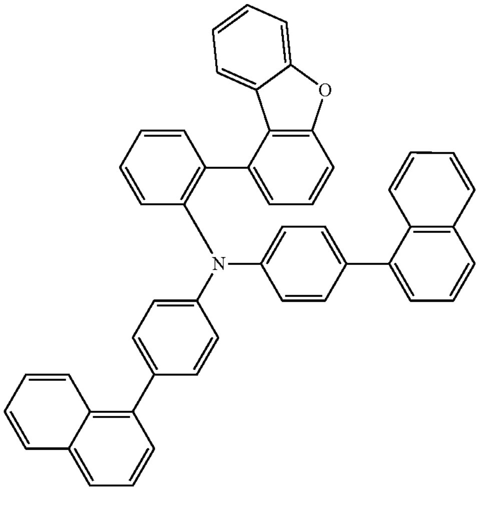
-continued
047
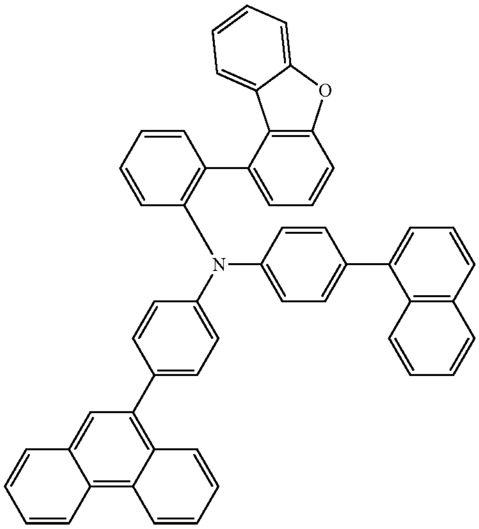
048
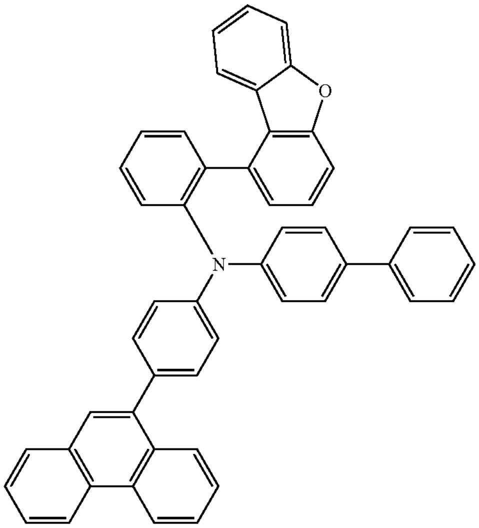
049
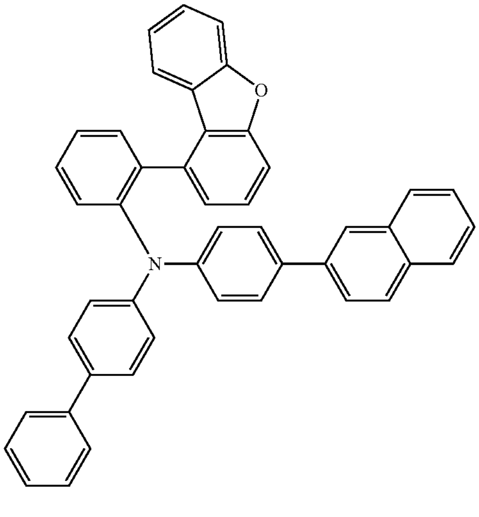

-continued
050
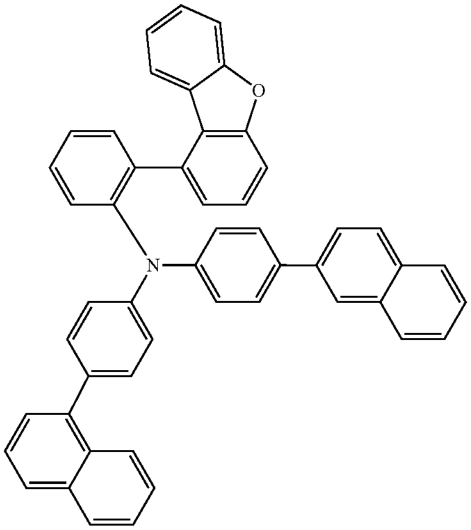
051
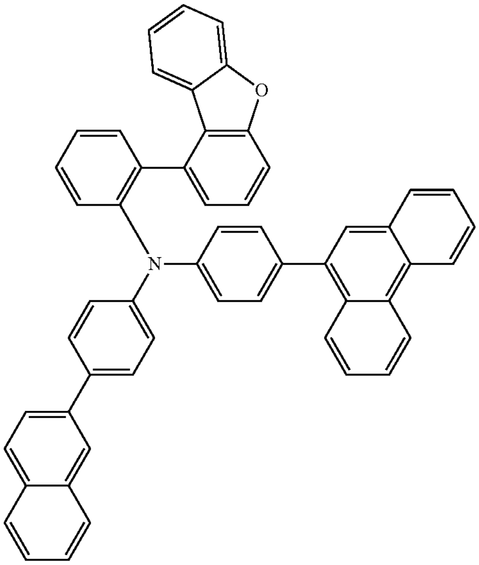
052
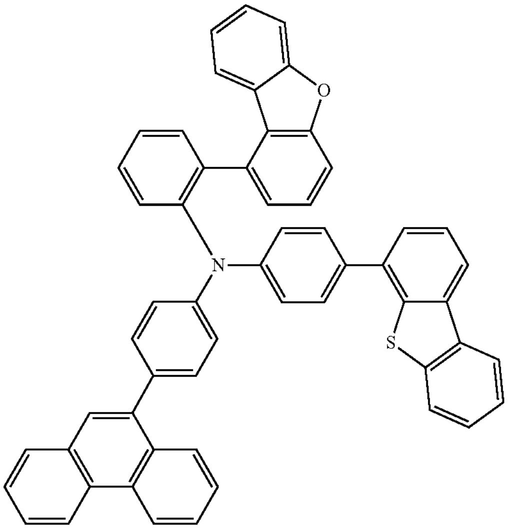
-continued
053
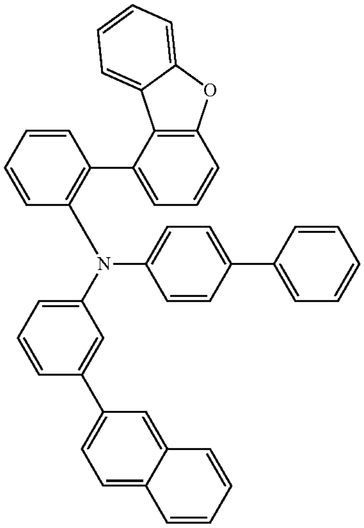
054
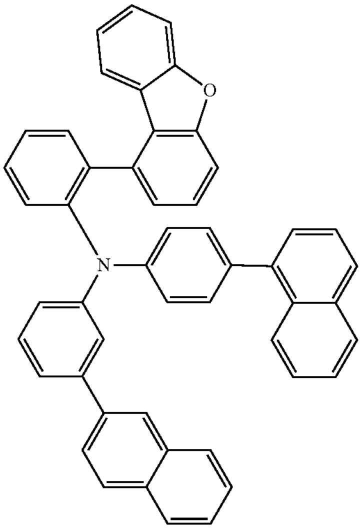
055
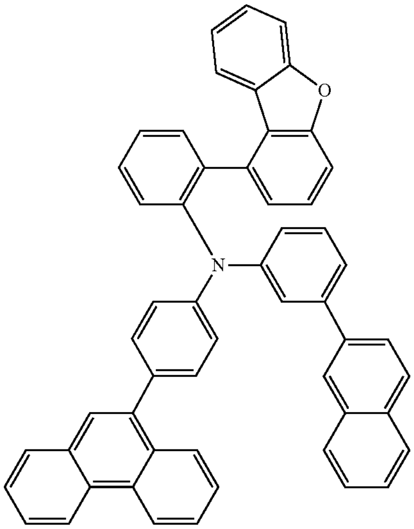

-continued
056
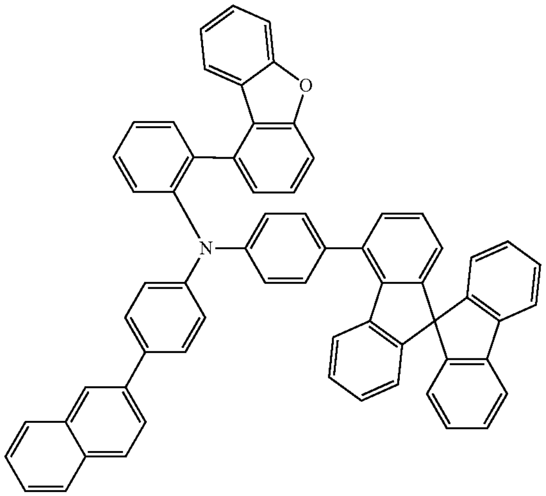
057
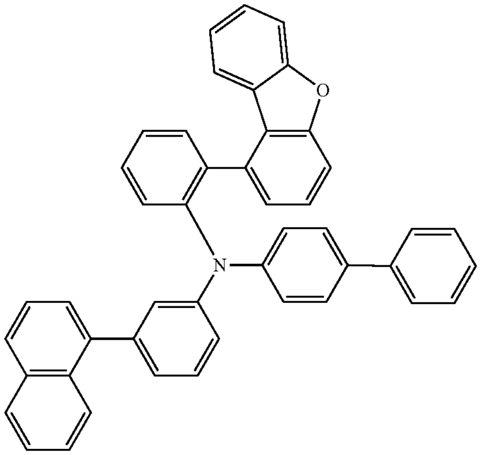
058
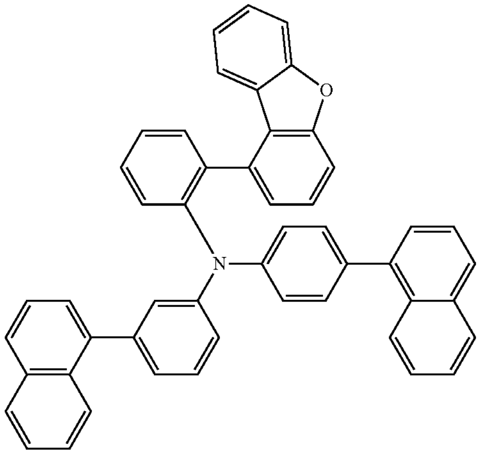
-continued
059
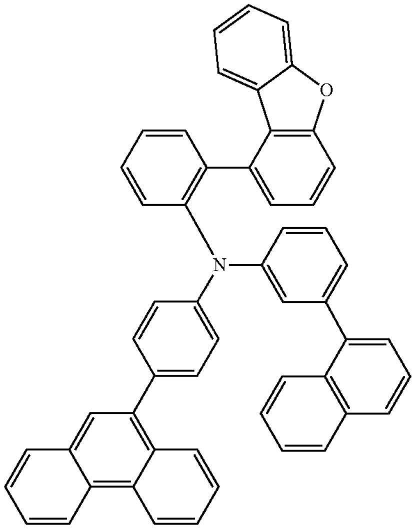
060
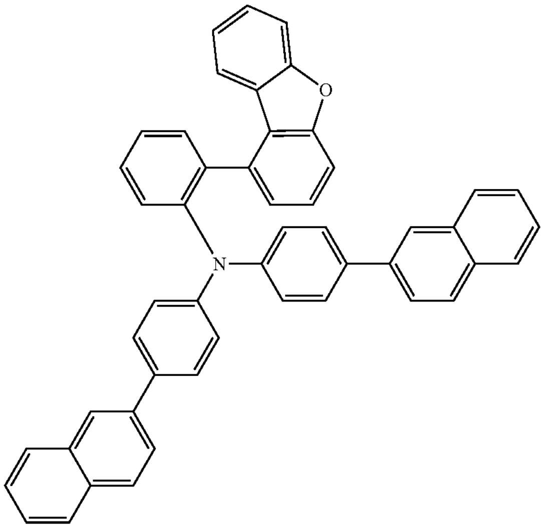
061
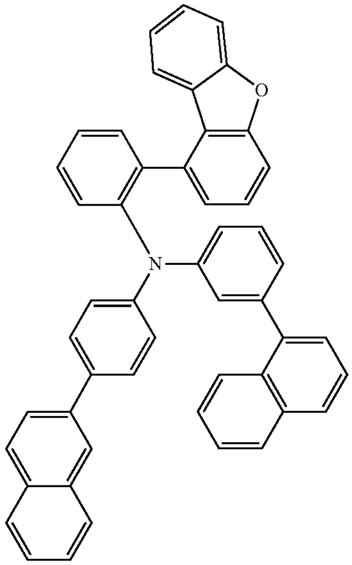

-continued
062
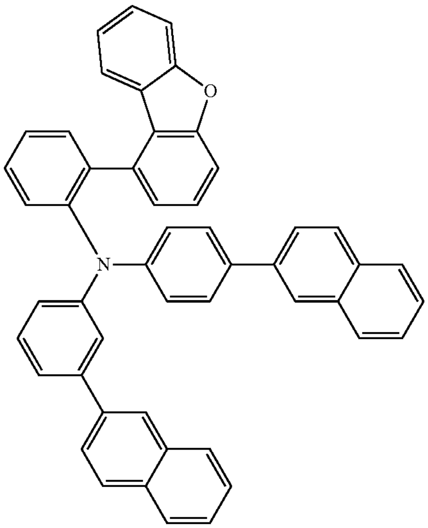
063
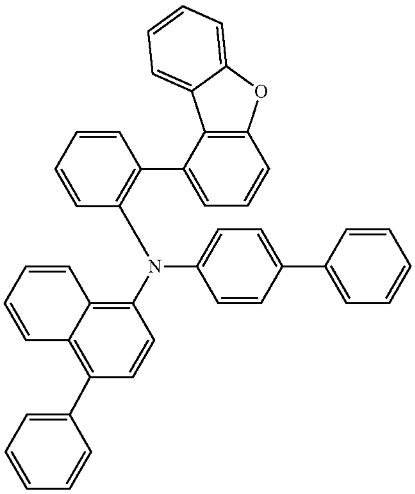
064
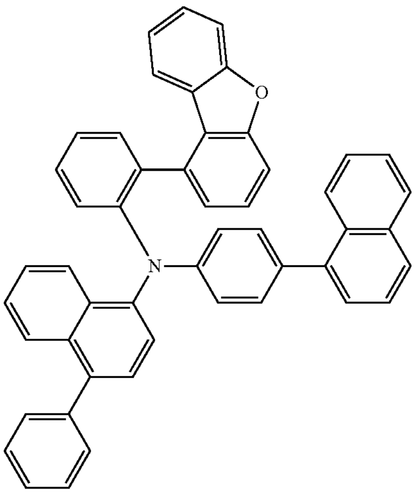
-continued
065
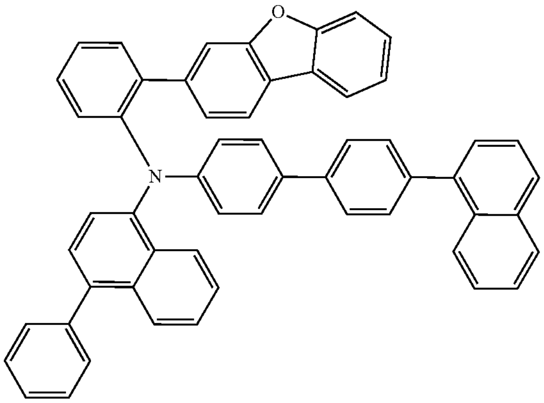
066
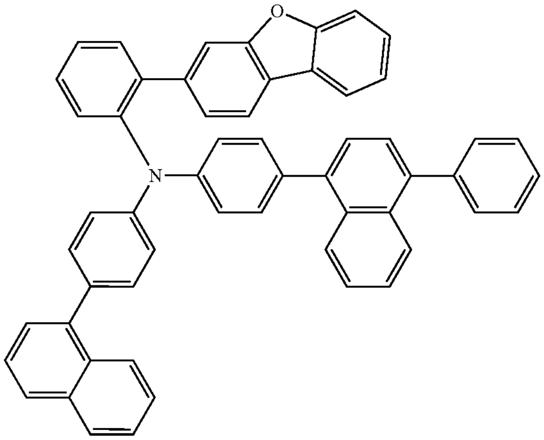
067
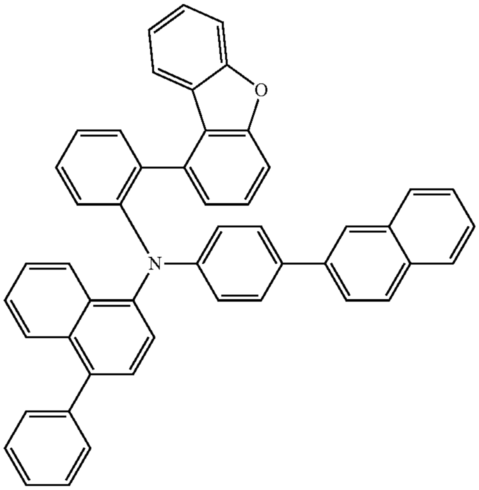

-continued
068
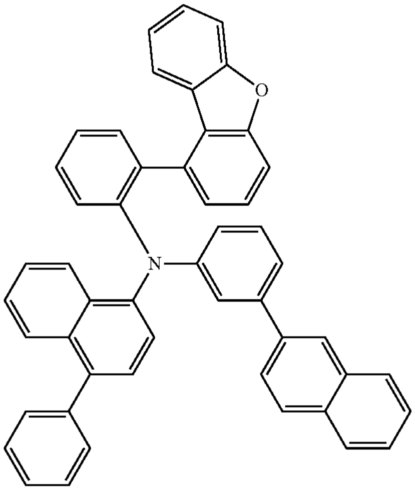
069
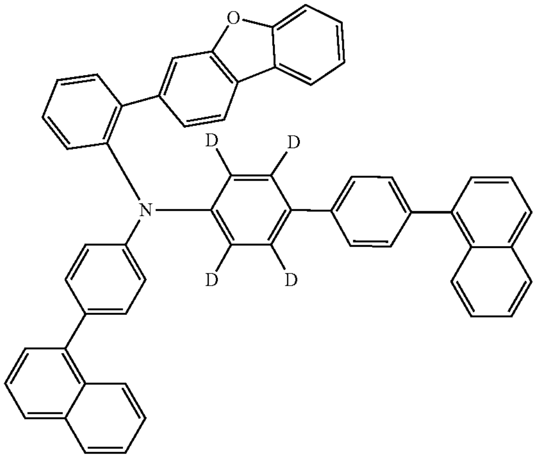
070
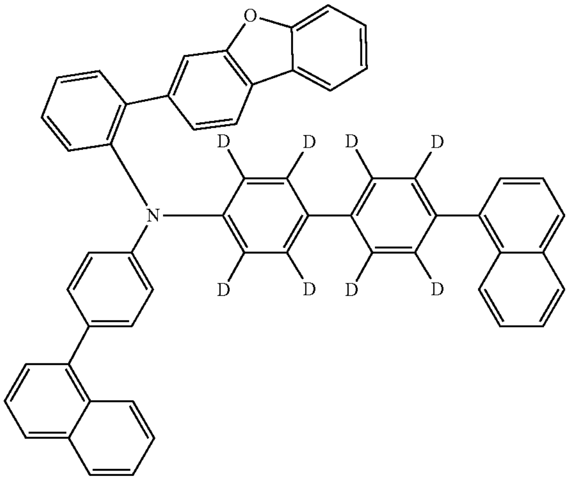
-continued
071
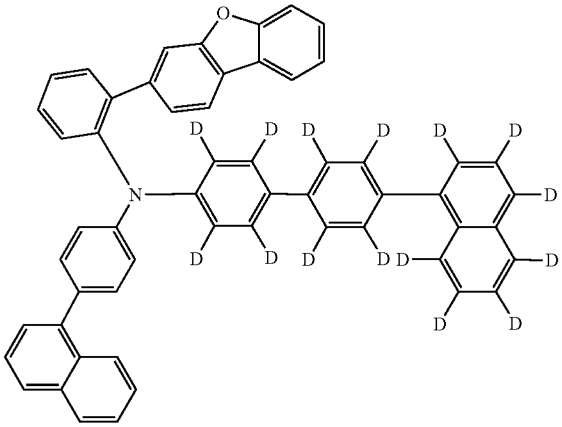
072
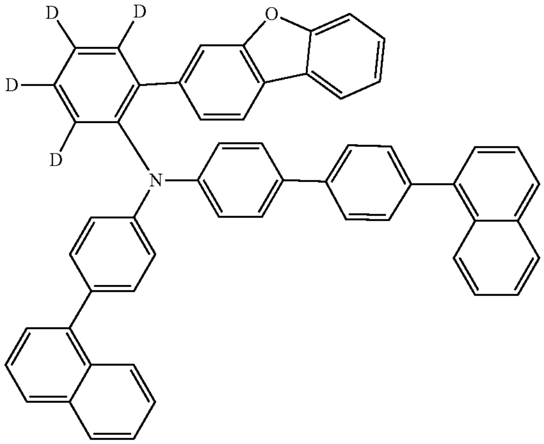
073
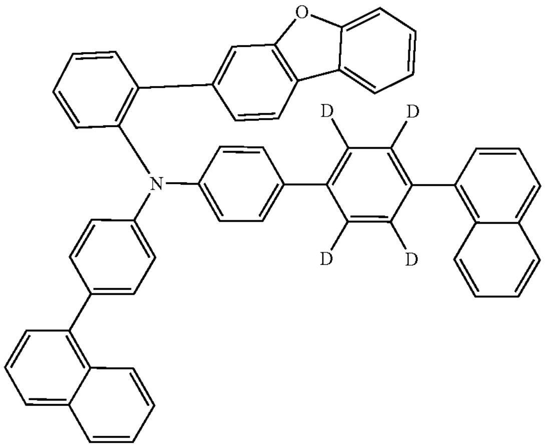

-continued
074
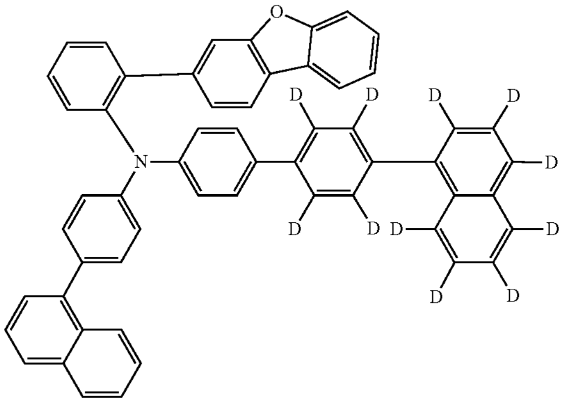
075
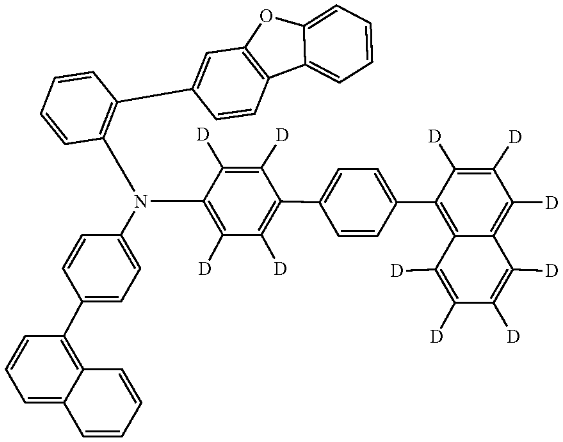
076
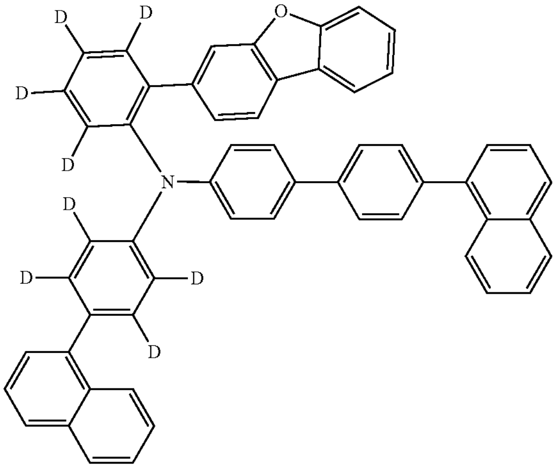
-continued
077
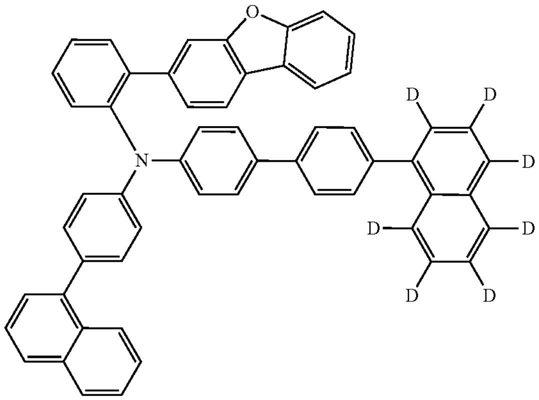
078
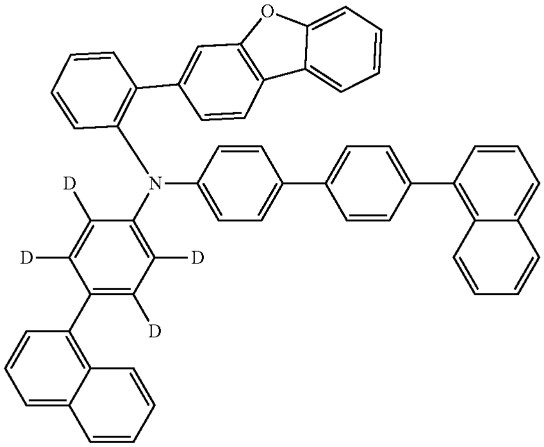
079
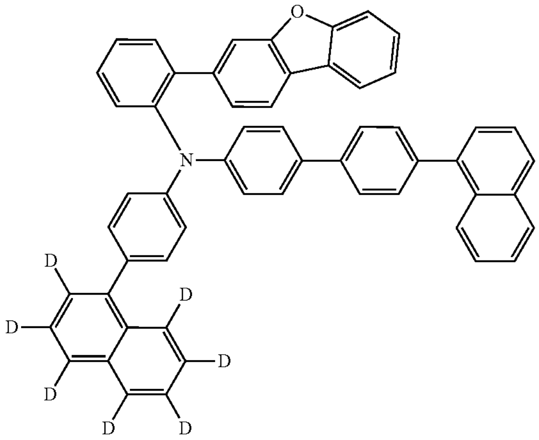

-continued
080
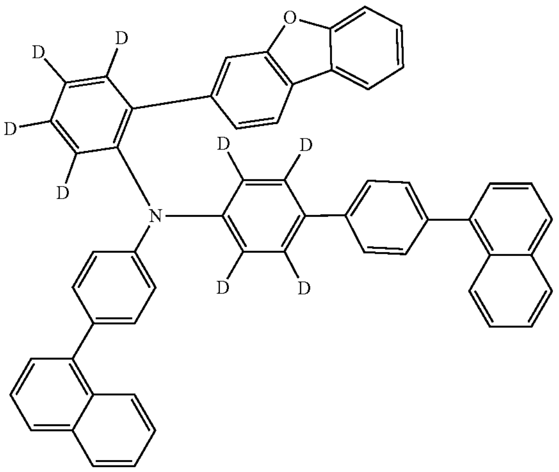
081
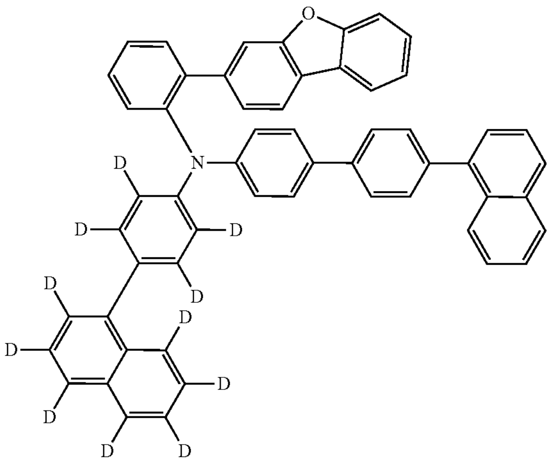
082
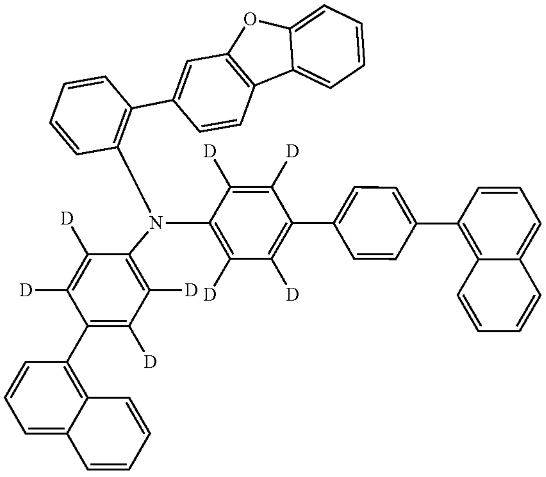
-continued
083
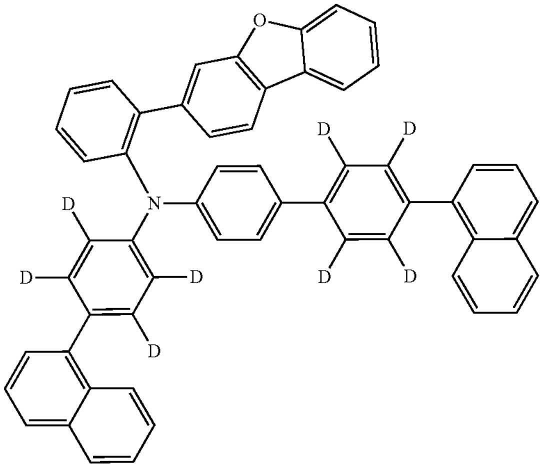
084
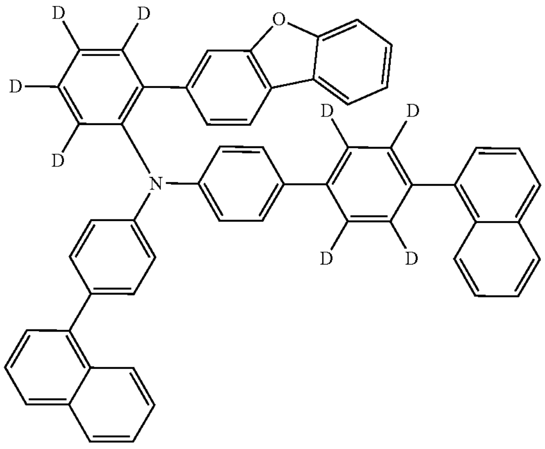
085
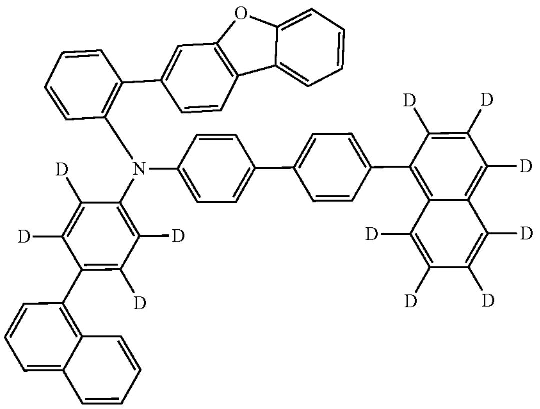

-continued
086
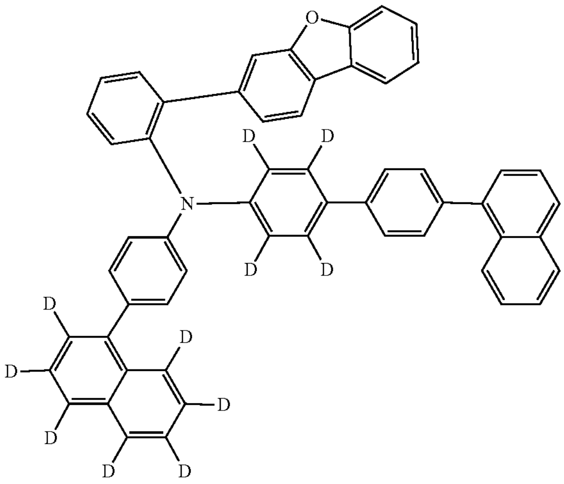
087
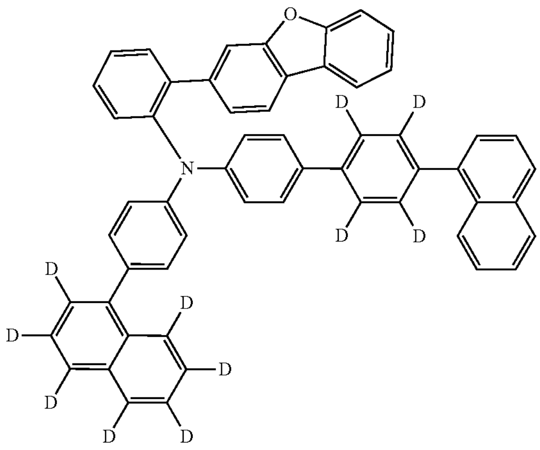
088
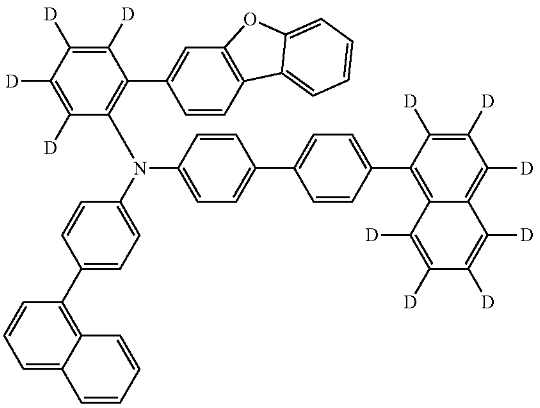
-continued
089
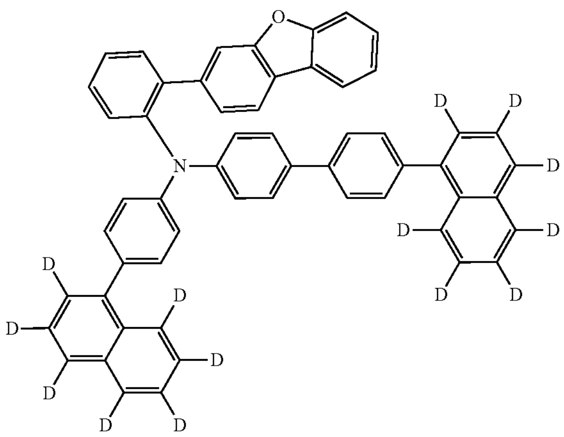
090
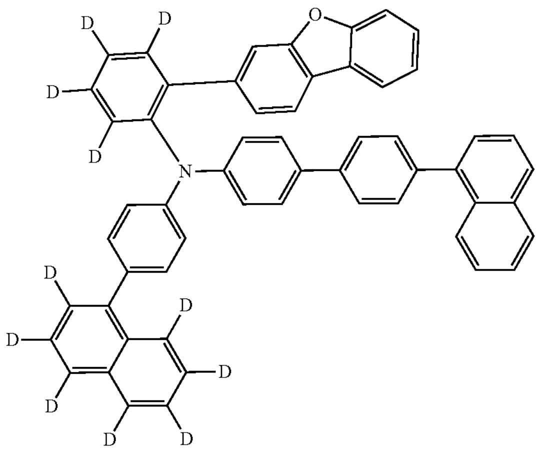
091
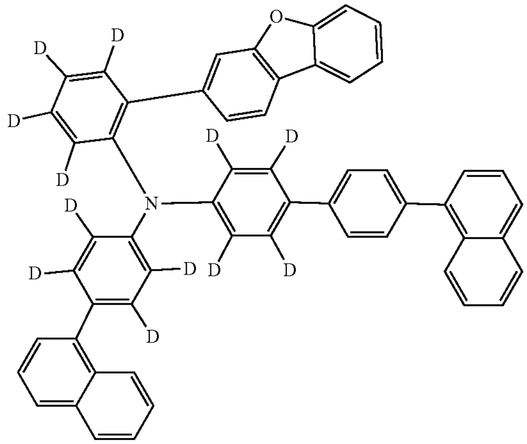

-continued
092
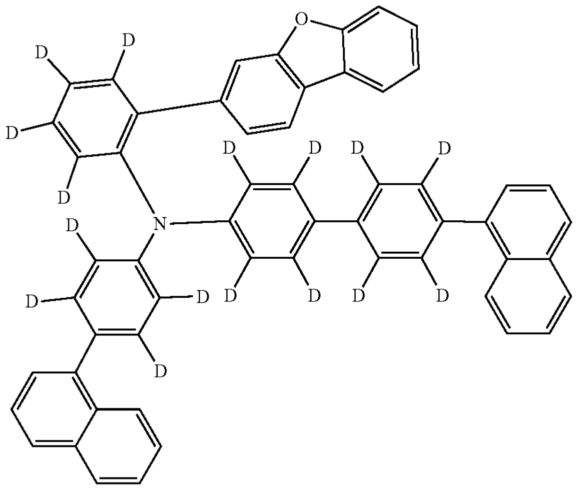
093
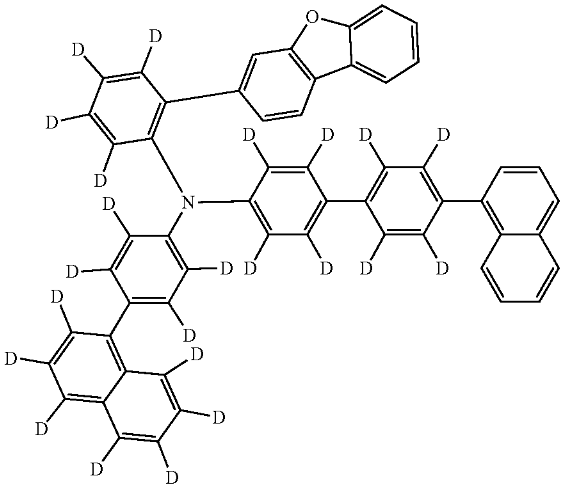
094
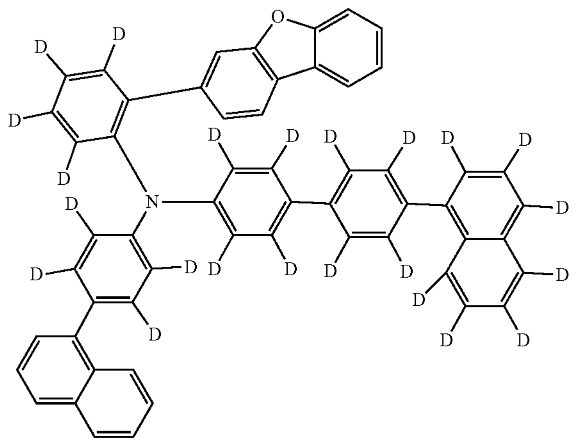
-continued
095
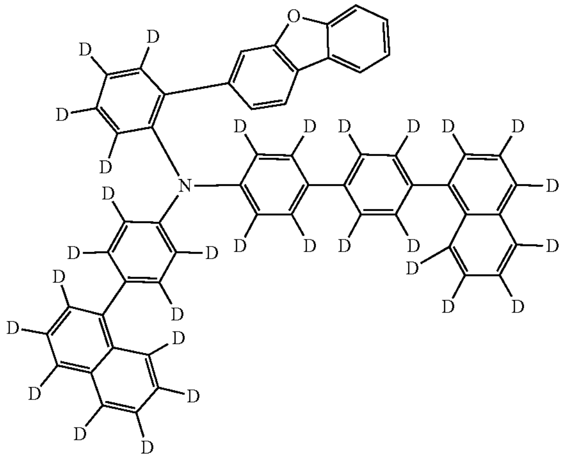
096
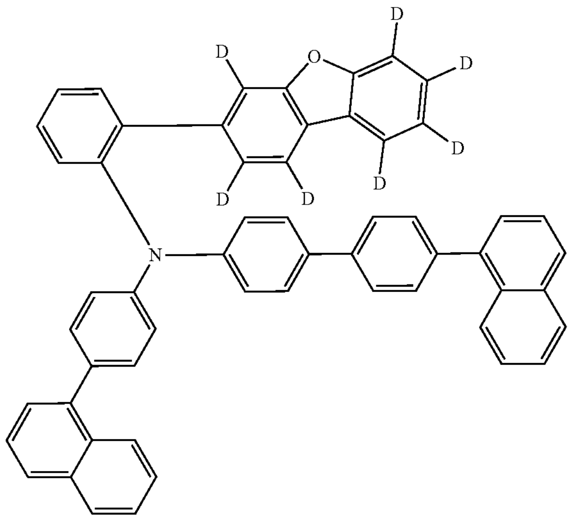
097
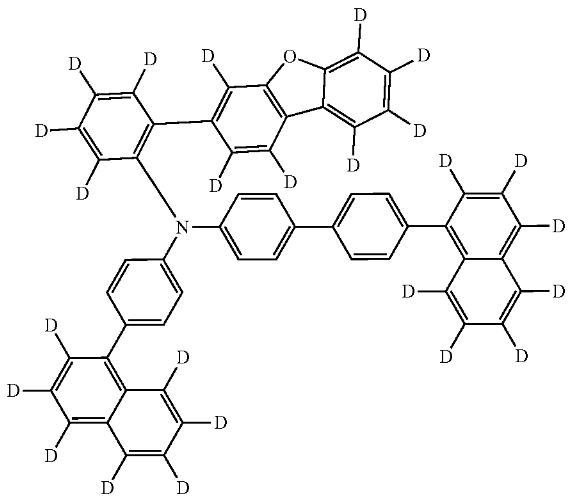

-continued
098
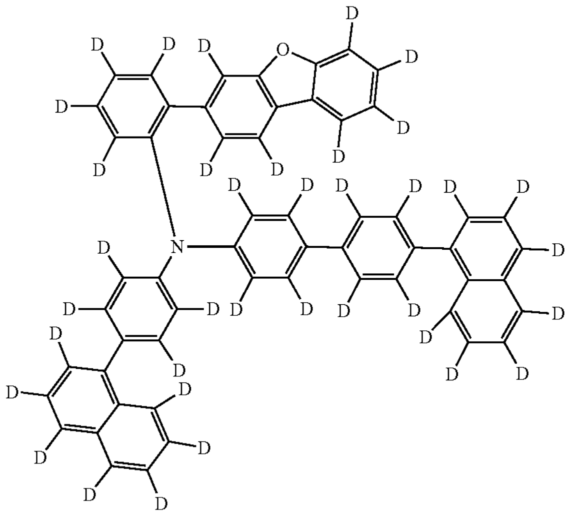
099
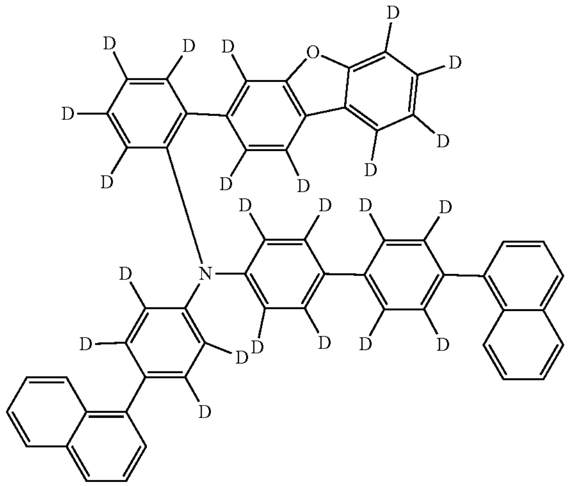
100
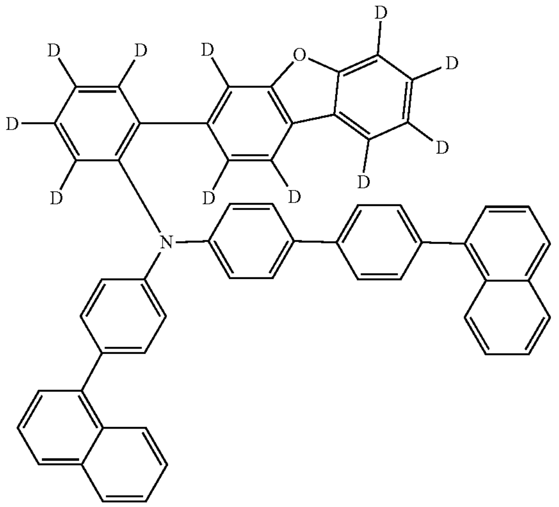
-continued
101
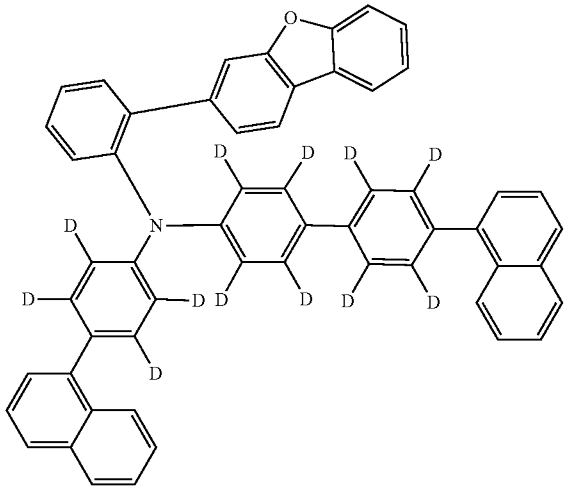
102
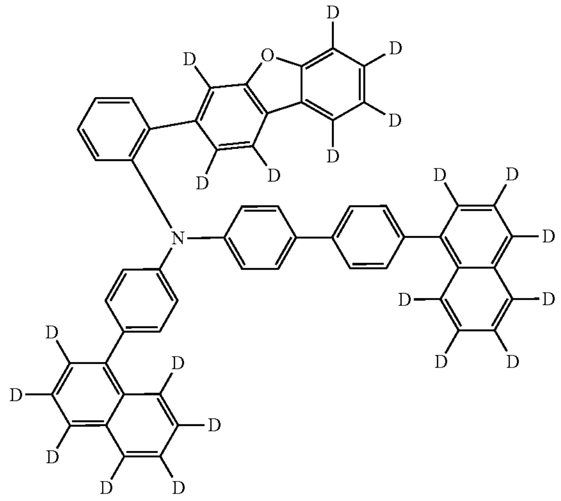
103
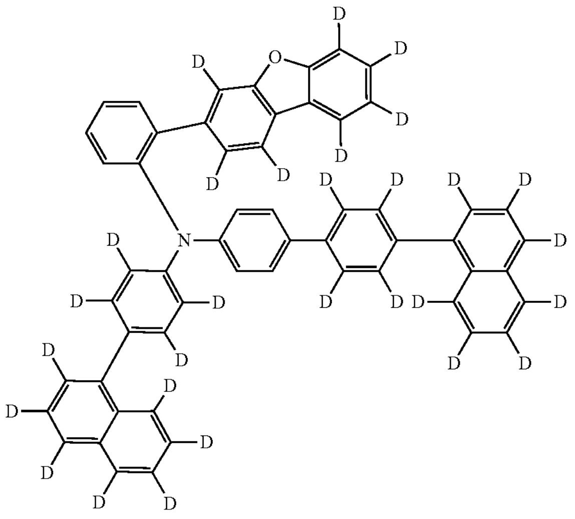

-continued
104
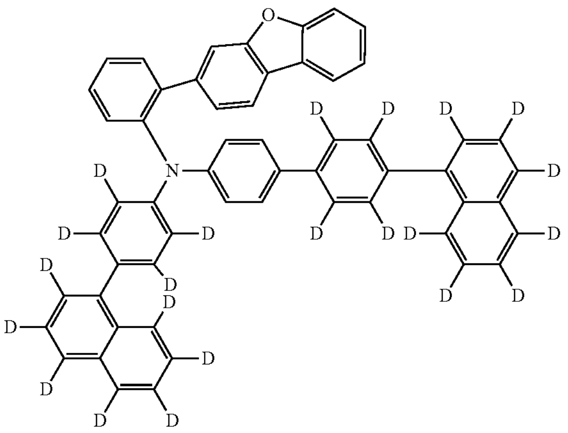
105
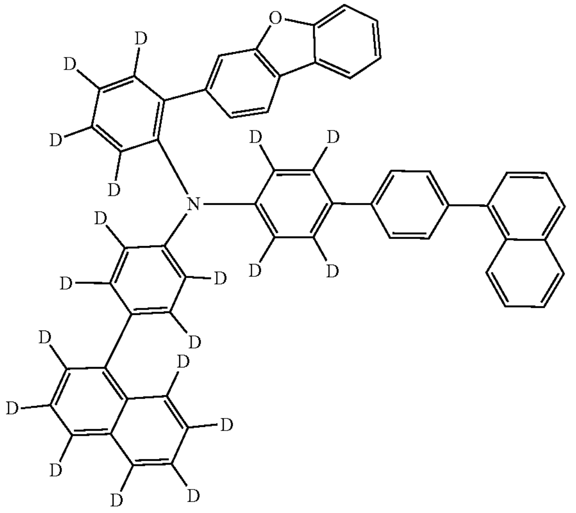
106
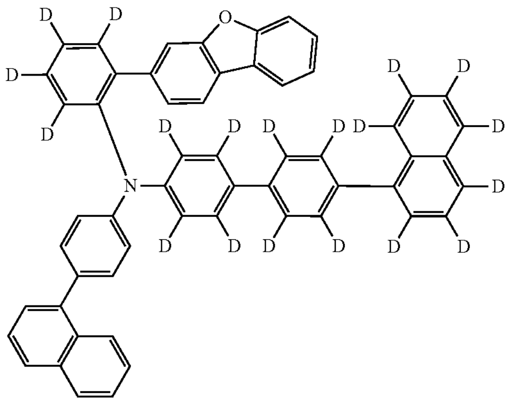
-continued
107
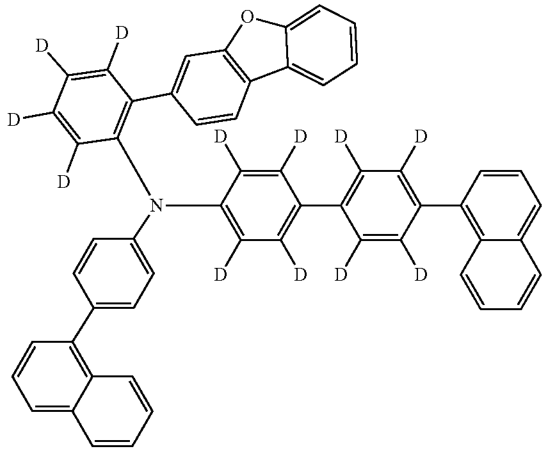
108
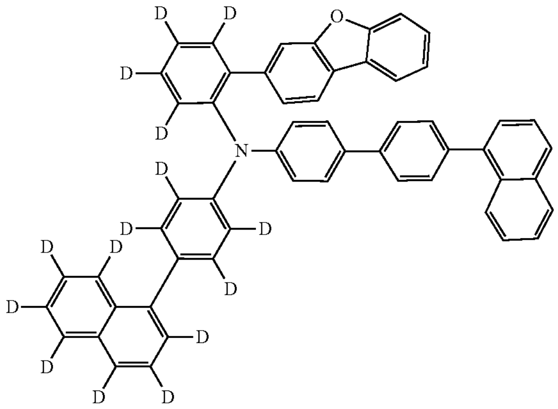
109
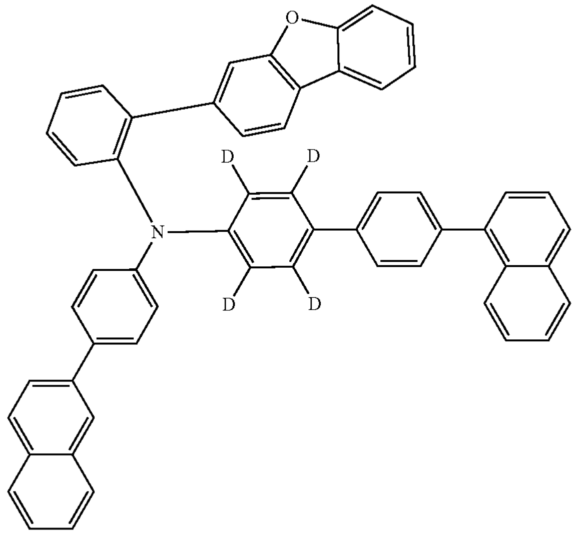

-continued
110
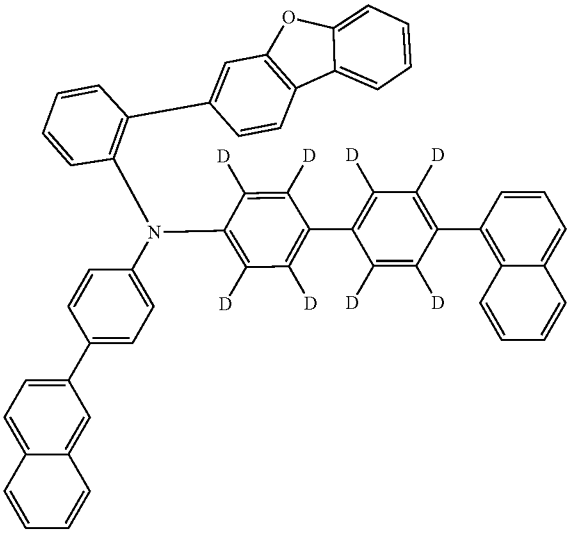
111
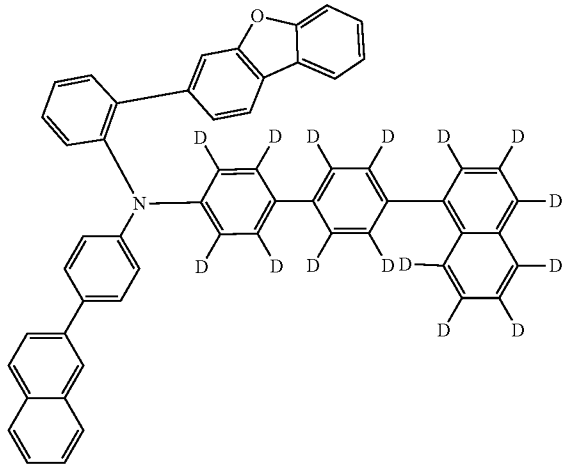
112
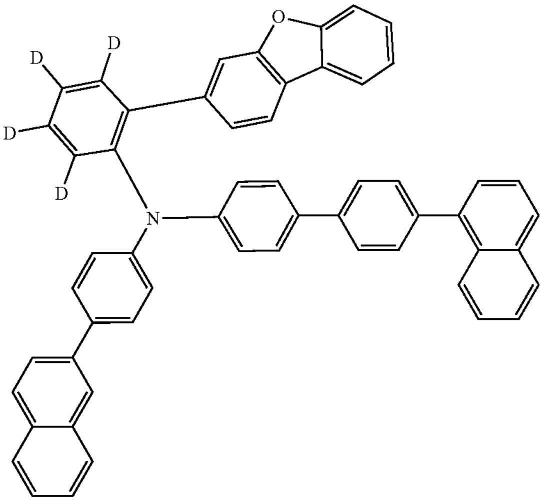
-continued
113
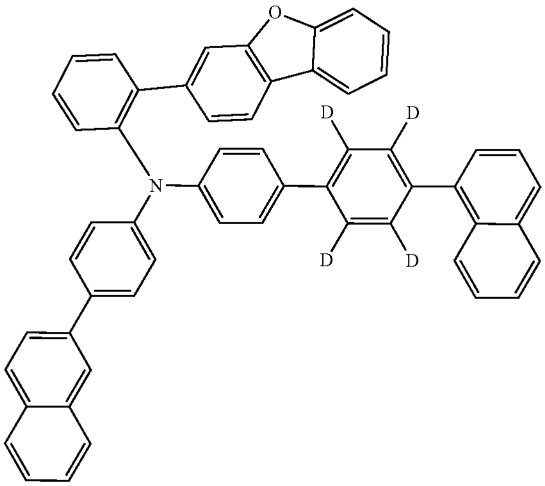
114
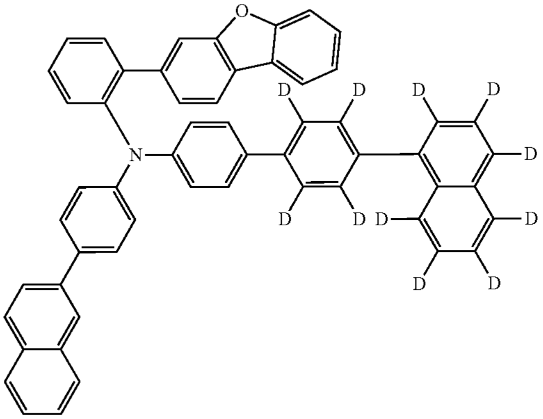
115
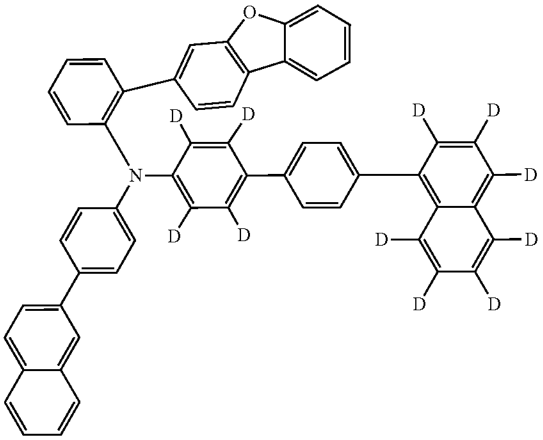

-continued
116
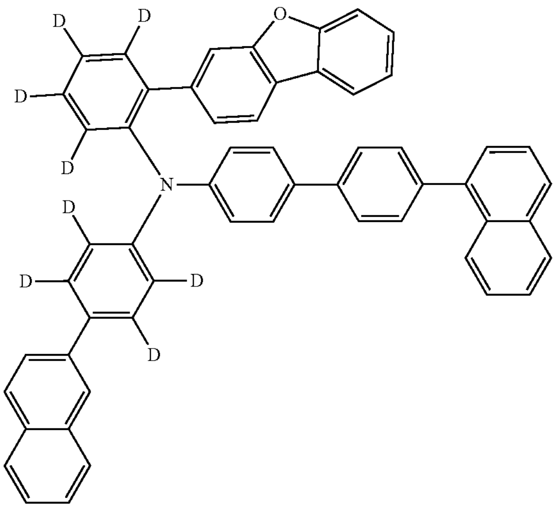
117
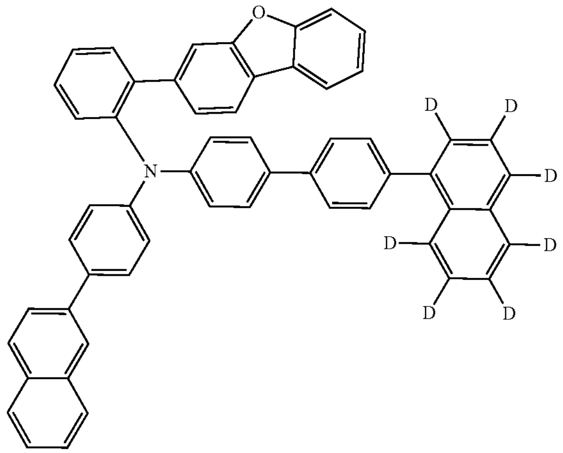
118
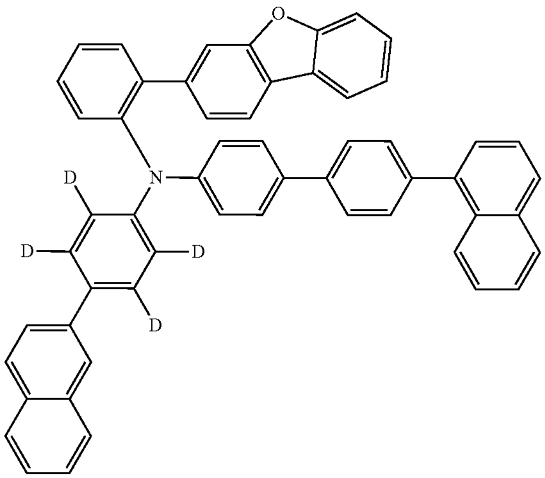
-continued
119
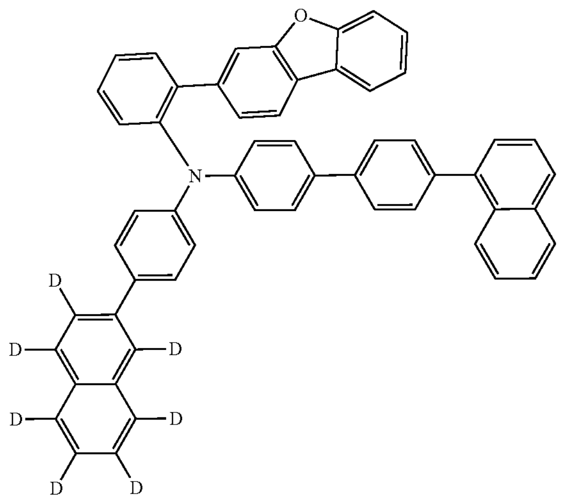
120
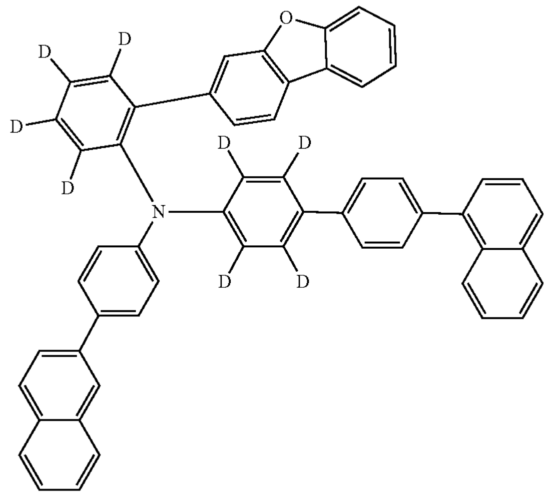
121
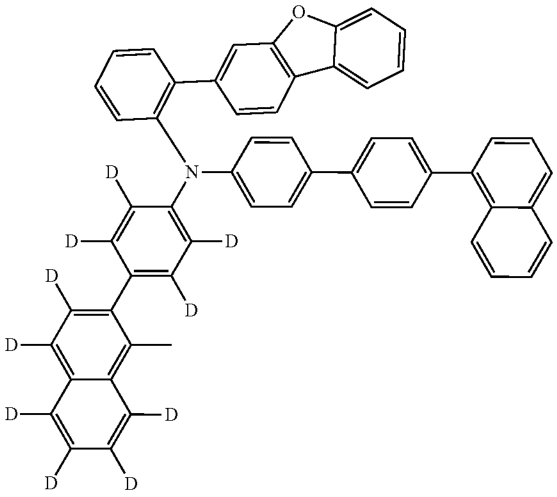

-continued
122
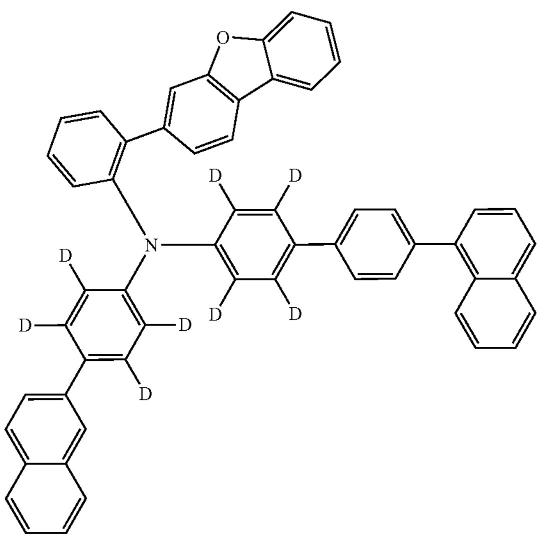
123
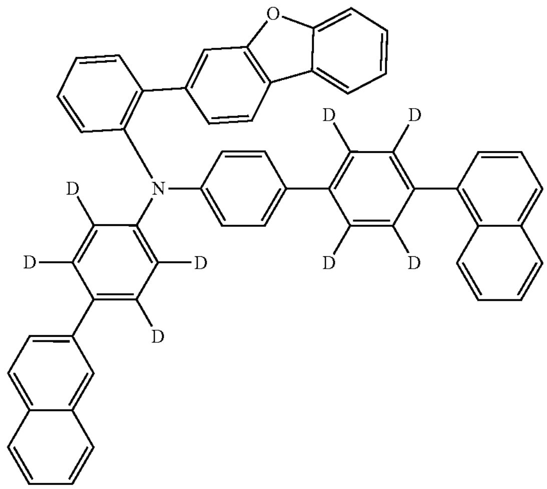
124
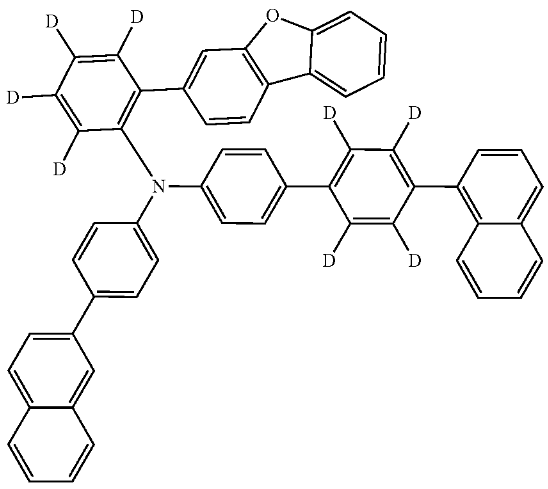
-continued
125
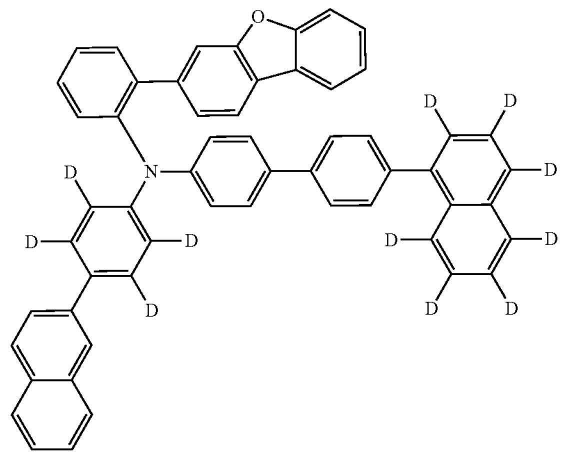
126
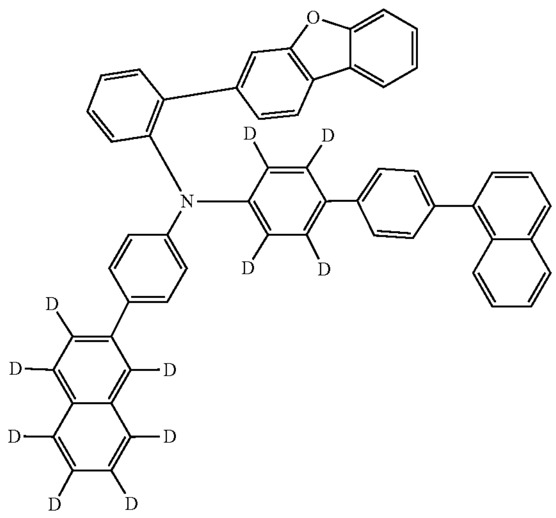
127
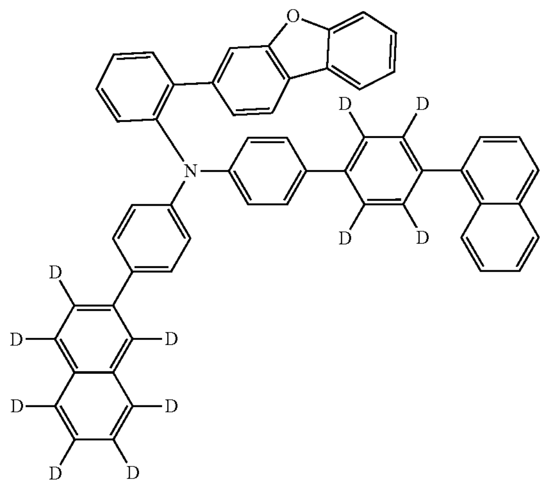

-continued
128
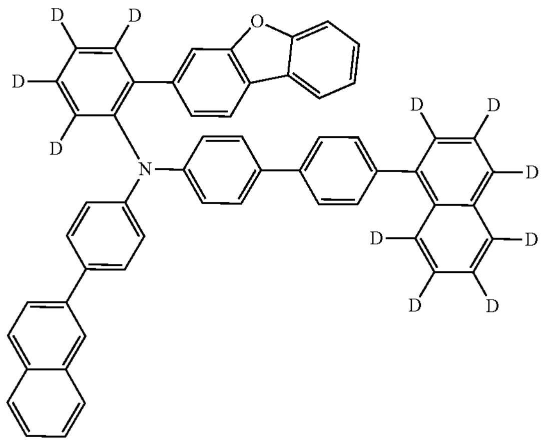
129
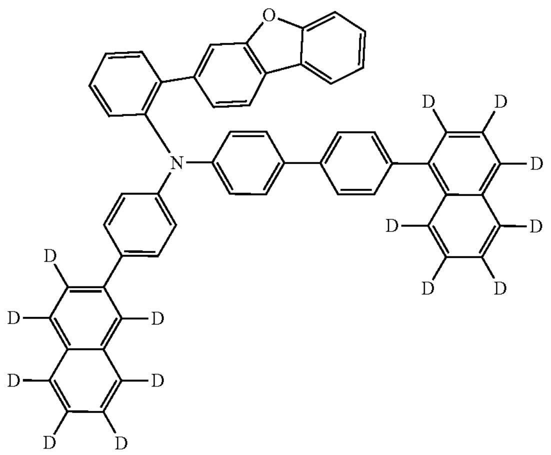
130
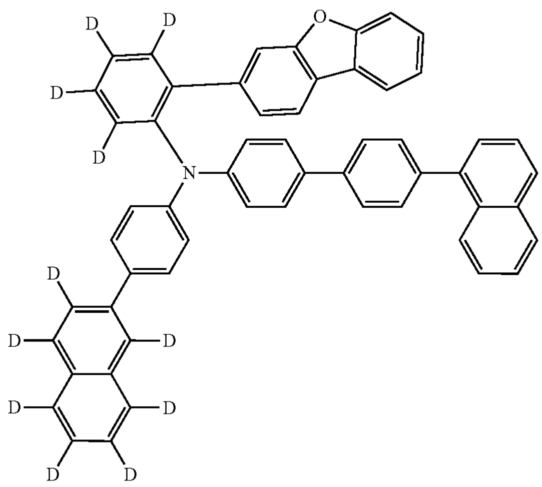
-continued
131
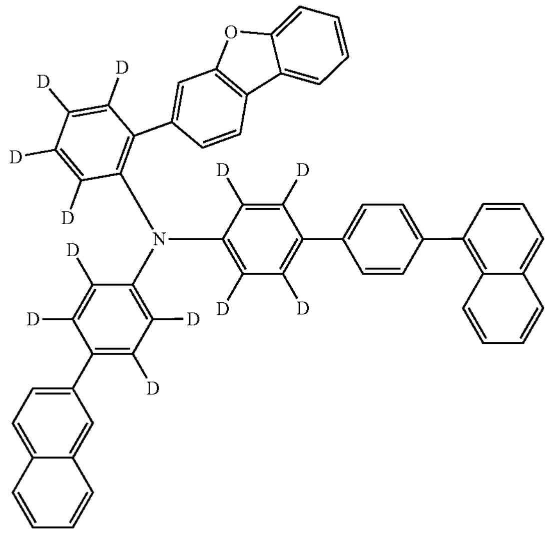
132
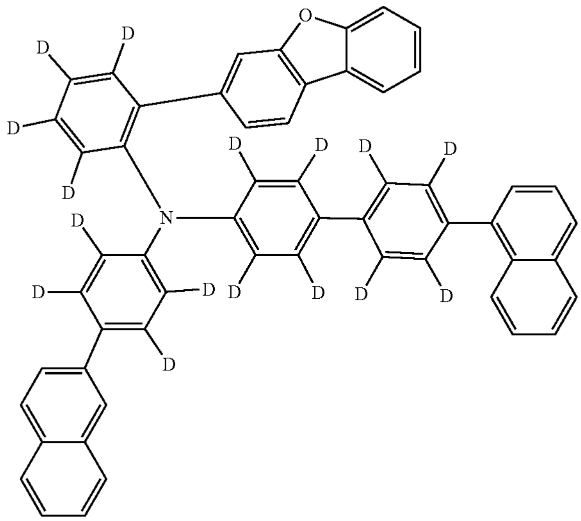
133
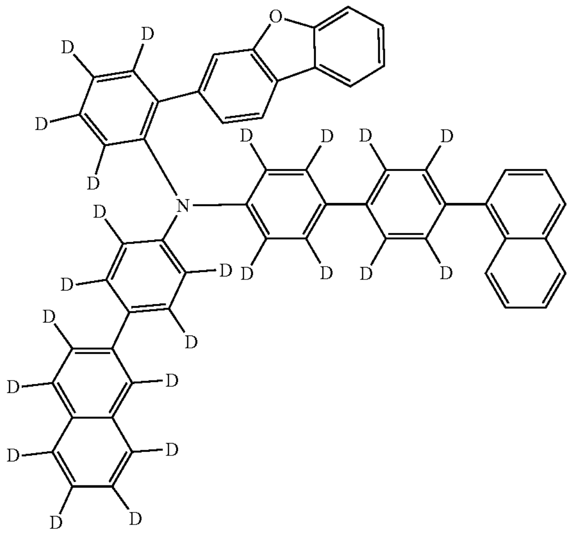

-continued
134
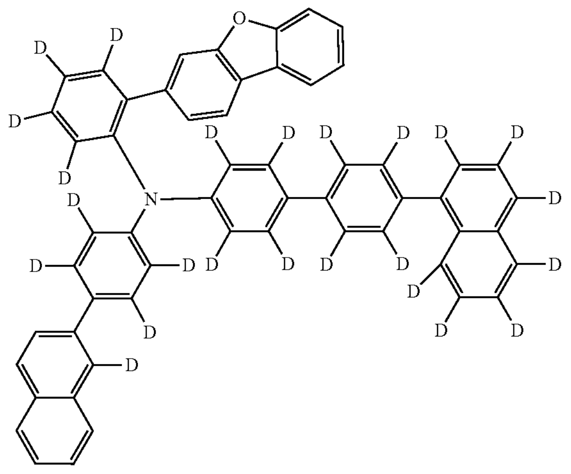
135
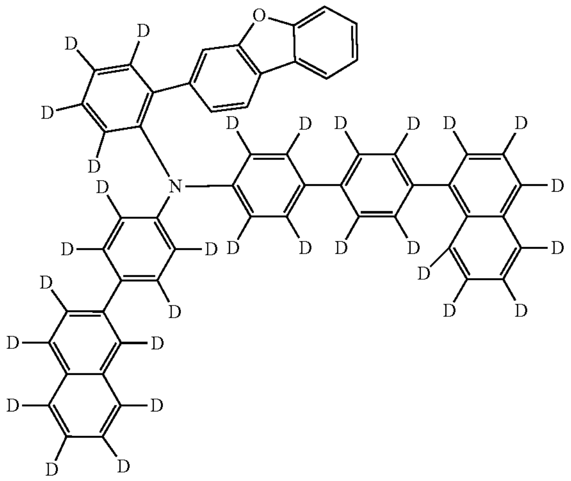
136
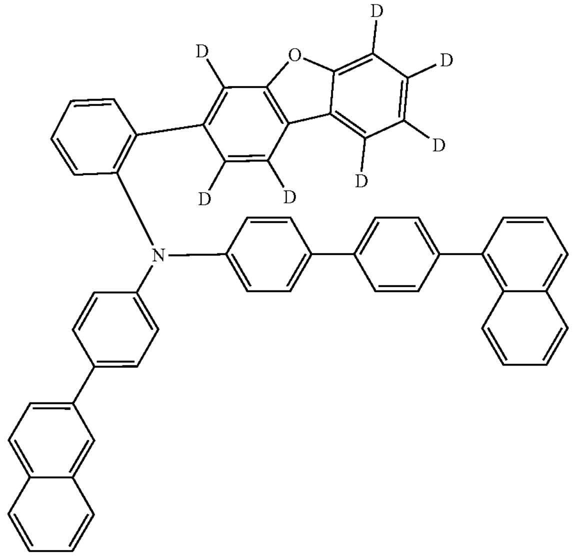
-continued
137
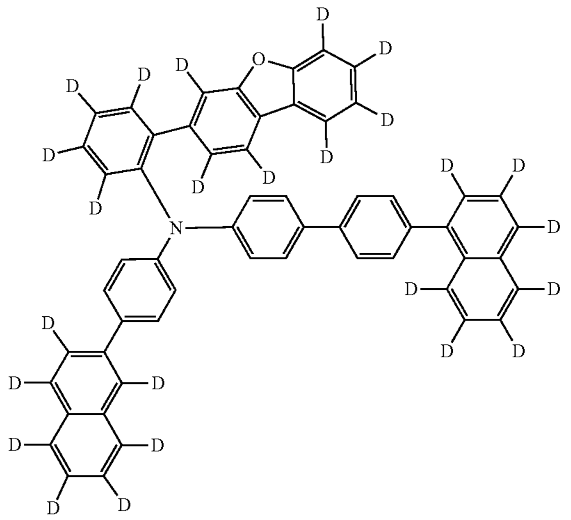
138
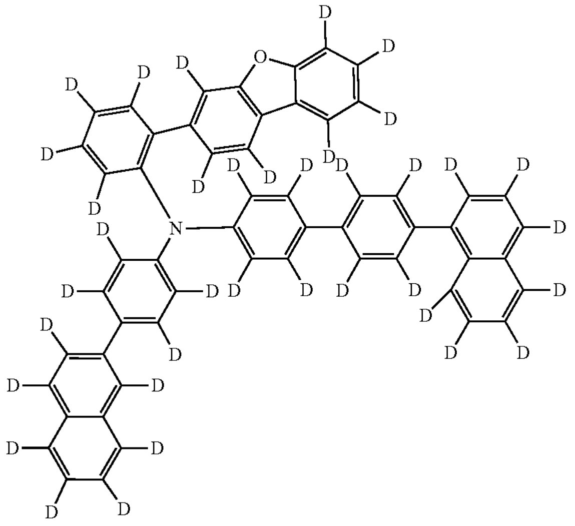
139
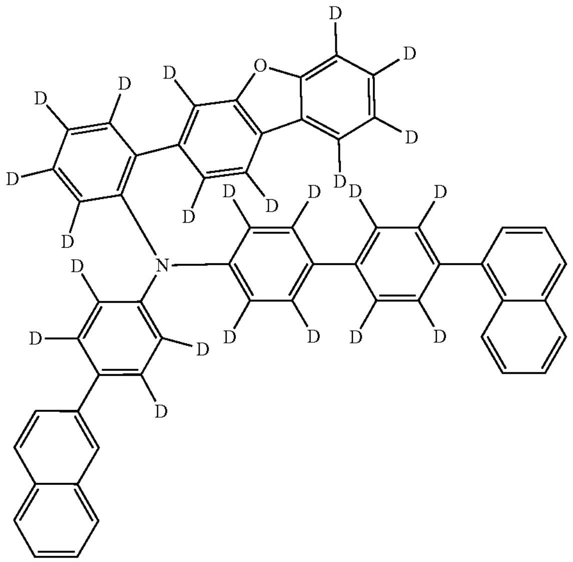

-continued
140
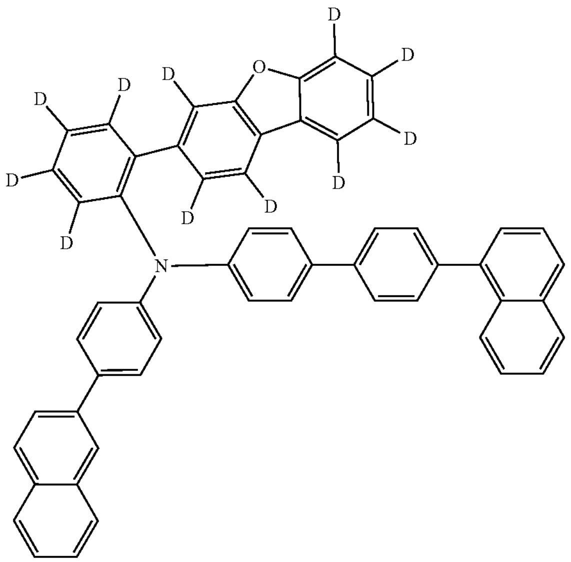
141
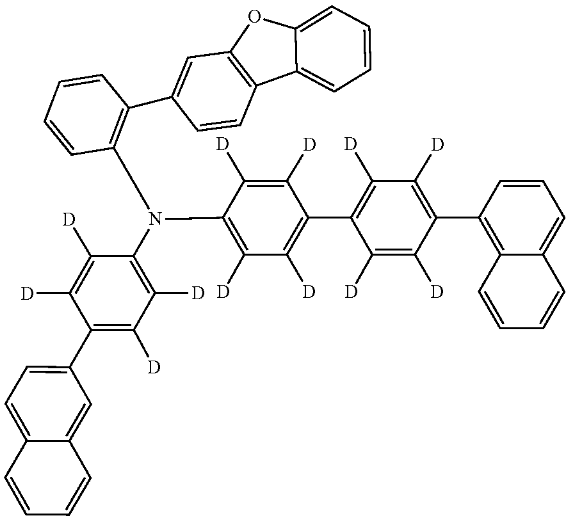
142
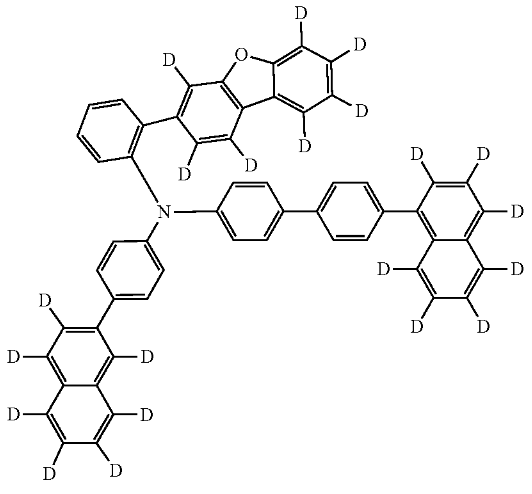
-continued
143
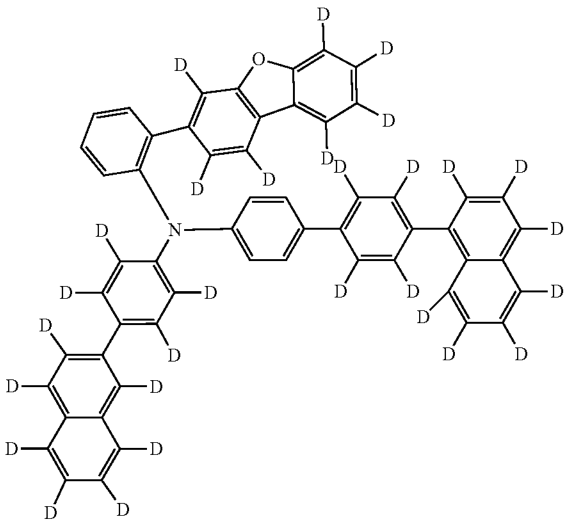
144
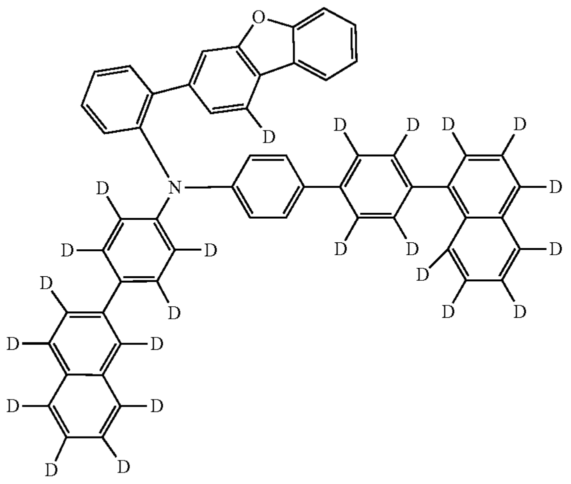
145
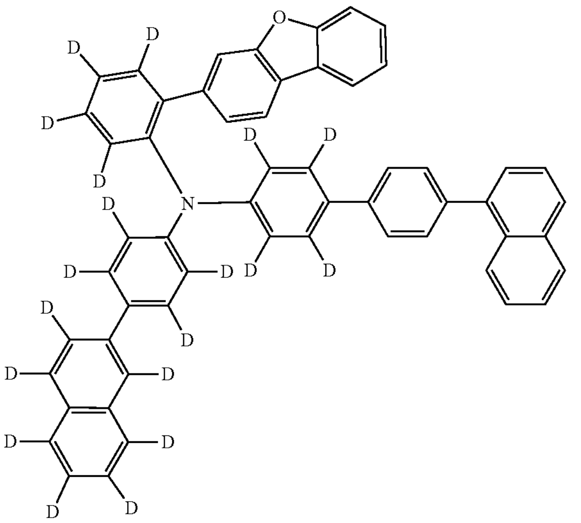

-continued
146
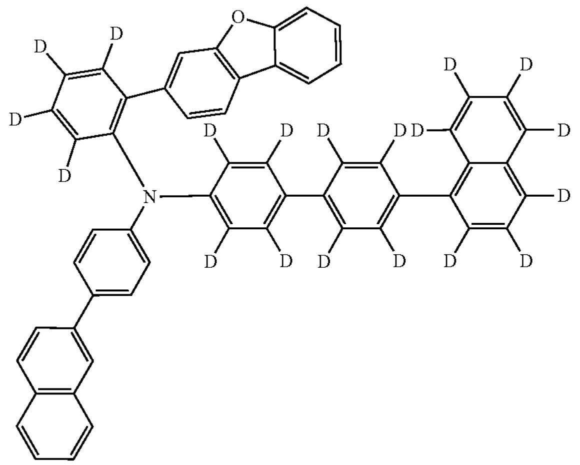
147
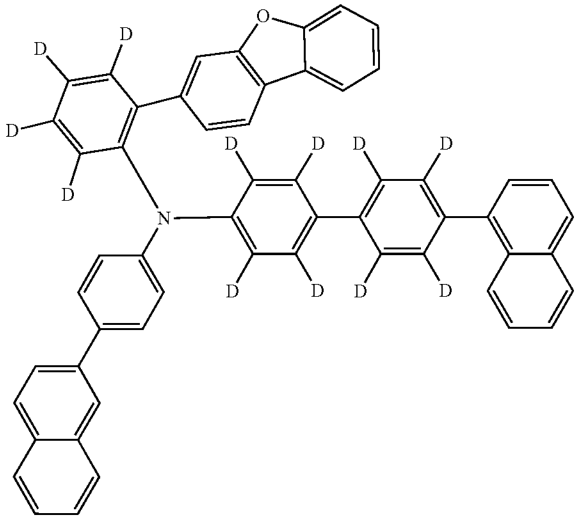
148
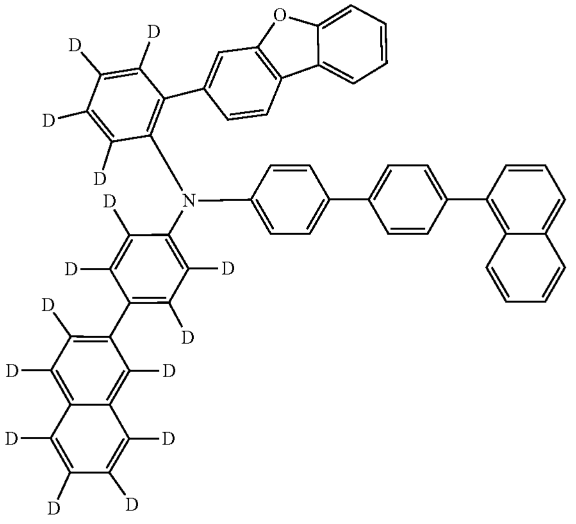
-continued
149
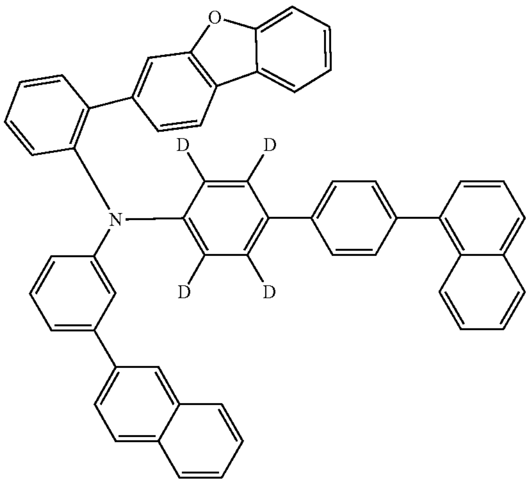
150
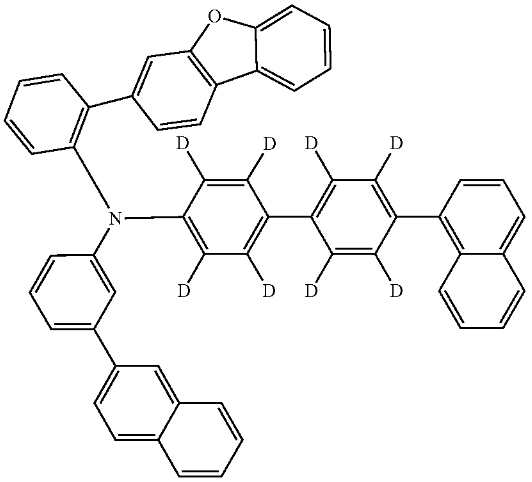
151
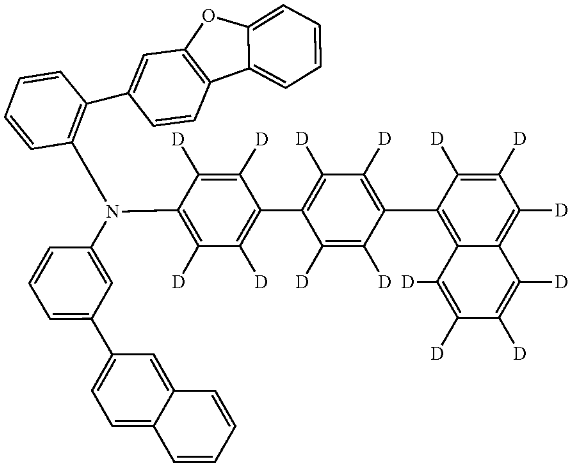

152
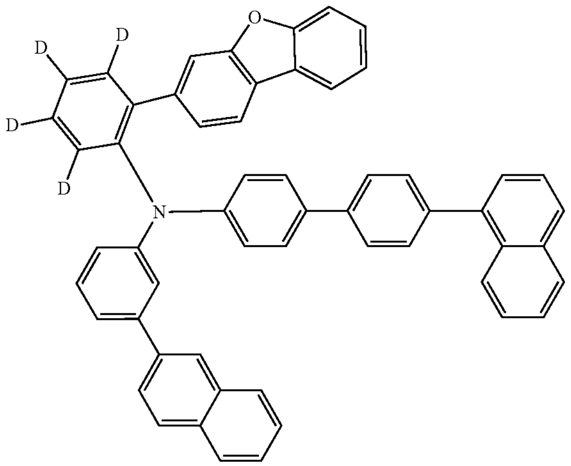
153
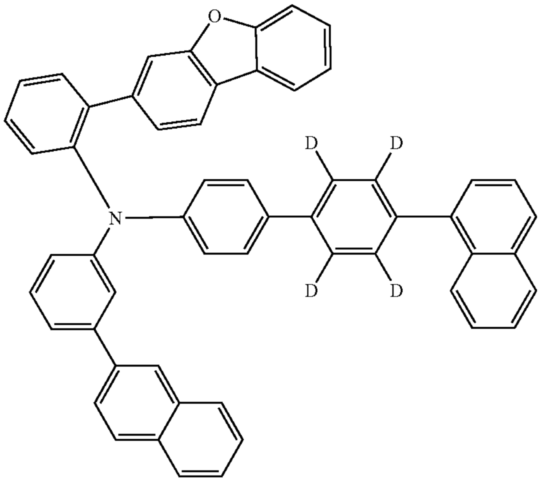
154
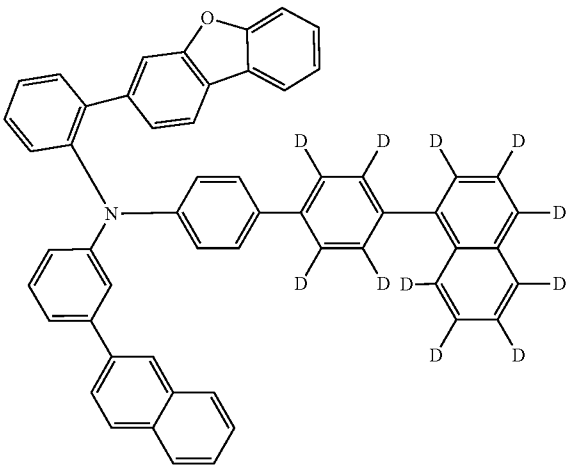
155
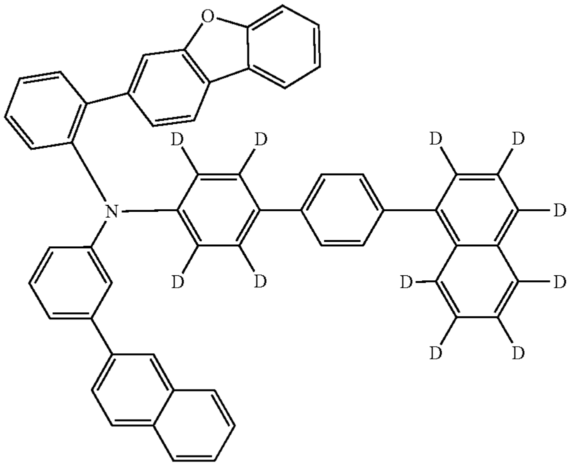
156
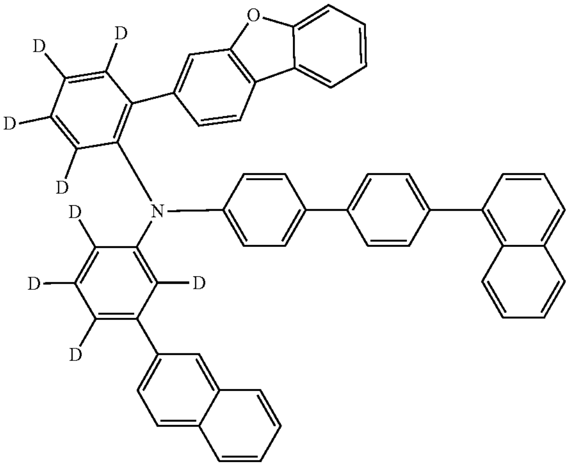
157
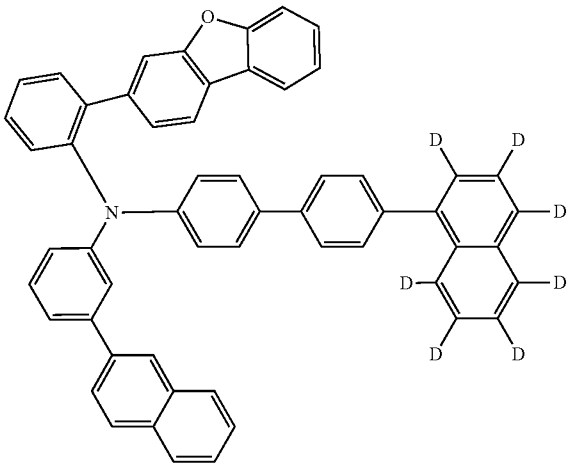

-continued
158
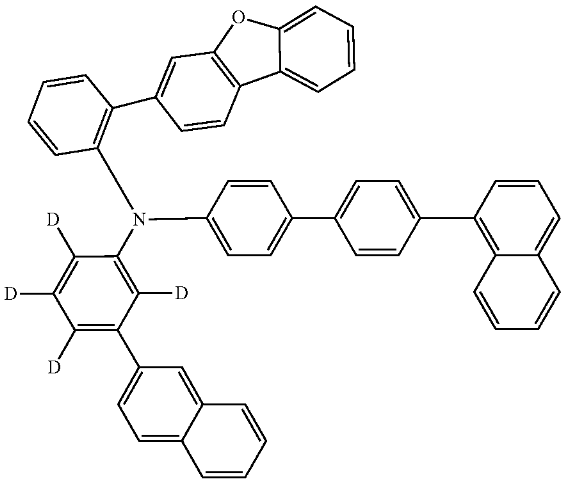
159
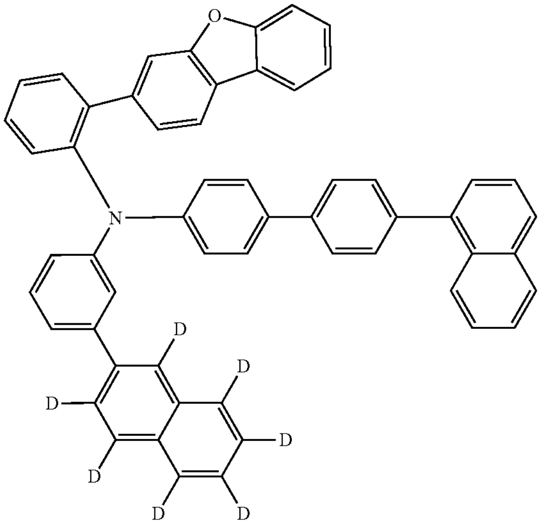
160
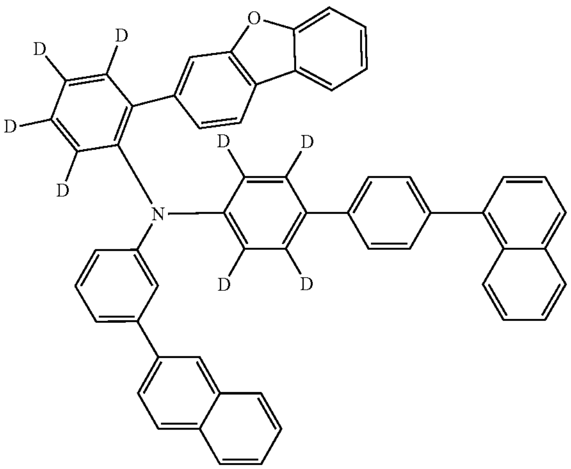
-continued
161
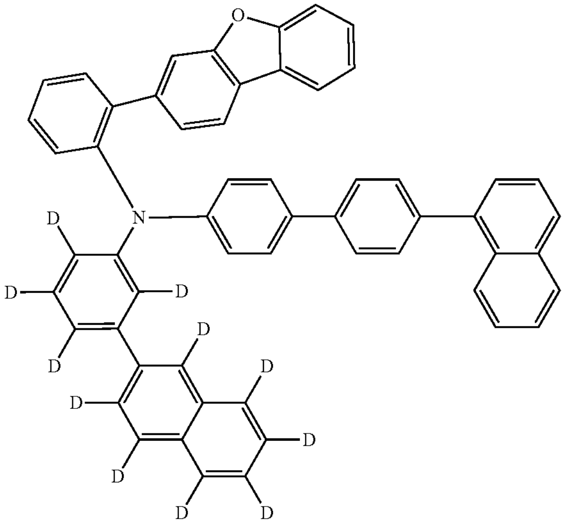
162
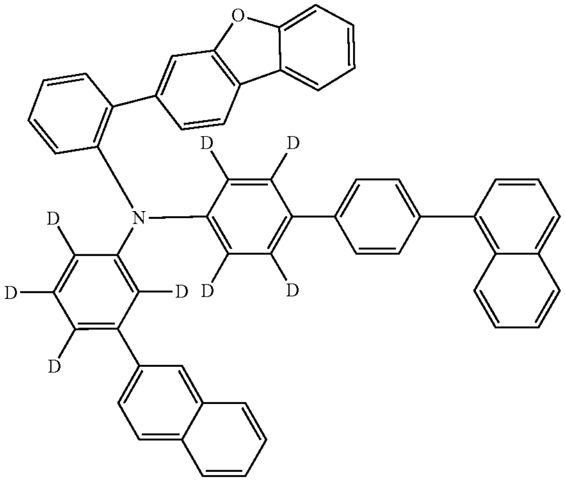
163
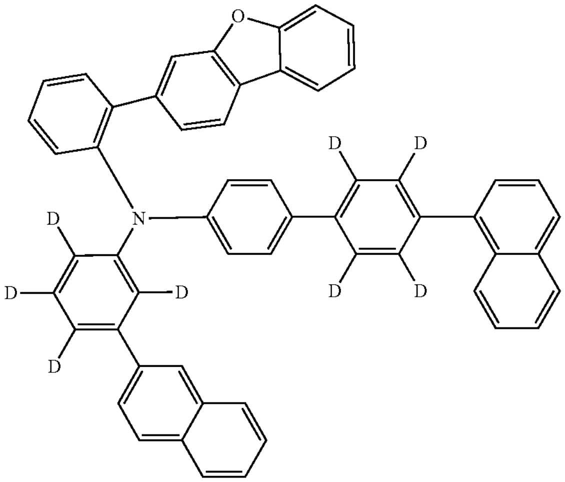

-continued
164
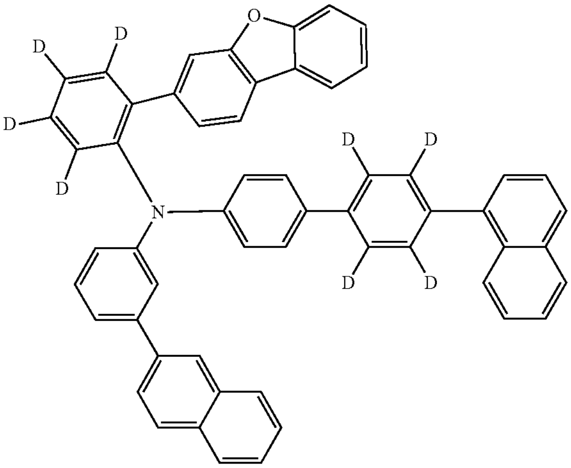
165
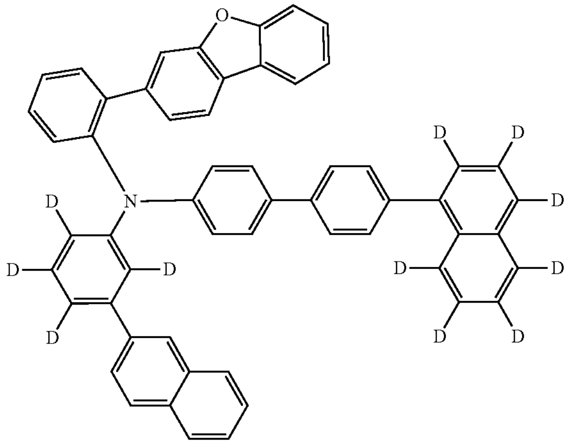
166
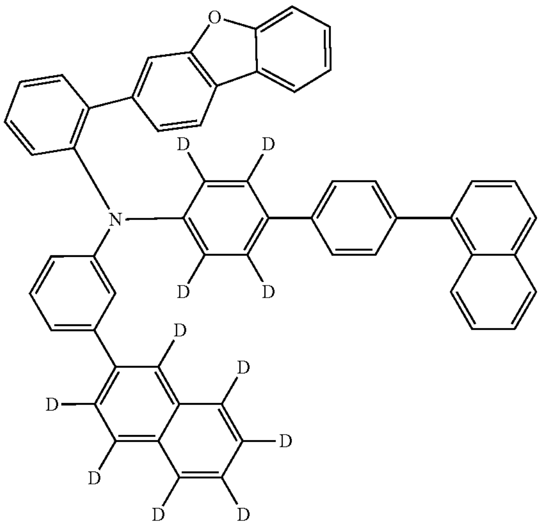
-continued
167
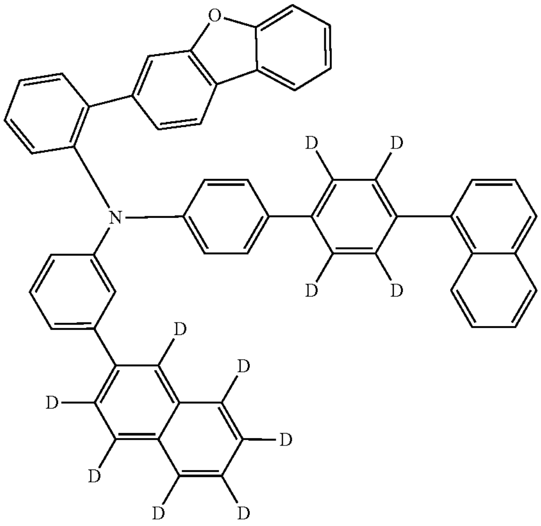
168
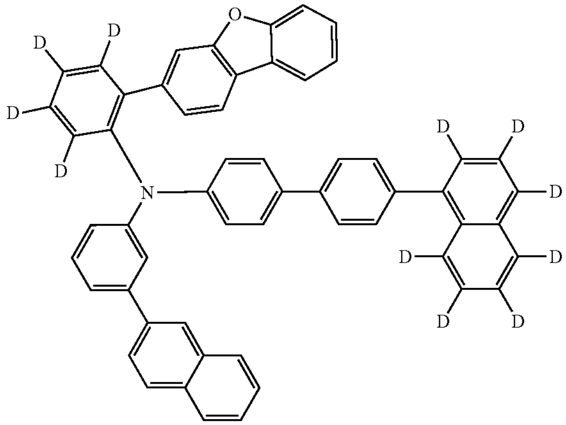
169
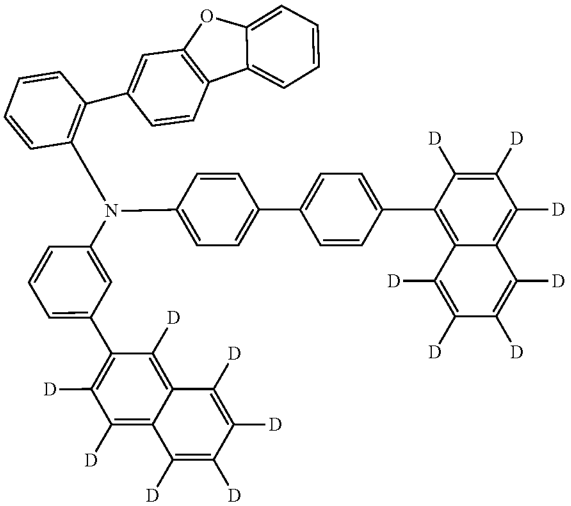

-continued
170
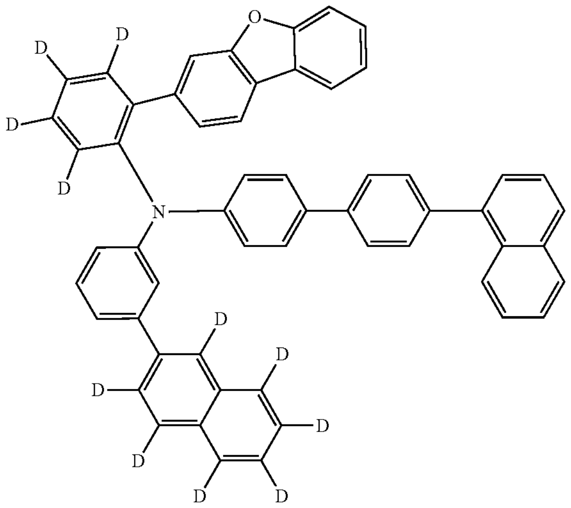
171
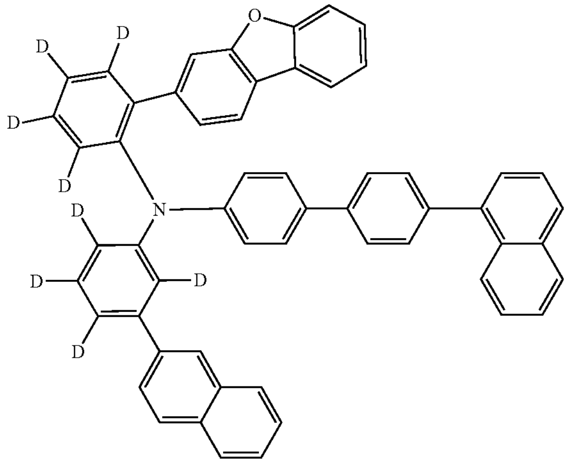
172
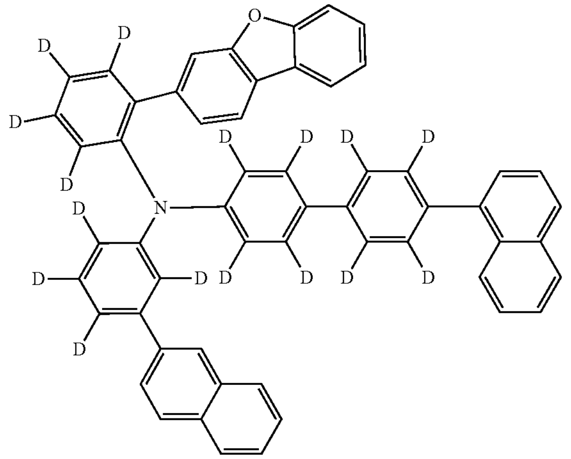
-continued
173
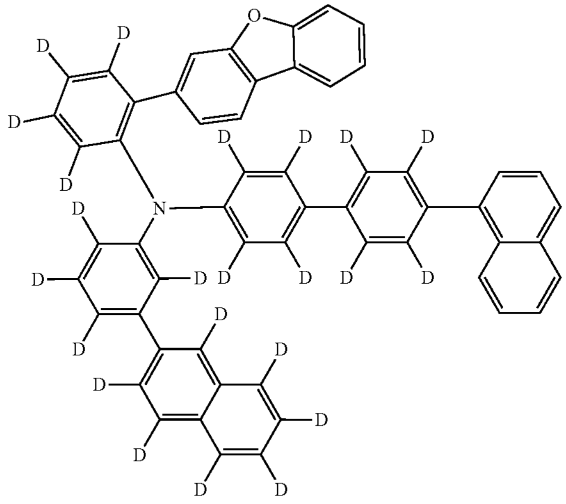
174
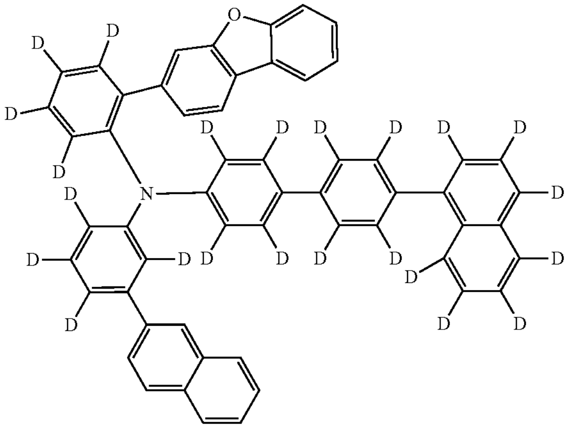
175
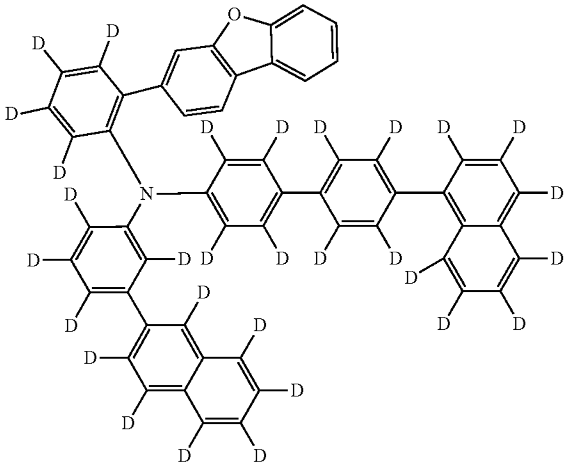

-continued
176
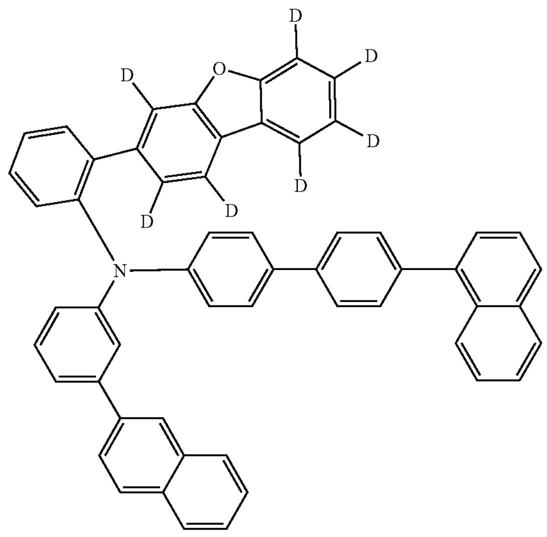
177
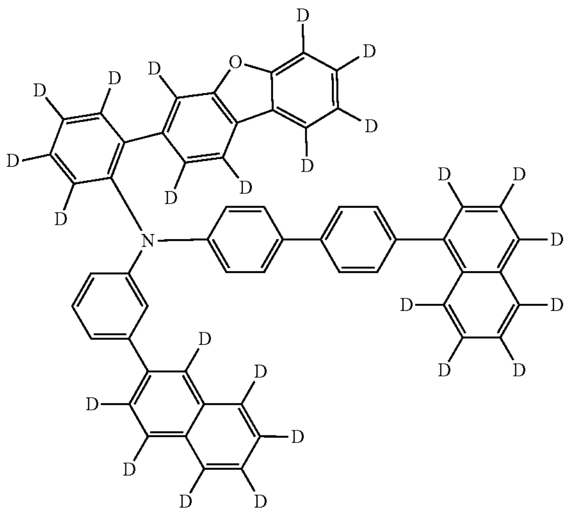
178
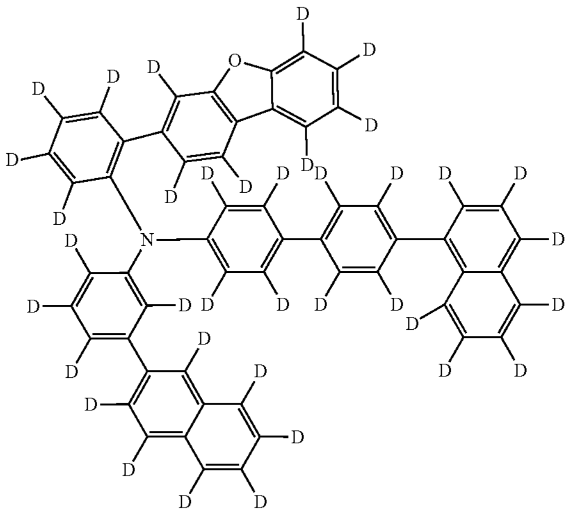
-continued
179
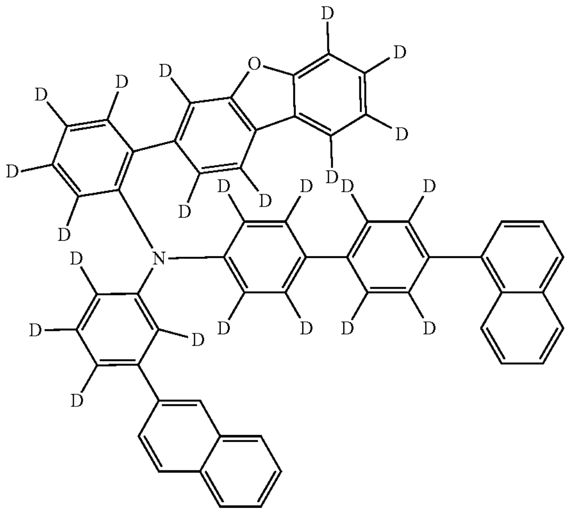
180
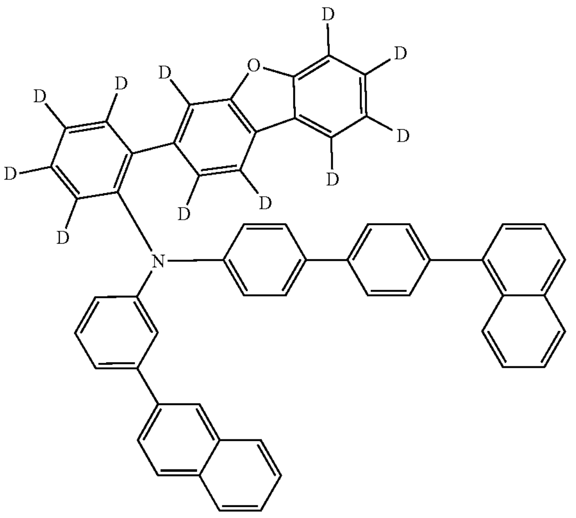
181
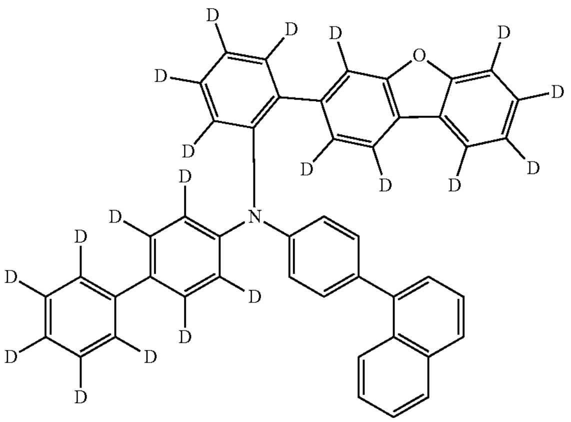

-continued
182
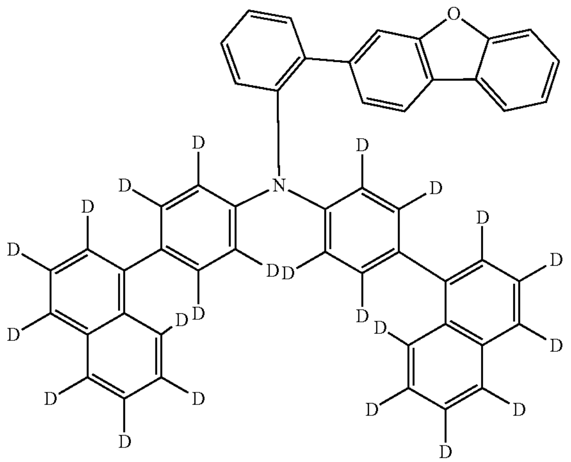
183
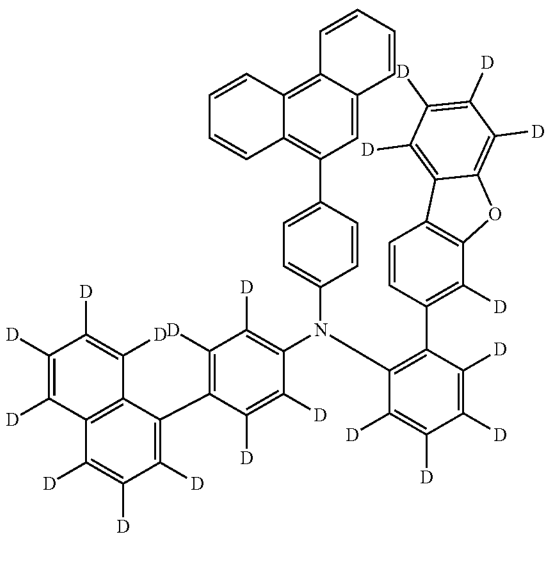
-continued
184
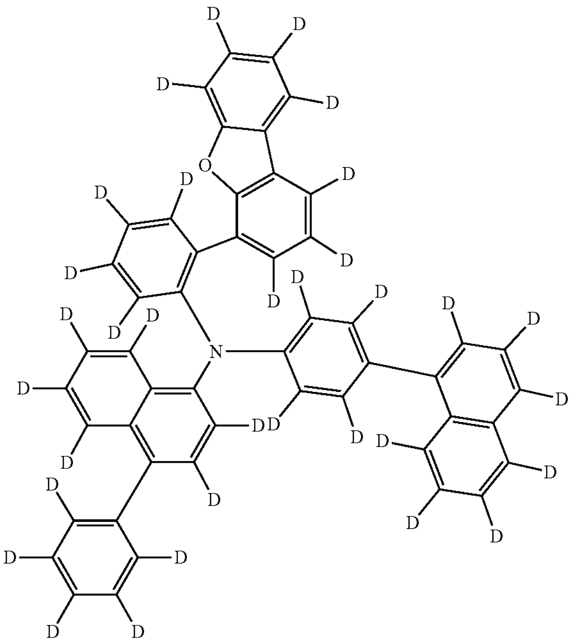
185
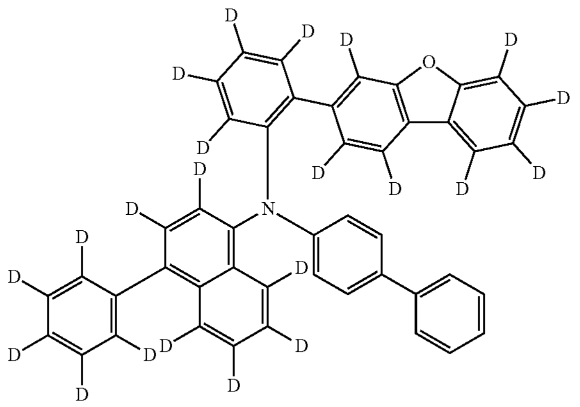
186
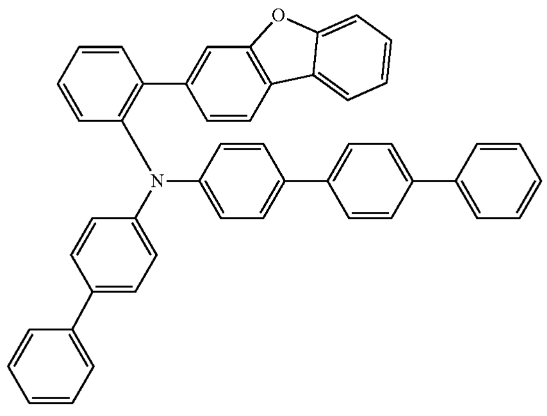

-continued
187
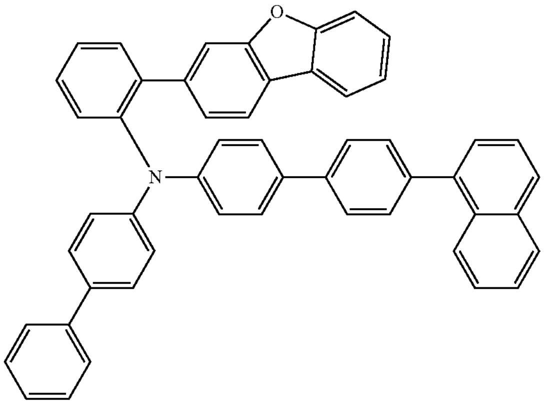
188
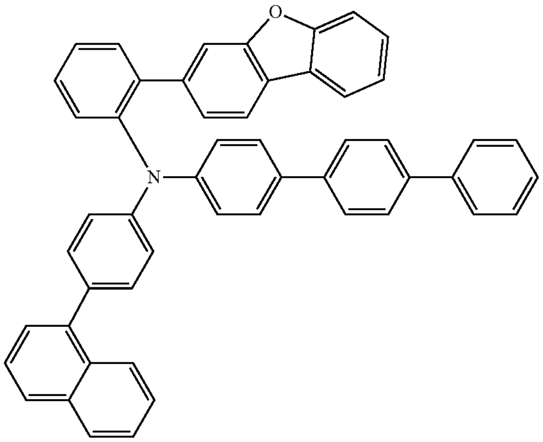
189
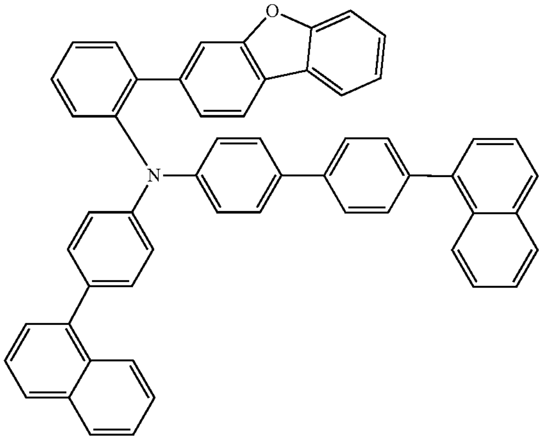
-continued
190
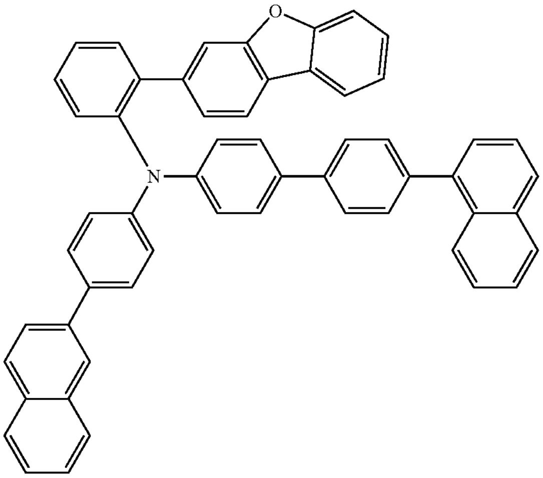
191
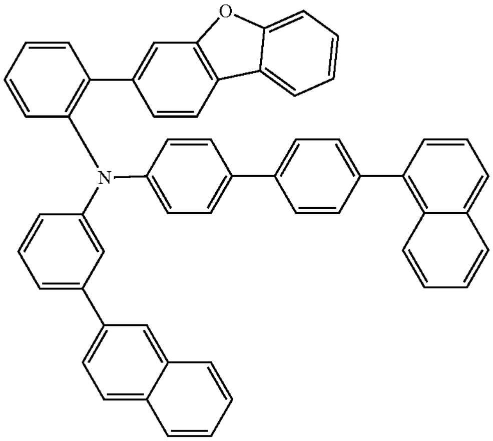
192
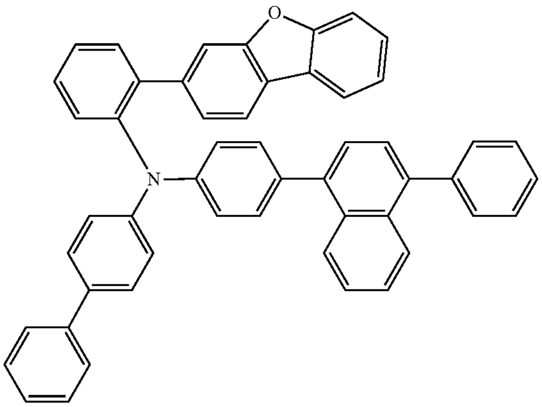

-continued
193
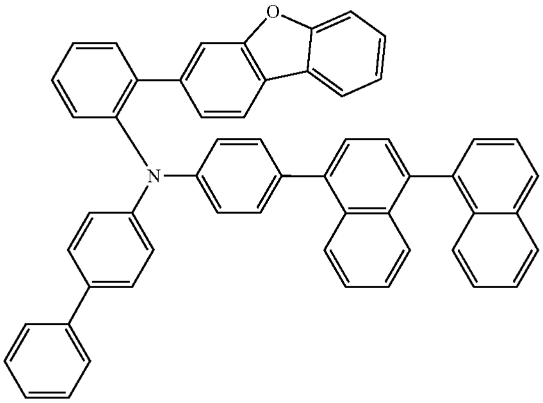
194
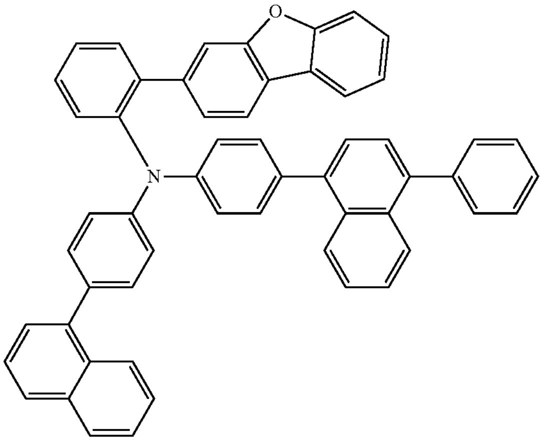
195
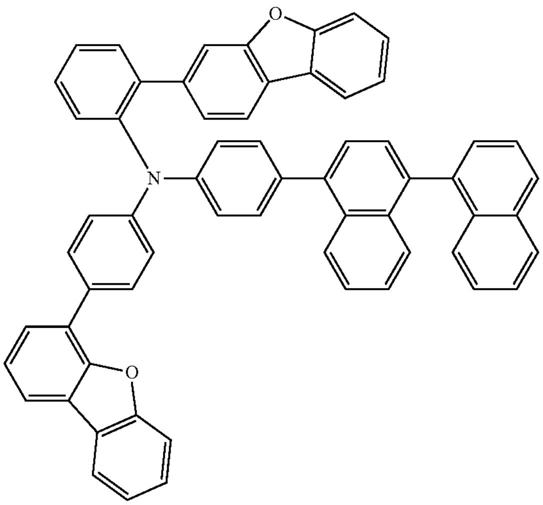
-continued
196
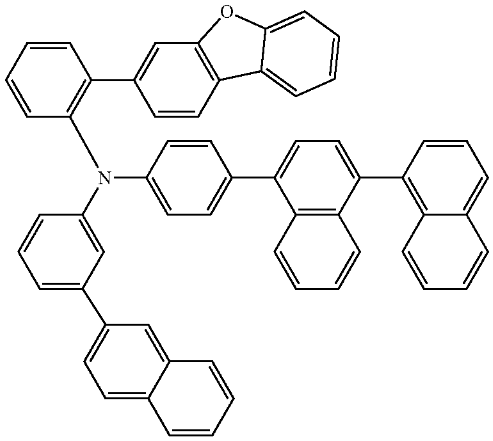
197
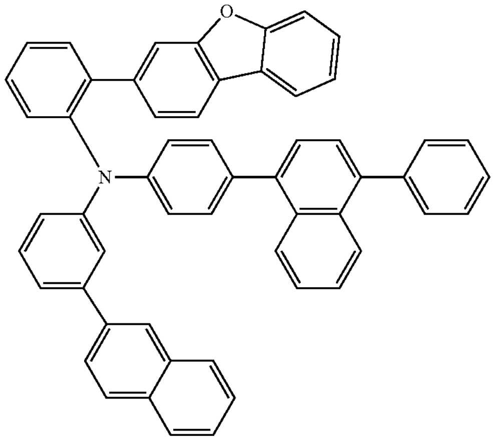
198
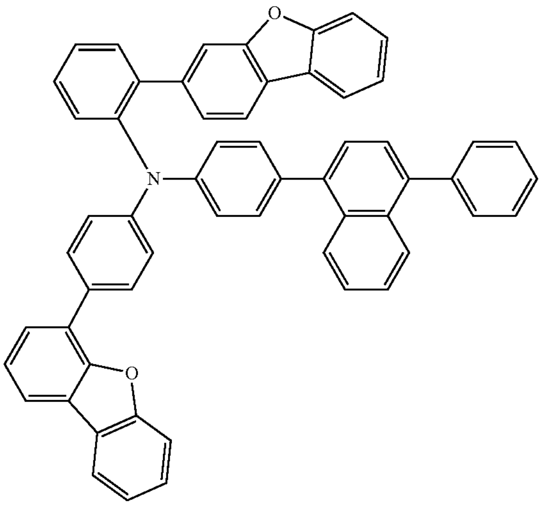

-continued
199
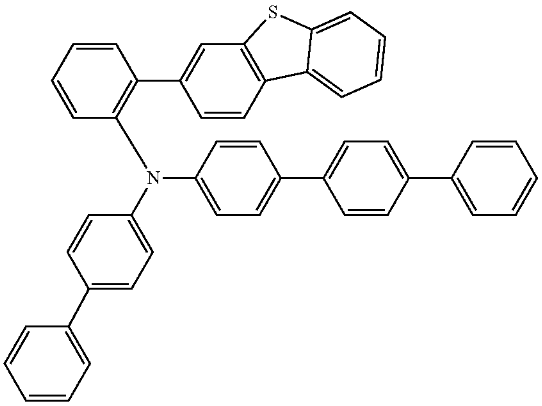
200
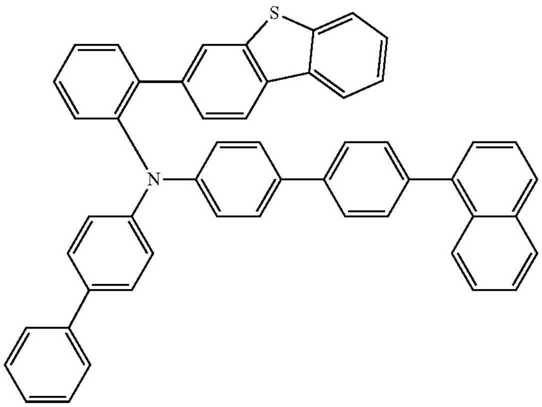
201
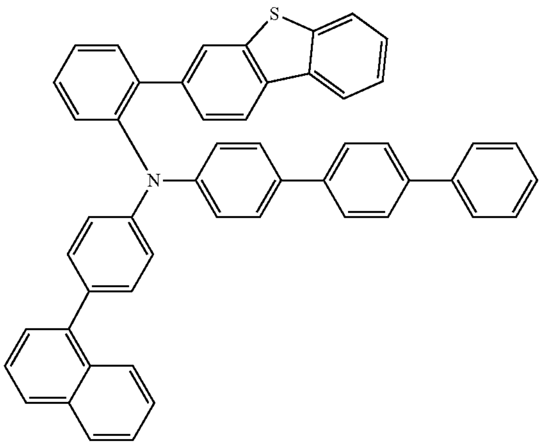
-continued
202
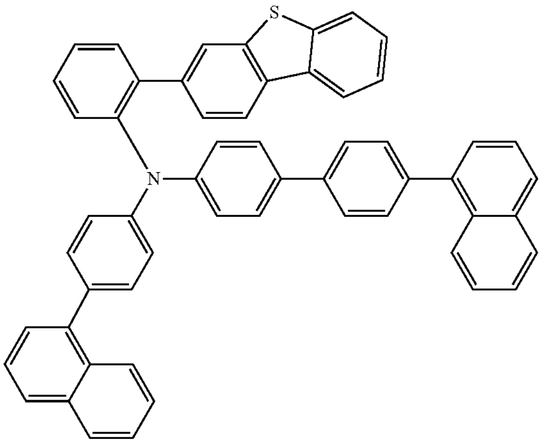
203
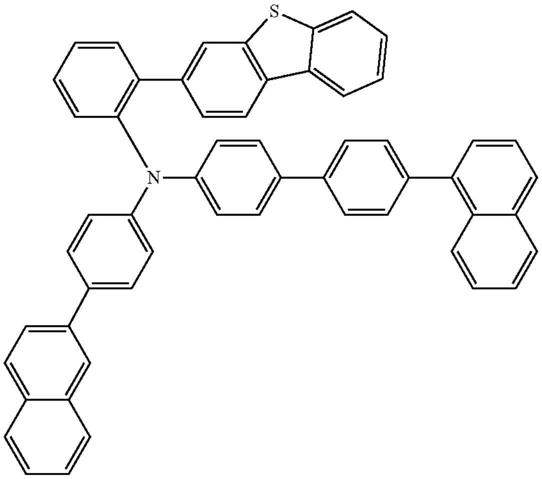
204
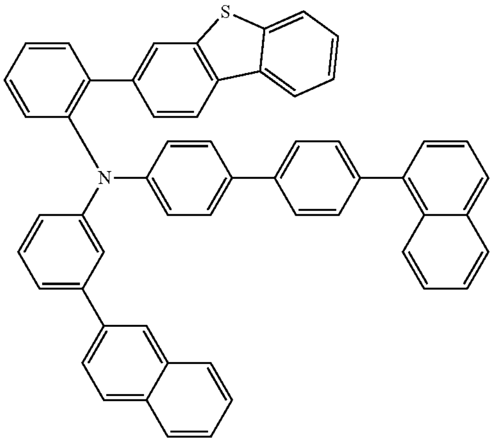

-continued
205
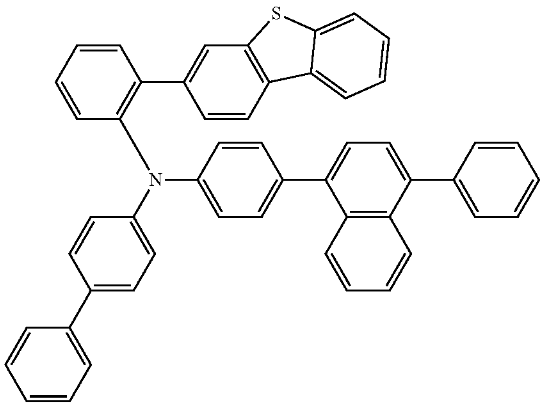
206
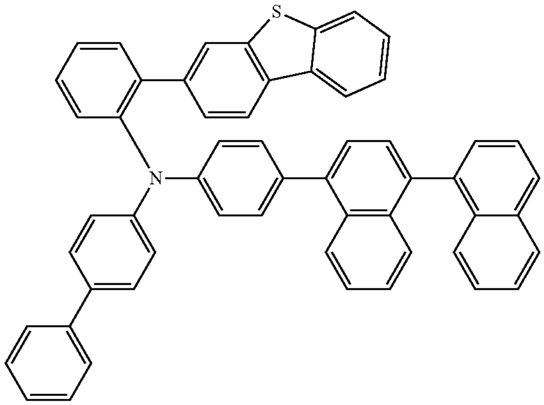
207
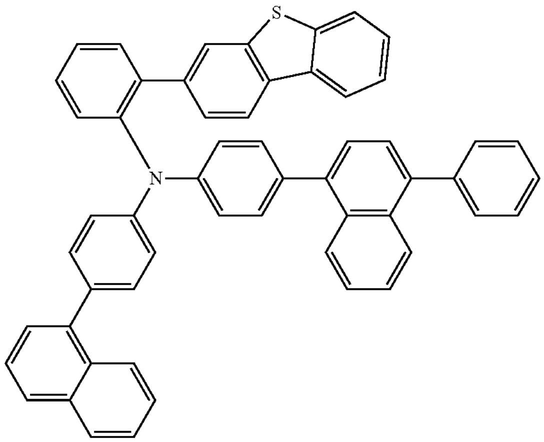
-continued
208
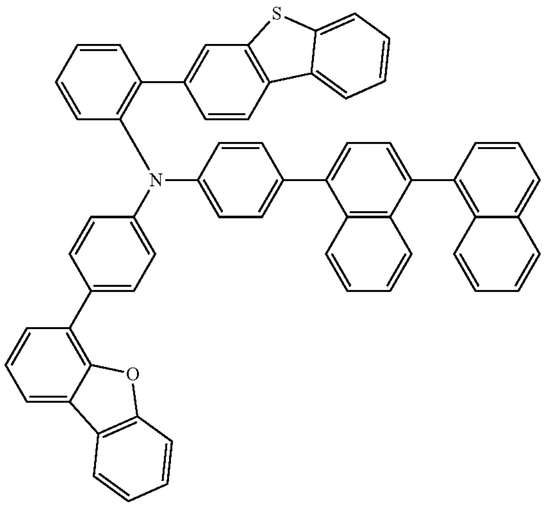
209
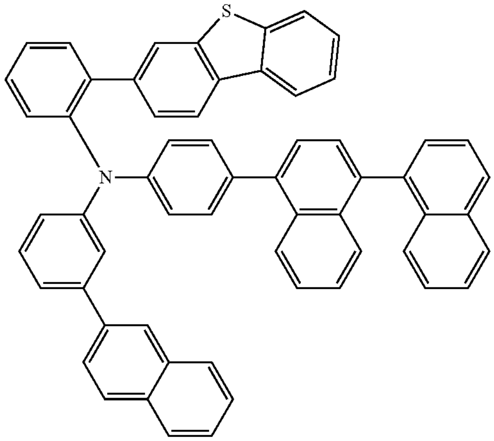
210
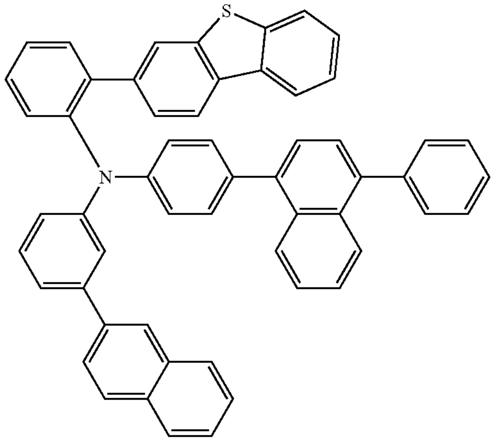

-continued
211
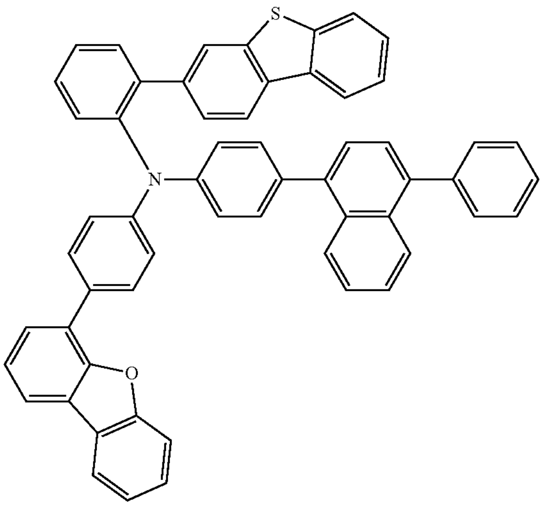
212
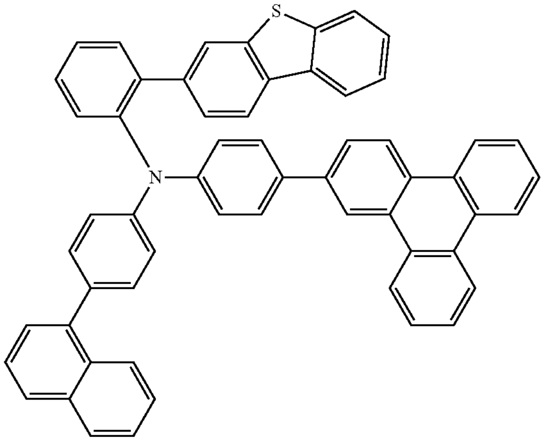
213
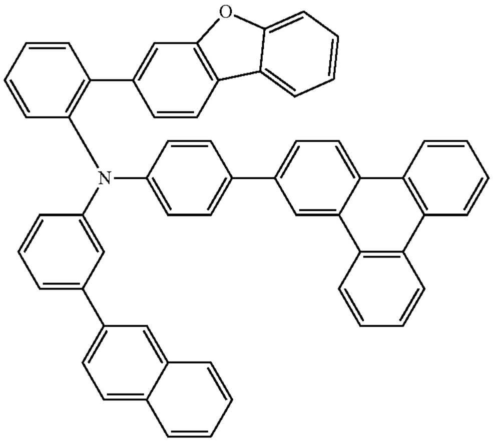
-continued
214
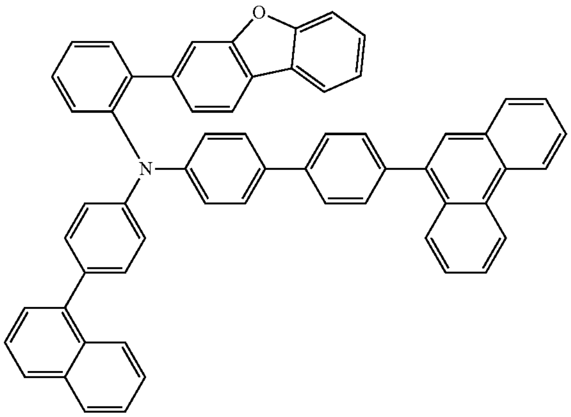
215
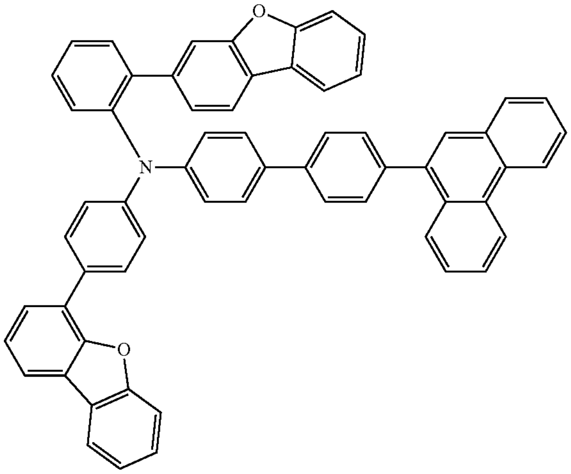
216
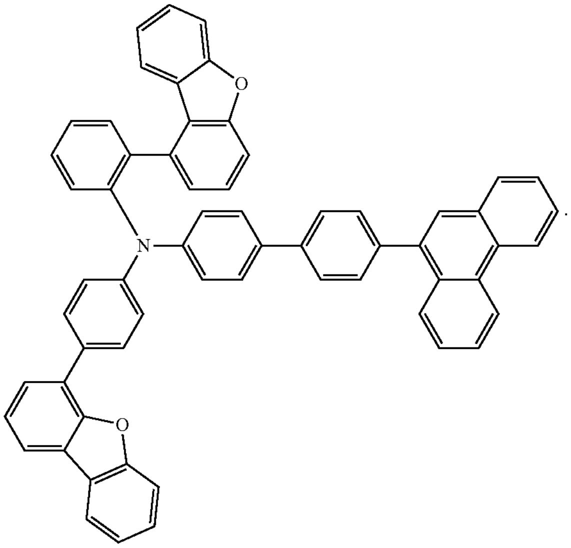
The present disclosure further provides a composition, including the organic compound shown in formula (I) and a compound having a structure shown in formula (II):

formula (II)

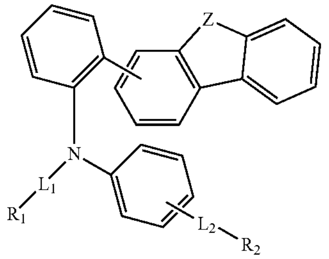

Where, in formula (II), Z is selected from O or S atom; $L_1$ and $L_2$ are each independently selected from a single bond or C6-C30 aryls, $R_1$ and $R_2$ are each independently selected from substituted or unsubstituted C6-C30 aryls or substituted or unsubstituted C6-C30 heteroaryls, and the substituents are each independently selected from deuterium or C1-C24 alkyls; hydrogen atoms in the compound shown in formula (II) may be partially or completely deuterated.

The organic electroluminescent device of the present disclosure can be used in an OLED lighting or display apparatus.

The present disclosure further provides a display or lighting apparatus, including one or more of the organic electroluminescent devices as described above.

In summary, compared to the prior art, the present disclosure has the following beneficial effects:

By defining the modification of triazines performed by aromatic substituents containing heteroatoms or cyano-substituted aromatic groups, the organic compound has a good thermal stability, excellent luminous efficiency and good purity. A combination of the organic compound as an electron transport material and a specific light-emitting auxiliary material can allow the organic light-emitting device to have lower driving voltage, keep stable voltage, to gain higher luminous efficiency, and have significantly longer working life.

DETAILED DESCRIPTION

The technical solutions of the embodiments of the present disclosure will be clearly and completely described below. Apparently, the described embodiments are only some of the embodiments of the present disclosure, not all of them. Based on the embodiments of the present disclosure, all other embodiments obtained by those skilled in the art without any creative efforts shall fall in the protection scope of the present disclosure.

The aryls described in the present disclosure refer to a general term of monovalent functional groups remaining after one hydrogen atom is removed from aromatic nucleus carbon of aromatic molecules. The aryls may be monocyclic aryls or condensed ring aryls. The aryls may have 6 to 30 carbon atoms, preferably 6 to 20 carbon atoms, and more preferably 6 to 12 carbon atoms. Examples may include, but are not limited to, phenyl, biphenyl, triphenyl, triphenylene, tetraphenylene, naphthyl, anthryl, phenanthryl, pyrenyl, etc. The aryls or aromatic groups as described herein may be considered as non-condensed and condensed systems. The aryls may have 6 to 30 carbon atoms, preferably 6 to 20 carbon atoms, and more preferably 6 to 12 carbon atoms. Examples of the aryls include phenyl, biphenyl, triphenyl, triphenylene, tetraphenylene, naphthyl, anthryl, phenalenyl, phenanthryl, fluorenyl, pyrenyl, perylenyl, and azulenyl, where, phenyl, biphenyl, triphenyl, triphenylene, fluorenyl, and naphthyl are preferred. Examples of non-condensed aryls include phenyl, biphen-2-yl, biphen-3-yl, biphen-4-yl, p-terphen-4-yl, p-terphen-3-yl, p-terphen-2-yl, m-terphen-4-yl, m-terphen-3-yl, m-terphen-2-yl, o-methylphenyl, m-methylphenyl, p-methylphenyl, p-(2-phenylpropyl)phenyl, 4'-methylbiphenyl, 4'-tert-butyl-p-triphen-4-yl, o-cumyl, m-cumyl, p-cumyl, 2,3-dimethylphenyl, 3,4-dimethylphenyl, 2,5-dimethylphenyl, mesitylenyl, and m-tetraphenyl.

The heteroaryls described in the present disclosure refer to a general term of groups obtained by substituting one or more aromatic core carbons in aryls by heteroatoms. The heteroatoms include, but are not limited to, oxygen, sulfur, silicon, or nitrogen atom. The heteroaryls may be monocyclic heteroaryl or condensed ring heteroaryl, and may have 6 to 30 carbon atoms, preferably 6 to 20 carbon atoms. Examples may include, but are not limited to, pyridinyl, pyrrolyl, pyridinyl, thiophenyl, furanyl, indolyl, quinolyl, isoquinolyl, benzothiophenyl, benzofuranyl, dibenzofuranyl, dibenzothiophenyl, carbazolyl, etc.

The alkyls described in the present disclosure include straight-chain or branched alkyl. The alkyls may have 1 to 24 carbon atoms. Preferably, the alkyls contain 1-20 carbon atoms, including methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, etc. In addition, the alkyls may be optionally substituted.

Throughout the entire description, unless explicitly described to the contrary, "including" any component will be understood as implicitly including other elements, rather than excluding any other elements. Moreover, it should be understood that throughout the entire description, when one element such as a layer, film, region, or substrate is referred to as "on" or "above" the other element, the element may be "directly on" the other element, or there may exist an intermediate element. In addition, the word "on . . . " or "above . . . " refers to being located above a target part, not necessarily above in the direction of gravity.

One objective of the present disclosure is to provide an organic electroluminescent device, including: a substrate; a first electrode on the substrate; an organic light-emitting functional layer on the first electrode; and a second electrode on the organic light-emitting functional layer; where the organic light-emitting functional layer includes an electron transport layer, and the electron transport layer includes triazines with nitrogen-containing spirofluorene groups.

In one embodiment of the present disclosure, the electron transport layer in the organic electroluminescent (OLED) device includes one or more of the compounds shown in formula (I) above as electron transport materials, and one or more of the compounds shown in formula (II) above as light-emitting auxiliary materials.

In one preferred embodiment of the present disclosure, an OLED is provided, including: a substrate, an anode, a cathode, and an organic light-emitting functional layer, where the organic light-emitting functional layer may include a light-emitting layer, a light-emitting auxiliary layer, a hole transport layer, a hole injection layer, an electron transport layer, an electron injection layer, etc., or may include only a light-emitting layer and one or more other layers; wherein the light-emitting auxiliary layer includes one or more of the compounds shown in formula (II) above; preferably, the electron transport layer includes one or more of the compounds shown in formula (I) above.

Optionally, it further includes a covering layer, a protective layer, and/or a packaging layer on the organic light-emitting functional layer.

The substrate described in the present disclosure may be any substrate used in typical organic light-emitting devices. The substrate may be a glass or transparent plastic substrate, may be a substrate made of an opaque material such as silicon or stainless steel substrate, or a flexible PI film. Different substrates have different mechanical strength, thermal stability, transparency, surface smoothness, and waterproofness, and their application fields are different based on their different properties.

Materials for the hole injection layer, the hole transport layer, the electron injection layer, and the light-emitting layer may be selected from known materials for OLED devices.

The present disclosure will be described in detail with reference to specific examples. All raw materials and solvents used in the synthesis examples can be purchased commercially, unless otherwise specified. The solvents are used directly without further treatment.

EXAMPLES

Example 1: Synthesis of Compound E003

Synthesis Route:

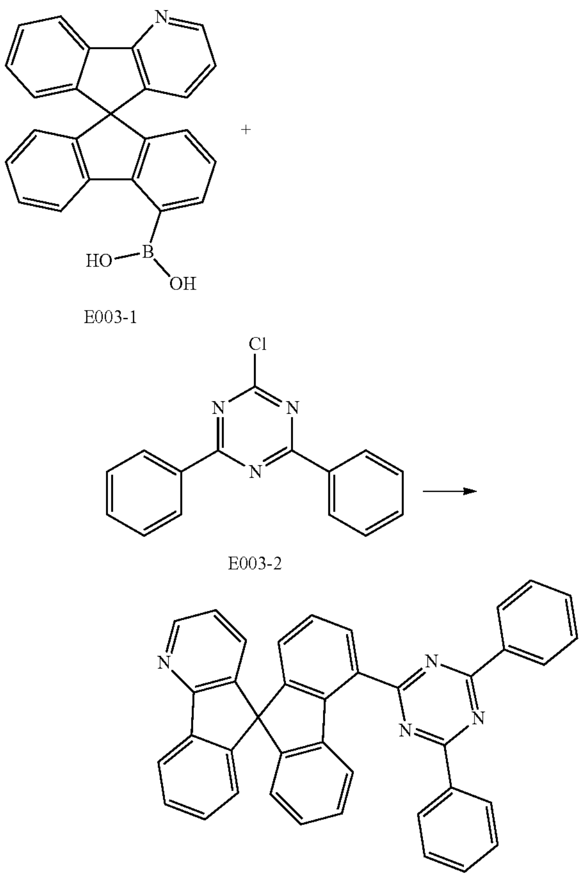

E003-1

E003-2

E003

1) E003-1 (10 mmol), E003-2 (10 mmol), and 10 mL of a solution of dioxane:water (4:1) were added to a 50 mL reaction flask, mixed, and subjected to a reflux reaction for 24 hours. The reaction solution was cooled to a room temperature, then a saturated $MgSO_4$ aqueous solution and ethyl acetate were slowly added to the solution for extraction three times, the solvent was removed from organic layers with a rotary evaporator, and a final product E003 was obtained by column chromatography.

The structure of the target product E003 was tested: by liquid chromatography-mass spectrometry, its LC-MS (m/z) (M+): theoretical value was 548.20, and its test value was 548.20.

Example 2: Synthesis of Compound E018

A compound E018 was synthesized with reference to the synthesis steps and reaction conditions in Example 1. By liquid chromatography-mass spectrometry, its LC-MS (m/z) (M+): theoretical value was 573.20, and its test value was 573.58.

Example 3: Synthesis of Compound E026

A compound E026 was synthesized with reference to the synthesis steps and reaction conditions in Example 1. By liquid chromatography-mass spectrometry, its LC-MS (m/z) (M+): theoretical value was 700.26, and its test value was 700.72.

Example 4: Synthesis of Compound E042

A compound E042 was synthesized with reference to the synthesis steps and reaction conditions in Example 1. By liquid chromatography-mass spectrometry, its LC-MS (m/z) (M+): theoretical value was 624.23, and its test value was 624.79.

Example 5: Synthesis of Compound E047

A compound E047 was synthesized with reference to the synthesis steps and reaction conditions in Example 1. By liquid chromatography-mass spectrometry, its LC-MS (m/z) (M+): theoretical value was 624.23, and its test value was 624.79.

Example 6: Synthesis of Compound E077

A compound E077 was synthesized with reference to the synthesis steps and reaction conditions in Example 1. By liquid chromatography-mass spectrometry, its LC-MS (m/z) (M+): theoretical value was 649.23, and its test value was 649.67.

Example 7: Synthesis of Compound E123

A compound E123 was synthesized with reference to the synthesis steps and reaction conditions in Example 1. By liquid chromatography-mass spectrometry, its LC-MS (m/z) (M+): theoretical value was 674.25, and its test value was 674.87.

Example 8: Synthesis of Compound E129

A compound E129 was synthesized with reference to the synthesis steps and reaction conditions in Example 1. By liquid chromatography-mass spectrometry, its LC-MS (m/z) (M+): theoretical value was 724.26, and its test value was 724.83.

Example 9: Synthesis of Compound E138

A compound E138 was synthesized with reference to the synthesis steps and reaction conditions in Example 1. By liquid chromatography-mass spectrometry, its LC-MS (m/z) (M+): theoretical value was 776.29, and its test value was 776.77.

Example 10: Synthesis of Compound E149

A compound E149 was synthesized with reference to the synthesis steps and reaction conditions in Example 1. By liquid chromatography-mass spectrometry, its LC-MS (m/z) (M+): theoretical value was 649.23, and its test value was 649.79.

Example 11: Synthesis of Compound E181

A compound E181 was synthesized with reference to the synthesis steps and reaction conditions in Example 1. By liquid chromatography-mass spectrometry, its LC-MS (m/z) (M+): theoretical value was 775.27, and its test value was 775.81.

Example 12: Synthesis of Compound E205

A compound E205 was synthesized with reference to the synthesis steps and reaction conditions in Example 1. By liquid chromatography-mass spectrometry, its LC-MS (m/z) (M+): theoretical value was 750.28, and its test value was 750.90.

Example 13: Synthesis of Compound 001

Synthesis Route:

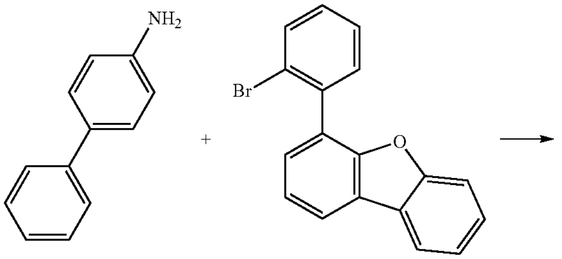

001-1

001-2

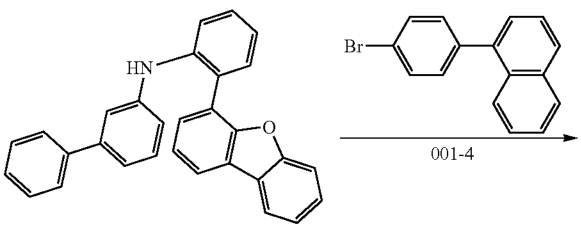

001-3

-continued

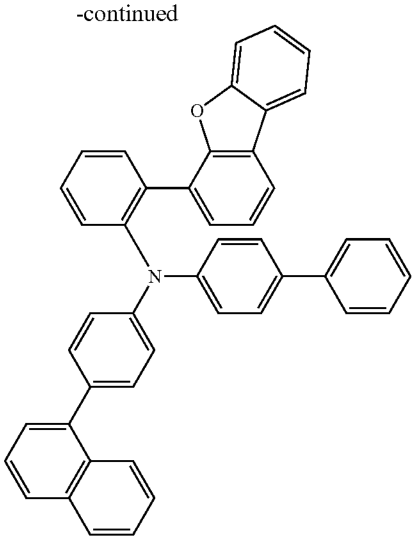

001

1) Compound 001-1 (10 mmol), compound 001-2 (25 mmol), sodium tert-butoxide (10 mmol), and 200 mL of toluene were added to a reaction flask. After nitrogen displacement, pd2 (dba) 3 ($5\times10^{-2}$ mmol) and Sphos ($5\times10^{-2}$ mmol) were added, followed by heating to 100-120° C. and a reflux reaction for 6 hours. Then, the reaction was stopped. The reaction solution was cooled to a temperature of 30-40° C., 200 mL of water was added, and the solution was stratified. After washing twice with water, the toluene was concentrated, then 100 mL of n-hexane was added, followed by pulping. An intermediate product 003 was obtained. [0071]2) 001-3 (10 mmol), 001-4 (25 mmol), sodium tert-butoxide (10 mmol), and 200 mL of toluene were added to a reaction flask. After nitrogen displacement, pd2 (dba) 3 ($5\times10^{-2}$ mmol) and Sphos ($5\times10^{-2}$ mmol) were added, followed by heating to 100-120° C. and reflux reaction for 6 hours. Then, the reaction was stopped. The solution was cooled to a temperature of 30-40° C., 200 mL of water was added, and the solution was stratified. After washing twice with water, the toluene was concentrated, then 100 mL of n-hexane was added, followed by pulping. A target product 001 was obtained.

The structure of the target product 001 was tested by liquid chromatography-mass spectrometry, its LC-MS (m/z) (M+): theoretical value was 613.24, and its test value was 613.68.

Example 14: Synthesis of Compound 008

A compound 008 was synthesized with reference to the synthesis steps and reaction conditions in Example 13. By liquid chromatography-mass spectrometry, its LC-MS (m/z) (M+): theoretical value was 753.27, and its test value was 753.77.

Example 15: Synthesis of Compound 023

A compound 023 was synthesized with reference to the synthesis steps and reaction conditions in Example 13. By liquid chromatography-mass spectrometry, its LC-MS (m/z) (M+): theoretical value was 663.26, and its test value was 663.68.

Example 16: Synthesis of Compound 036

A compound 036 was synthesized with reference to the synthesis steps and reaction conditions in Example 13. By liquid chromatography-mass spectrometry, its LC-MS (m/z) (M+): theoretical value was 729.30, and its test value was 729.90.

Example 17: Synthesis of Compound 048

A compound 048 was synthesized with reference to the synthesis steps and reaction conditions in Example 13. By liquid chromatography-mass spectrometry, its LC-MS (m/z) (M+): theoretical value was 663.26, and its test value was 663.72.

Example 18: Synthesis of Compound 052

A compound 052 was synthesized with reference to the synthesis steps and reaction conditions in Example 13. By liquid chromatography-mass spectrometry, its LC-MS (m/z) (M+): theoretical value was 769.24, and its test value was 769.92.

Example 19: Synthesis of Compound 056

A compound 056 was synthesized with reference to the synthesis steps and reaction conditions in Example 13. By liquid chromatography-mass spectrometry, its LC-MS (m/z) (M+): theoretical value was 851.32, and its test value was 852.02.

Example 20: Synthesis of Compound 066

A compound 066 was synthesized with reference to the synthesis steps and reaction conditions in Example 13. By liquid chromatography-mass spectrometry, its LC-MS (m/z) (M+): theoretical value was 739.29, and its test value was 739.81.

Example 21: Synthesis of Compound 074

A compound 074 was synthesized with reference to the synthesis steps and reaction conditions in Example 13. By liquid chromatography-mass spectrometry, its LC-MS (m/z) (M+): theoretical value was 754.38, and its test value was 754.86.

Example 22: Synthesis of Compound 098

Synthesis Route:

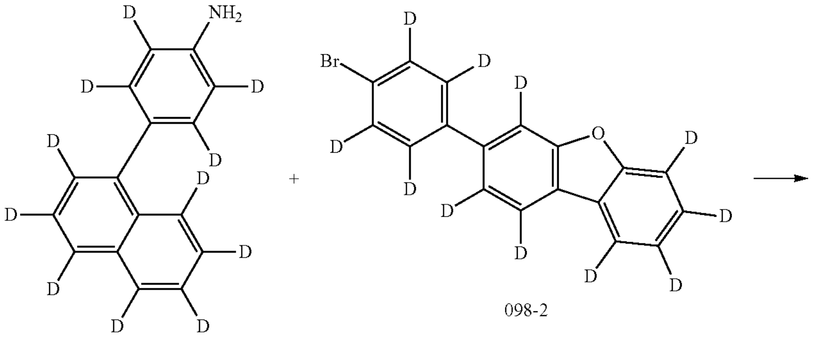

098-1 098-2

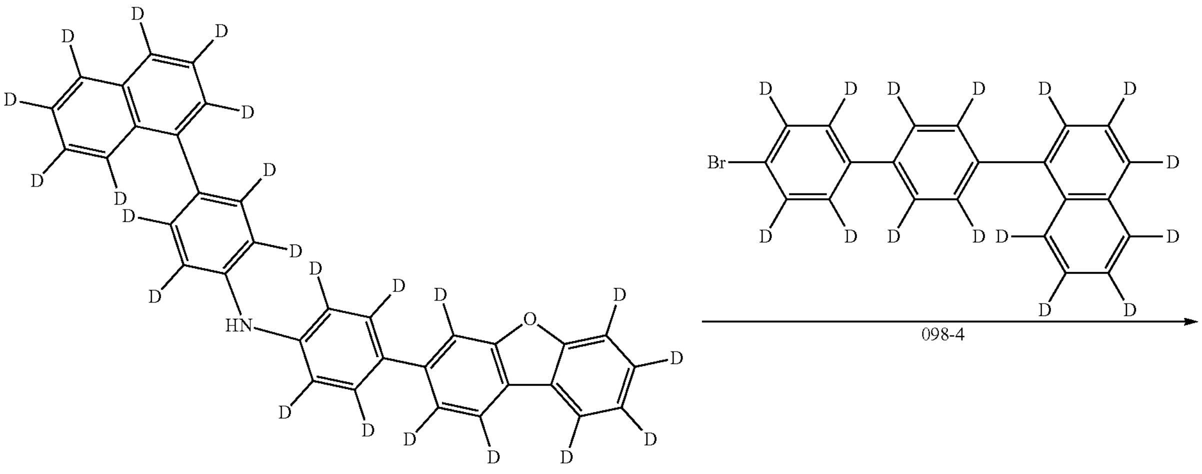

098-3 098-4

-continued

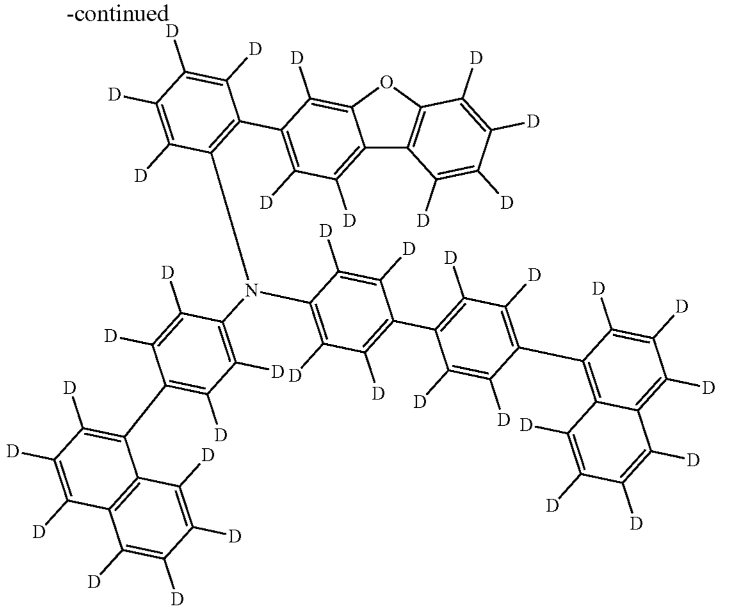

098

A compound 098 was synthesized with reference to the synthesis steps and reaction conditions in Example 13. By liquid chromatography-mass spectrometry, its LC-MS (m/z) (M+): theoretical value was 776.52, and its test value was 777.06.

Example 23: Synthesis of Compound 142

A compound 142 was synthesized with reference to the synthesis steps and reaction conditions in Example 13. By liquid chromatography-mass spectrometry, its LC-MS (m/z) (M+): theoretical value was 760.42, and its test value was 760.98.

Example 24: Synthesis of Compound 186

A compound 186 was synthesized with reference to the synthesis steps and reaction conditions in Example 13. By liquid chromatography-mass spectrometry, its LC-MS (m/z) (M+): theoretical value was 639.26, and its test value was 639.78.

Example 25: Synthesis of Compound 191

A compound 191 was synthesized with reference to the synthesis steps and reaction conditions in Example 13. By liquid chromatography-mass spectrometry, its LC-MS (m/z) (M+): theoretical value was 739.26, and its test value was 739.80.

Example 26: Synthesis of Compound 195

A compound 195 was synthesized with reference to the synthesis steps and reaction conditions in Example 13. By liquid chromatography-mass spectrometry, its LC-MS (m/z) (M+): theoretical value was 829.30, and its test value was 829.94.

Example 27: Synthesis of Compound 203

A compound 203 was synthesized with reference to the synthesis steps and reaction conditions in Example 13. By liquid chromatography-mass spectrometry, its LC-MS (m/z) (M+): theoretical value was 755.26, and its test value was 755.82.

Example 28: Synthesis of Compound 208

A compound 208 was synthesized with reference to the synthesis steps and reaction conditions in Example 13. By liquid chromatography-mass spectrometry, its LC-MS (m/z) (M+): theoretical value was 845.28, and its test value was 845.96.

Example 29: Synthesis of Compound 212

A compound 212 was synthesized with reference to the synthesis steps and reaction conditions in Example 13. By liquid chromatography-mass spectrometry, its LC-MS (m/z) (M+): theoretical value was 763.29, and its test value was 763.97.

Example 30: Synthesis of Compound 216

A compound 216 was synthesized with reference to the synthesis steps and reaction conditions in Example 13. By liquid chromatography-mass spectrometry, its LC-MS (m/z) (M+): theoretical value was 829.30, and its test value was 829.98.

The following are several application examples of the organic compounds described in the present disclosure applied in OLED devices, so as to further illustrate the beneficial effects of the compounds of the present disclosure. The materials used in the examples are purchased commercially or synthesized.

Manufacturing of OLED Device:

As a reference method for manufacturing a device in other examples, by a vacuum evaporation process, 50-500 nm of ITO/Ag/ITO was deposited on an alkali-free glass substrate to form an anode; then a hole injection layer (5-20 nm), a hole transport layer (50-120 nm), a light-emitting auxiliary layer (5-120 nm), a light-emitting layer (20-50 nm), an electron transport layer (20-80 nm), and an electron injection layer (1-10 nm) were deposited on the anode in sequence; then Mg and Ag (weight ratio 10:1, 10-50 nm) were co-deposited to form a semi-transparent cathode, and the compound was deposited as a covering.layer Finally, the light-emitting device was packaged using an epoxy resin adhesive in a nitrogen atmosphere.

In a preferred example, the structure of the OLED device according to the present disclosure was formed as follows: the alkali-free glass substrate was first washed with isopropanol using an ultrasonic cleaner for 15 minutes, and then washed with UV ozone in air for 30 minutes. Various layers were deposited on the treated substrate by vacuum evaporation, namely, 100 nm of ITO/Ag/ITO was deposited to form an anode; then a hole injection layer (HT:PD, 10 nm, 2%), a hole transport layer (HT, 30 nm), a light-emitting auxiliary layer (compound 001, 5 nm), a blue light-emitting layer (host material:doping material=BH1:BD1 (weight ratio 98:2, 30 nm), an electron transport layer (compound E003:Liq=1:1, 30 nm), and an electron injection layer (Yb, 1 nm) were sequentially stacked and deposited on the anode; Mg and Ag (weight ratio 10:1, 15 nm) were co-deposited to form a semi-transparent cathode, and a compound CPL (65 nm) was deposited as a covering layer. Finally, the light-emitting device was packaged using an epoxy resin adhesive in a nitrogen atmosphere, referred to as Application Example 1. The molecular structural formulas of the relevant materials are shown as follows (preferably selected from the following structures, but not limited to the following structures in the present disclosure):

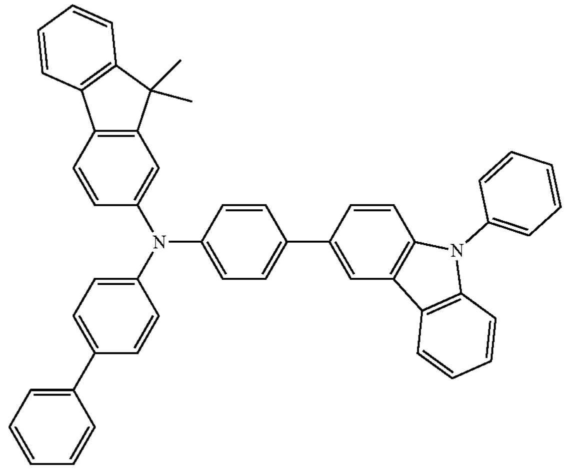

HT

-continued

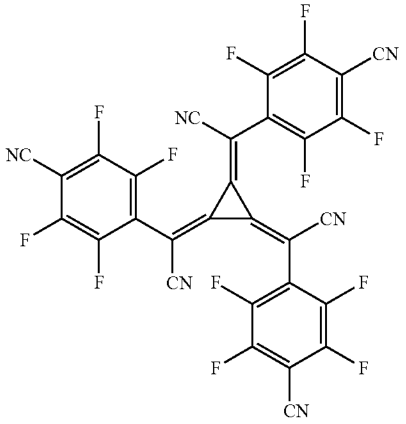

PD

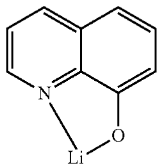

Liq

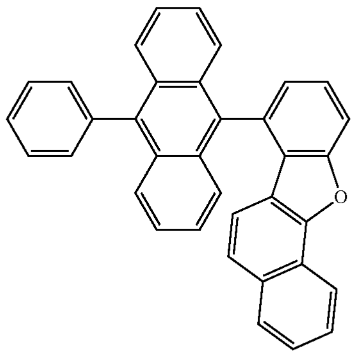

BH

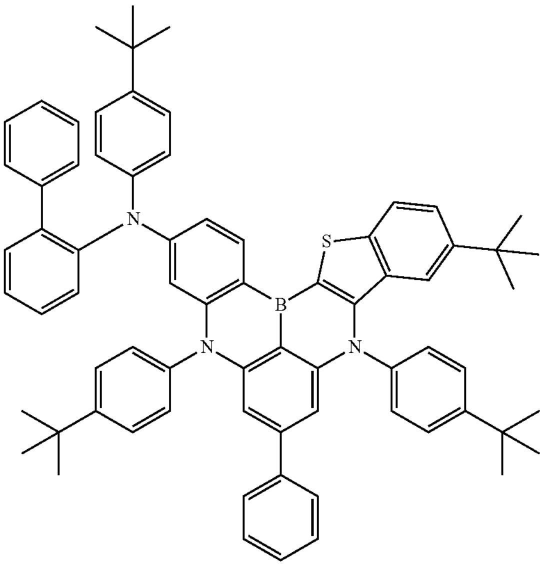

BD

-continued

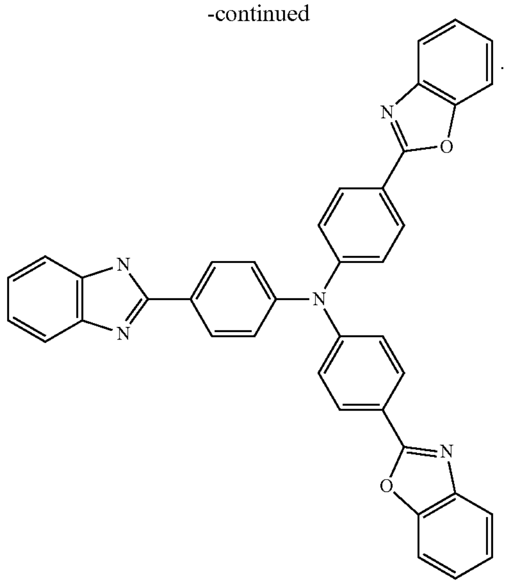

CPL

OLED devices in Application Examples 2 to 20 and Comparative Example 1 were manufactured with reference to the method provided in Application Example 1, only except that the compounds listed in Table 1 were used as light-emitting auxiliary materials instead of compound 001 in Application Example 1. A Ref-1 used in the comparative examples has a structure as follows:

Ref-1

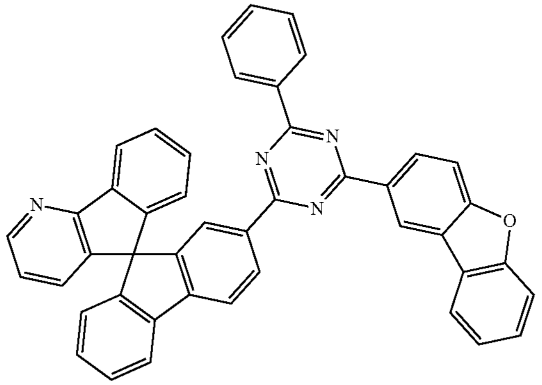

Evaluation on Performances of OLED Devices:

Current of each OLED device at different voltages was tested with a Keithley 2365 A digital nanovoltmeter, and then the current was divided by the light-emitting area to obtain current densities of the OLED device at different voltages. The brightness and radiation energy flux densities of the OLED device at different voltages were tested with a Konicaminolta CS-2000 spectrophotometer. Working voltage Volt and current efficiency (cd/A) at the same current density (10 mA/$cm^2$) were obtained based on the current densities and brightness of the OLED device at different voltages. BI=E/CIEy refers to a Blue Index in blue light, which is also a parameter for measuring the luminous efficiency of blue light, where E represents current efficiency, and CIEy represents an ordinate color point obtained by inputting a light-emitting half peak width wavelength of the device into CIE1930 software. The test data is shown in Table 1.

TABLE 1

Electron transport materials and electronoluminescence characteristics of devices in application examples

| Examples of devices | Light-emitting auxiliary materials | Electron transport materials | Volt (V) | BI (cd/A/ CIEy) | LT95 (hrs) |
|---|---|---|---|---|---|
| Application Example 1 | Compound 001 | Compound E003 | 3.30 | 232.5 | 125 |
| Application Example 2 | Compound 001 | Compound E018 | 3.34 | 227.9 | 122 |
| Application Example 3 | Compound 001 | Compound E026 | 3.28 | 234.1 | 128 |
| Application Example 4 | Compound 001 | Compound E042 | 3.31 | 229.6 | 123 |
| Application Example 5 | Compound 001 | Compound E047 | 3.33 | 227.5 | 129 |
| Application Example 6 | Compound 001 | Compound E077 | 3.32 | 230.7 | 126 |
| Application Example 7 | Compound 001 | Compound E123 | 3.29 | 233.3 | 130 |
| Application Example 8 | Compound 001 | Compound E129 | 3.31 | 234.0 | 131 |
| Application Example 9 | Compound 001 | Compound E138 | 3.30 | 233.4 | 133 |
| Application Example 10 | Compound 001 | Compound E149 | 3.31 | 229.2 | 123 |
| Application Example 11 | Compound 001 | Compound E181 | 3.35 | 231.6 | 121 |
| Application Example 12 | Compound 001 | Compound E205 | 3.28 | 234.9 | 122 |
| Comparative Example 1 | Compound 001 | Ref-1 | 3.50 | 210.3 | 105 |

It can be seen from Table 1 that, compared to Comparative Example 1, the OLED devices in Application Examples 1 to 12 have lower working voltage, higher BI luminous efficiency and longer service life. The improvement on the performance in each application example is based on better thermal stability and auxiliary transport capability of the organic compound materials in the present disclosure.

In order to further verify the excellent performance of the organic compound according to the present disclosure, OLED devices in Application Examples 13 to 33 and Comparative Examples 2 and 3 were manufactured with reference to the method provided in Application Example 1, only except that the compounds listed in Table 2 were used instead of compound E003 and compound 001 in Application Example 1. A structure of new materials involved in the comparative examples in Table 2 is as follows:

Ref-2

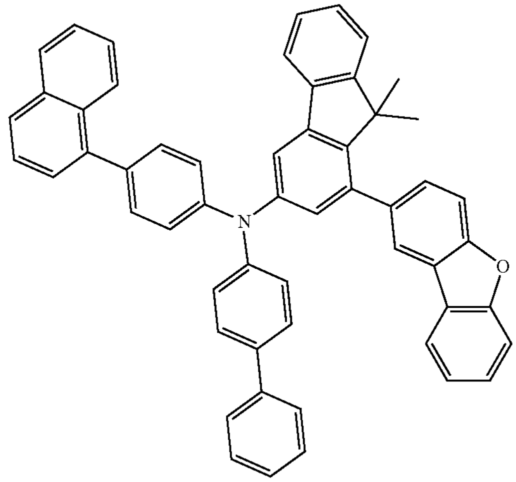

TABLE 2

| Combined materials and electronoluminescence characteristics of devices in application examples | | | | | |
|---|---|---|---|---|---|
| Examples of devices | Light-emitting auxiliary materials | Electron transport materials | Volt (V) | BI (cd/A/ CIEy) | LT95 (hrs) |
| Application Example 13 | Compound 008 | Compound E018 | 3.32 | 229.9 | 126 |
| Application Example 14 | Compound 023 | Compound E026 | 3.30 | 232.6 | 129 |
| Application Example 15 | Compound 036 | Compound E026 | 3.31 | 230.3 | 127 |
| Application Example 16 | Compound 048 | Compound E042 | 3.33 | 228.9 | 127 |
| Application Example 17 | Compound 052 | Compound E042 | 3.30 | 229.0 | 125 |
| Application Example 18 | Compound 056 | Compound E047 | 3.29 | 230.8 | 126 |
| Application Example 19 | Compound 066 | Compound E047 | 3.28 | 231.0 | 124 |
| Application Example 20 | Compound 074 | Compound E077 | 3.27 | 233.1 | 137 |
| Application Example 21 | Compound 098 | Compound E123 | 3.27 | 234.2 | 139 |
| Application Example 22 | Compound 142 | Compound E129 | 3.29 | 234.7 | 140 |
| Application Example 23 | Compound 186 | Compound E138 | 3.32 | 231.3 | 125 |
| Application Example 24 | Compound 191 | Compound E149 | 3.30 | 232.0 | 127 |
| Application Example 25 | Compound 195 | Compound E181 | 3.31 | 232.7 | 129 |
| Application Example 26 | Compound 203 | Compound E205 | 3.29 | 231.6 | 126 |
| Application Example 27 | Compound 208 | Compound E077 | 3.32 | 231.5 | 130 |
| Application Example 28 | Compound 212 | Compound E123 | 3.28 | 232.9 | 128 |
| Application Example 29 | Compound 216 | Compound E129 | 3.30 | 232.4 | 131 |
| Application Example 30 | Compound 023 | Compound E138 | 3.34 | 232.3 | 136 |
| Application Example 31 | Compound 066 | Compound E149 | 3.26 | 232.4 | 125 |
| Application Example 32 | Compound 098 | Compound E181 | 3.29 | 233.8 | 130 |
| Application Example 33 | Compound 142 | Compound E205 | 3.29 | 235.0 | 133 |
| Comparative Example 2 | Ref-2 | Compound E003 | 3.52 | 213.3 | 108 |

TABLE 2-continued

| Combined materials and electronoluminescence characteristics of devices in application examples | | | | | |
|---|---|---|---|---|---|
| Examples of devices | Light-emitting auxiliary materials | Electron transport materials | Volt (V) | BI (cd/A/ CIEy) | LT95 (hrs) |
| Comparative Example 3 | Ref-2 | Ref-1 | 3.55 | 208.4 | 102 |

It can be seen from Table 2 that, compared to Comparative Examples 2 and 3, the OLED devices in Application Examples 13 to 33 have lower working voltage, higher BI luminous efficiency and longer service life. The improvement on the performances in each application example is based on better charge transport capability of the organic compound materials in the present disclosure. Hence, the combination of the light-emitting auxiliary material and the electron transport material in the present disclosure can be more advantageous to achieve the balance of electron and hole transport and exciton conversion in the blue light-emitting layer, to reduce the power consumption of the device, to prolong the service life of the device, and to improve the luminous efficiency of the device.

The specific embodiments are merely to explain the present invention and do not limit the present invention. After reading the description, those skilled in the art can make any amendments or modifications to the embodiments as needed without creative efforts, but these modifications are protected by the Patent Law as long as they fall into the scope of the claims of the present disclosure.

What is claimed is:

1. An organic electroluminescent device, comprising:

a substrate;

a first electrode on the substrate;

an organic light-emitting functional layer on the first electrode; and a second electrode on the organic light-emitting functional layer;

wherein the organic light-emitting functional layer comprises an electron transport layer;

the electronic transport layer comprises an organic compound selected from any one of the following chemical structures:

E001

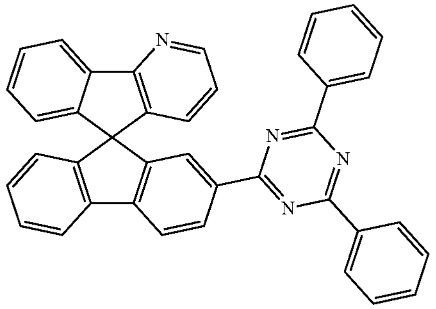

-continued
E002
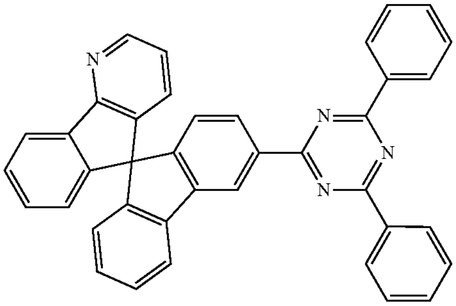
E003
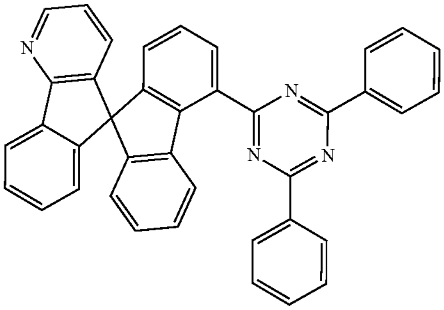
E004
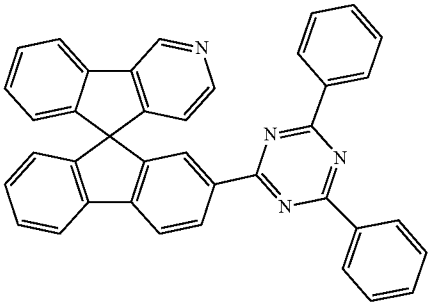
E005
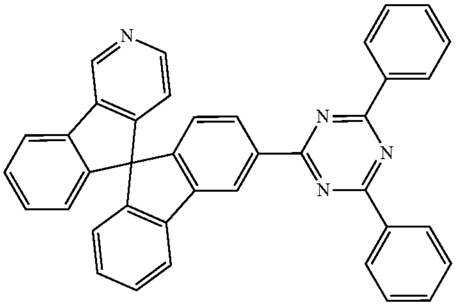
E006
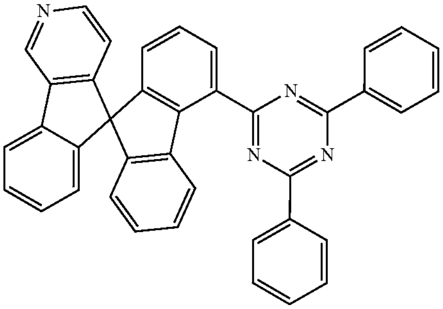
-continued
E007
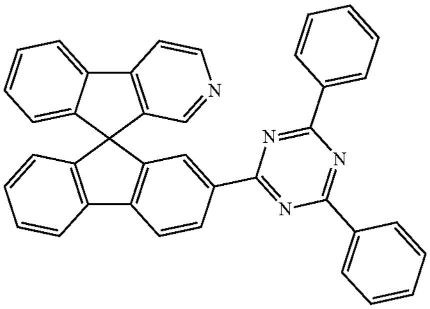
E008
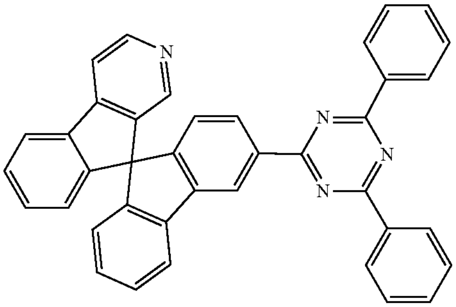
E009
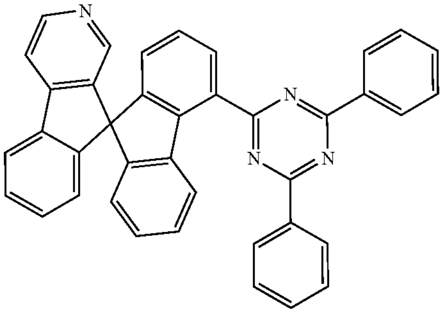
E010
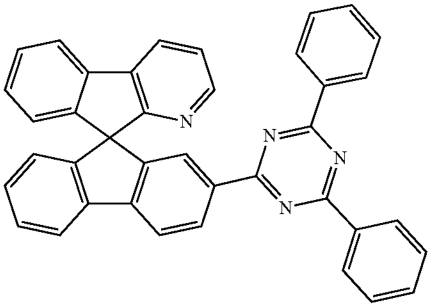
E011
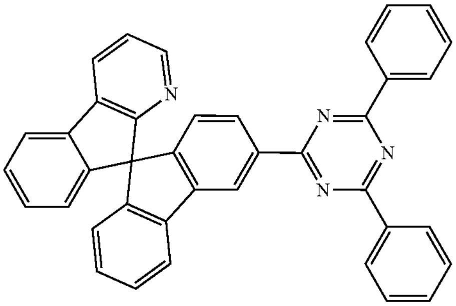

E012
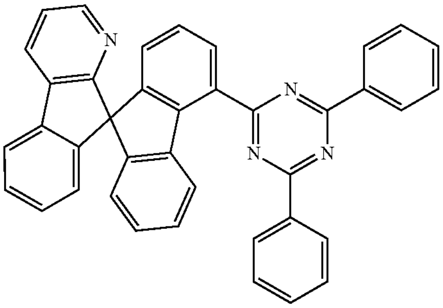
E013
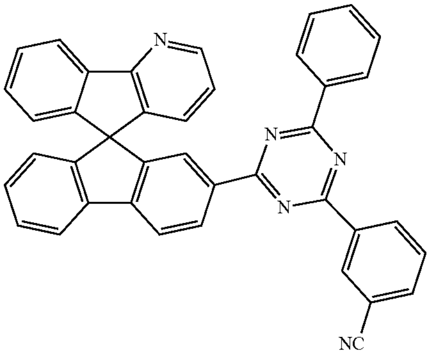
E014
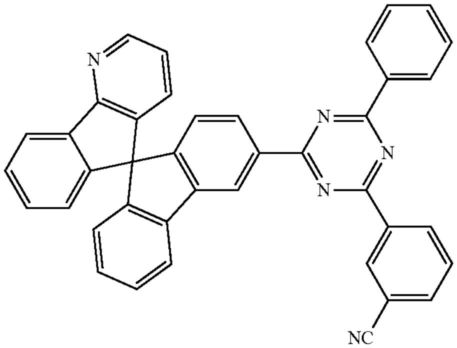
E015
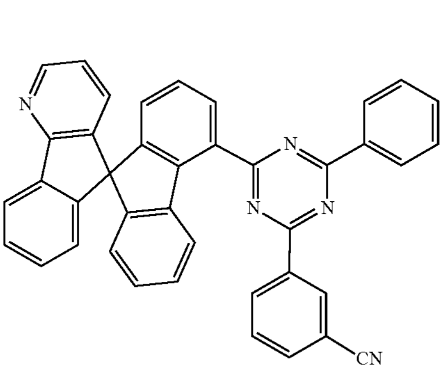
E016
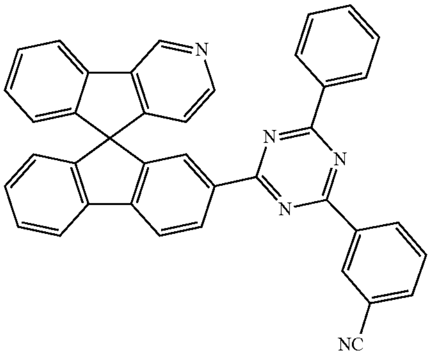
E017
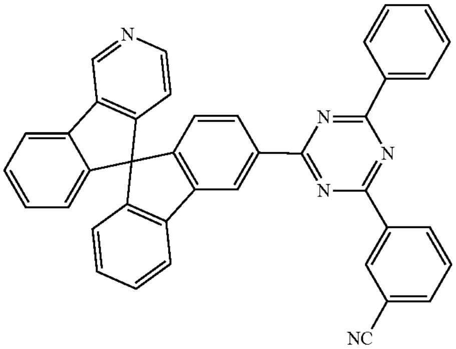
E018
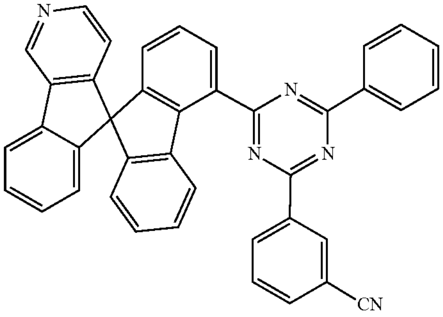
E019
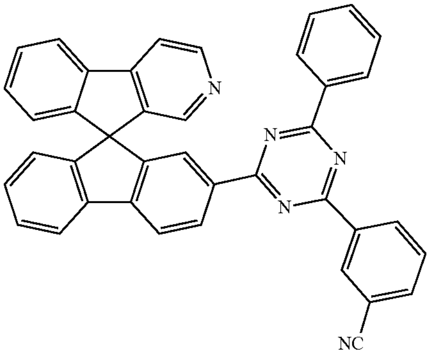

-continued
E020
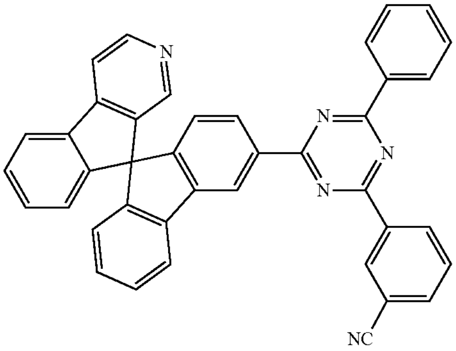
E021
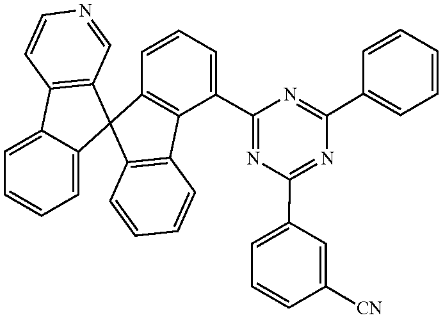
E022
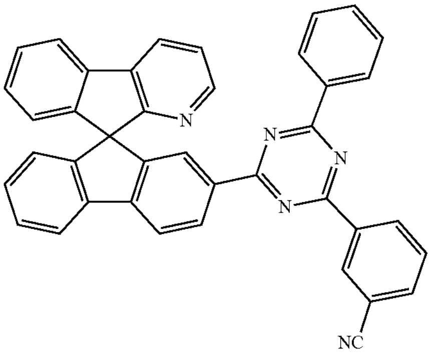
E023
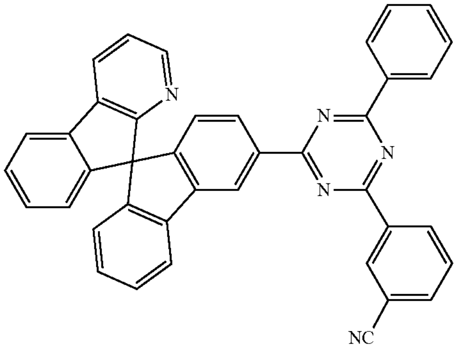
-continued
E024
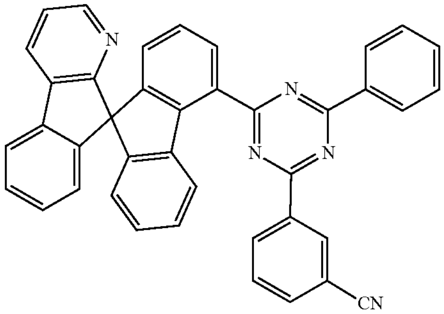
E025
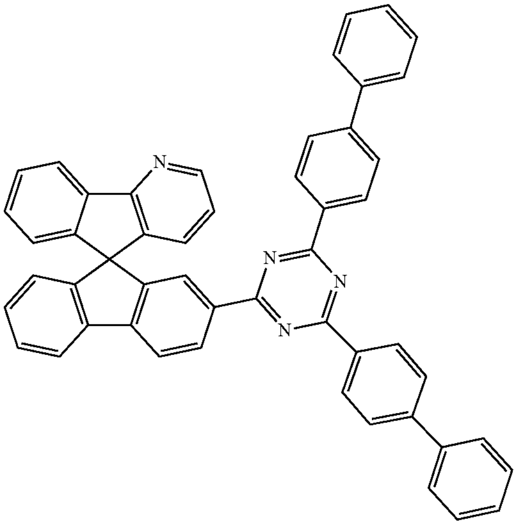
E026
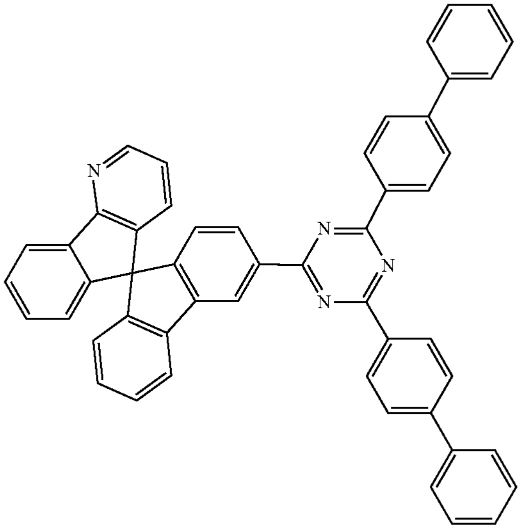

-continued
E027
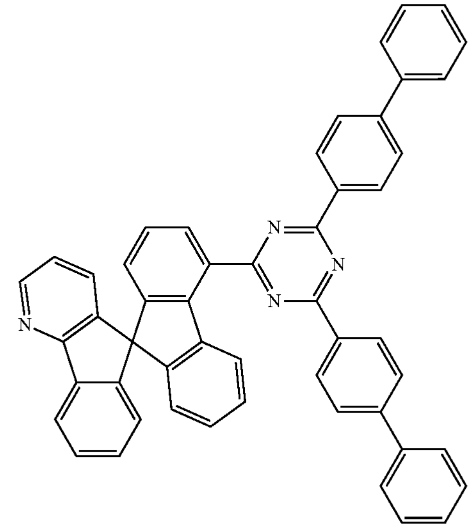
E028
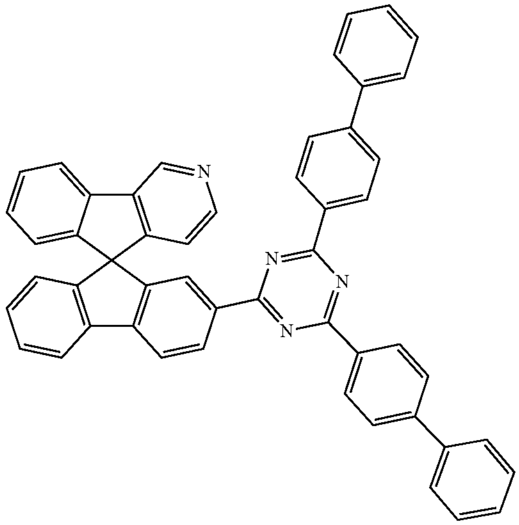
E029
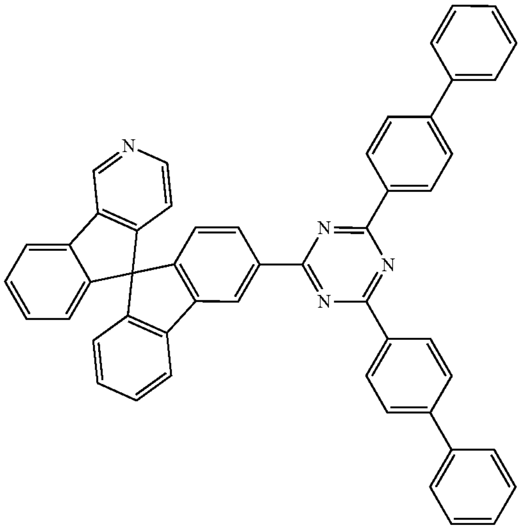
-continued
E030
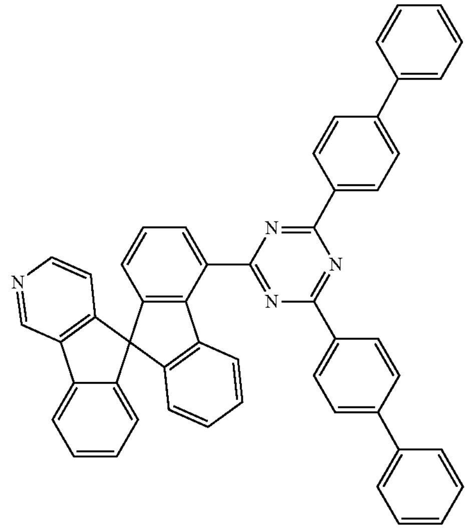
E031
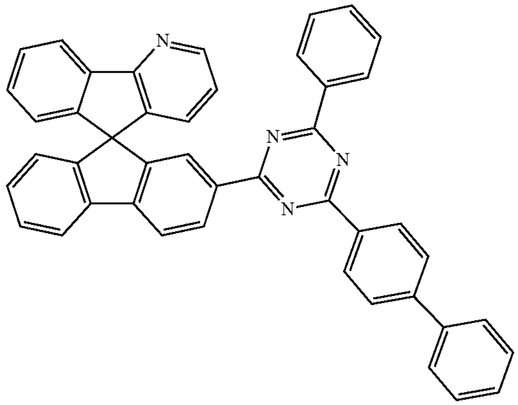
E032
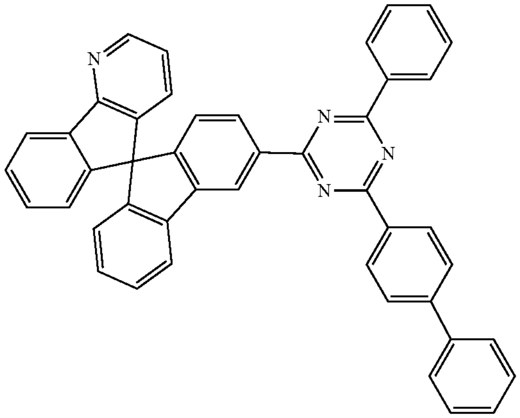

-continued
E033
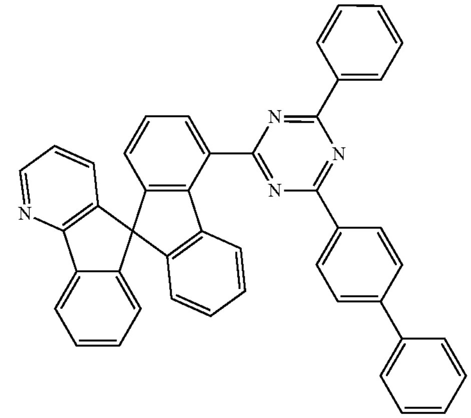
E034
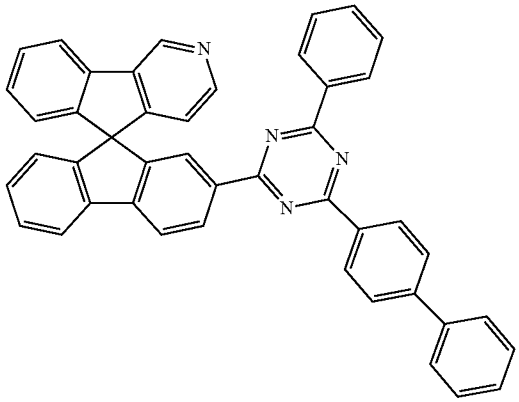
E035
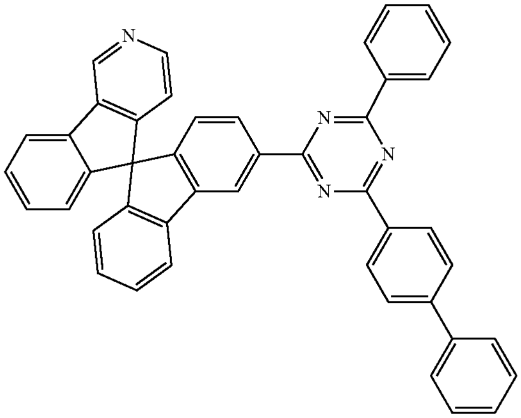
-continued
E036
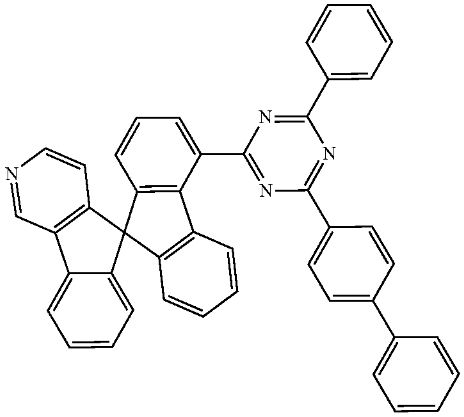
E037
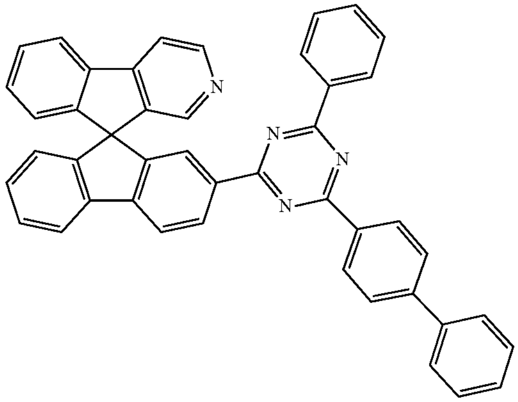
E038
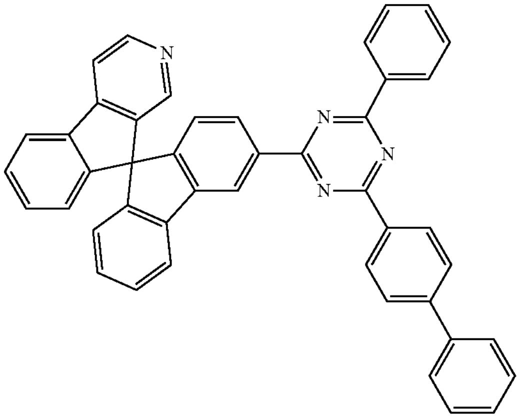

-continued
E039
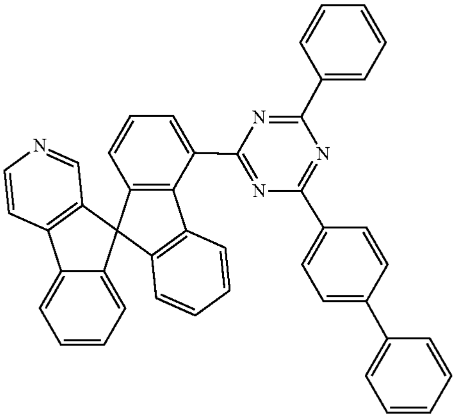
E040
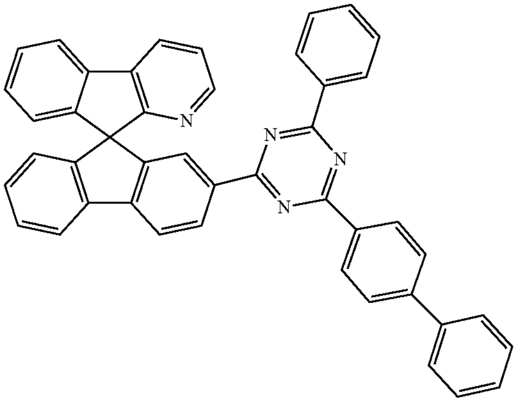
E041
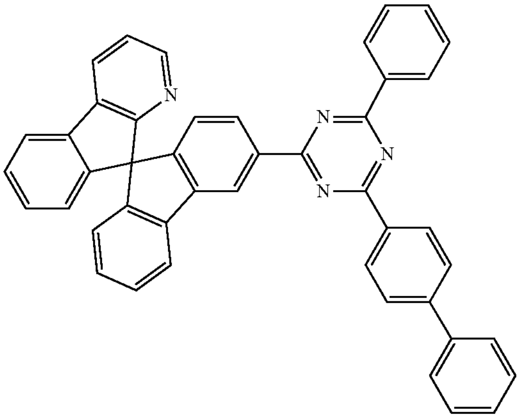
-continued
E042
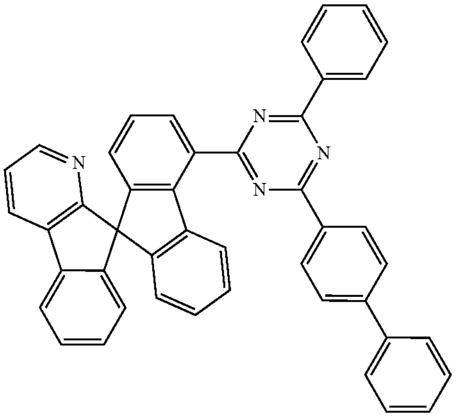
E043
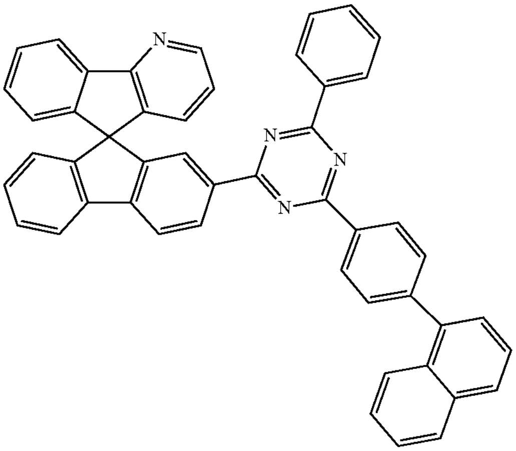
E044
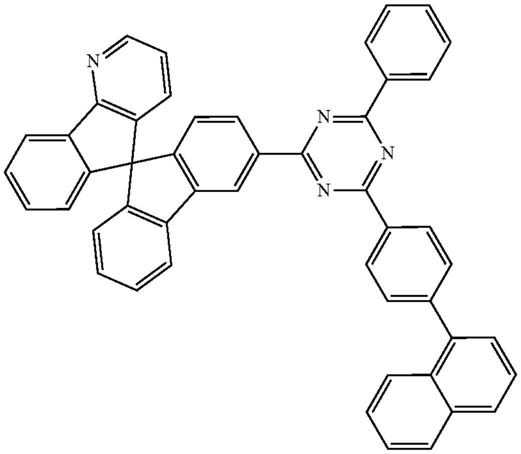

-continued
E045
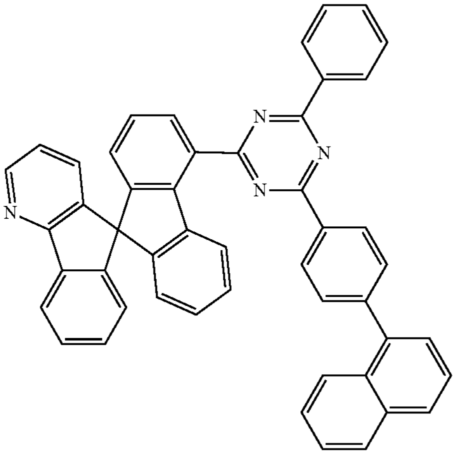
E046
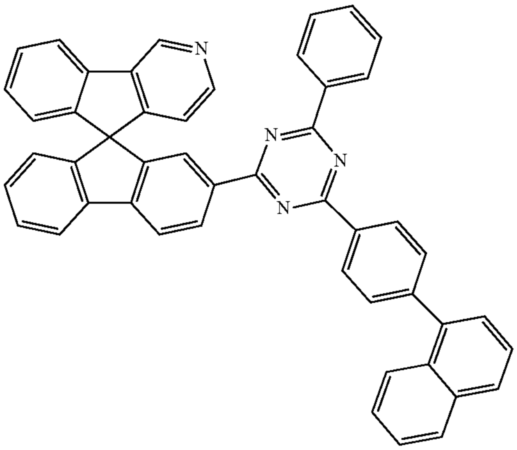
E047
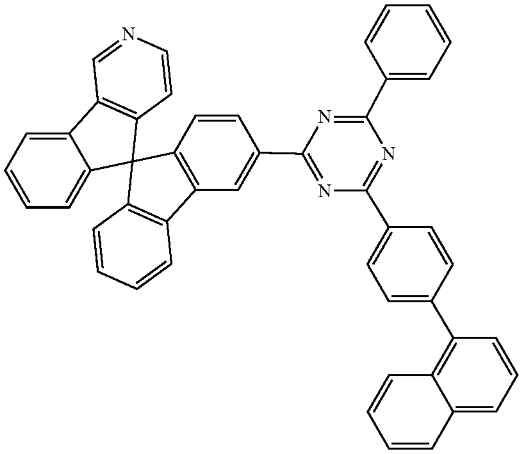
-continued
E048
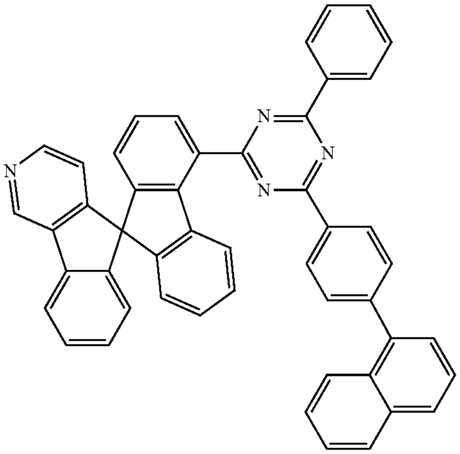
E049
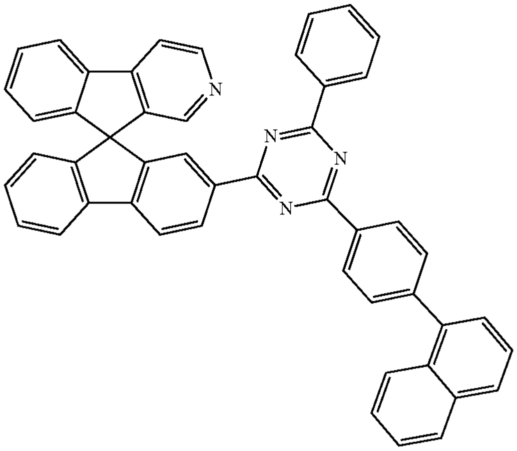
E050
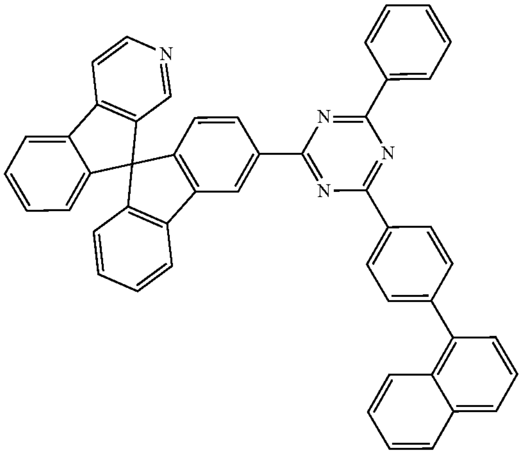

-continued
E051
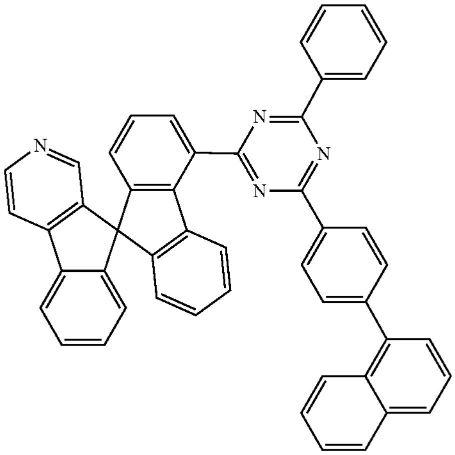
E052
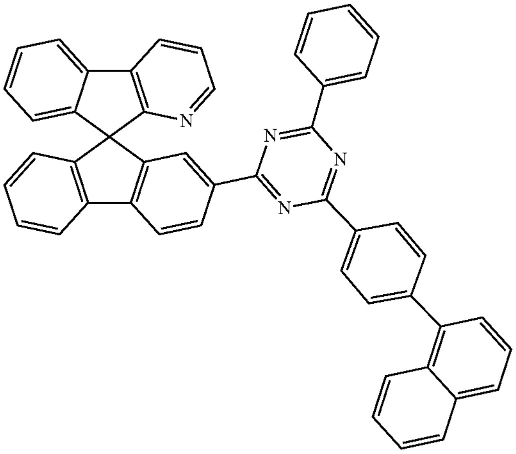
E053
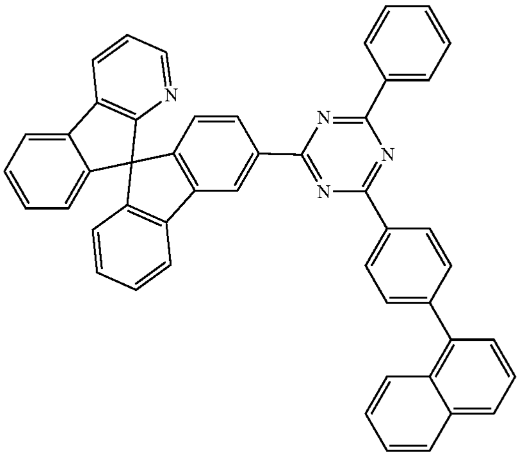
-continued
E054
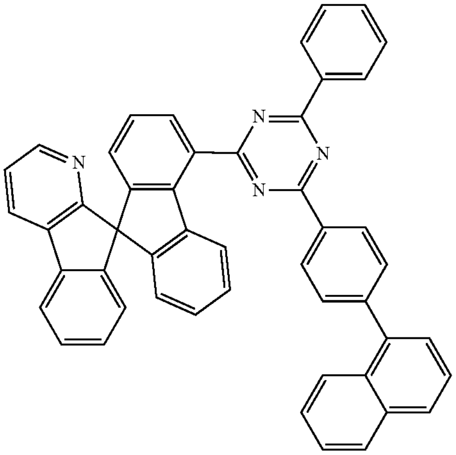
E055
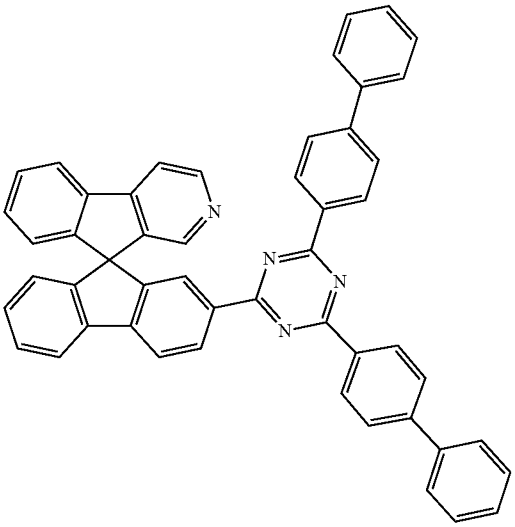
E056
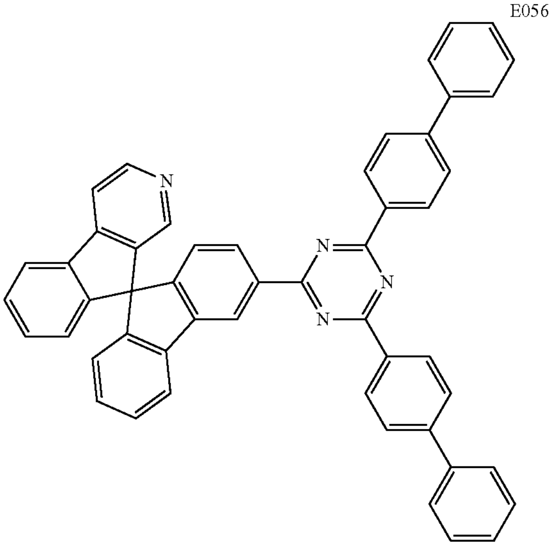

-continued
E057
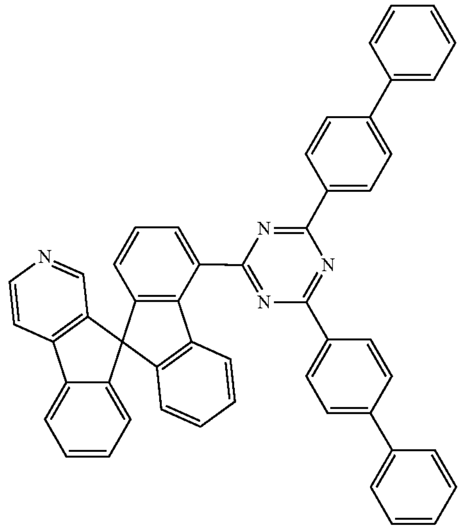
E058
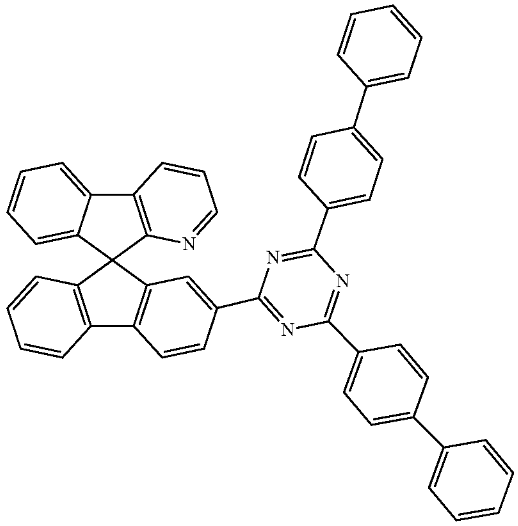
E059
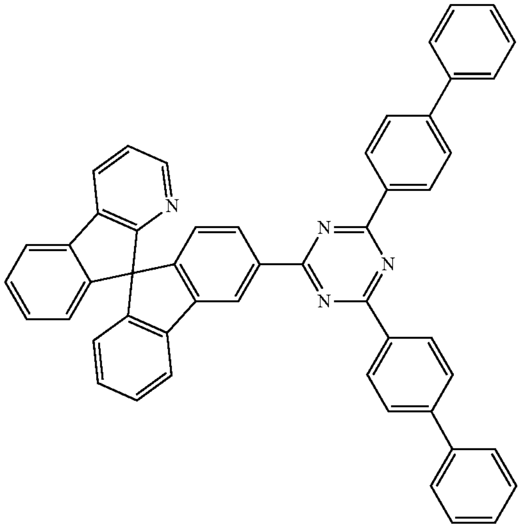
-continued
E060
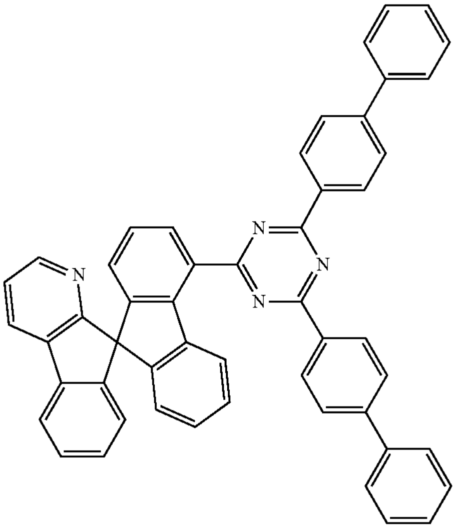
E061
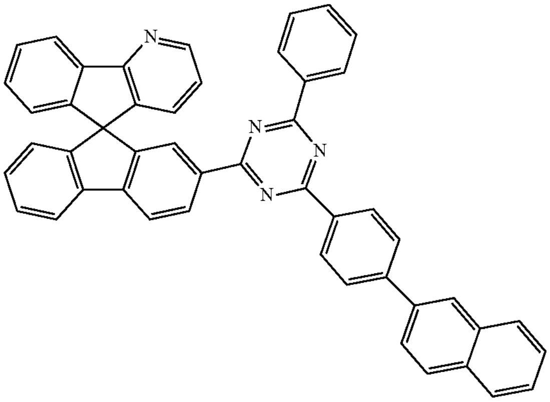
E062
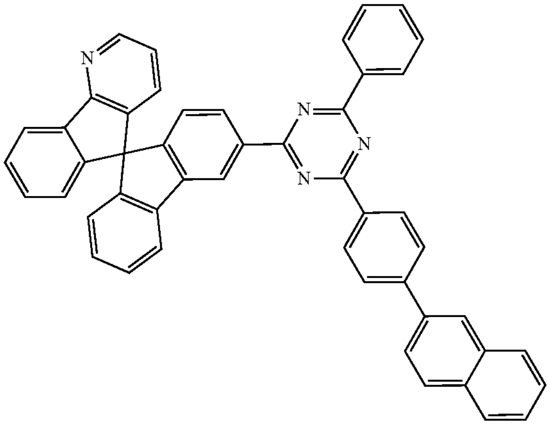

-continued
E063
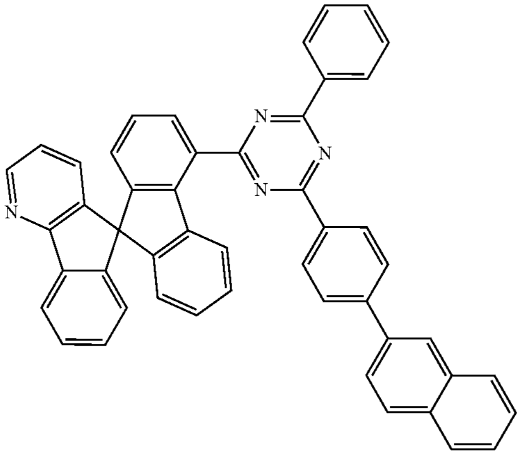
E064
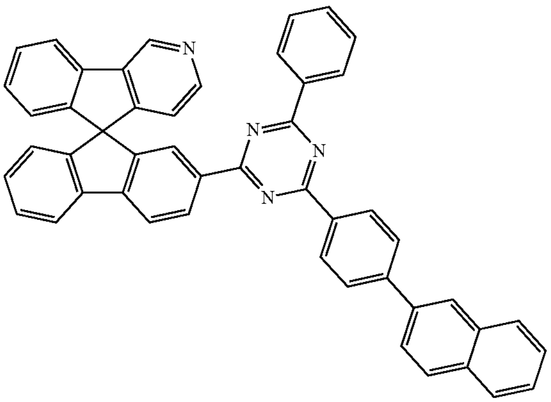
E065
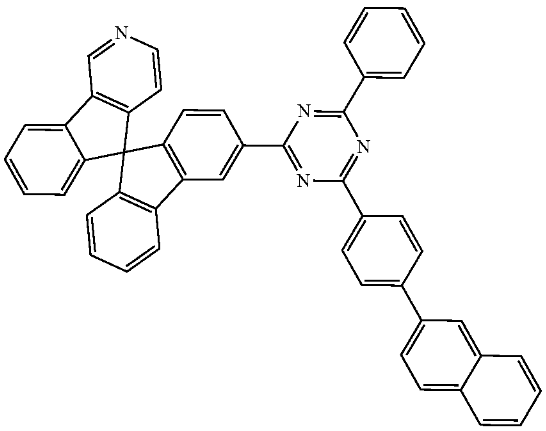
-continued
E066
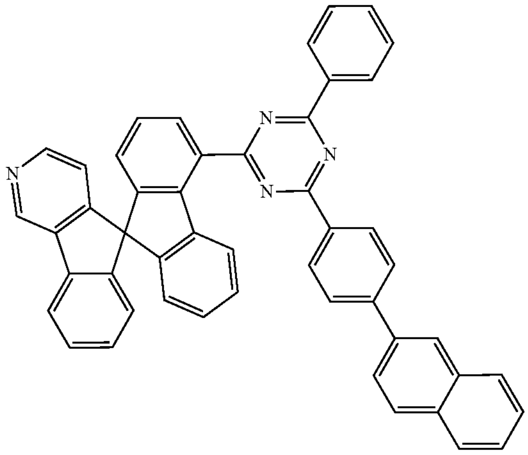
E067
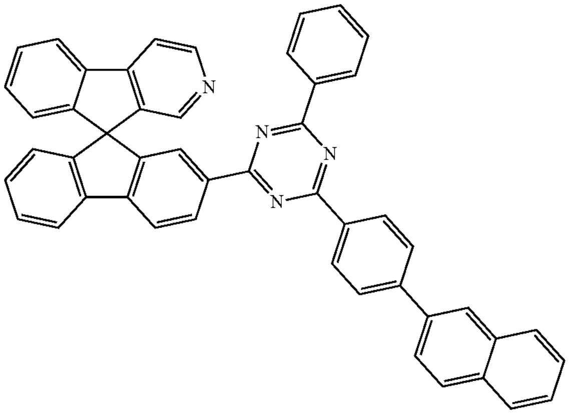
E068
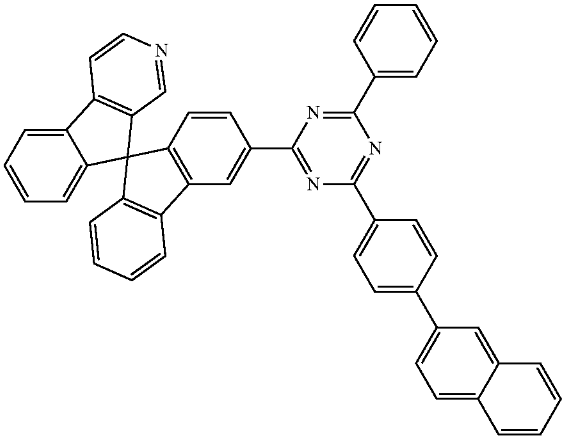

-continued
E069
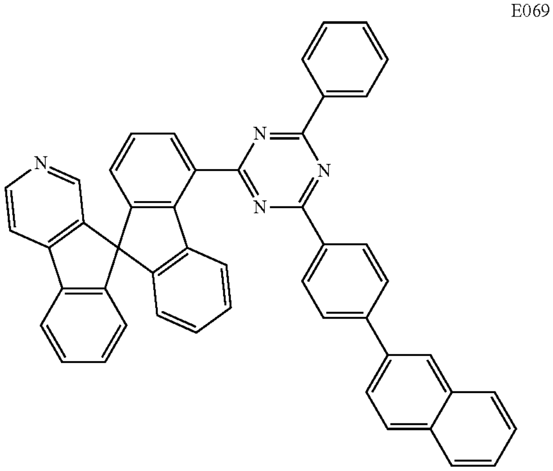
E070
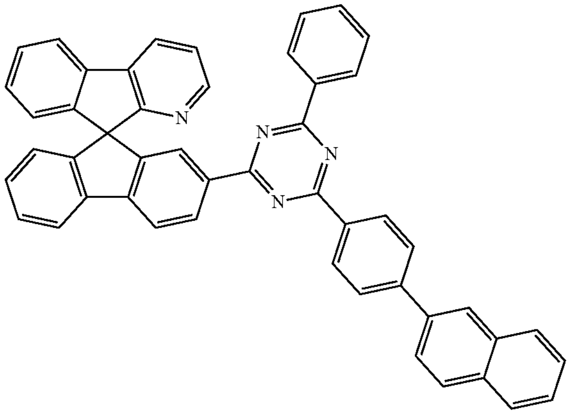
E071
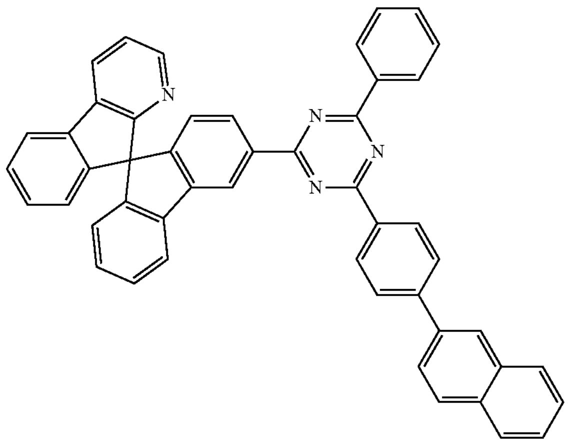
-continued
E072
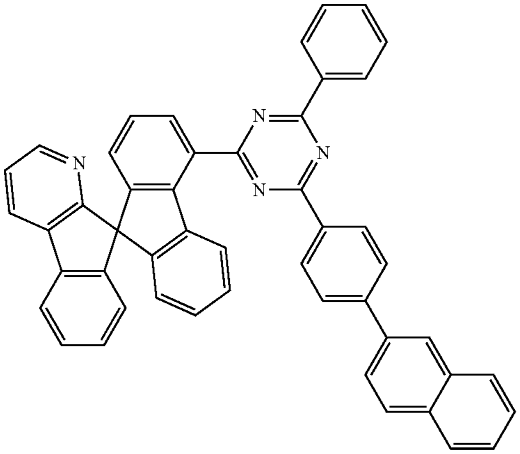
E073
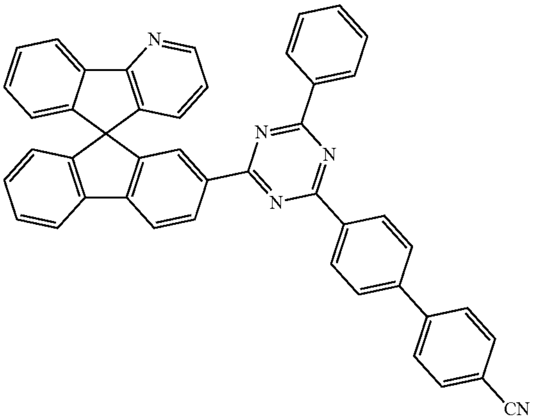
E074
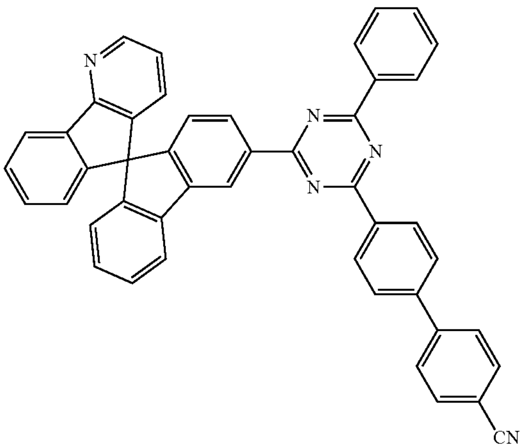

-continued
E075
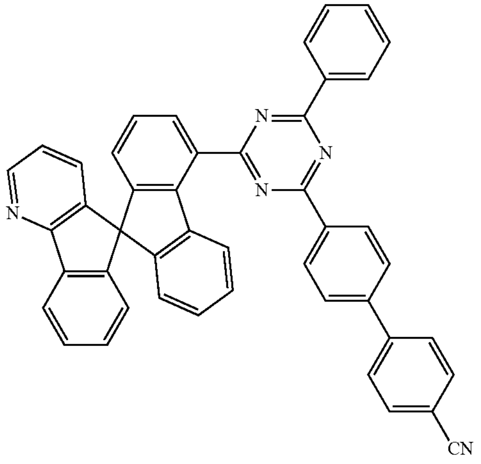
E076
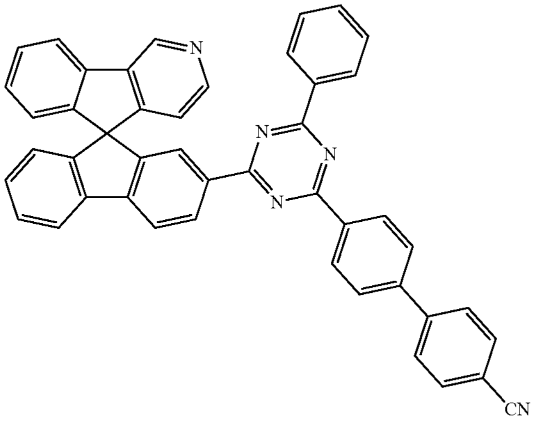
E077
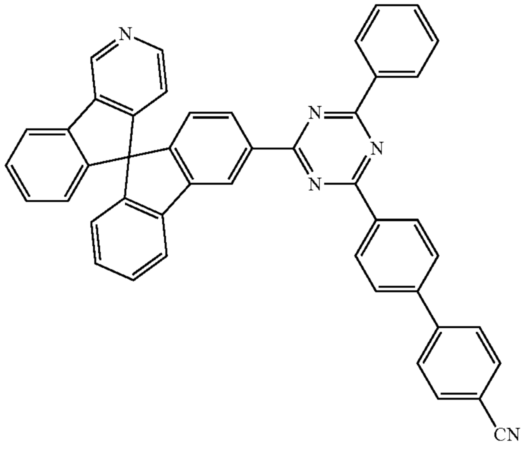
-continued
E078
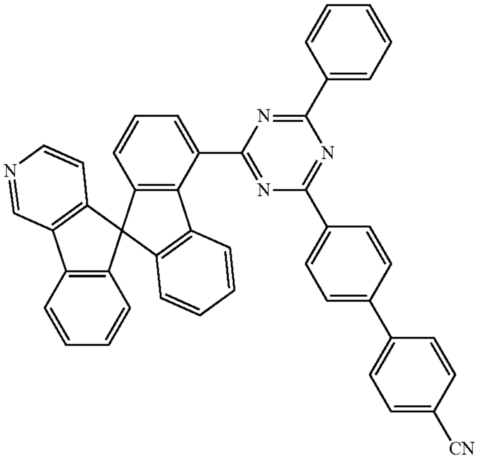
E079
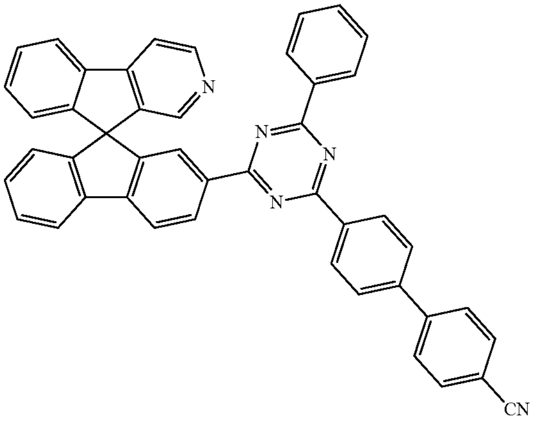
E080
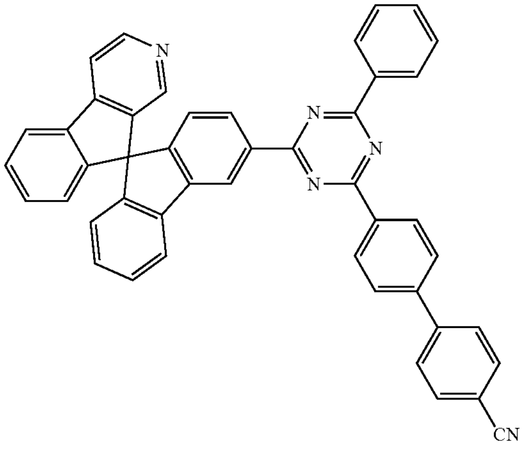

-continued
E081
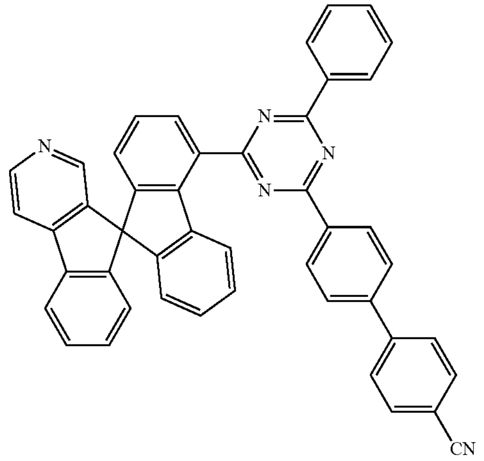
E079
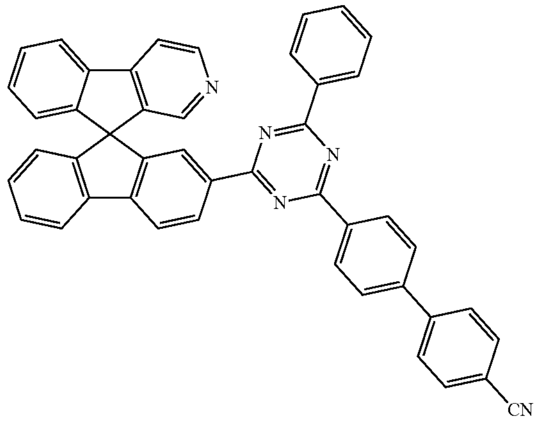
E080
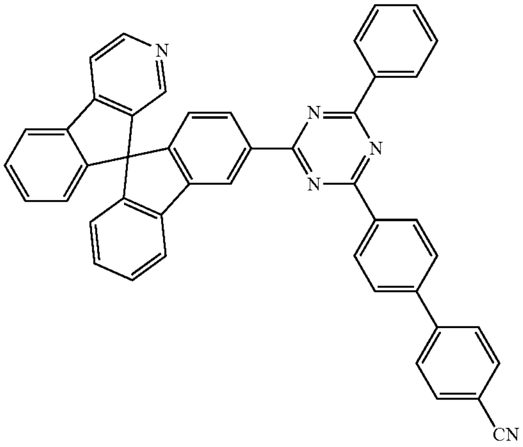
-continued
E081
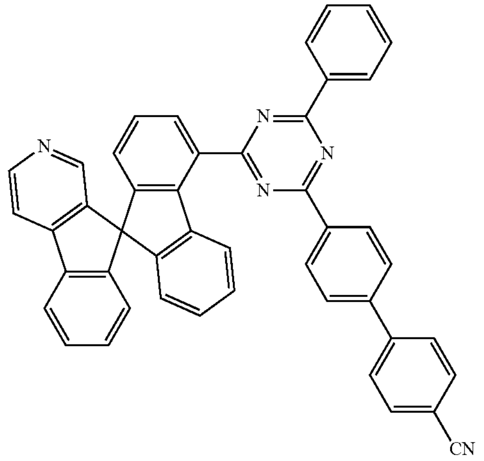
E082
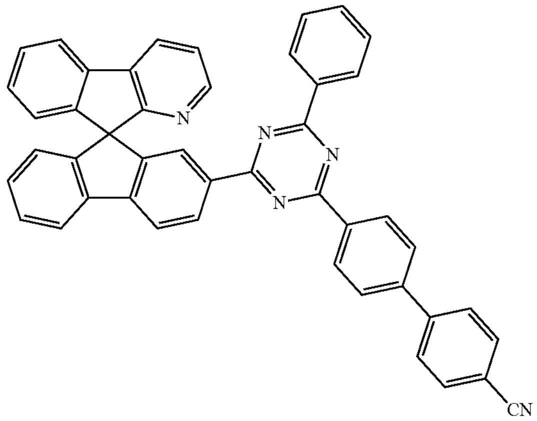
E083
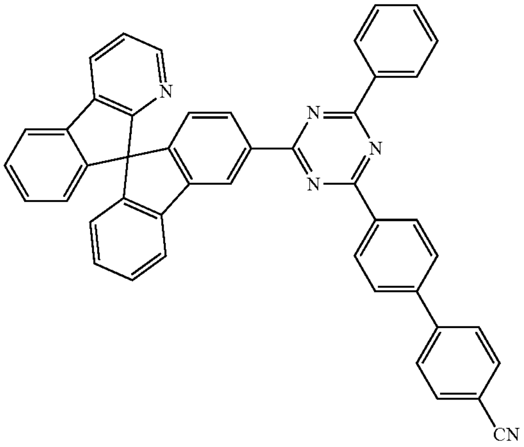

-continued
E084
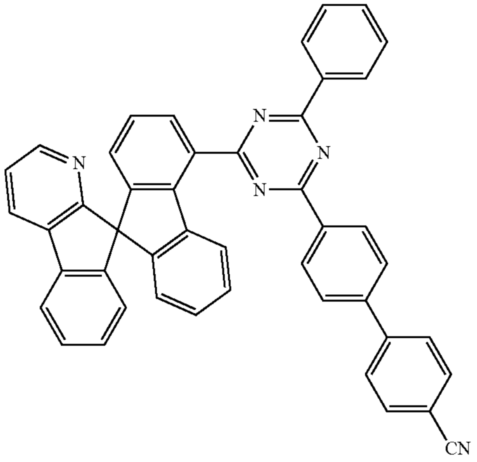
E090
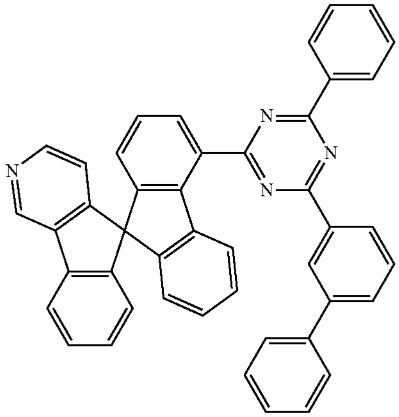
E088
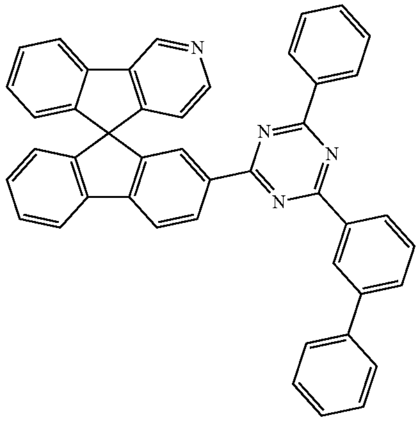
E091
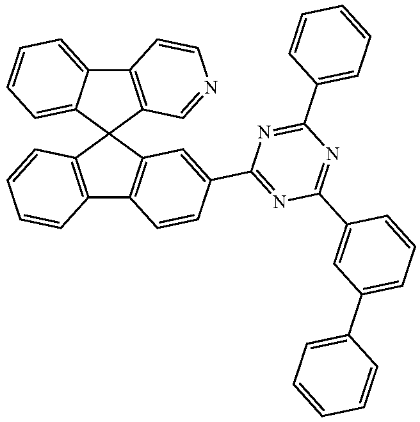
E089
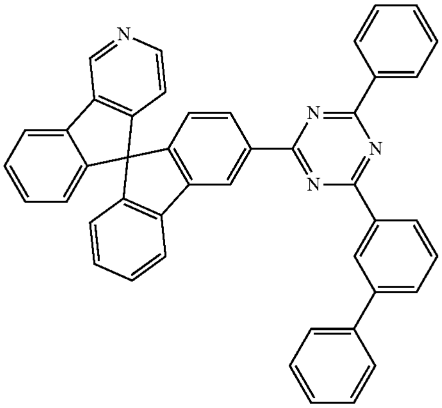
E092
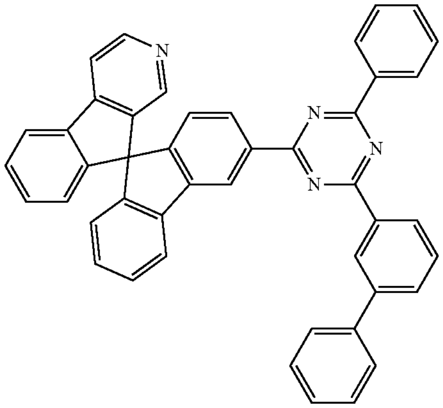

-continued
E093
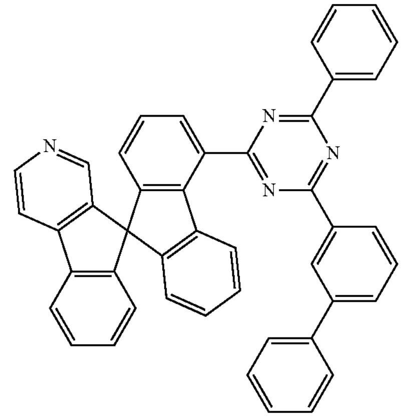
E094
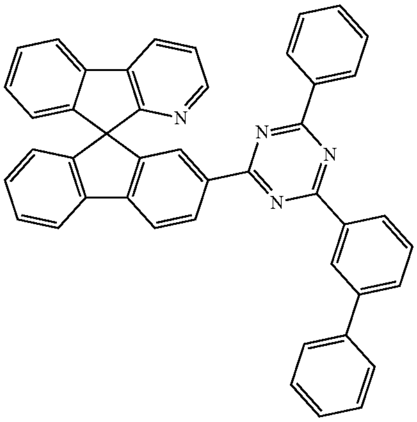
E095
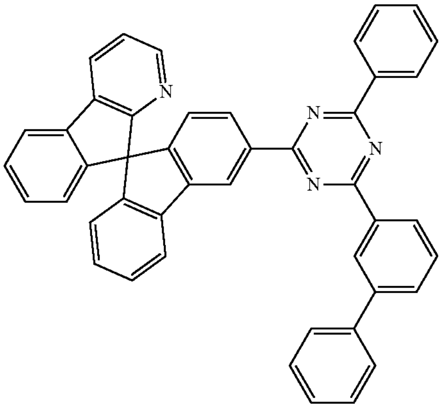
-continued
E096
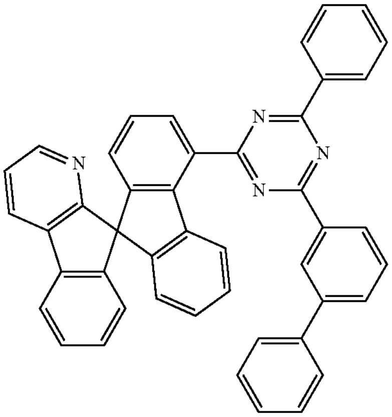
E097
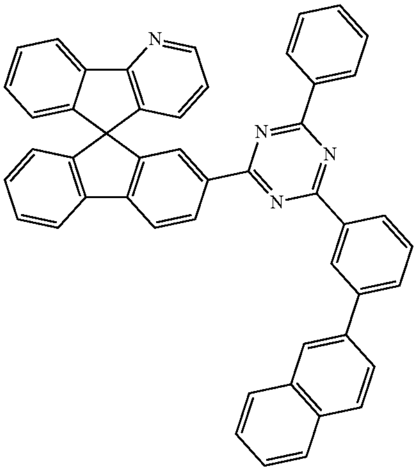
E098
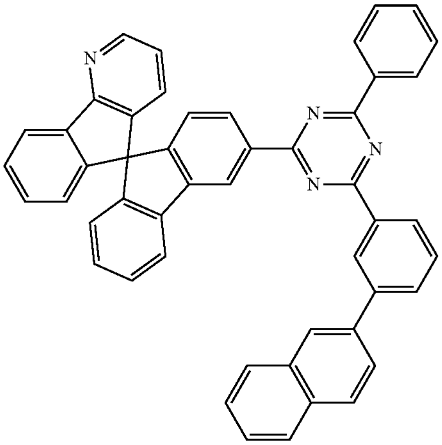

-continued
E099
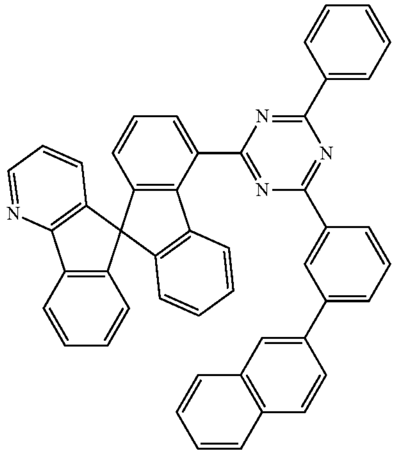
E100
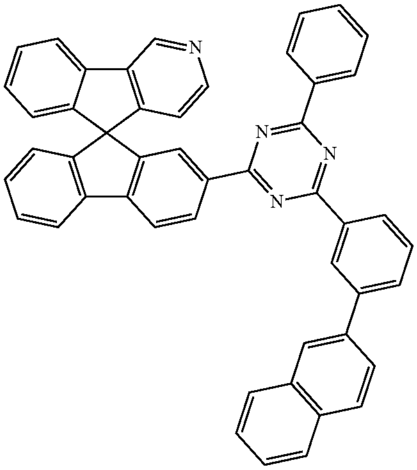
E101
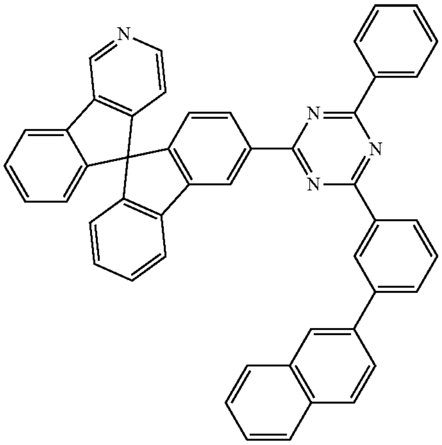
-continued
E102
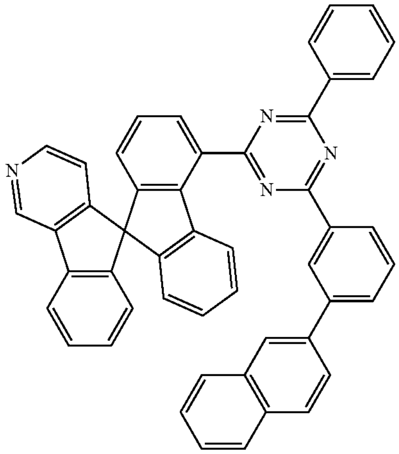
E103
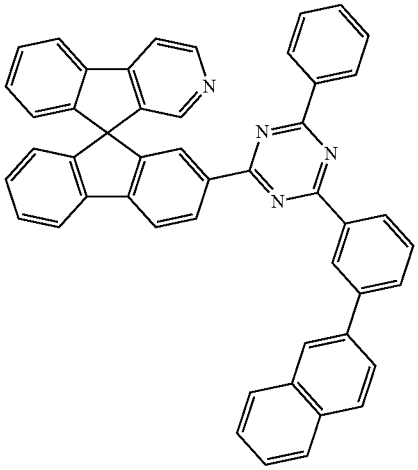
E104
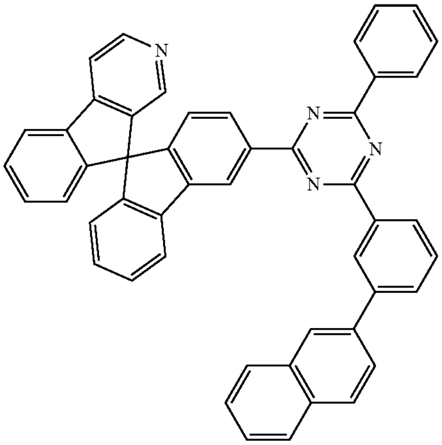

-continued
E105
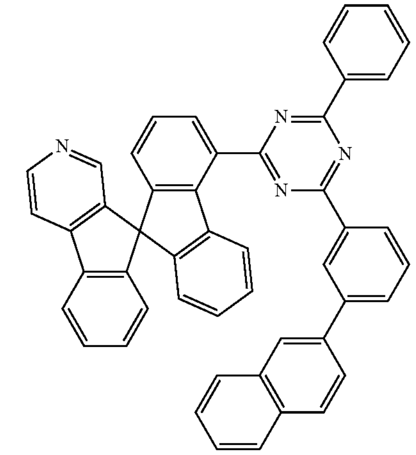
E106
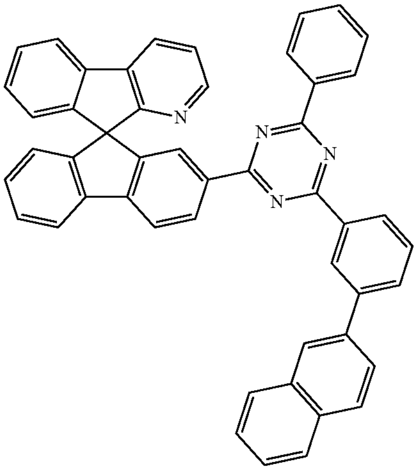
E107
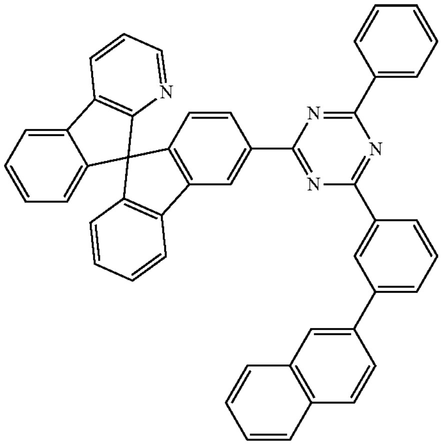
-continued
E108
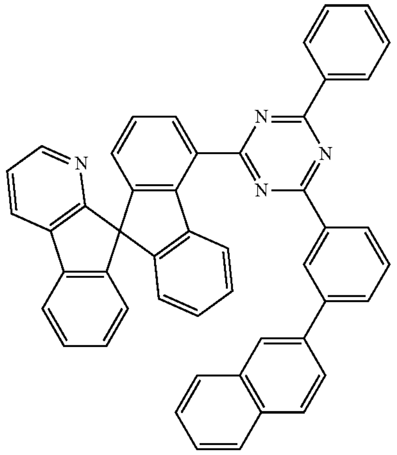
E109
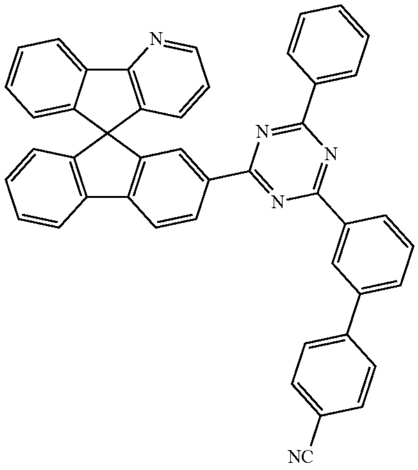
E110
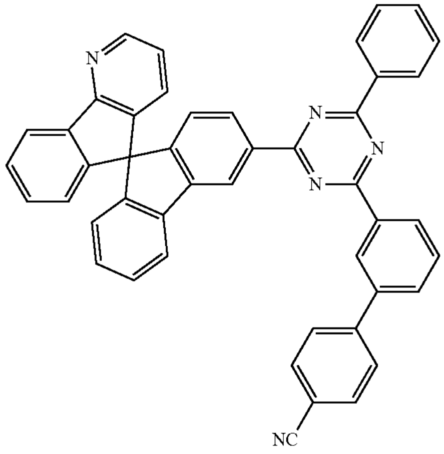

-continued
E111
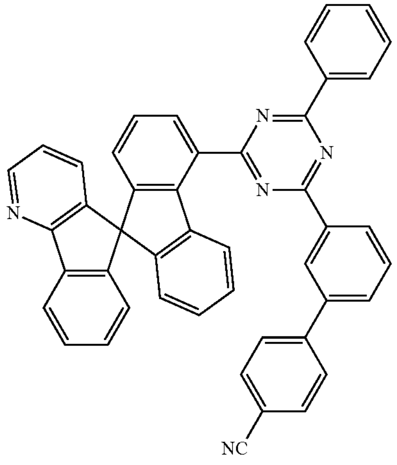
E112
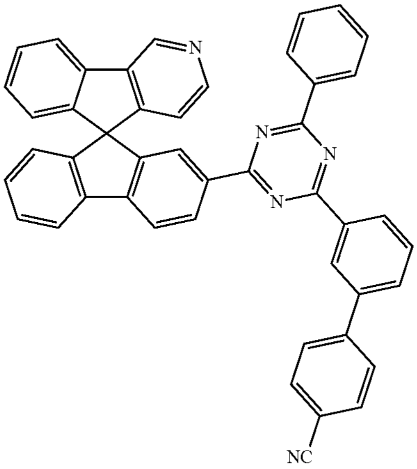
E113
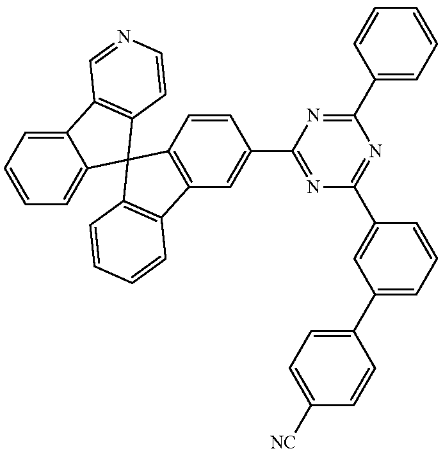
-continued
E114
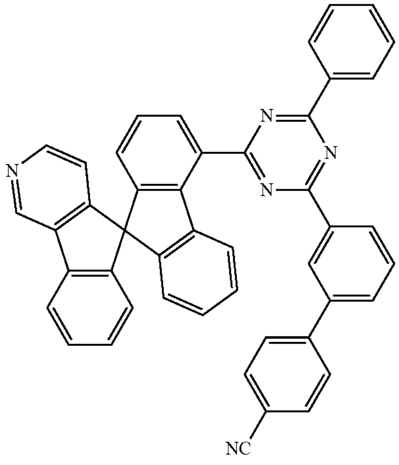
E115
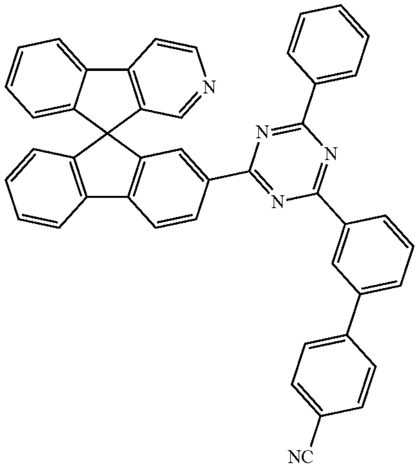
E116
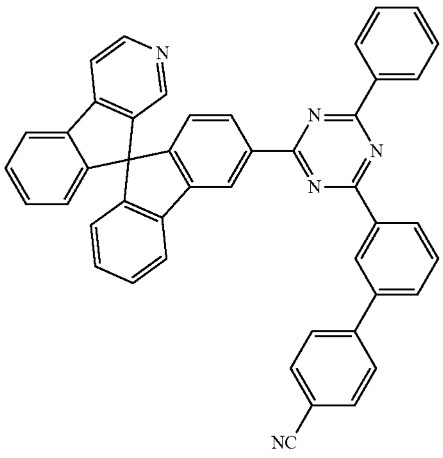

-continued
E117
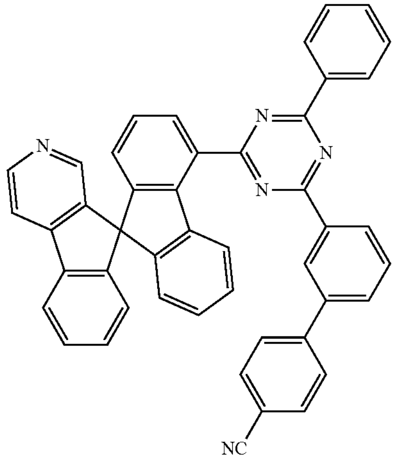
E118
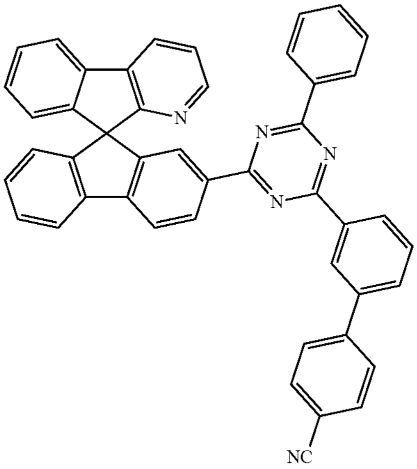
E119
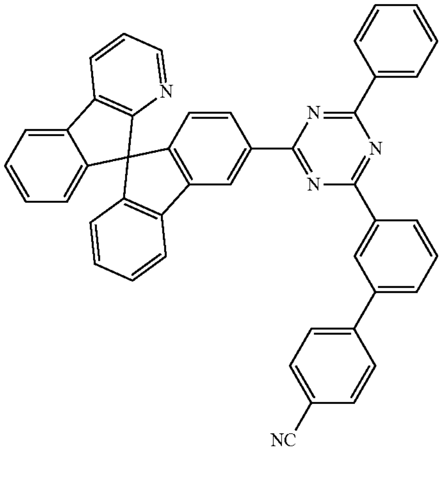
-continued
E120
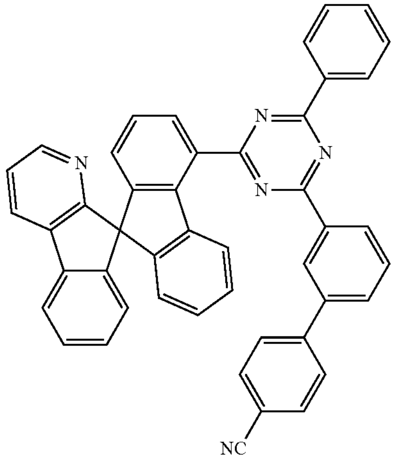
E121
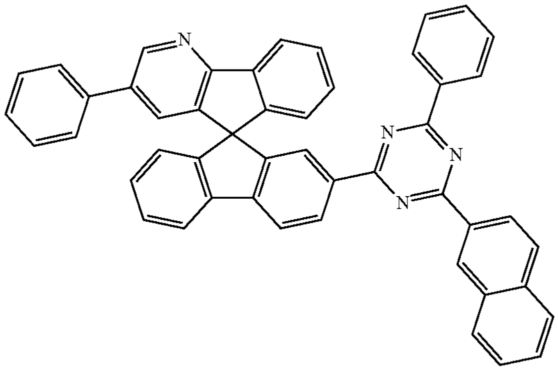
E122
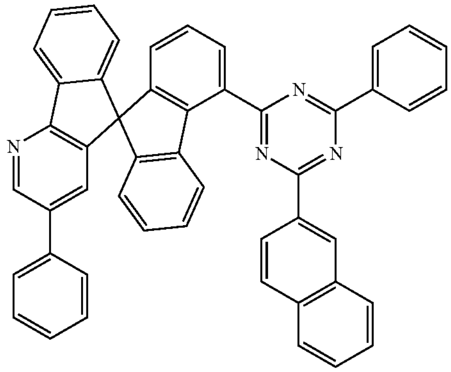

-continued
E123
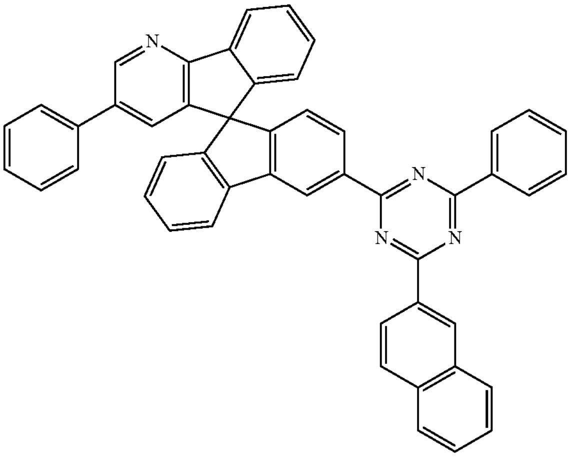
E124
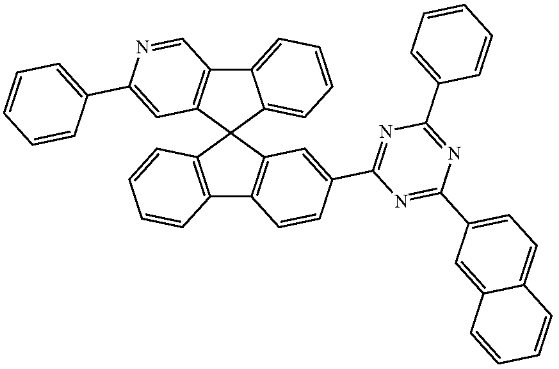
E125
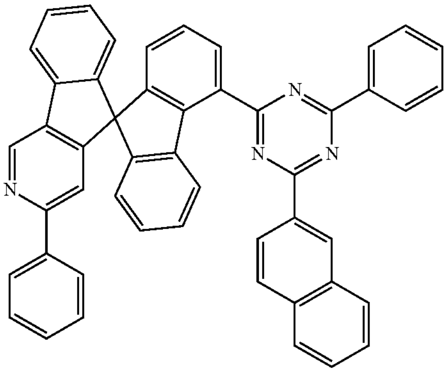
-continued
E126
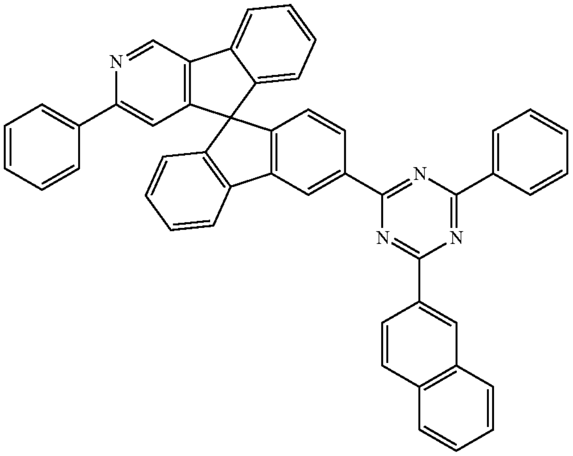
E127
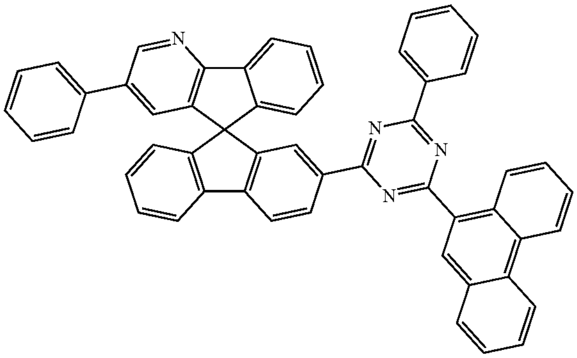
E128
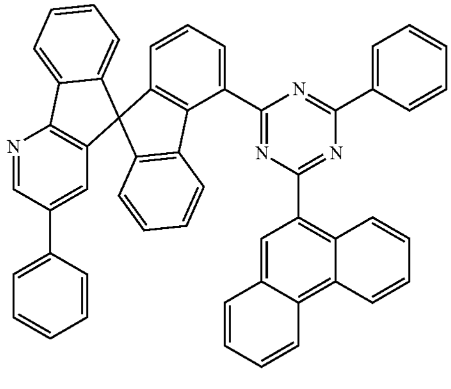

-continued
E129
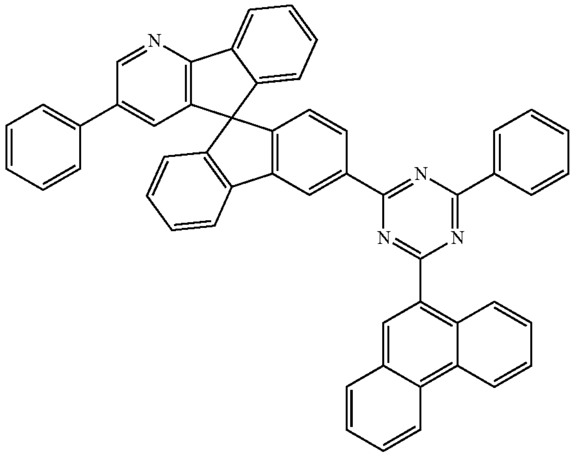
E130
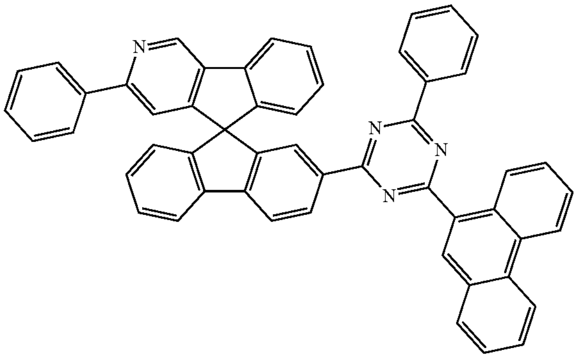
E131
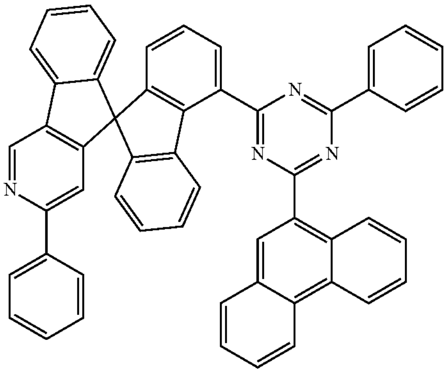
-continued
E132
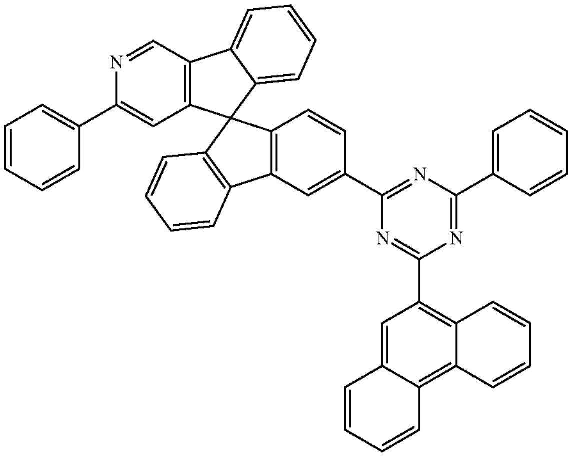
E133
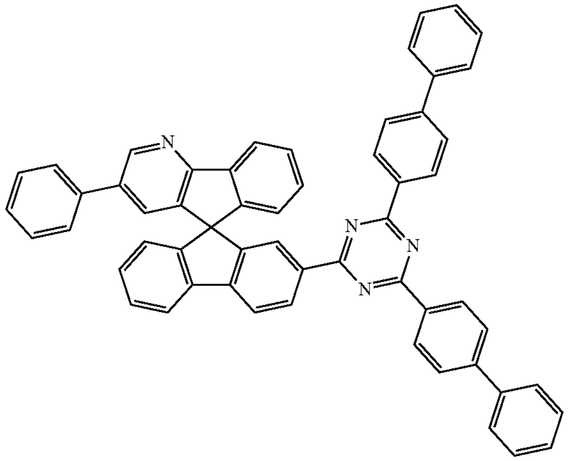
E134
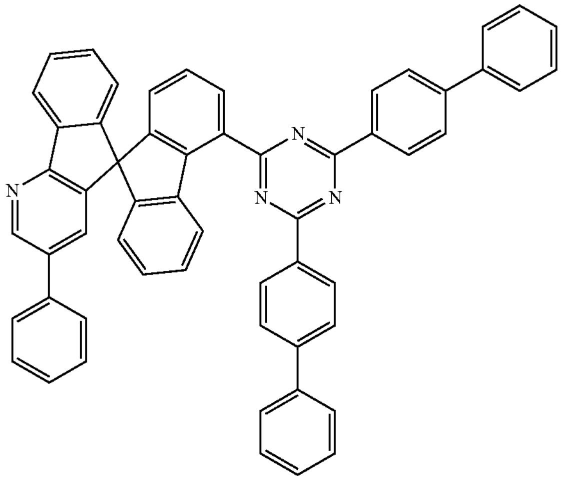

-continued
E135
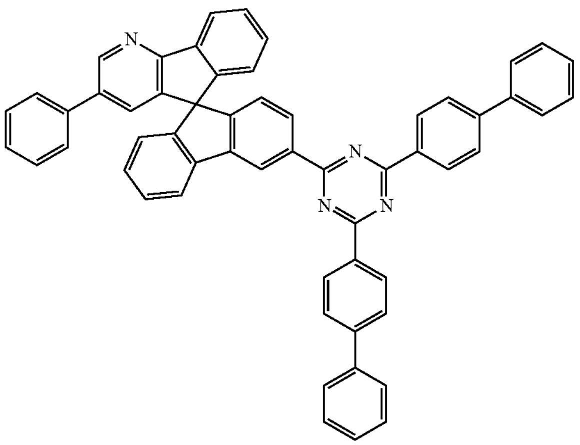
E136
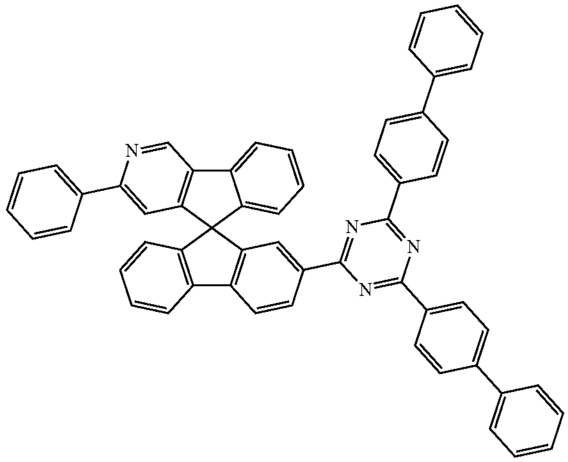
E137
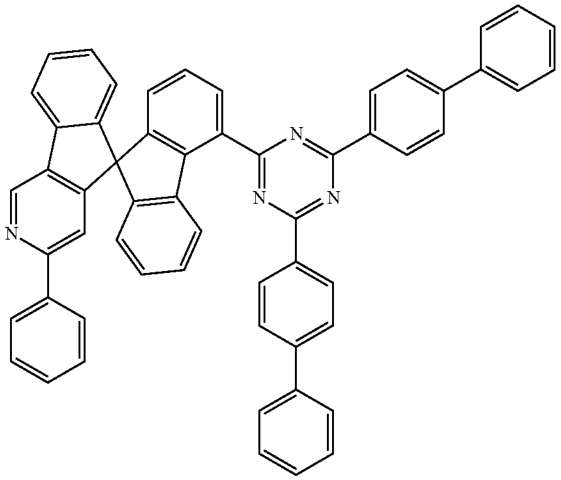
-continued
E138
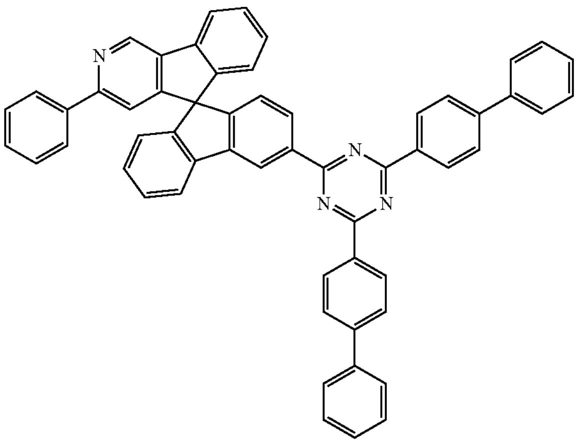
E139
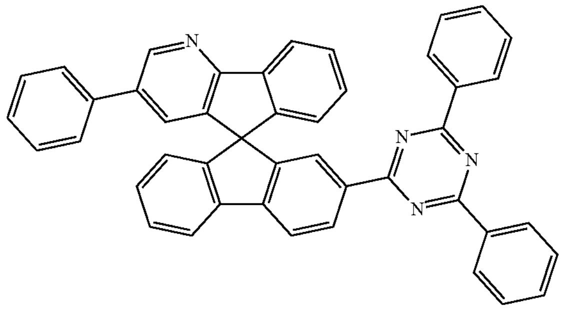
E140
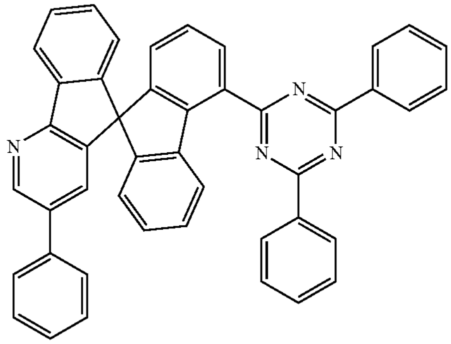
E141
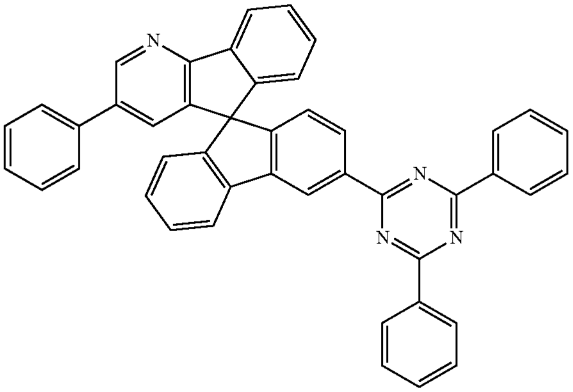

-continued
E142
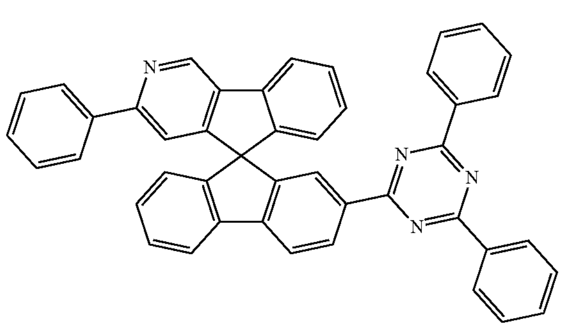
E143
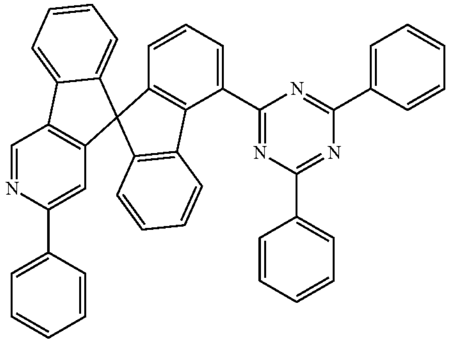
E144
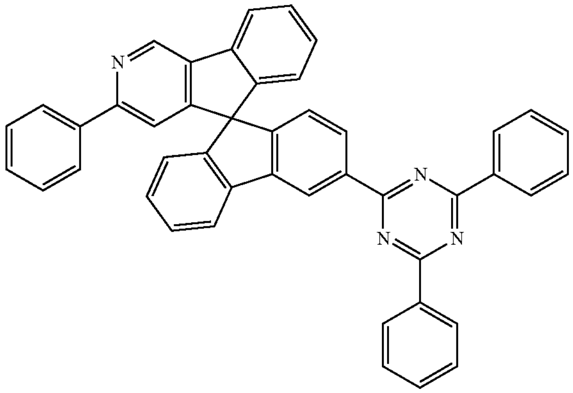
E145
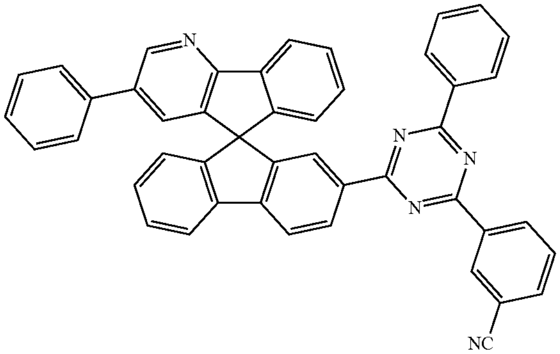
-continued
E146
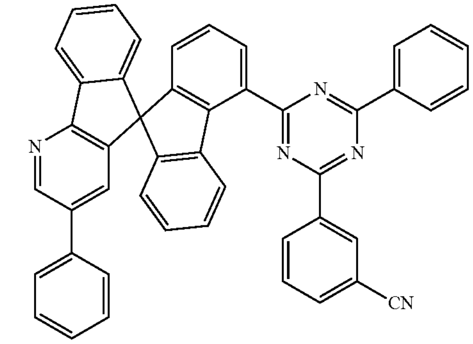
E147
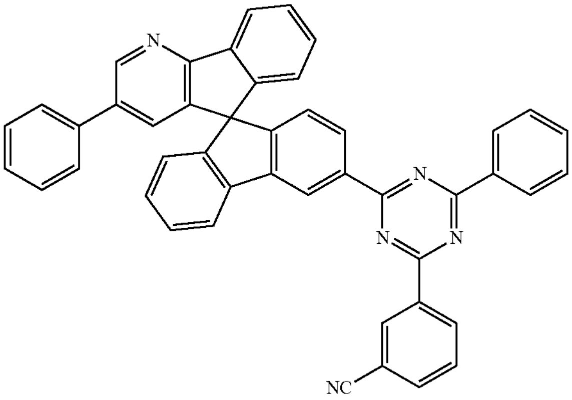
E148
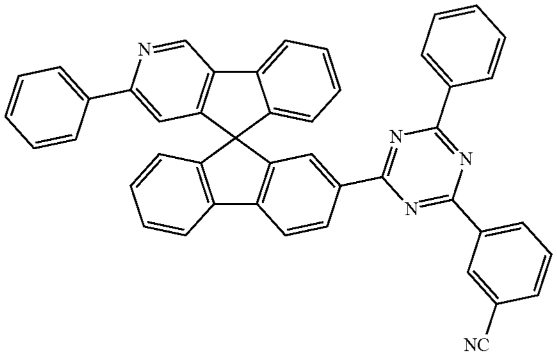
E149
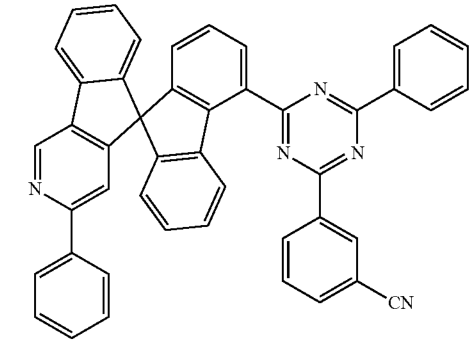

-continued
E150
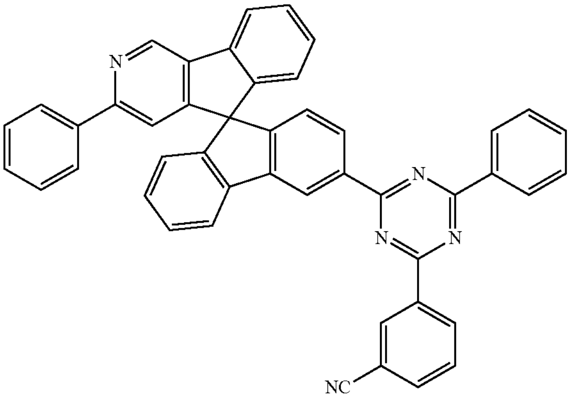
E151
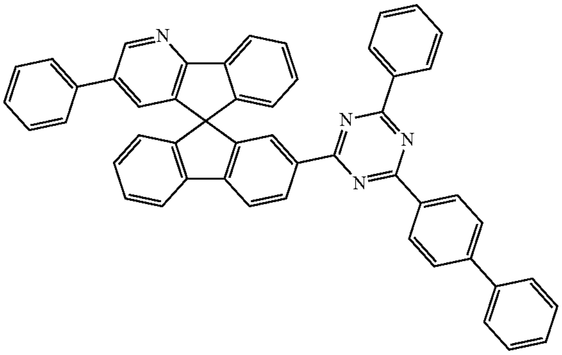
E152
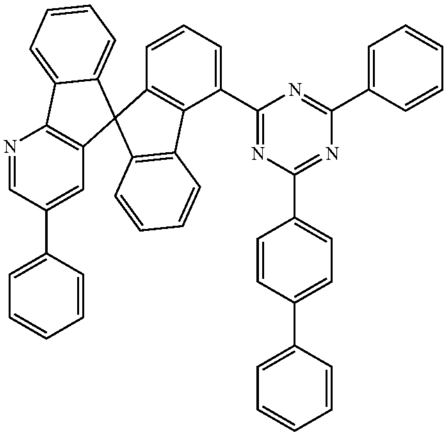
-continued
E153
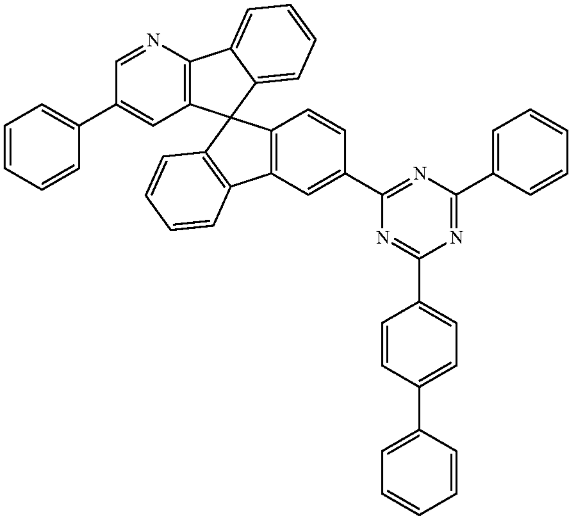
E154
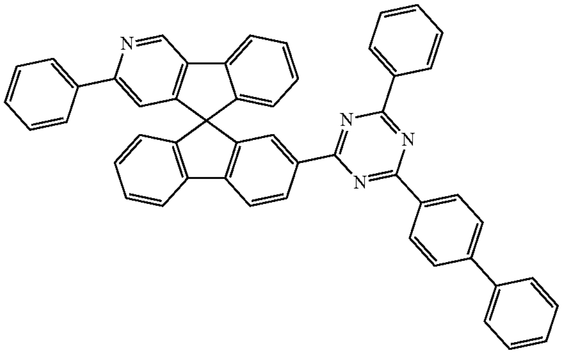
E155
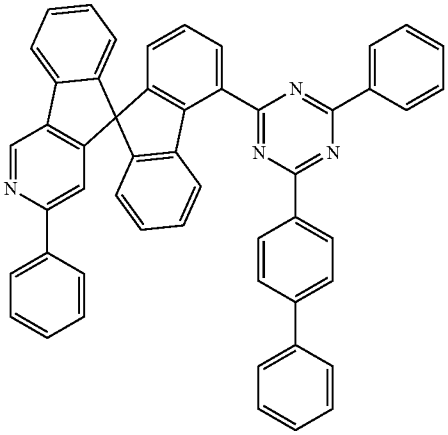

E156
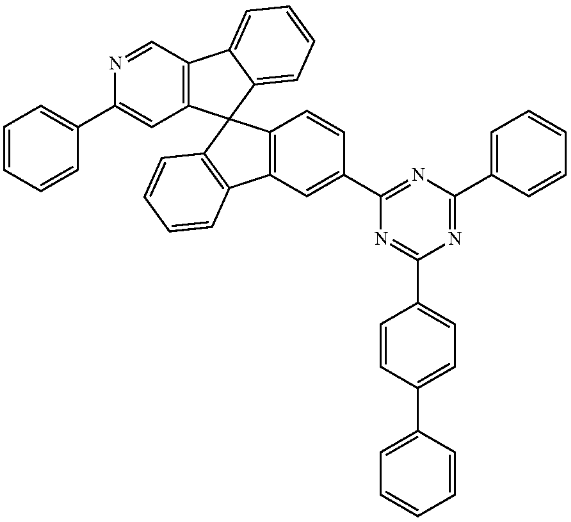
E159
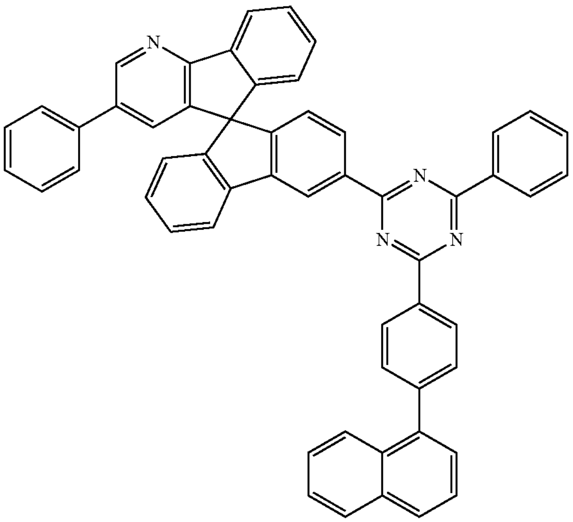
E157
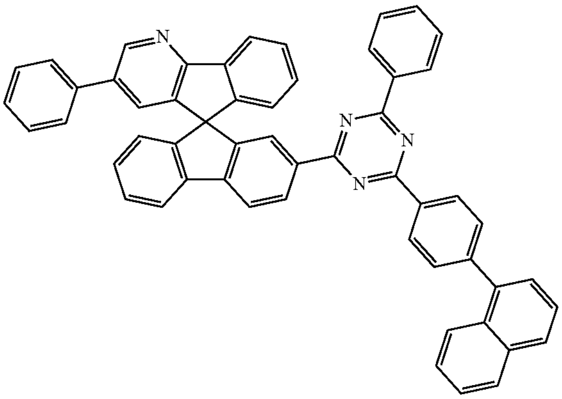
E160
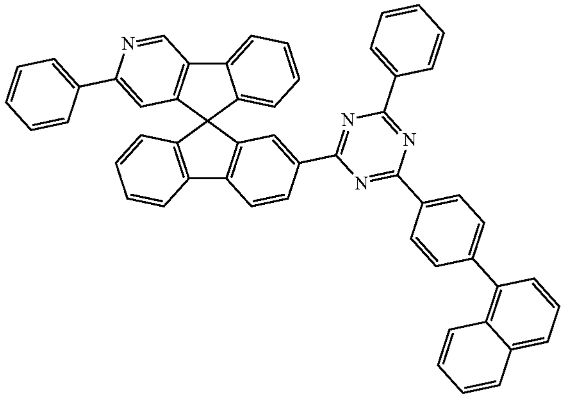
E158
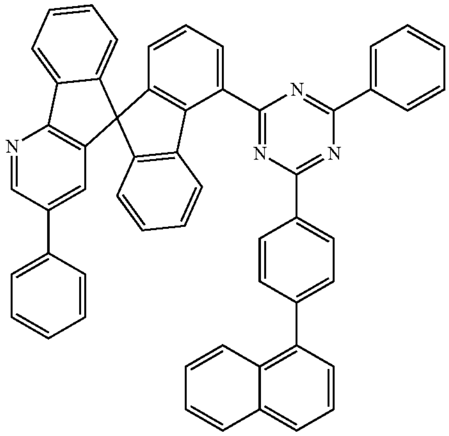
E161
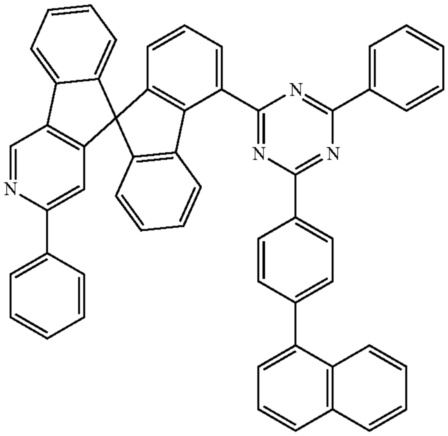

-continued
E162
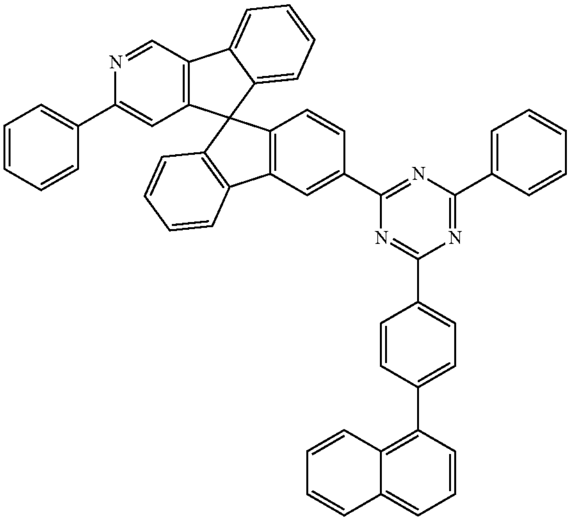
E163
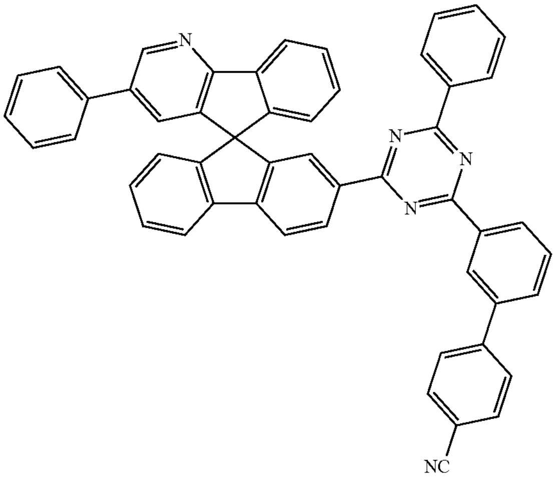
E164
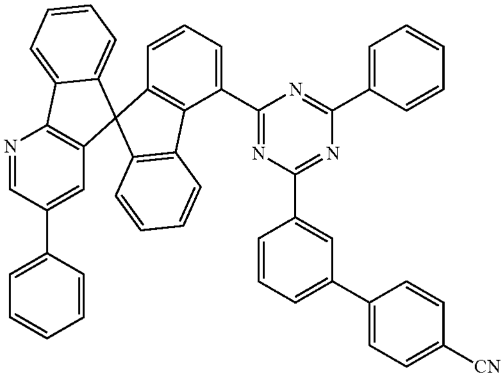
-continued
E165
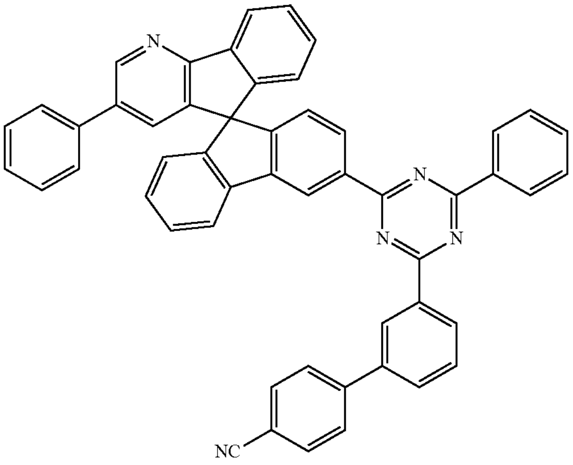
E166
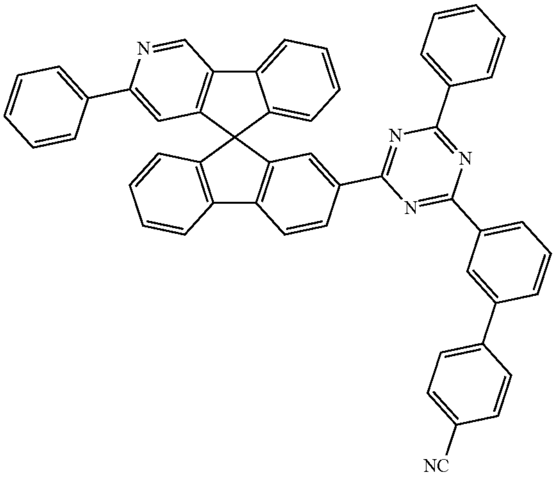
E167
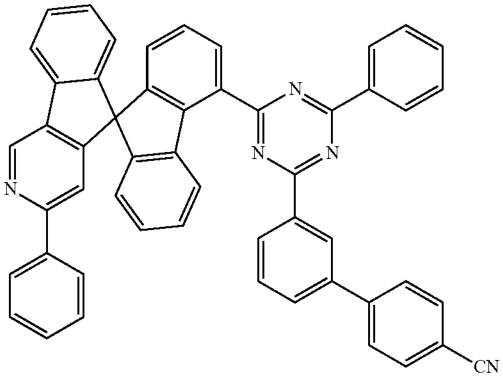

-continued
E168
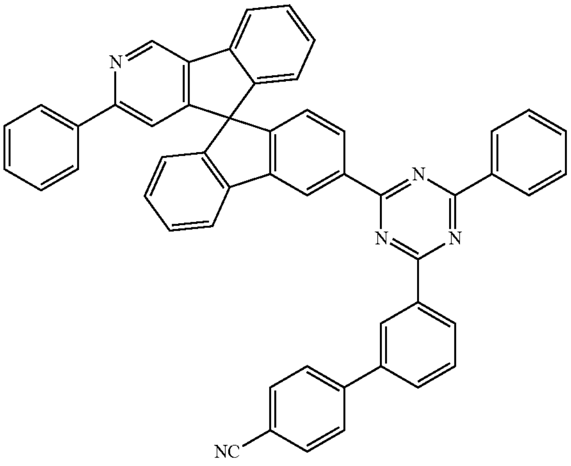
E169
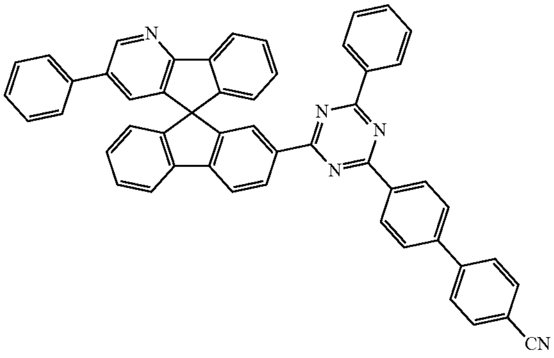
E170
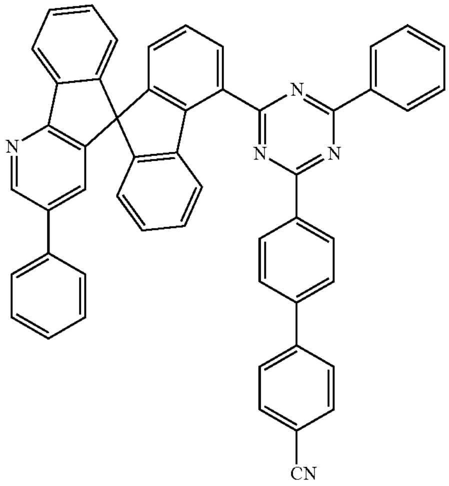
-continued
E171
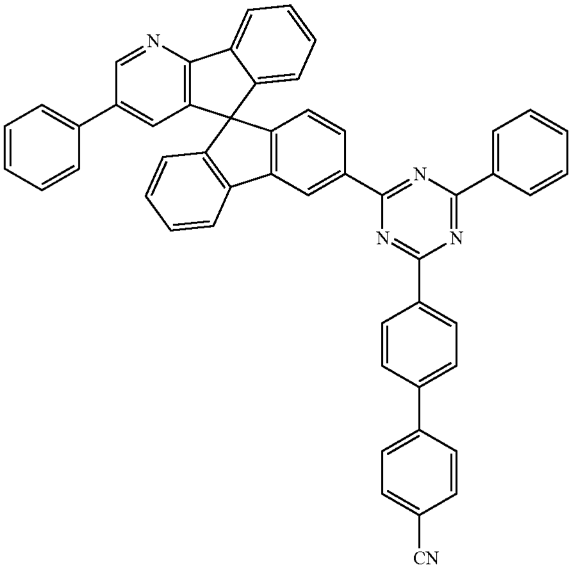
E172
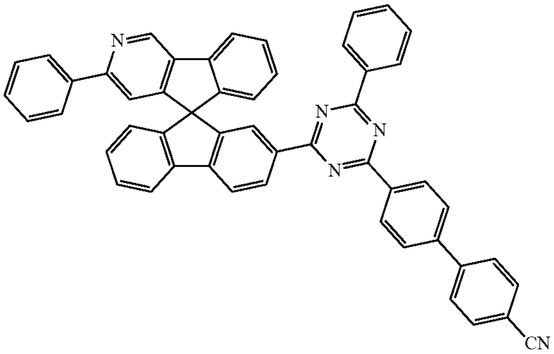
E173
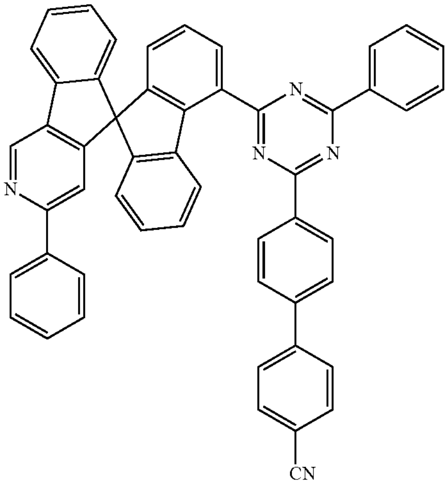

-continued
E174
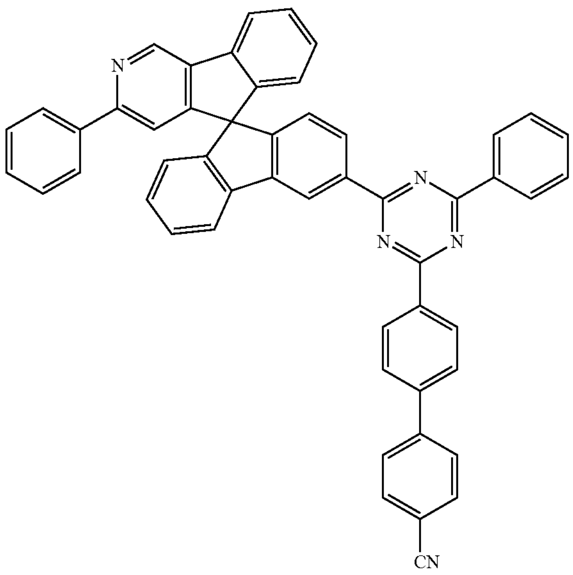
E175
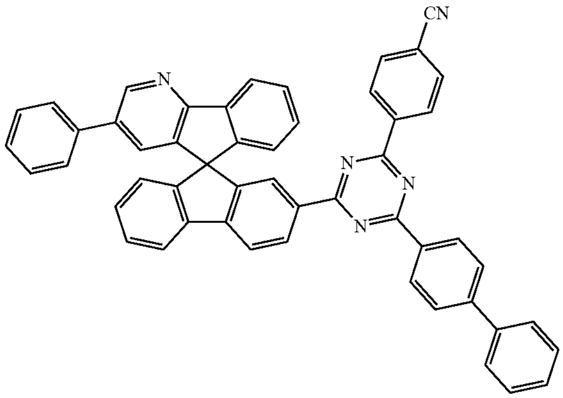
E176
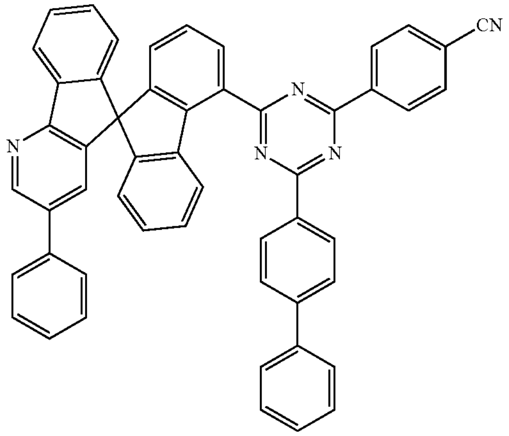
-continued
E177
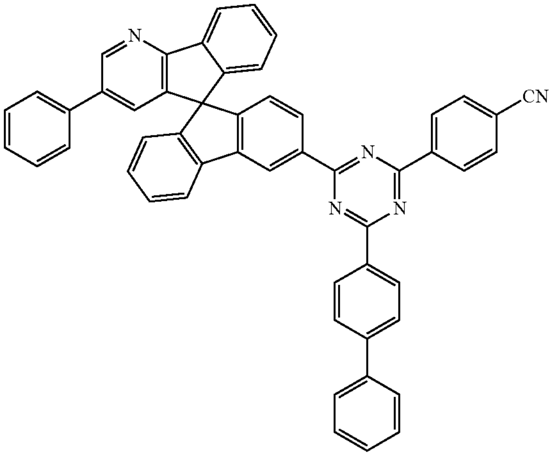
E178
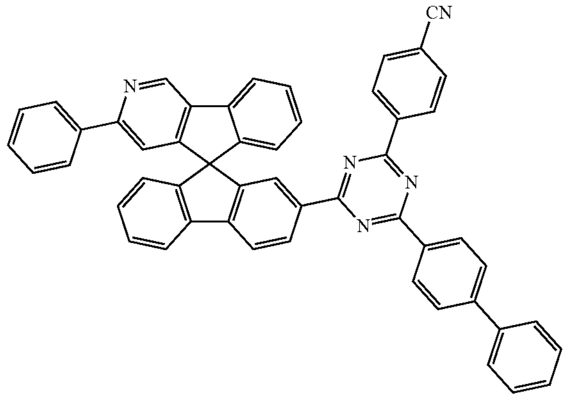
E179
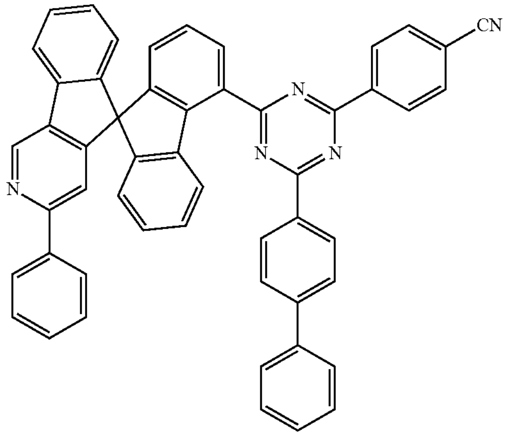

-continued
E180
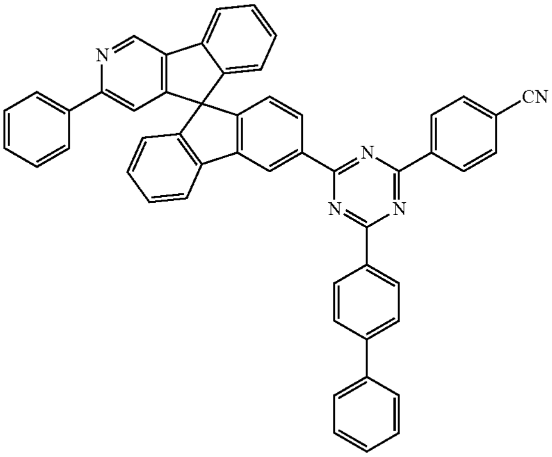
E181
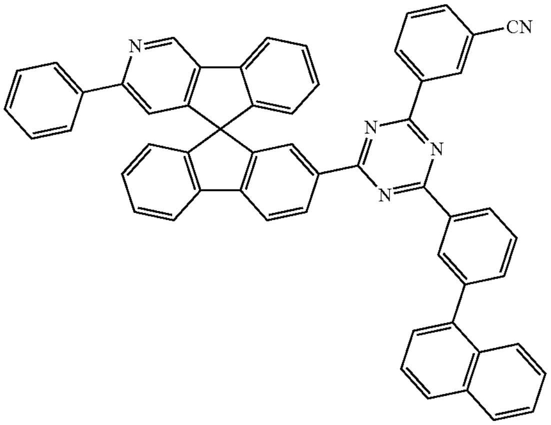
E182
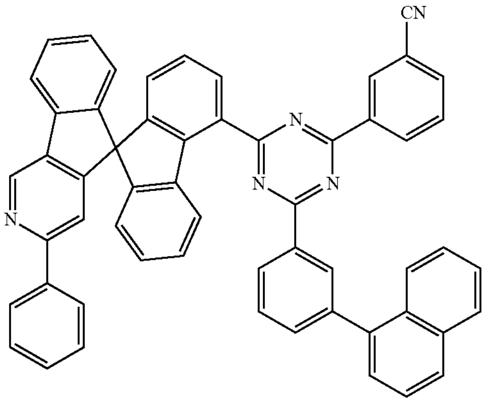
-continued
E183
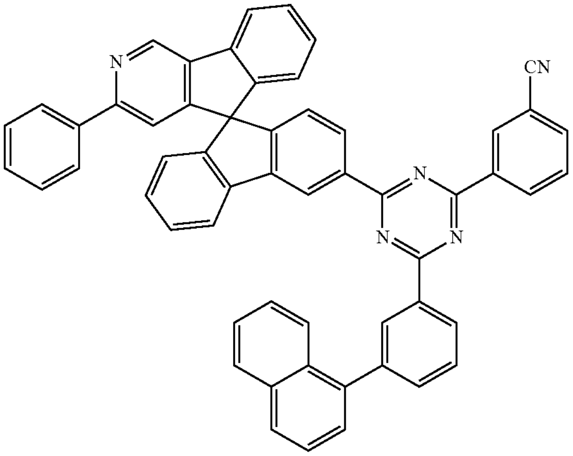
E184
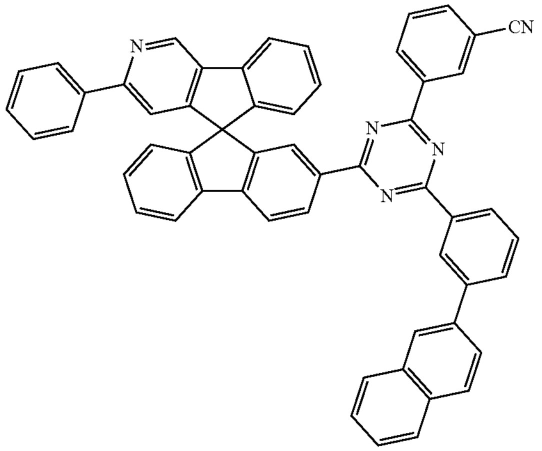
E185
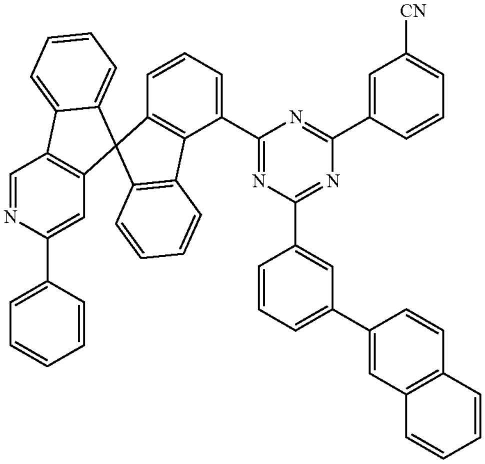

-continued
E186
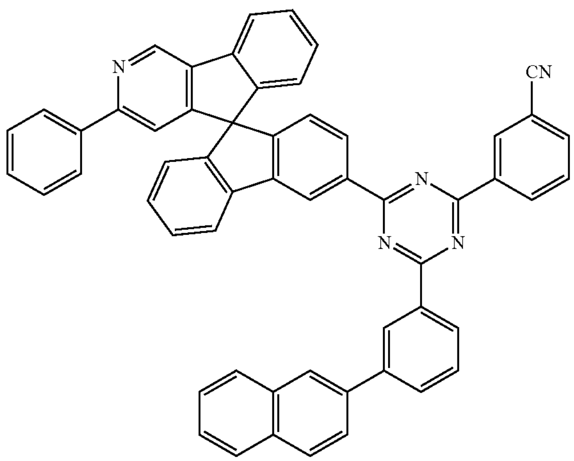
E187
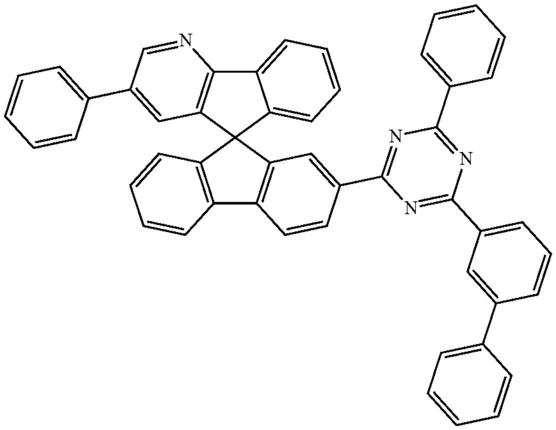
E188
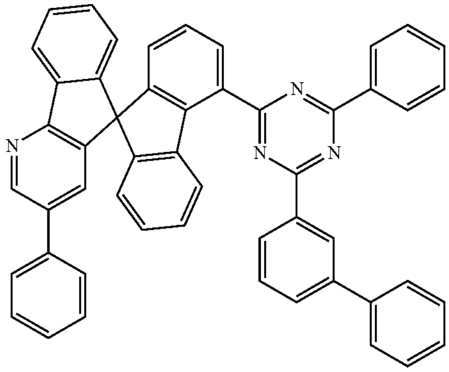
-continued
E189
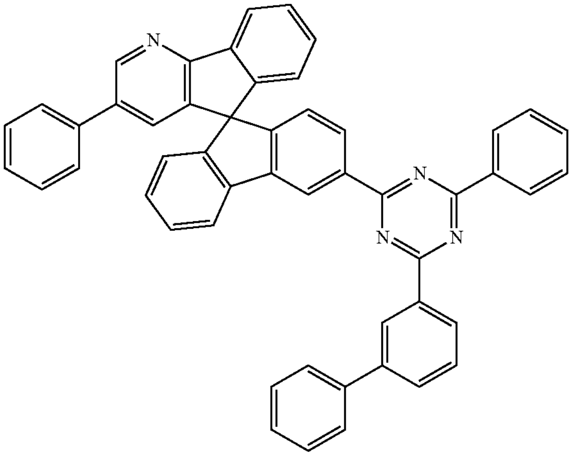
E190
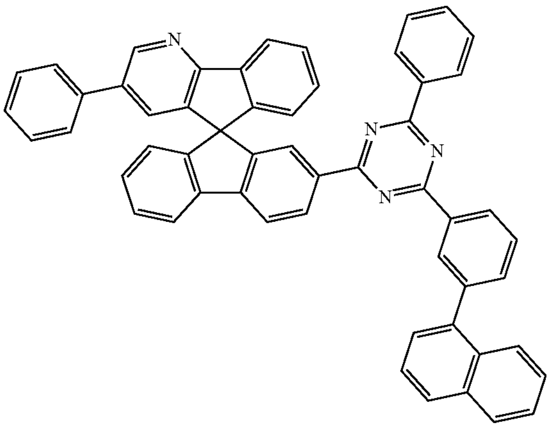
E191
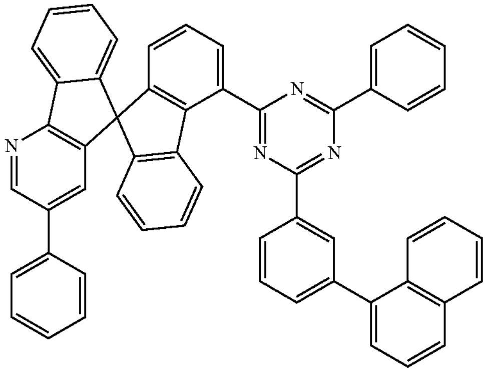

-continued
E192
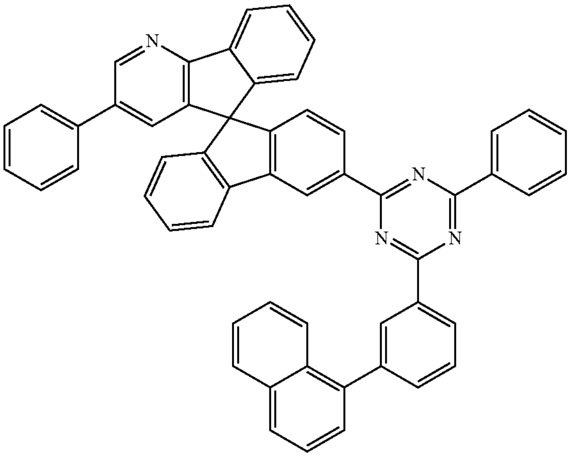
E193
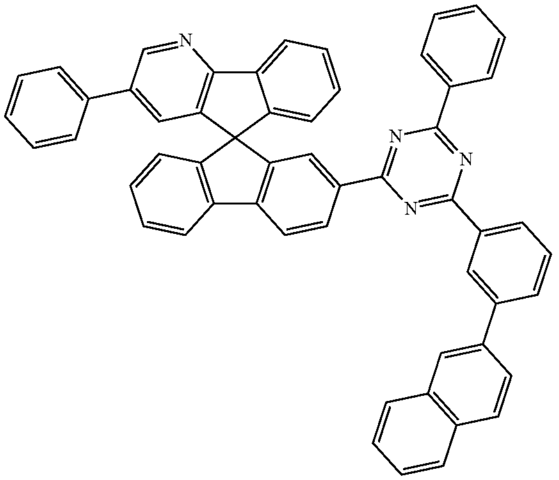
E194
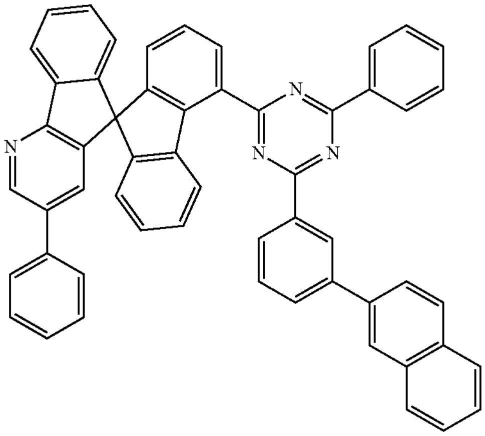
-continued
E195
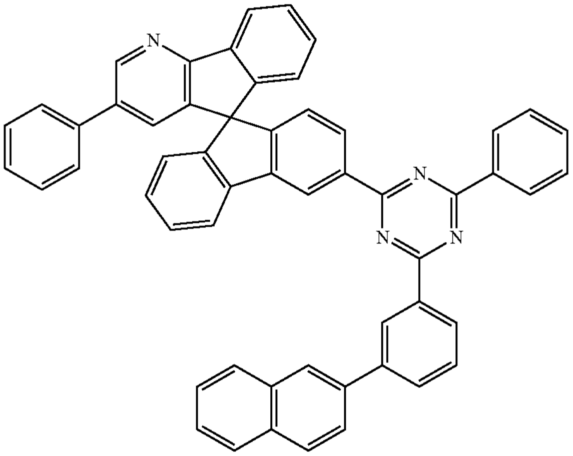
E196
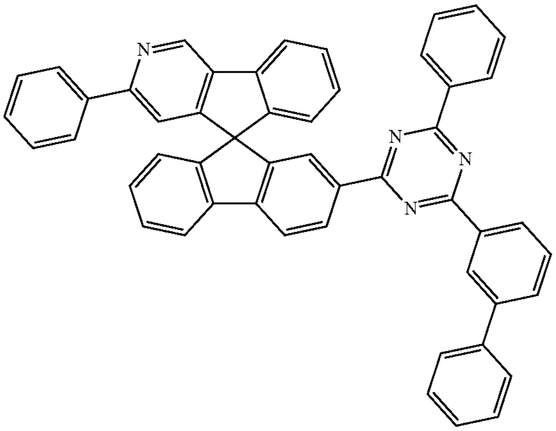
E197
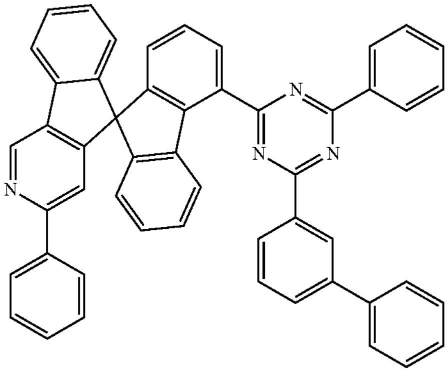

-continued
E198
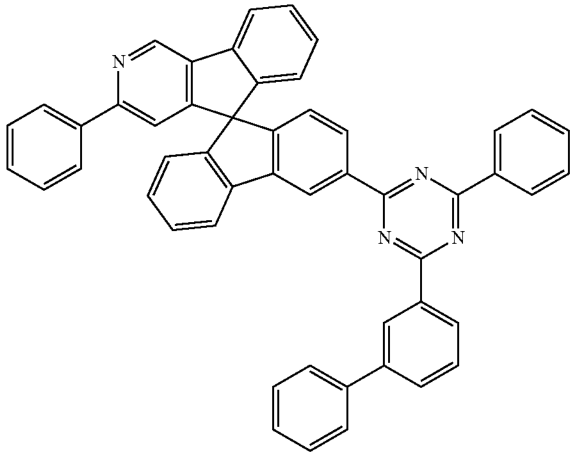
E199
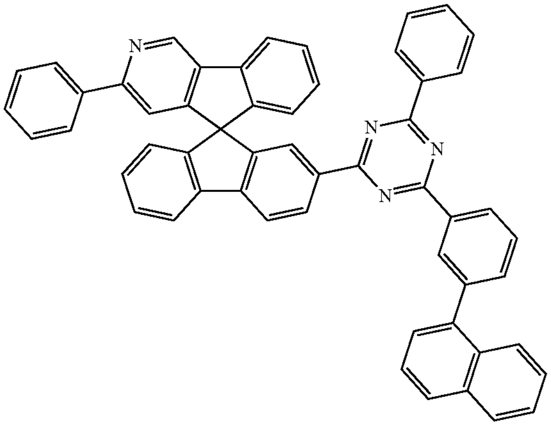
E200
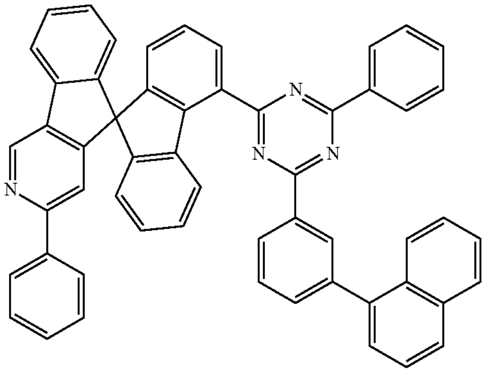
-continued
E201
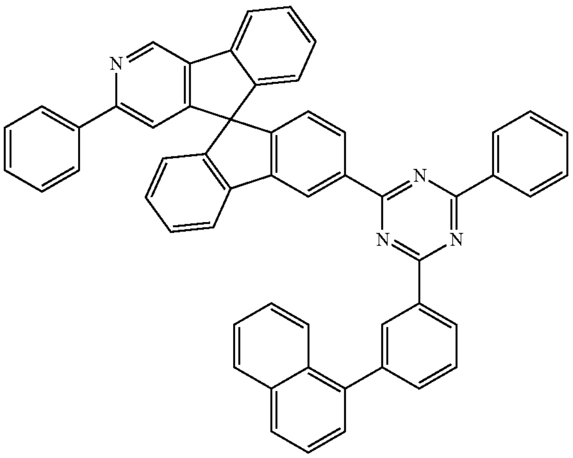
E202
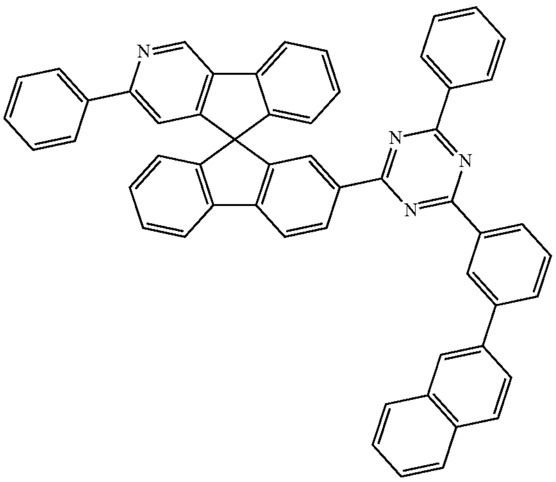
E203
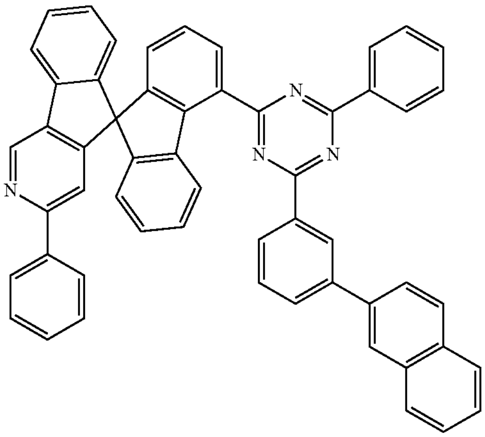

-continued
E204
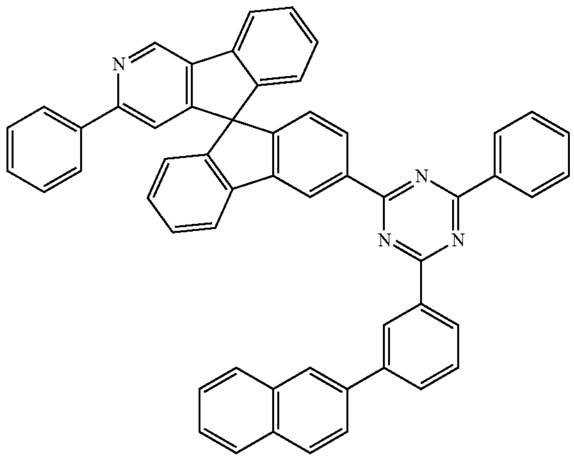
E205
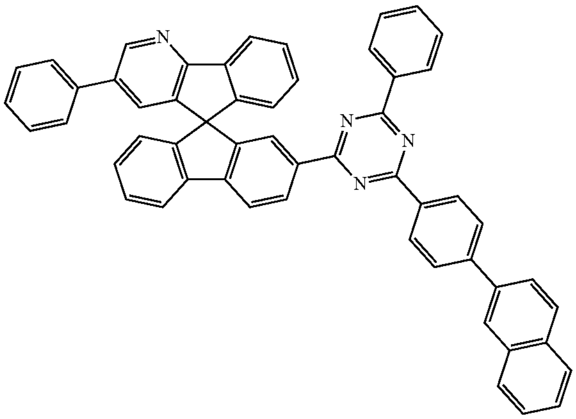
E206
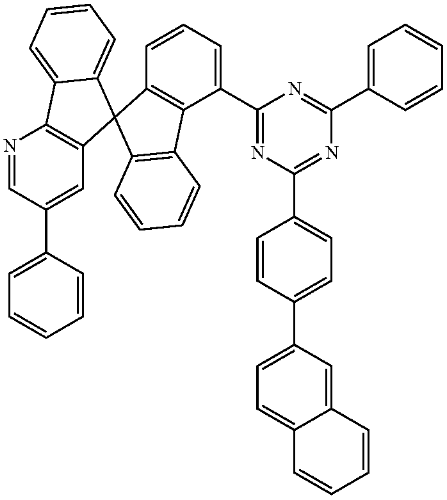
-continued
E207
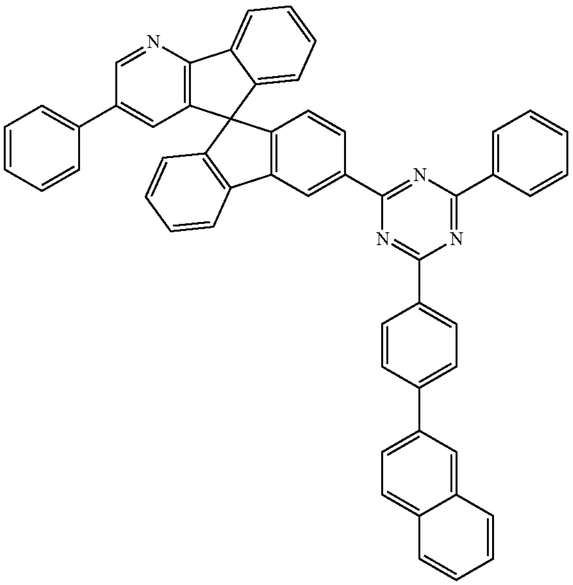
E208
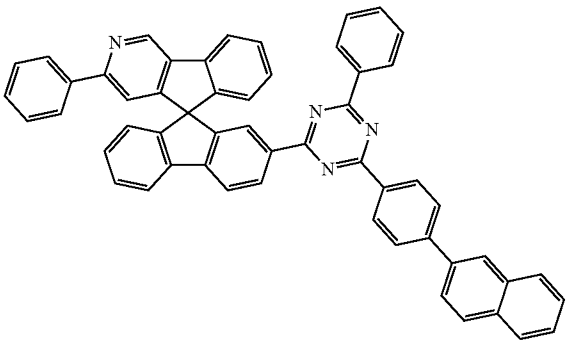
E209
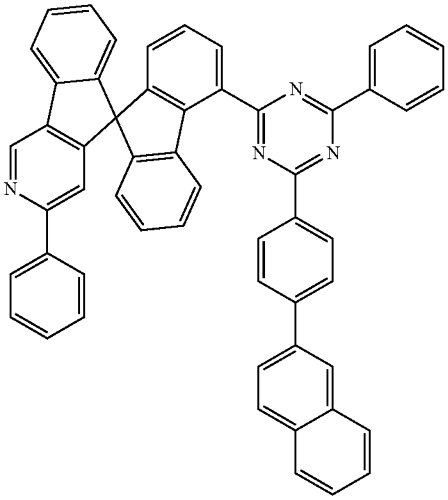

-continued

E210

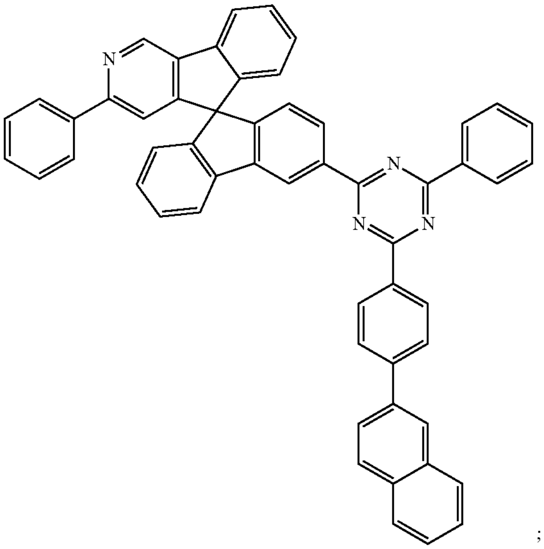

;

wherein the organic light-emitting functional layer further comprises a light-emitting auxiliary layer, and the light-emitting auxiliary layer comprises a compound having a structure shown in formula (11) below:

formula (II)

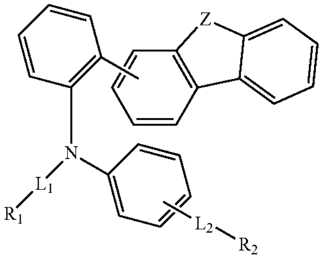

wherein Z is selected from O or S atom; $L_1$ and $L_2$ are each independently selected from a single bond or C6-C30 aryls, $R_1$ and $R_2$ are each independently selected from substituted or unsubstituted C6-C30 aryls or substituted or unsubstituted C6-C30 heteroaryls, and the substituents are each independently selected from deuterium or C1-C24 alkyls; hydrogen atoms in the compound shown in formula (II) may be partially or completely deuterated; wherein the degree of deuteration in the structure shown in formula (II) is 10% to 100%.

2. The organic electroluminescent device according to claim 1, wherein, in formula (II), $L_1$ and $L_2$ are each independently selected from a single bond, phenyl, or naphthyl; $R_1$ and $R_2$ are each independently selected from one or more of phenyl, naphthyl, phenanthryl, dibenzofuryl, dibenzothienyl, biphenyl, naphthylphenyl, benzophenanthryl, dimethylfluorenyl, and 9, 9'-spirobifluorenyl.

3. The organic electroluminescent device according to claim 1, wherein the compound is selected from any one of the following chemical structures, wherein “D” represents deuterium:

001

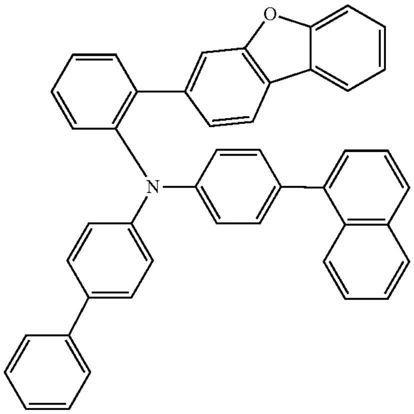

002

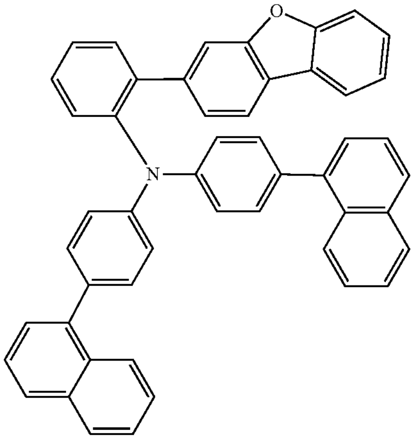

003

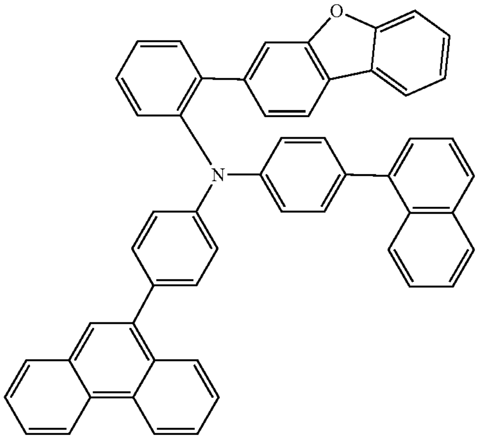

004
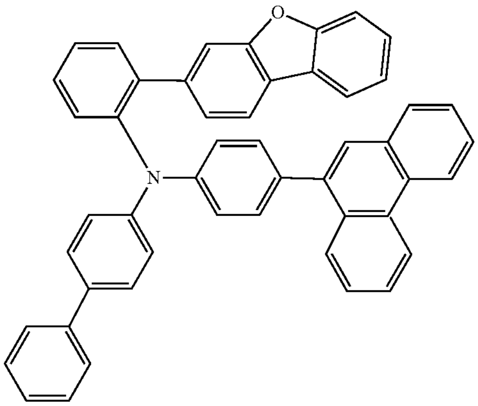
005
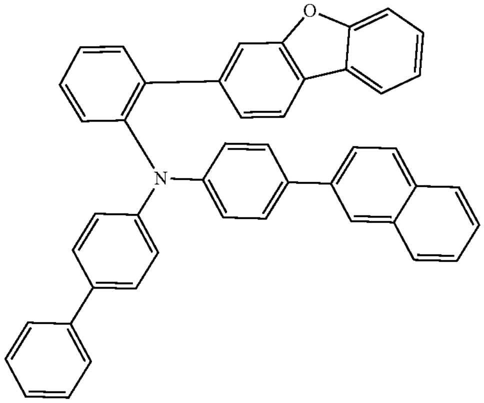
006
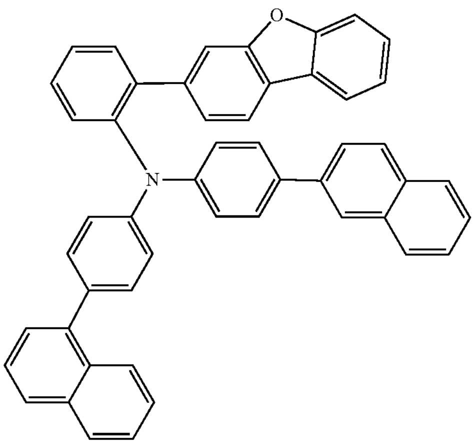
007
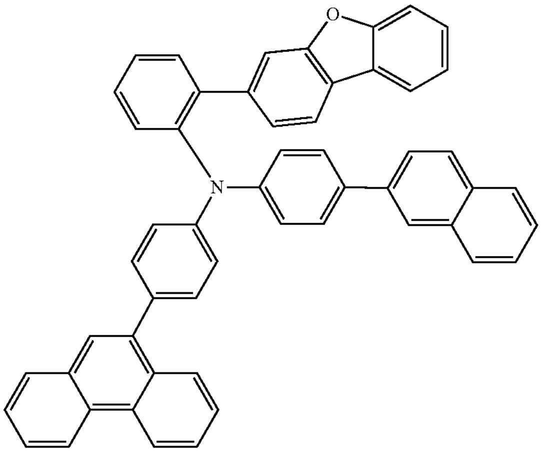
008
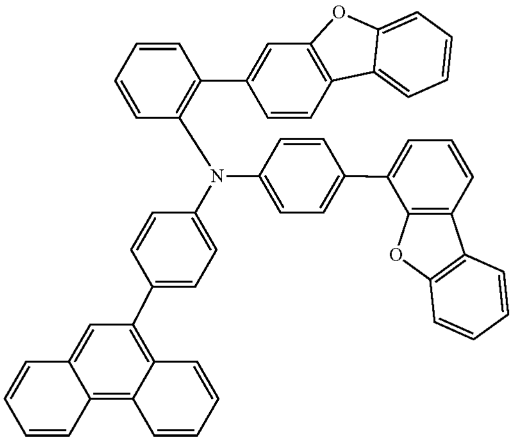
009
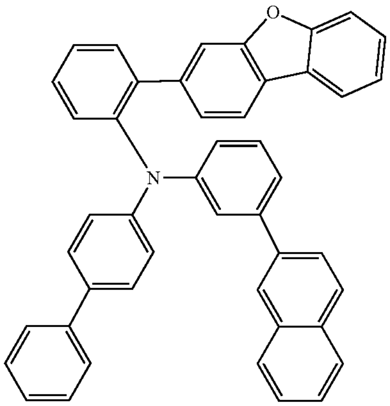

-continued
010
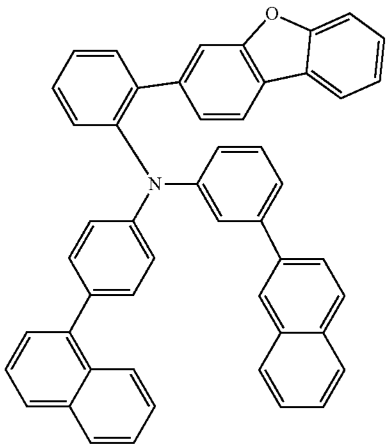
011
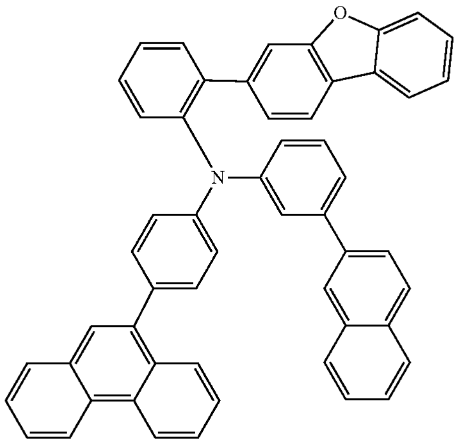
012
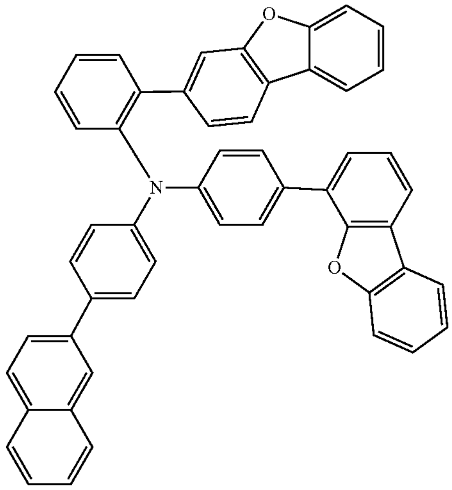
-continued
013
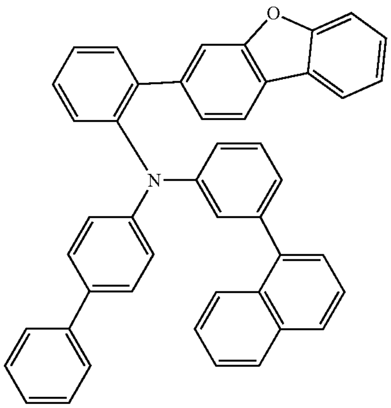
014
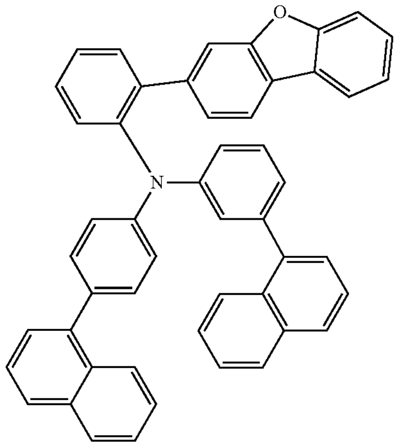
015
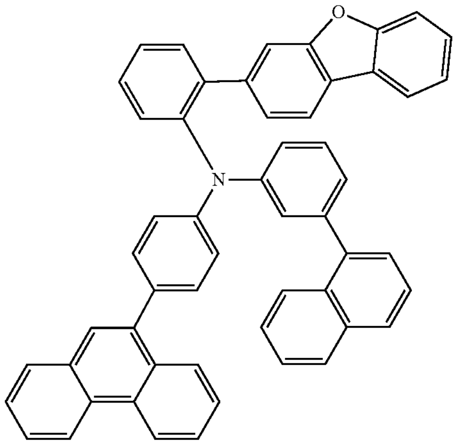

-continued
016
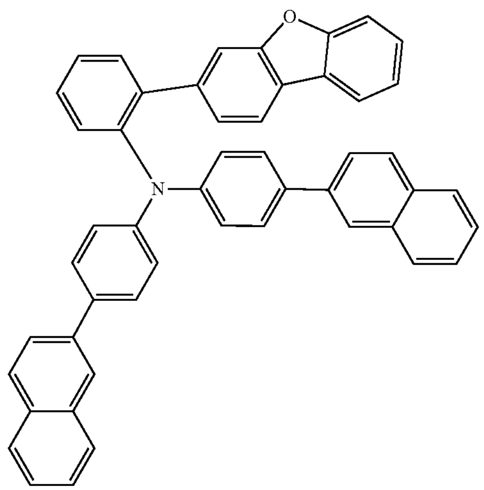
017
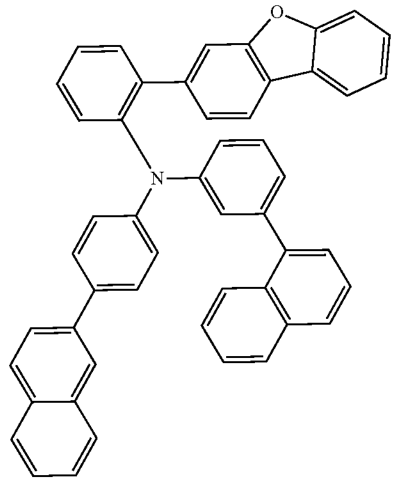
018
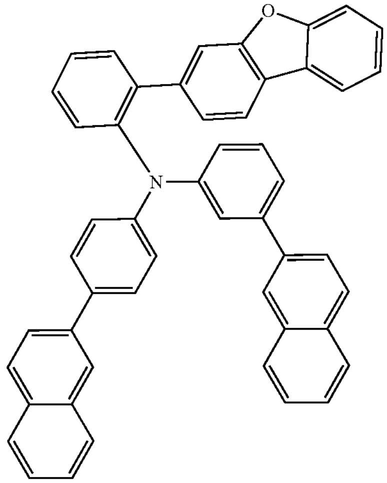
-continued
019
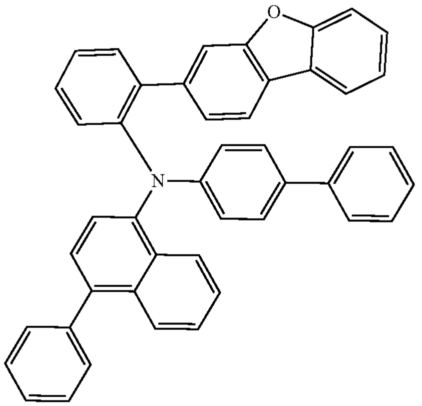
020
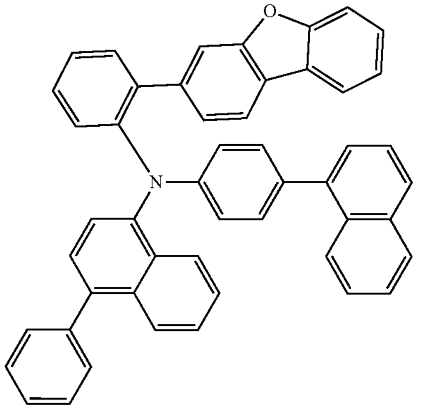
021
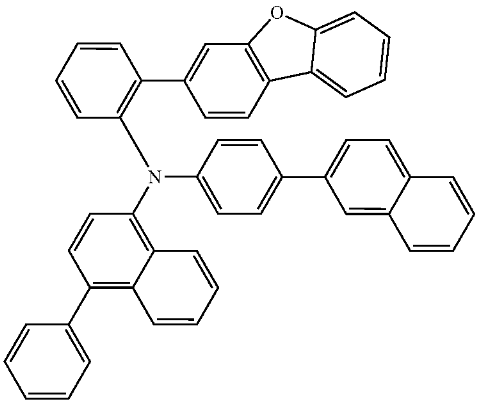
022
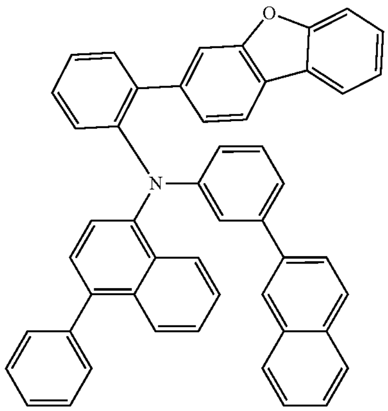

-continued
023
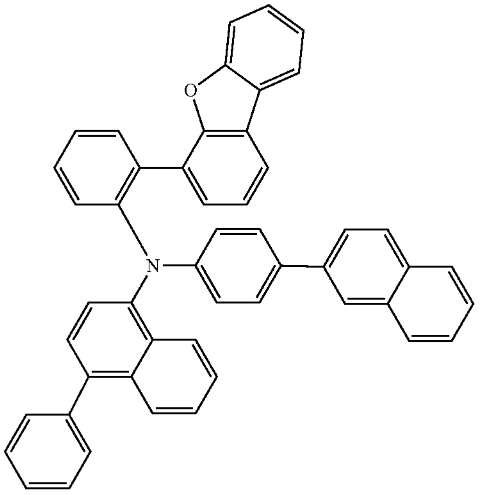
024
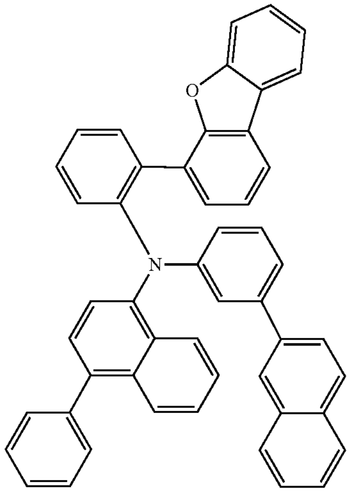
025
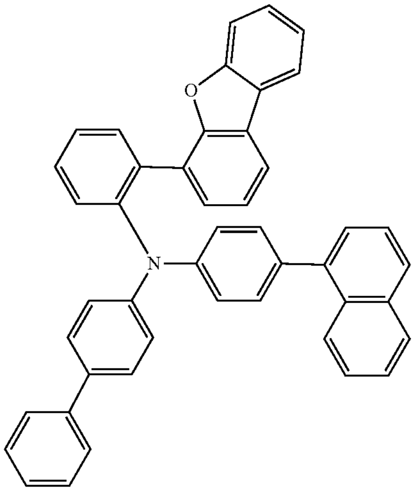
-continued
026
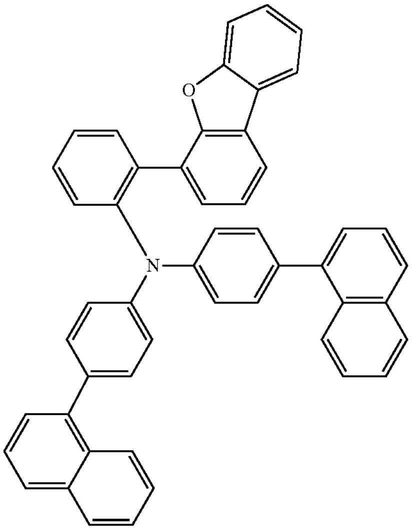
027
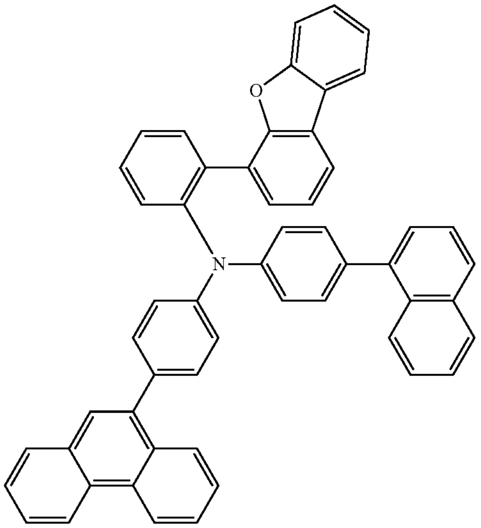
028
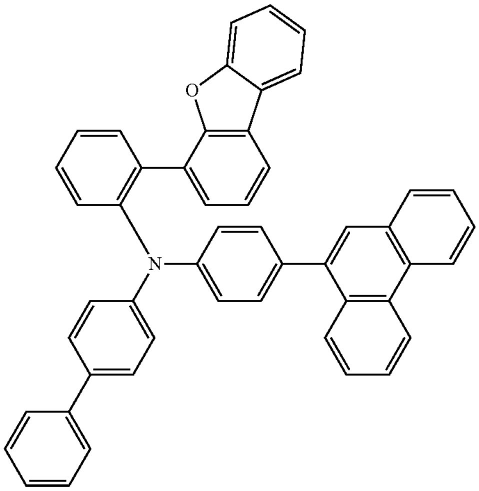

-continued
029
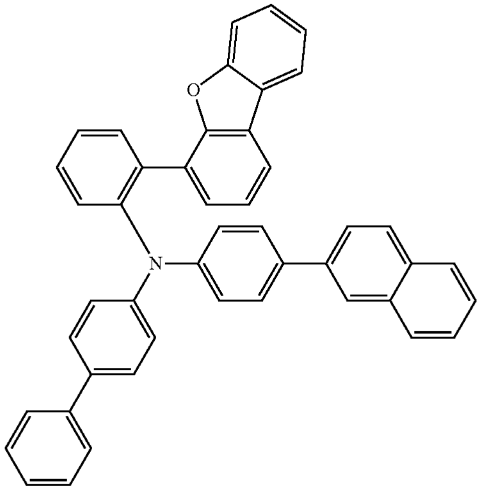
030
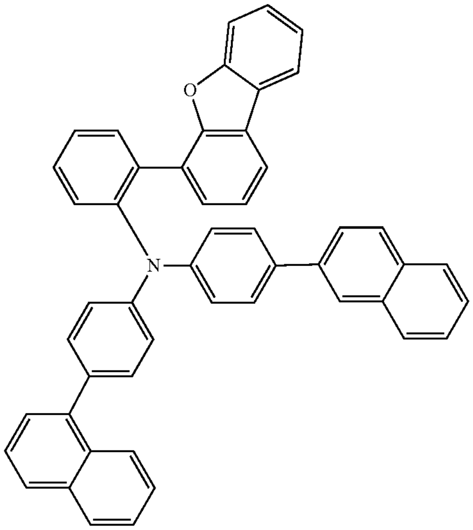
031
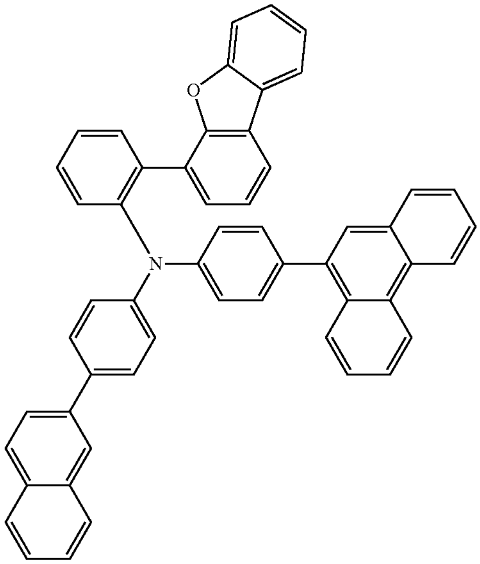
-continued
032
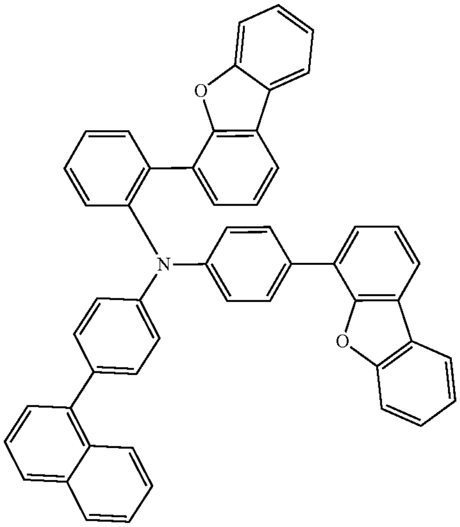
033
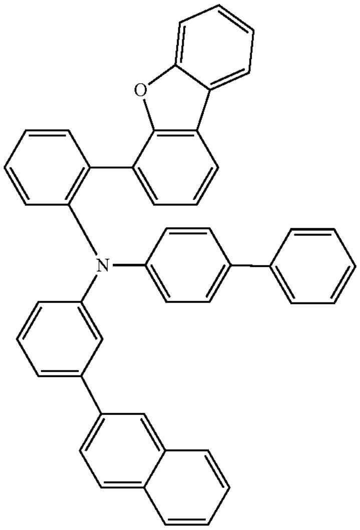
034
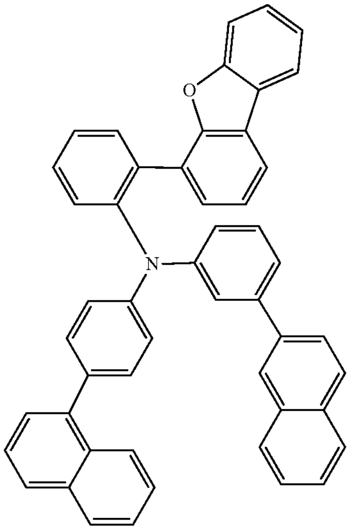

-continued
035
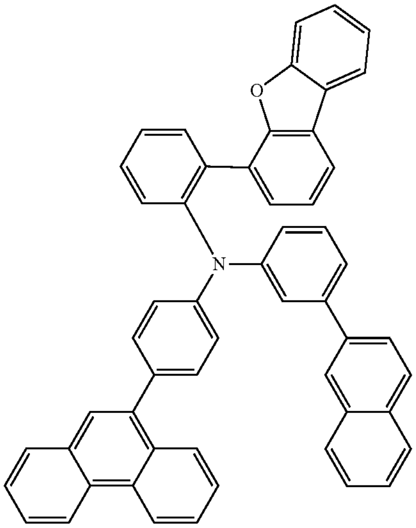
036
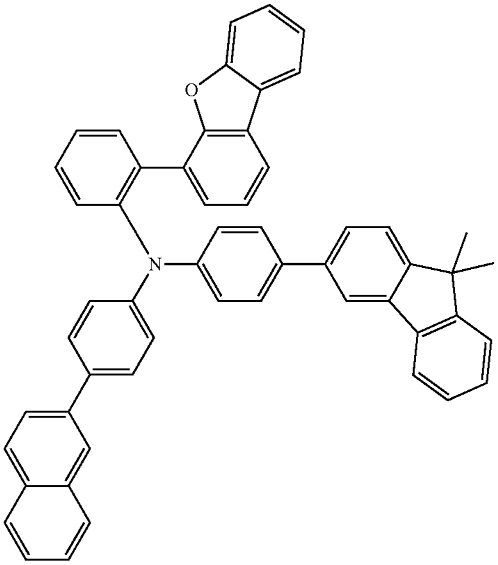
037
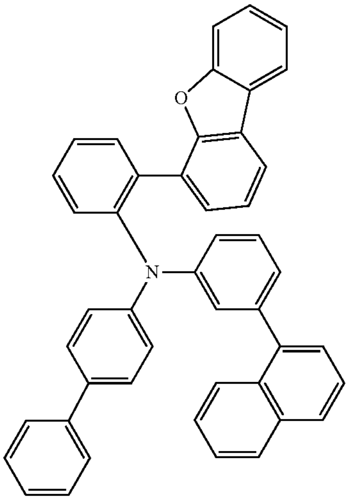
-continued
038
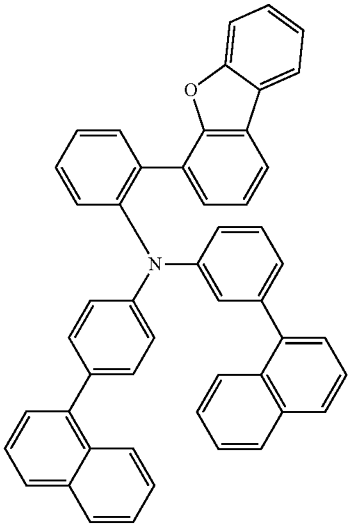
039
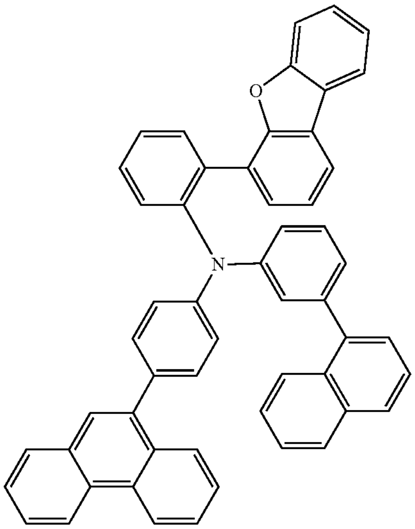
040
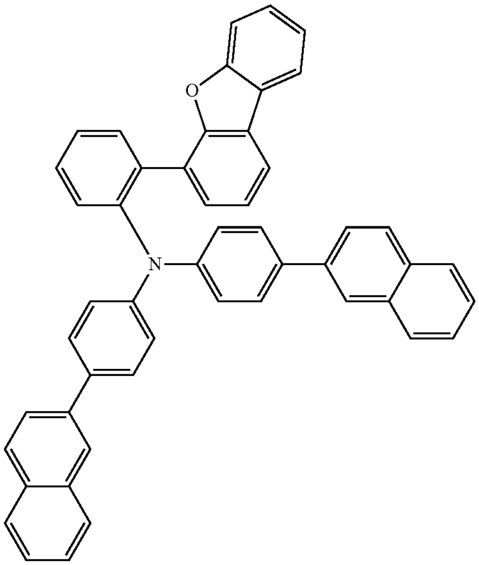

-continued
041
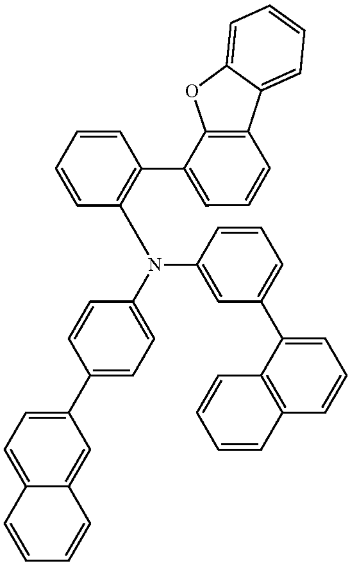
042
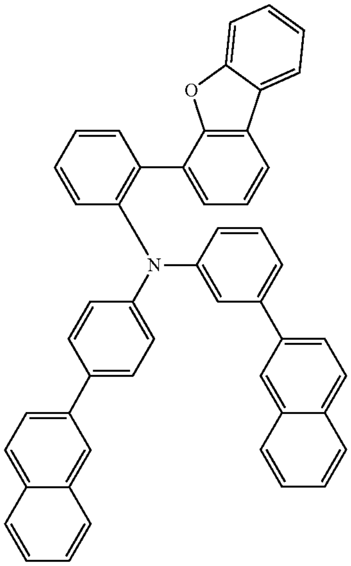
043
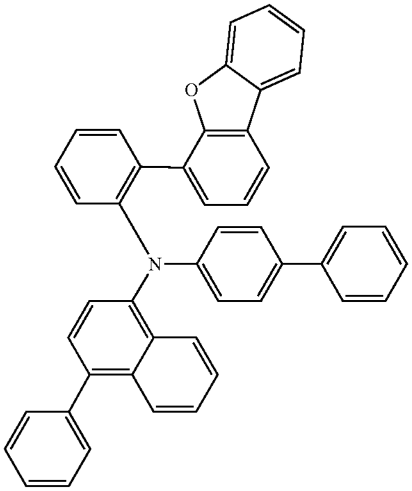
-continued
044
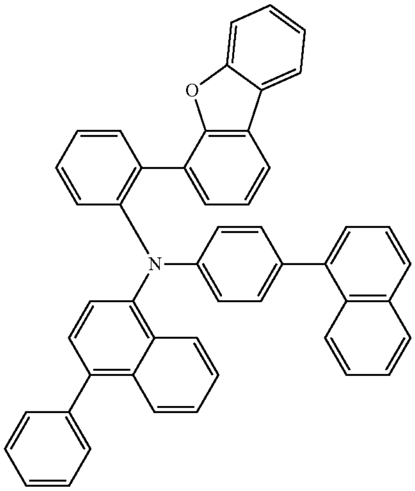
045
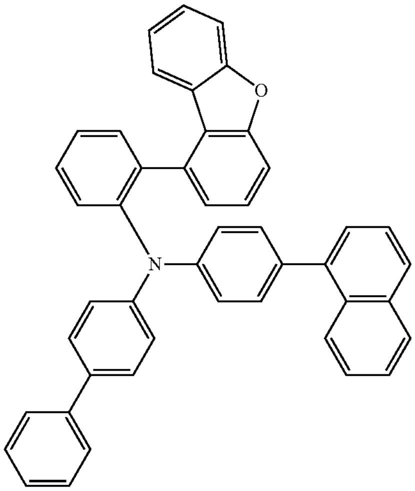
046
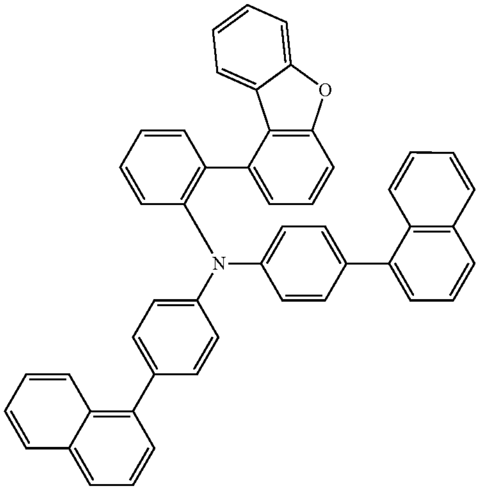

-continued
047
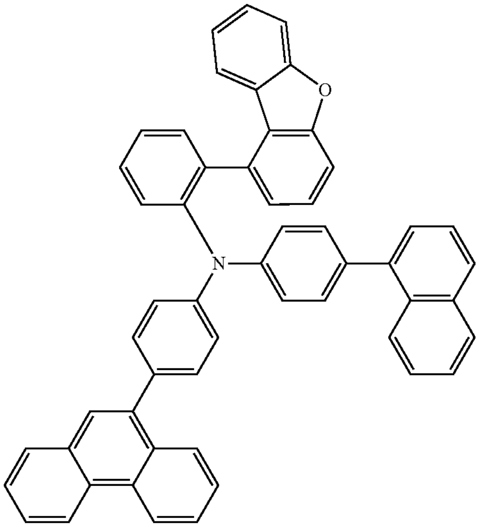
048
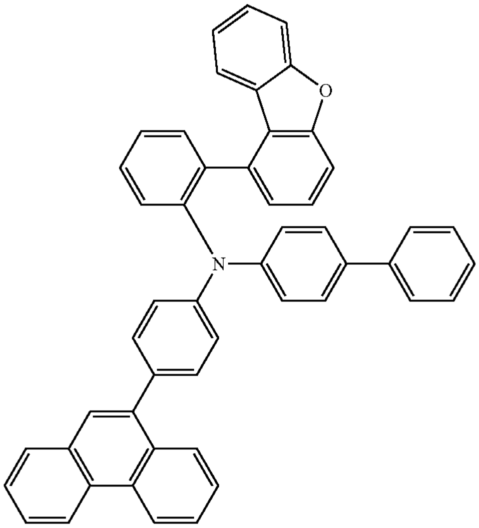
049
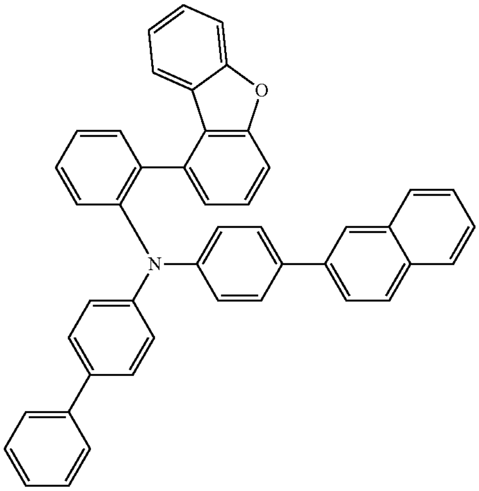
-continued
050
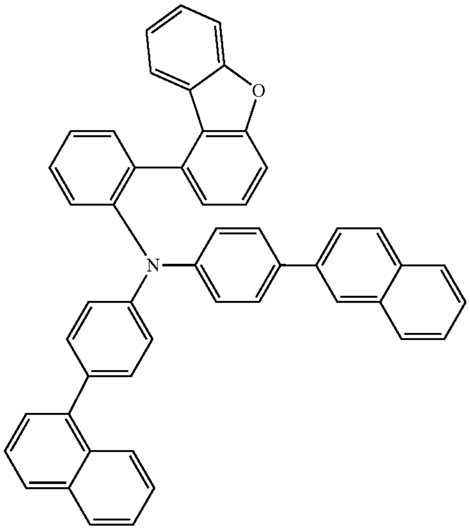
051
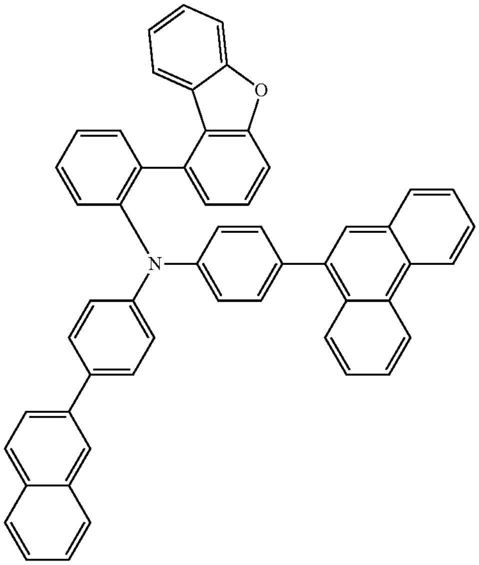
052
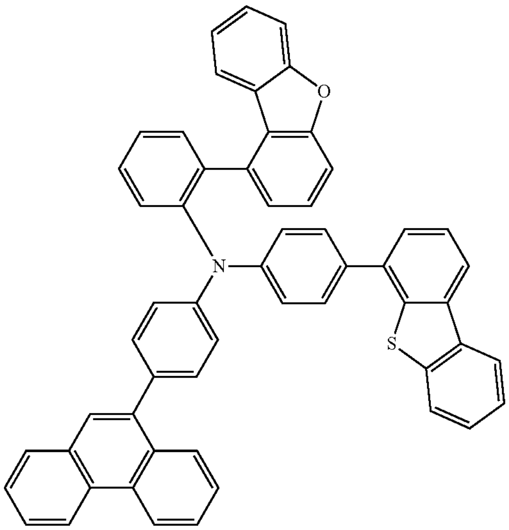

-continued
053
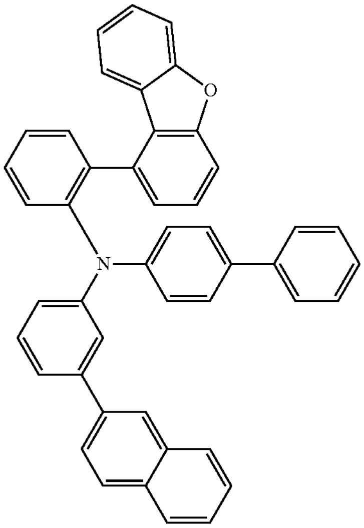
054
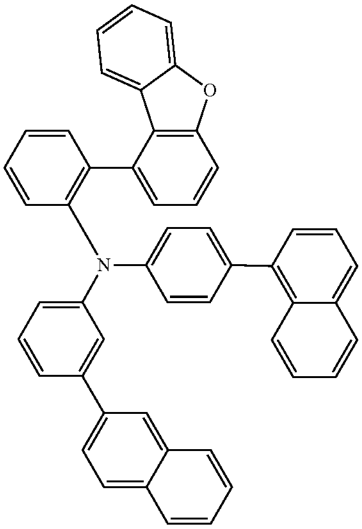
055
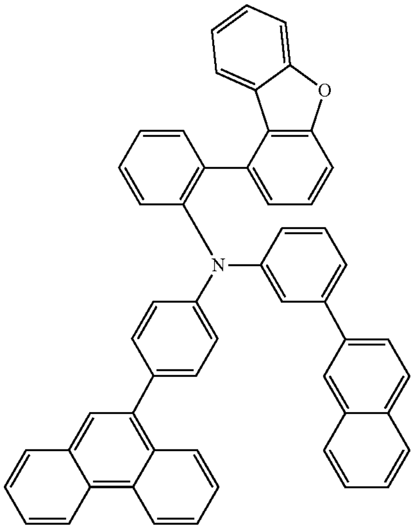
-continued
056
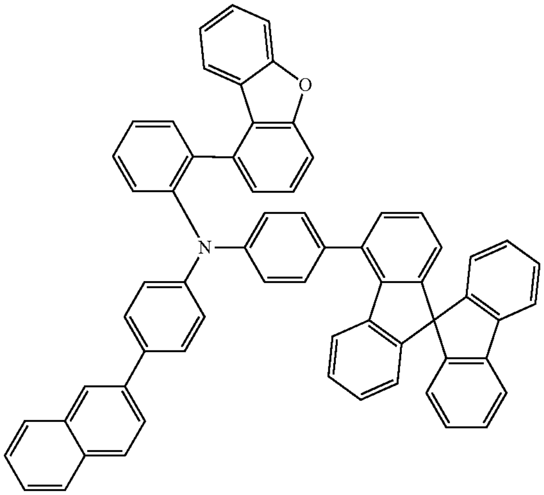
057
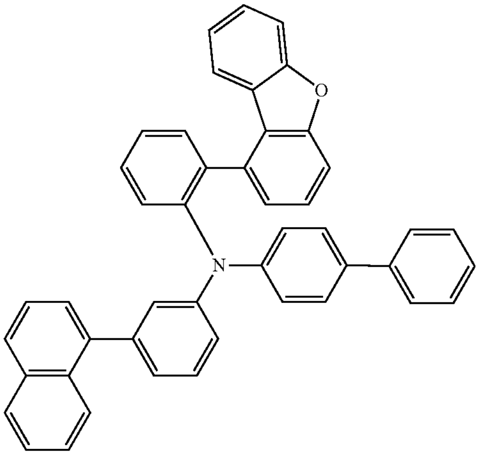
058
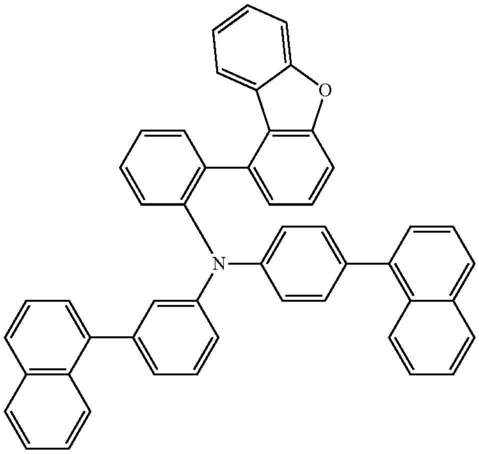

-continued
059
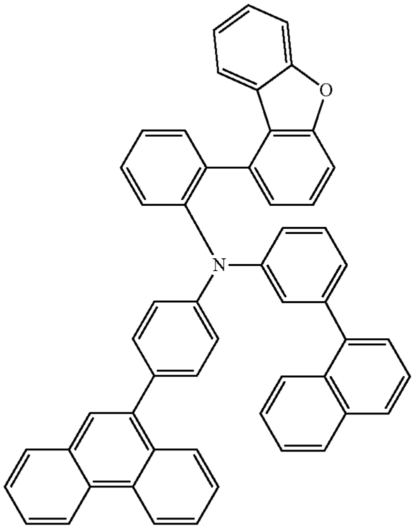
060
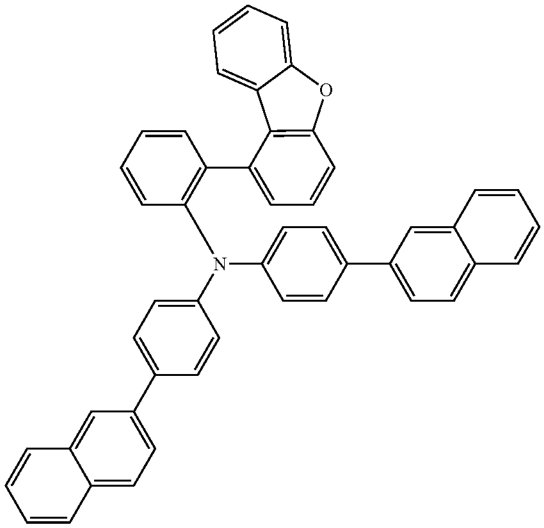
061
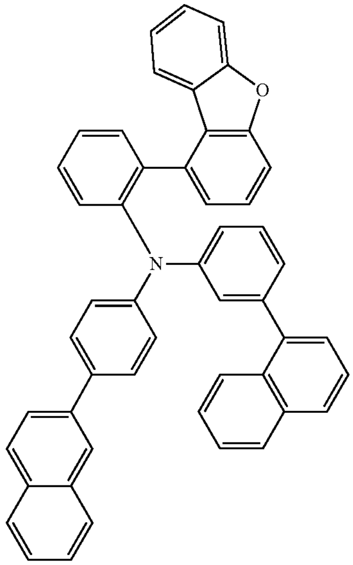
-continued
062
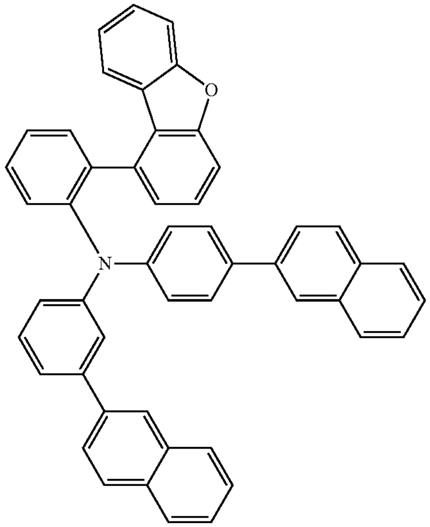
063
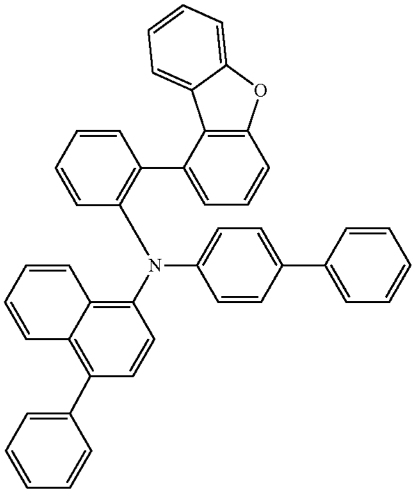
064
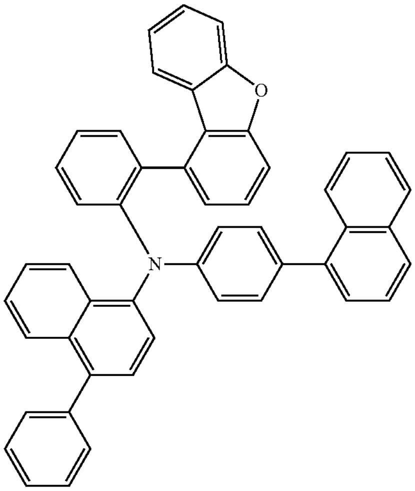

-continued
065
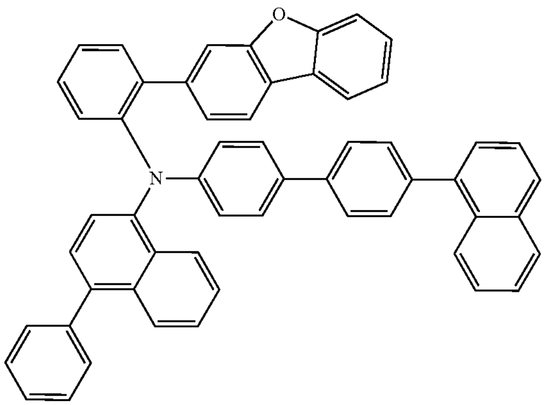
066
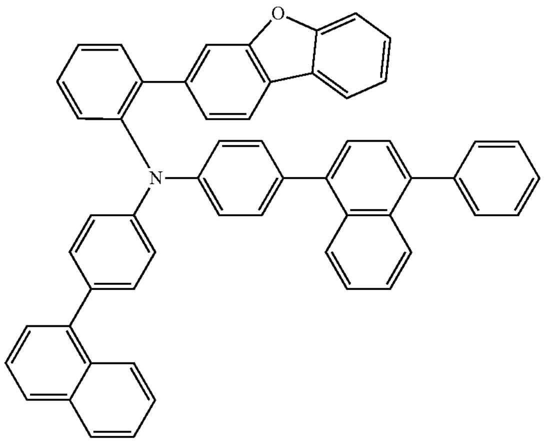
067
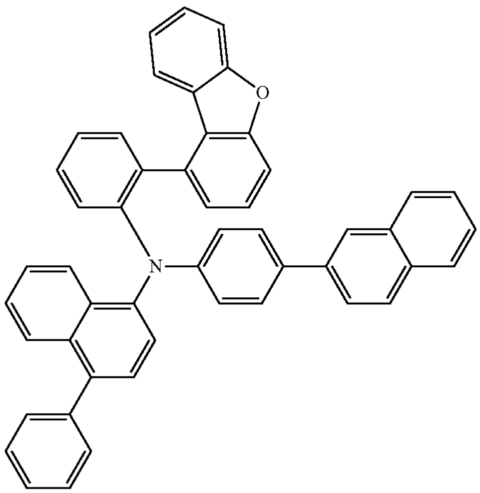
-continued
068
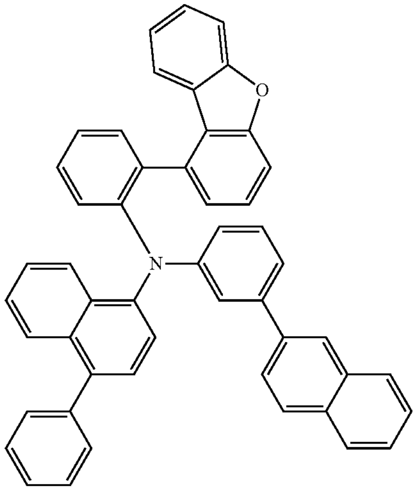
069
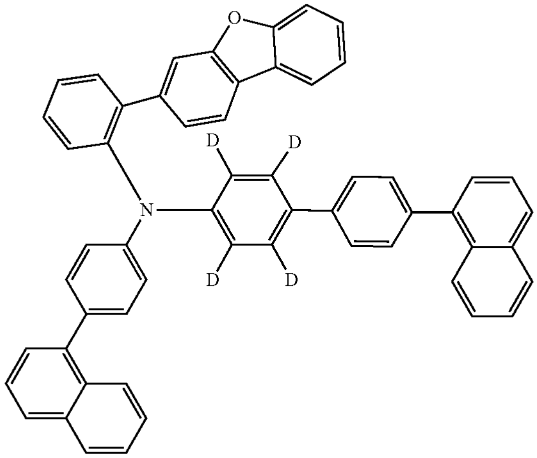
070
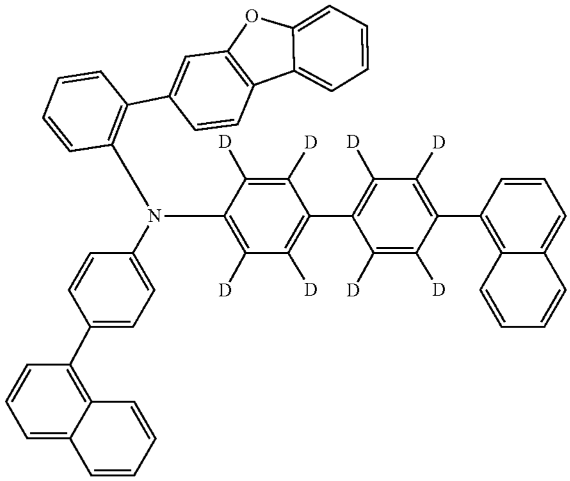

071
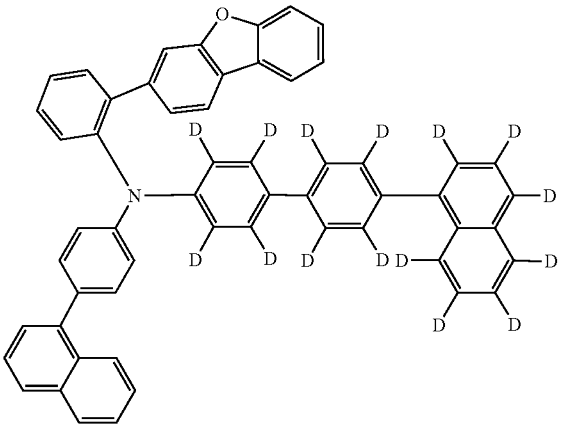
072
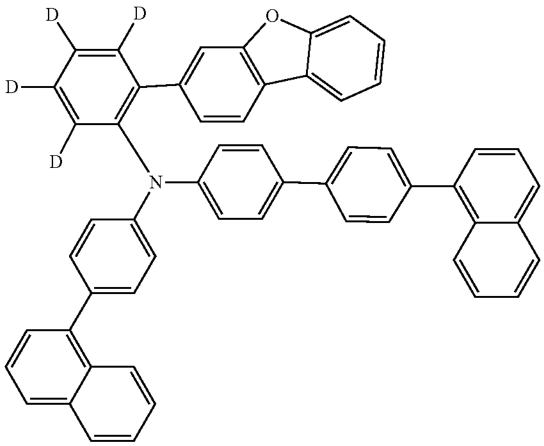
073
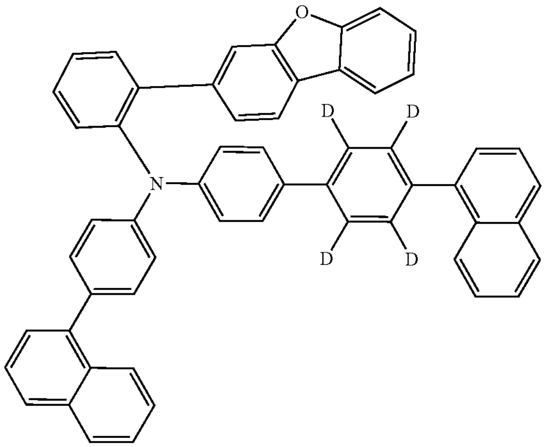
074
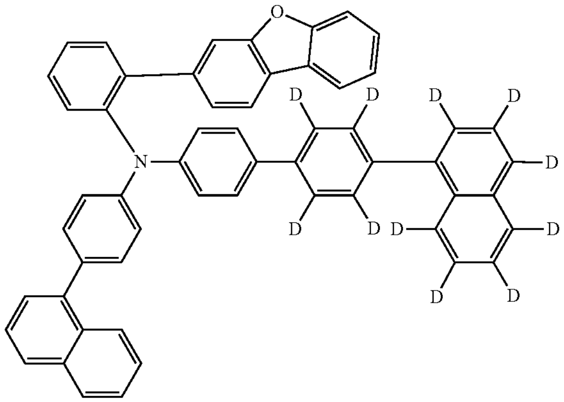
075
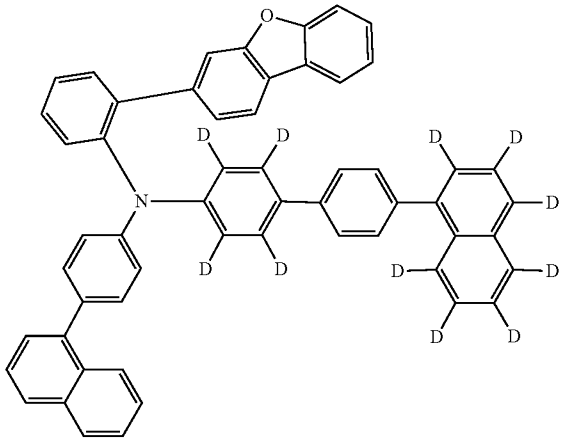
076
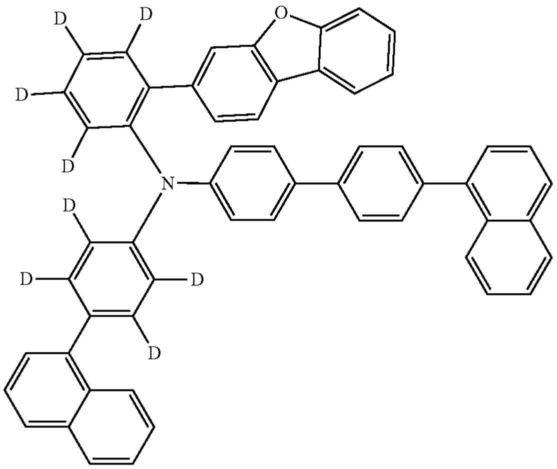

-continued
077
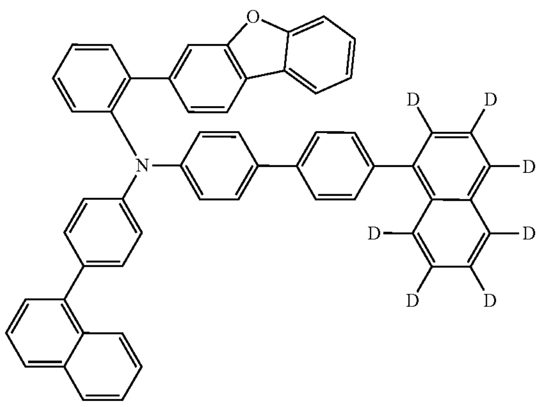
078
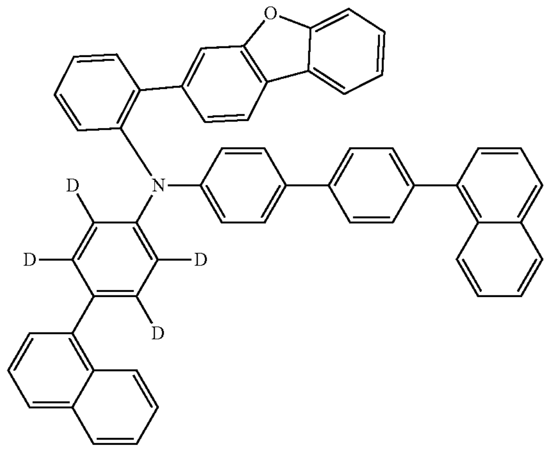
079
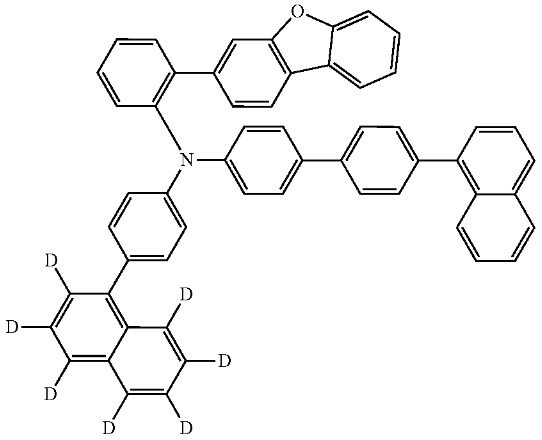
-continued
080
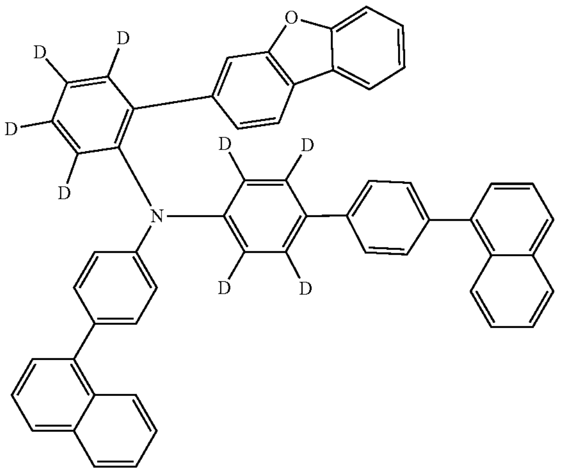
081
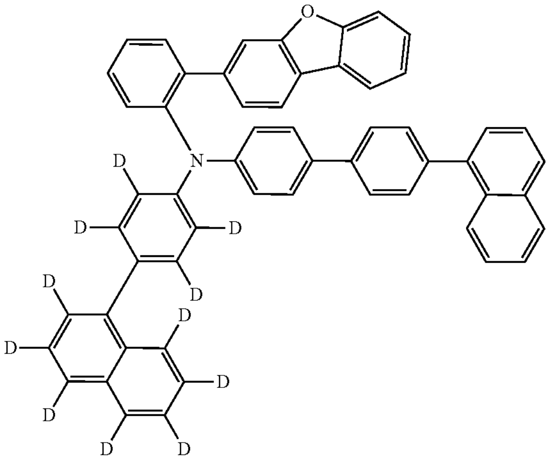
082
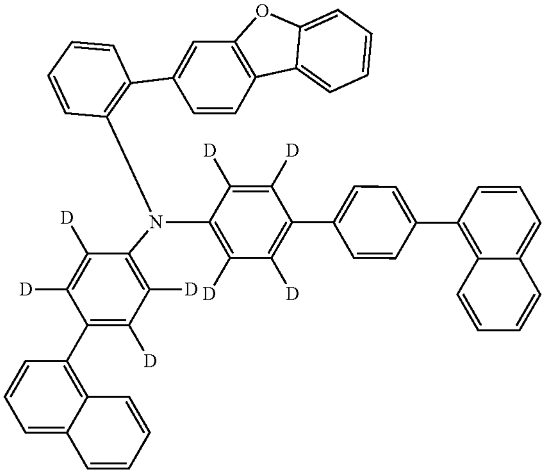

-continued
083
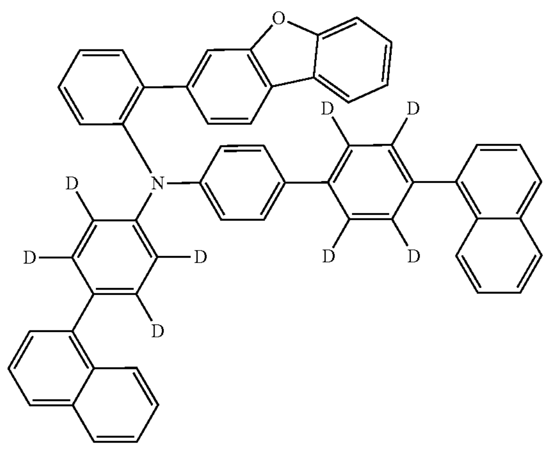
084
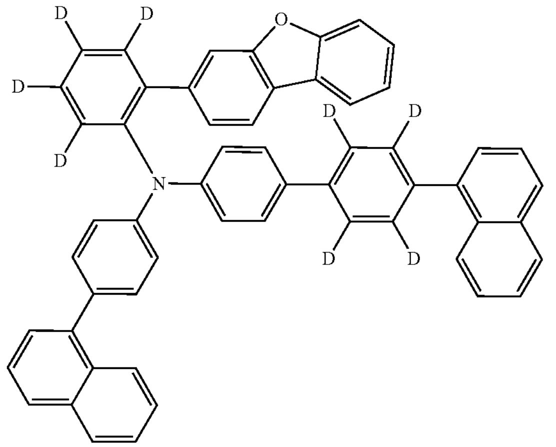
085
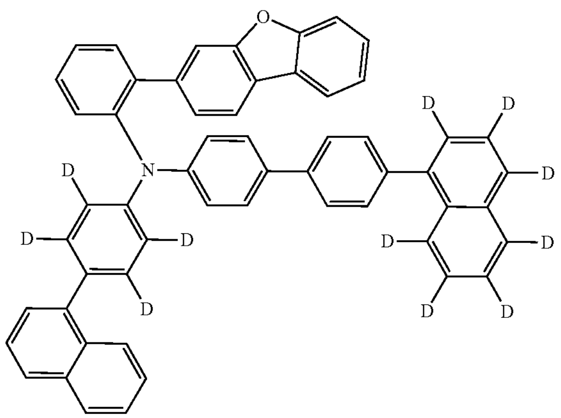
-continued
086
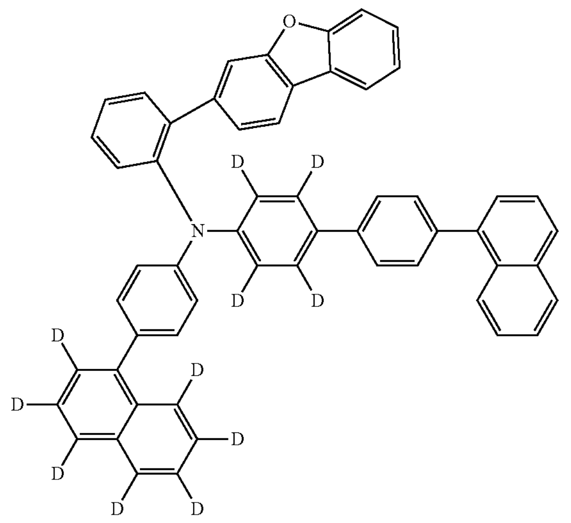
087
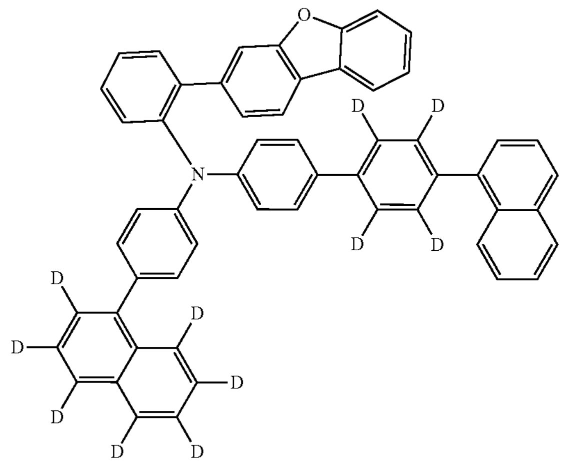
088
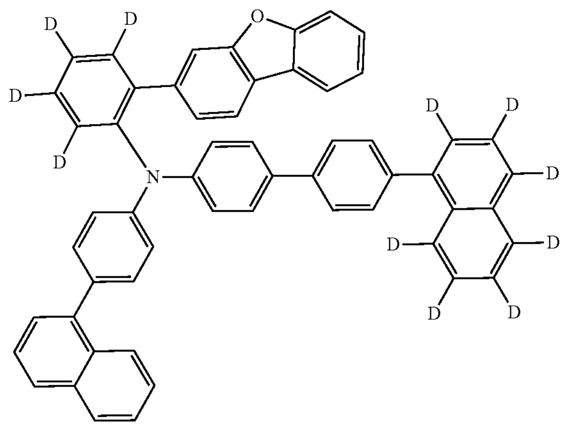

-continued
089
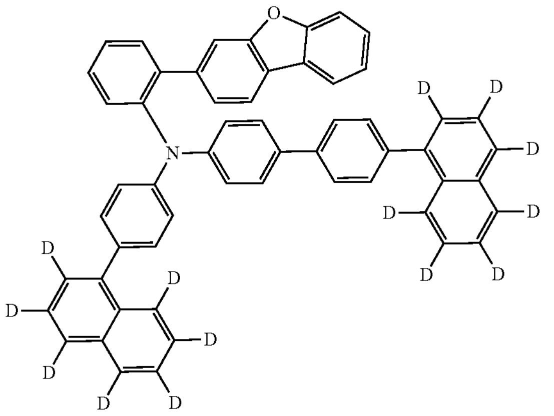
090
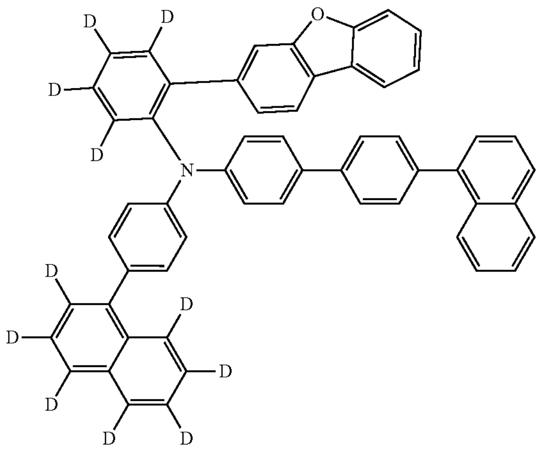
091
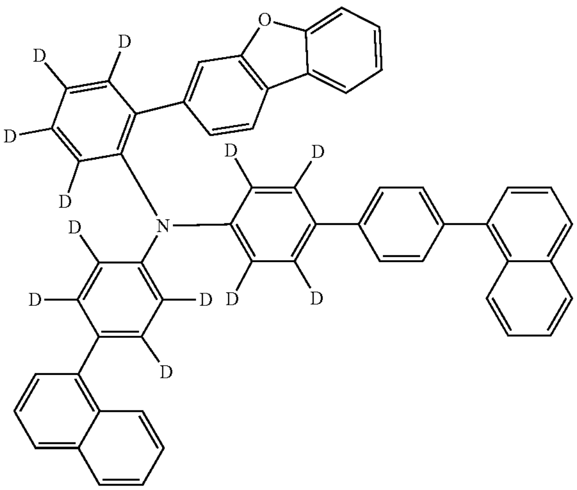
-continued
092
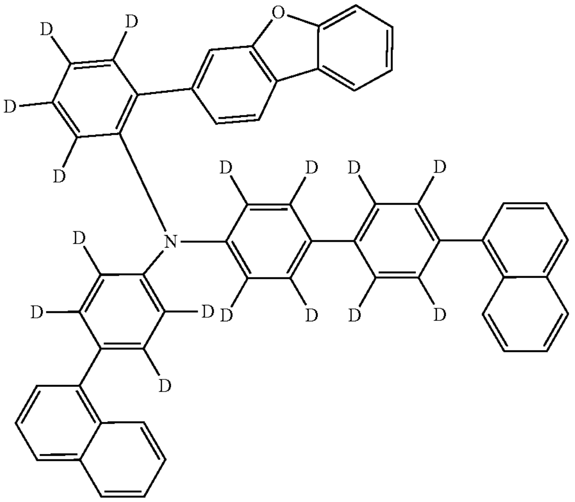
093
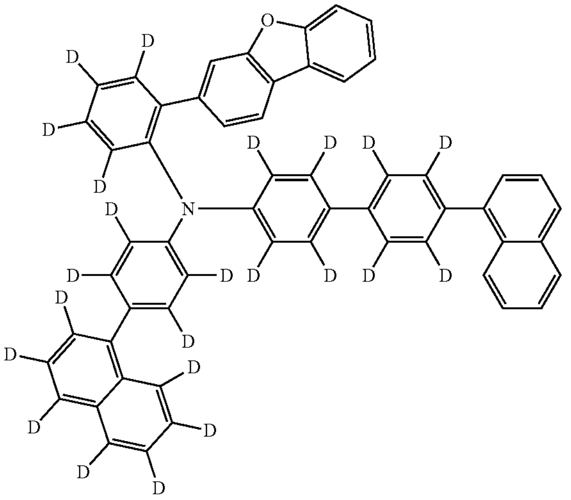
094
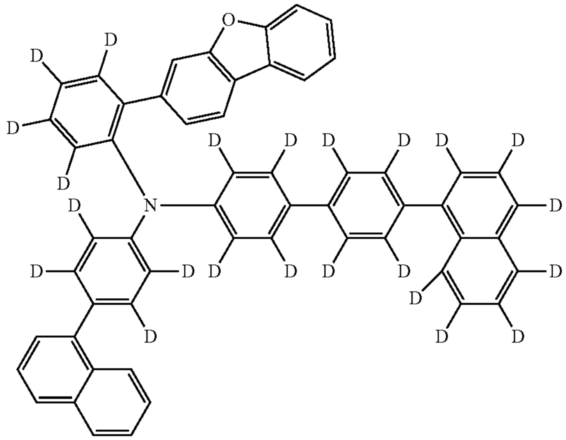

095
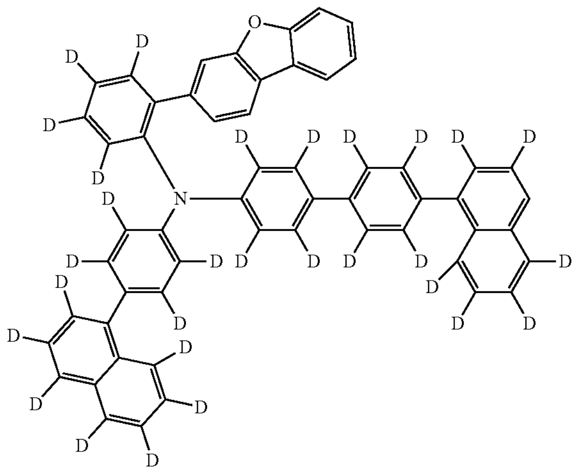
096
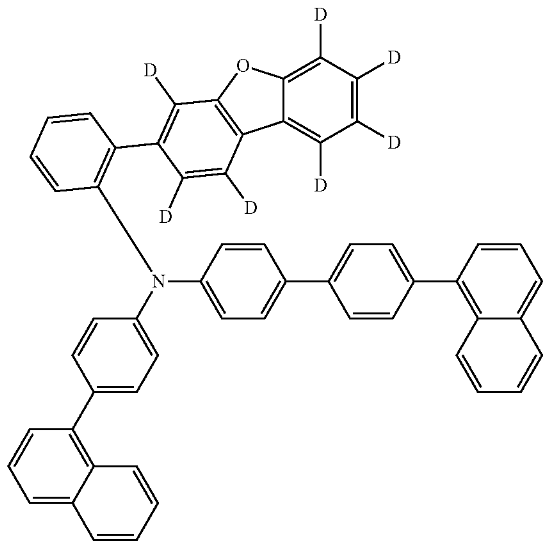
097
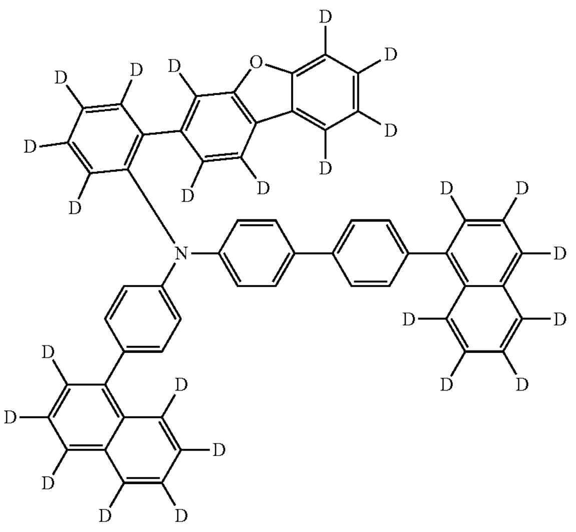
098
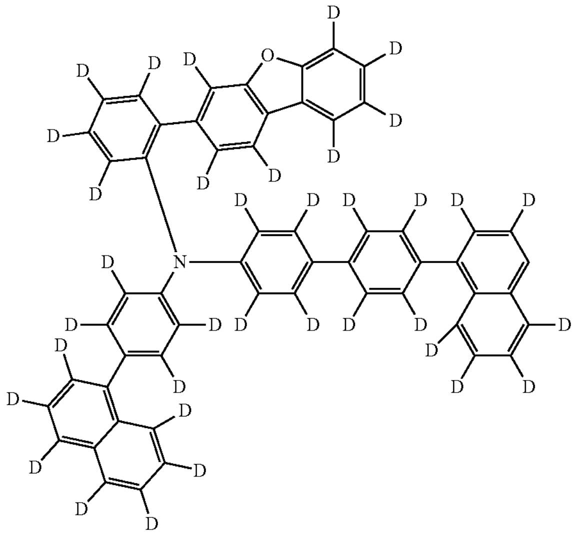
099
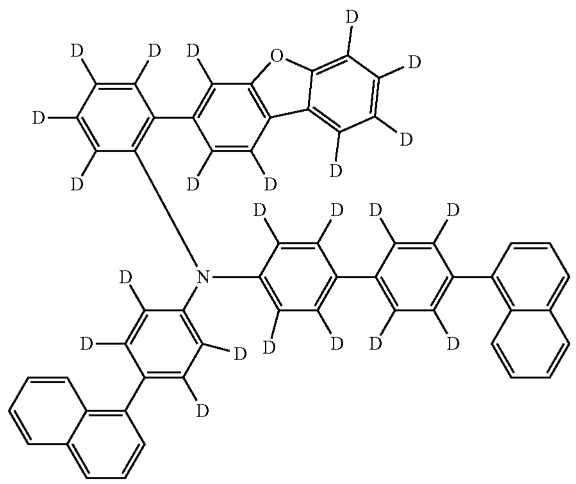
100
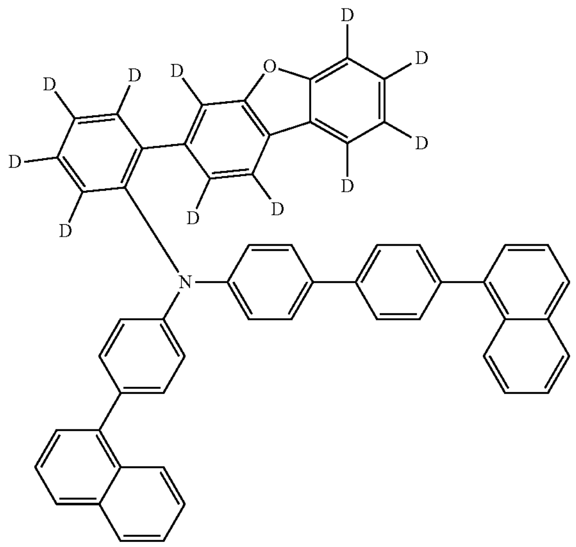

101
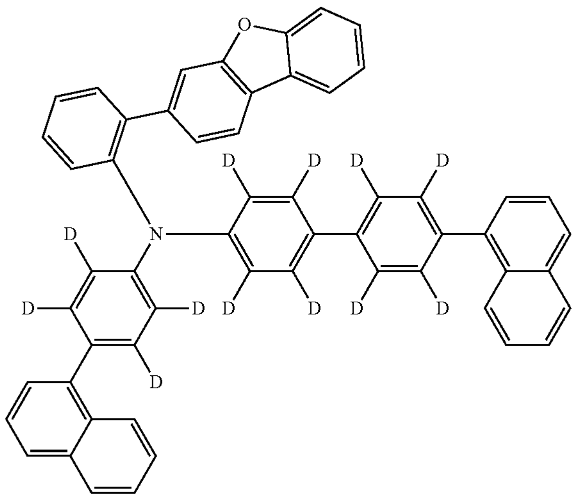
102
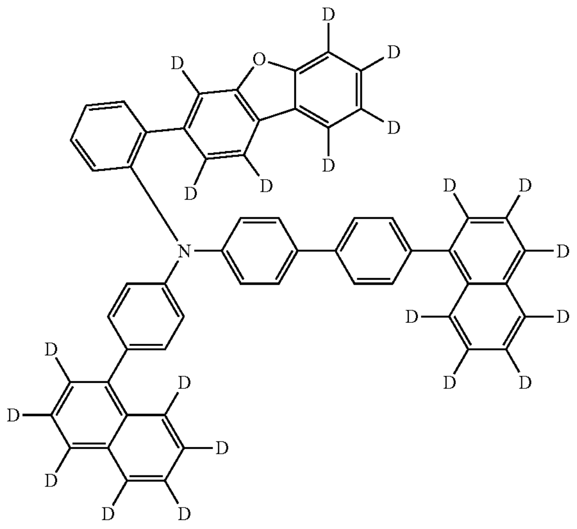
103
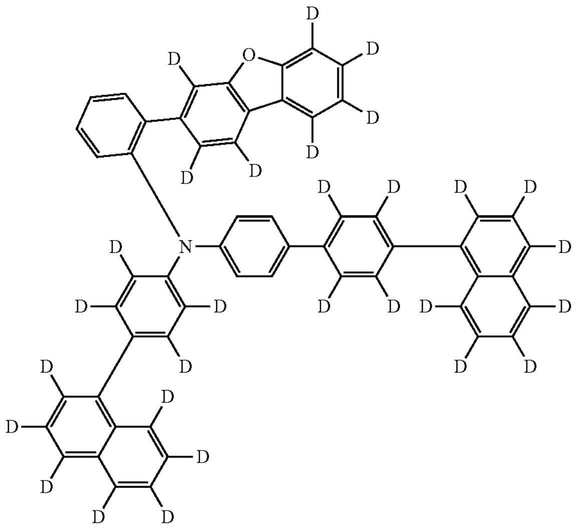
104
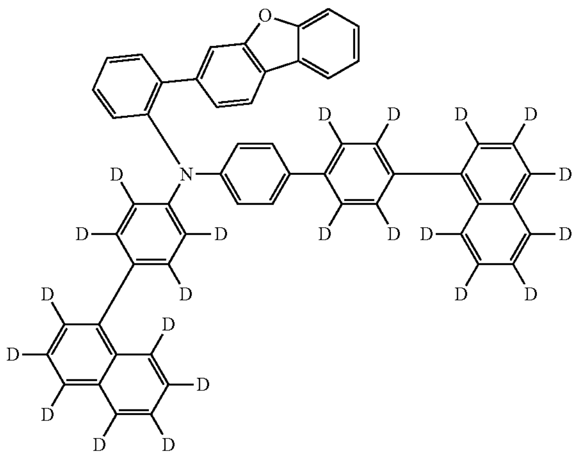
105
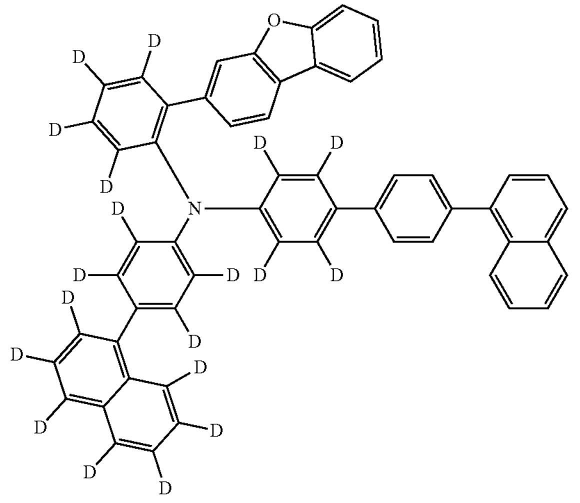
106
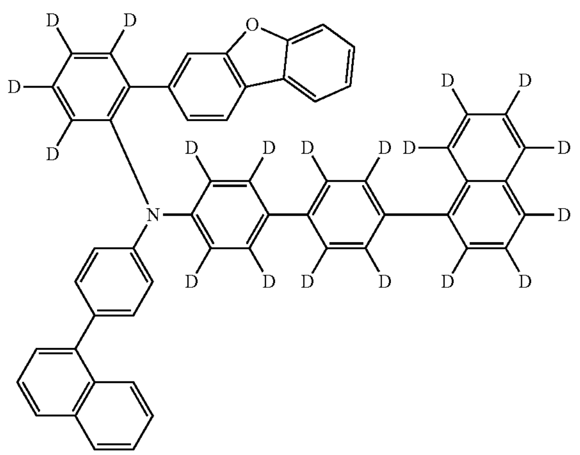

-continued
107
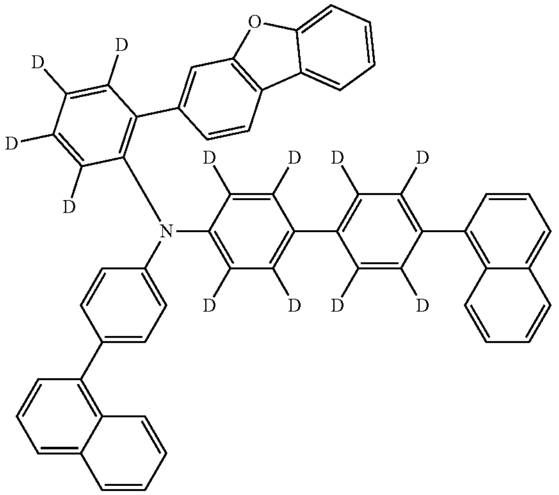
108
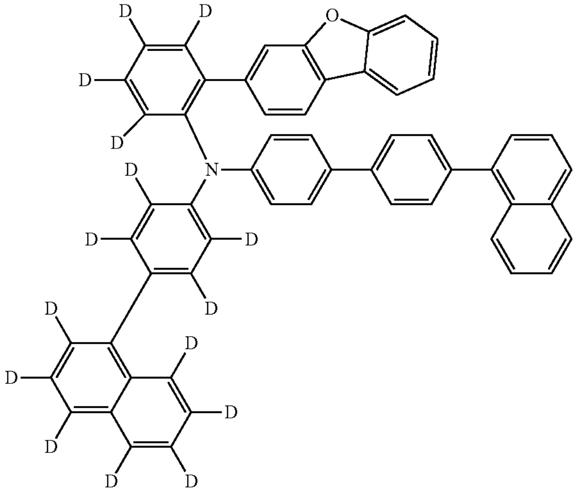
109
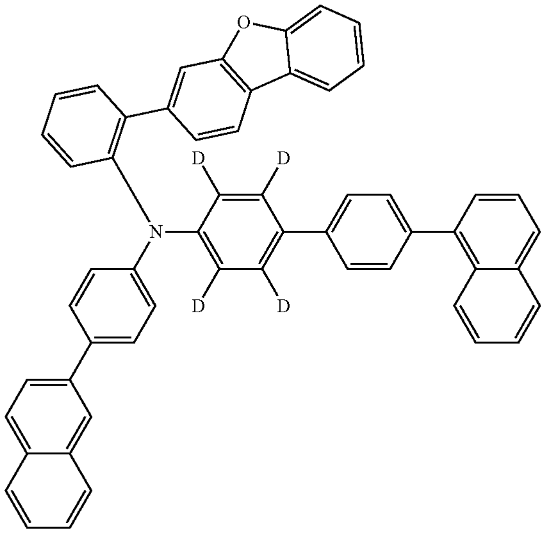
-continued
110
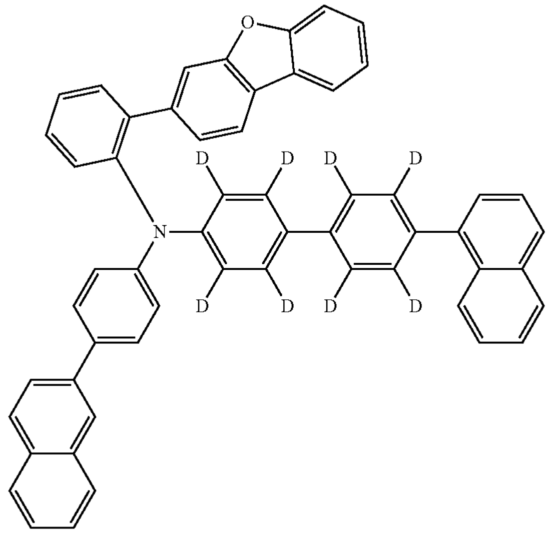
111
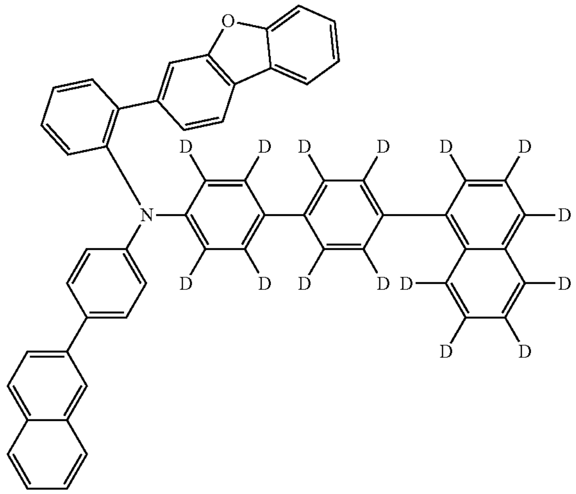
112
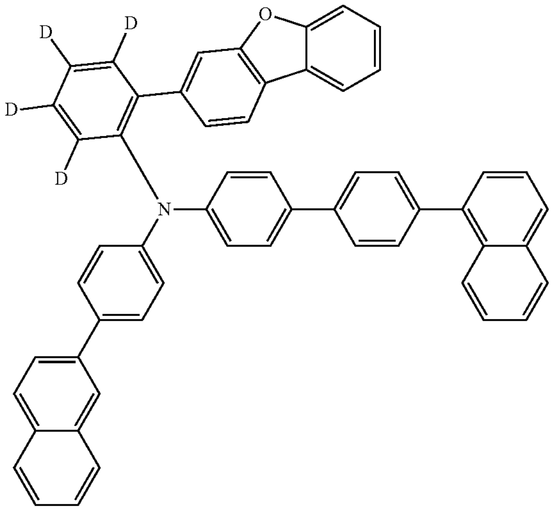

-continued
113
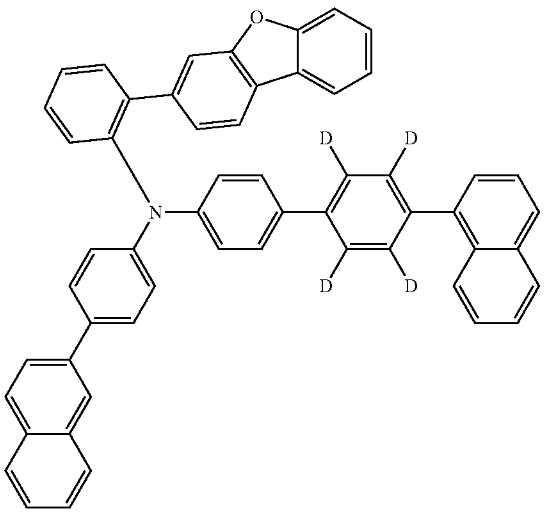
114
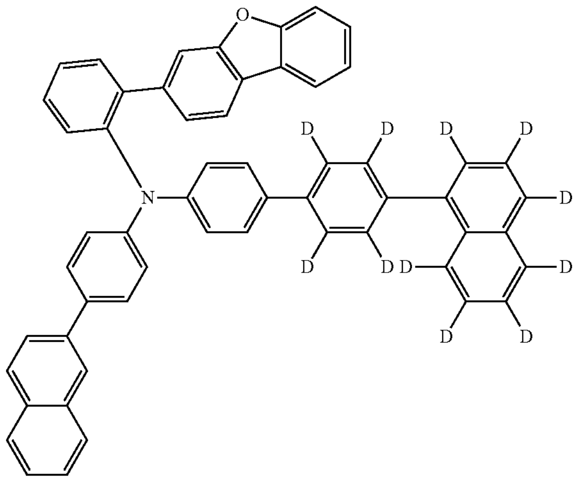
115
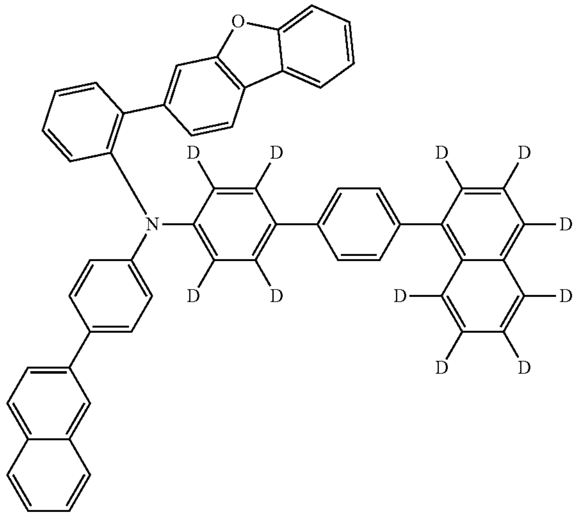
-continued
116
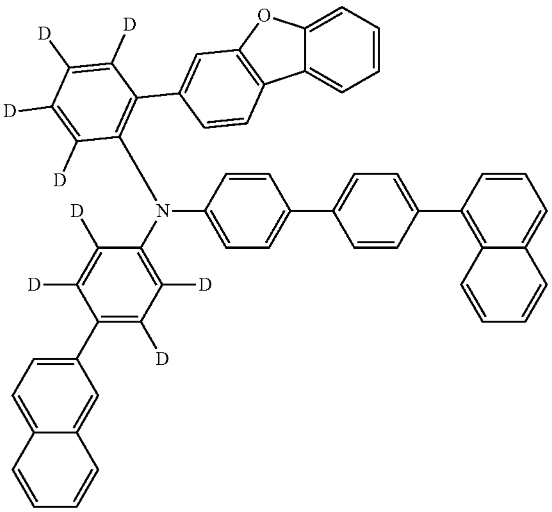
117
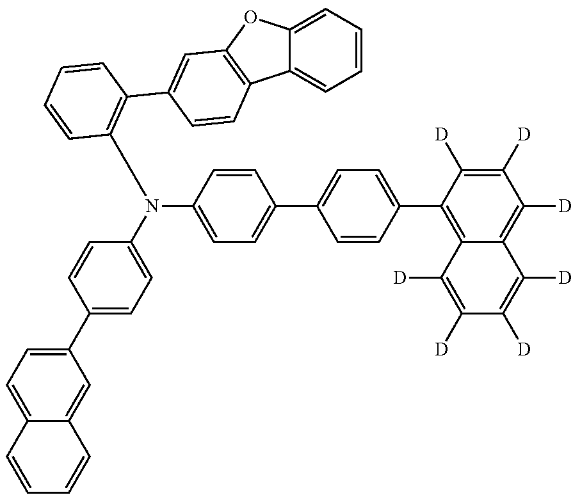
118
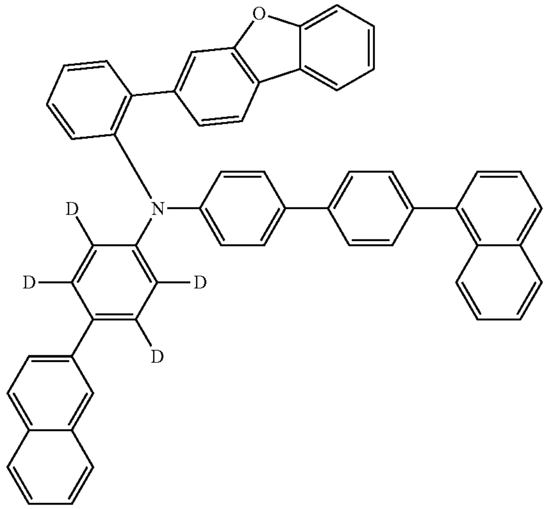

-continued
119
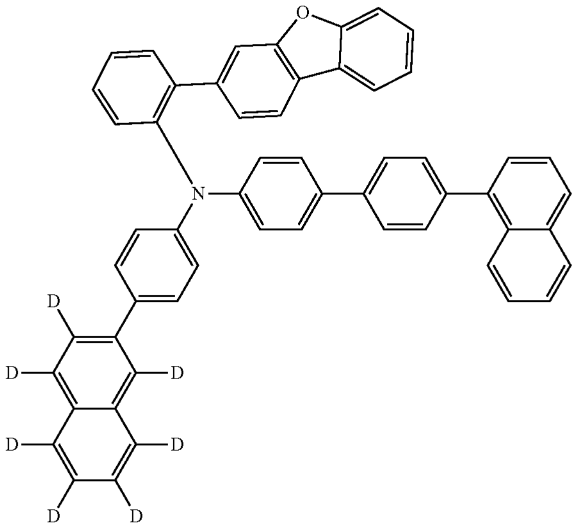
120
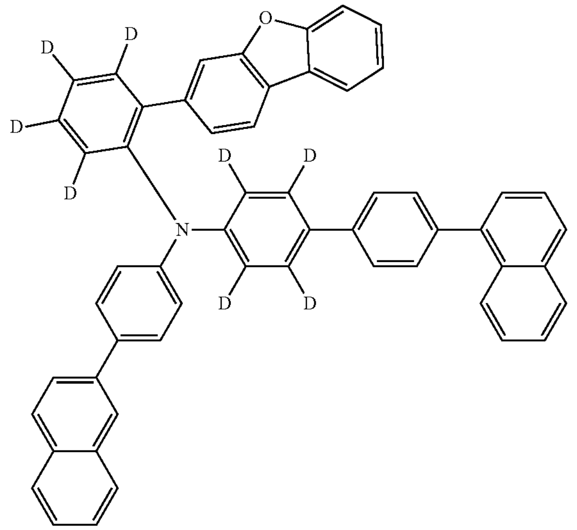
121
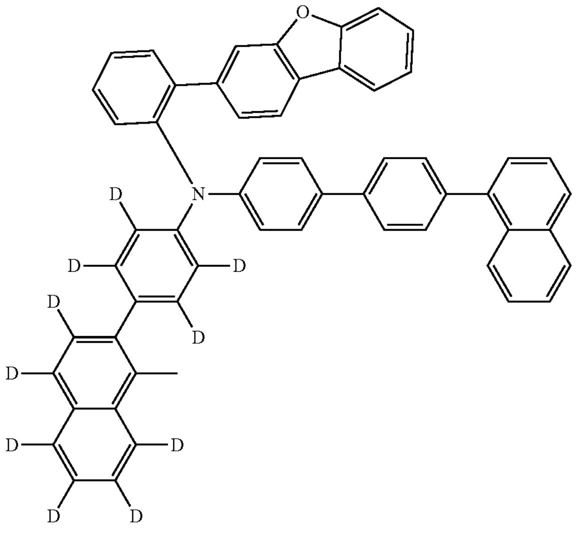
-continued
122
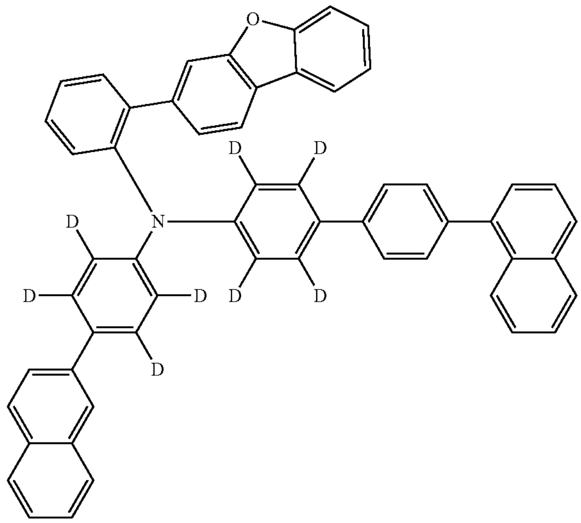
123
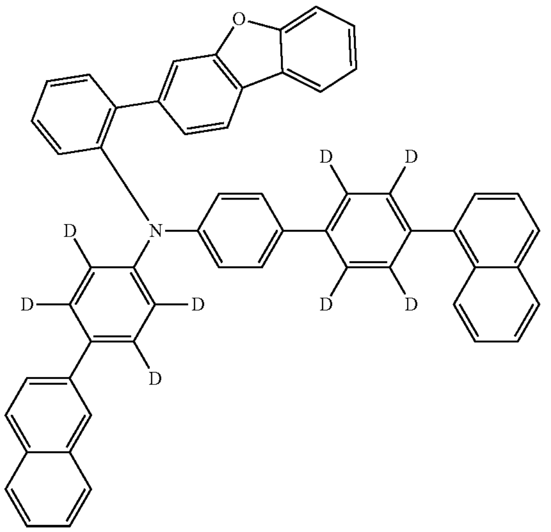
124
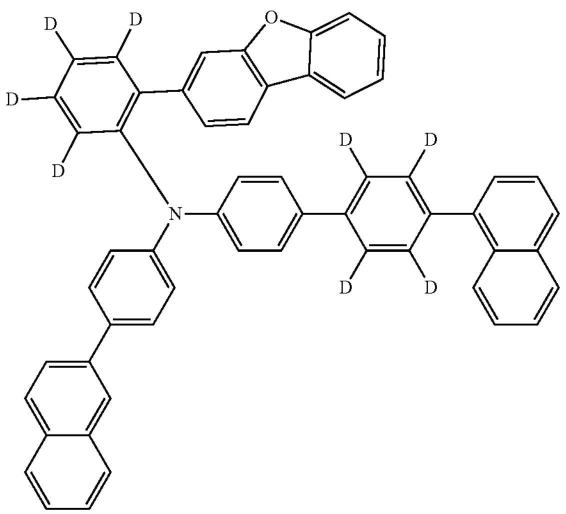

-continued
125
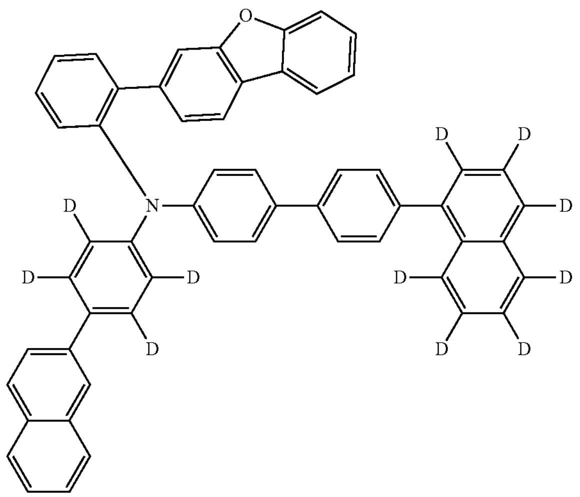
126
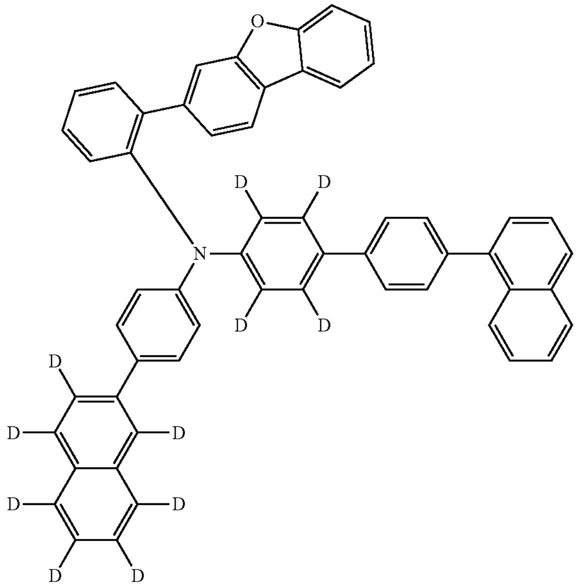
-continued
127
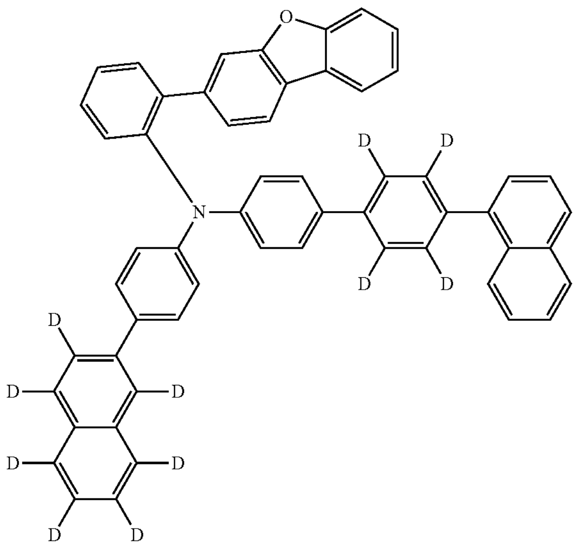
128
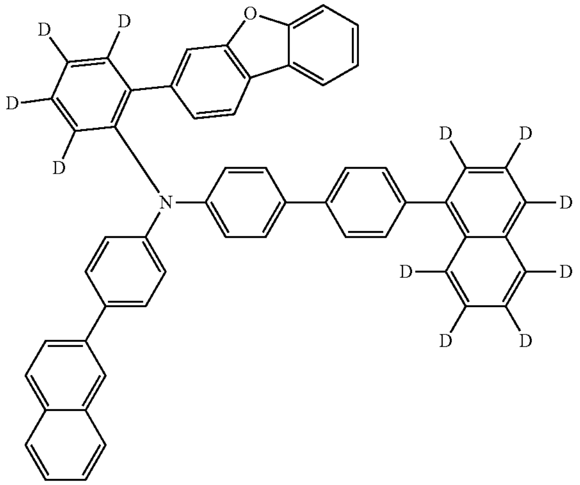
129
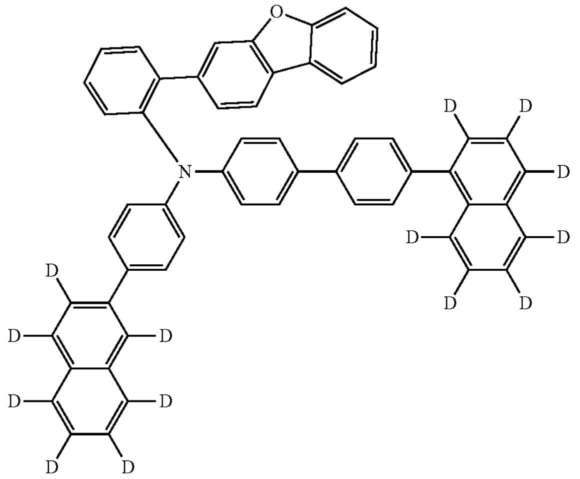

-continued
130
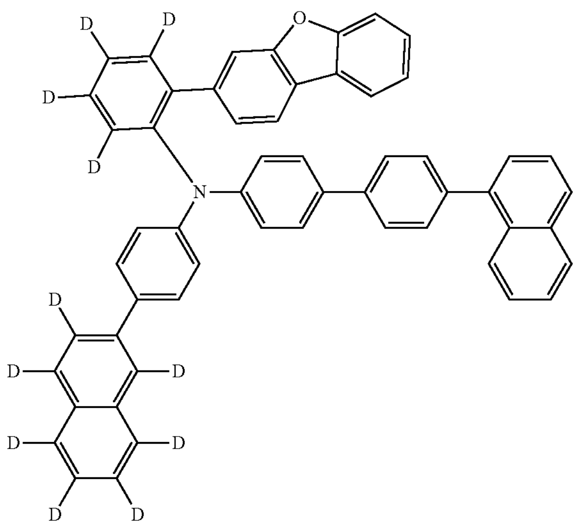
131
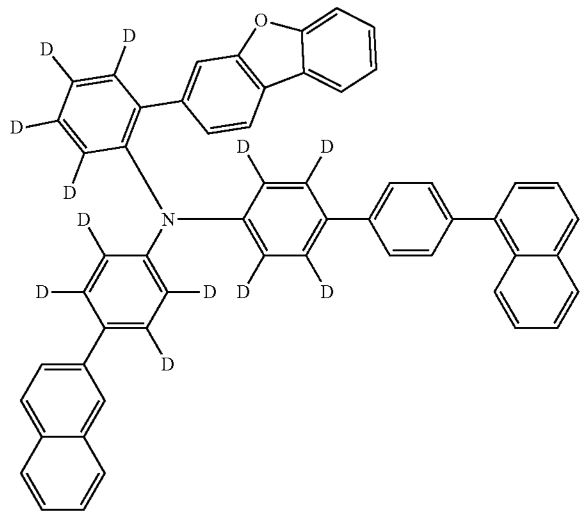
132
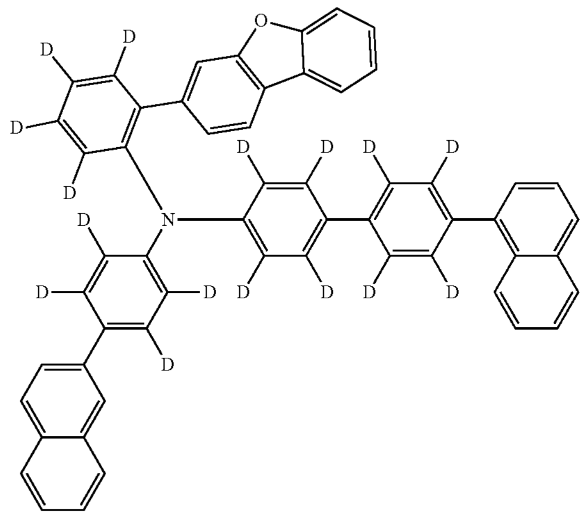
-continued
133
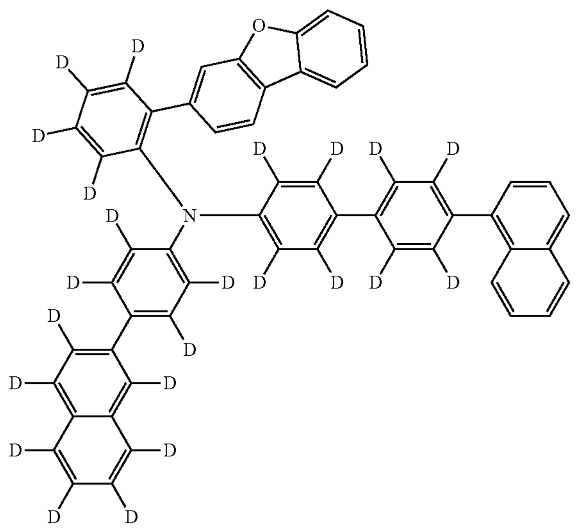
134
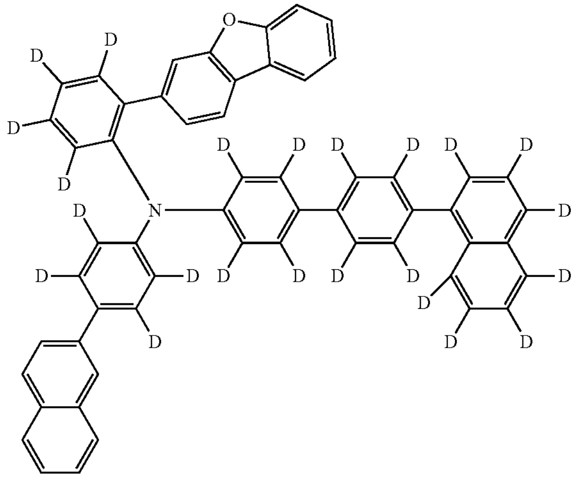
135
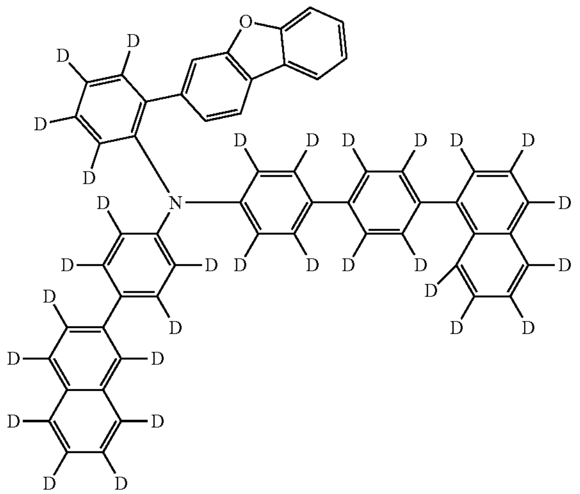

-continued
136
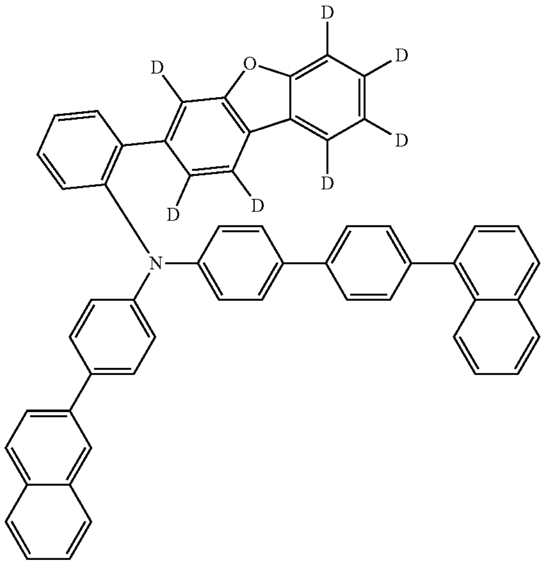
137
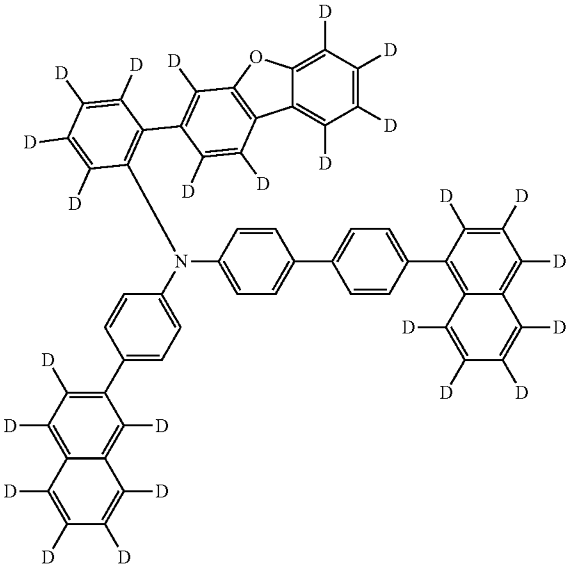
-continued
138
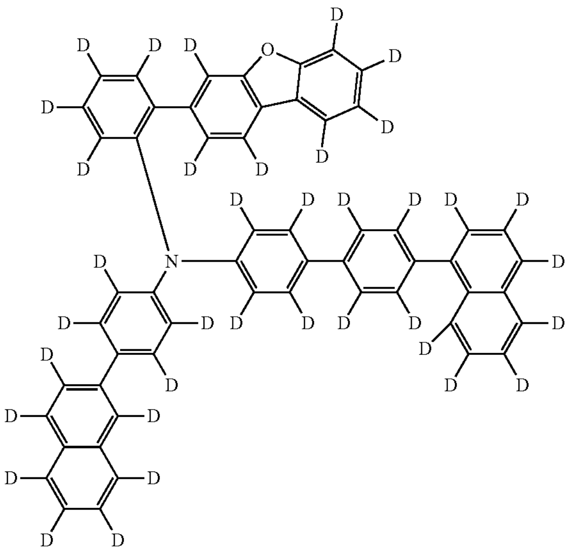
139
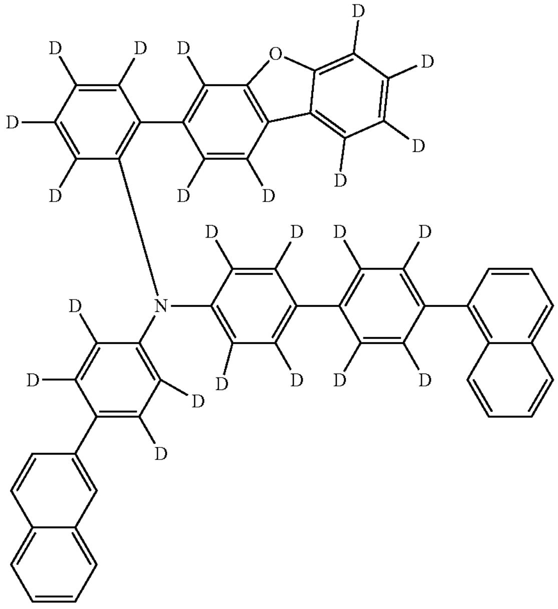

-continued
140
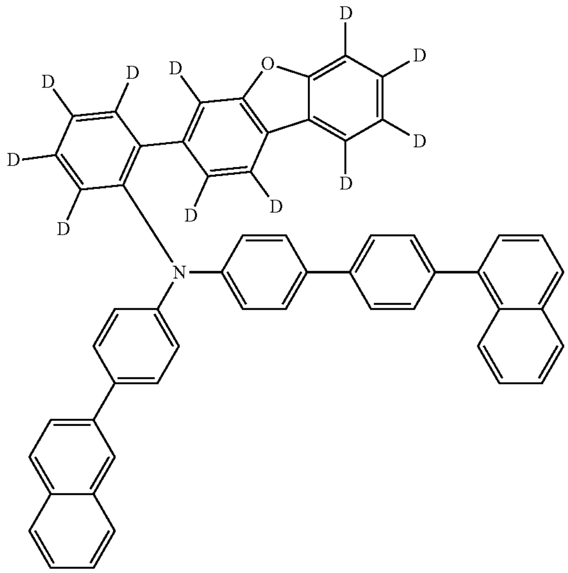
141
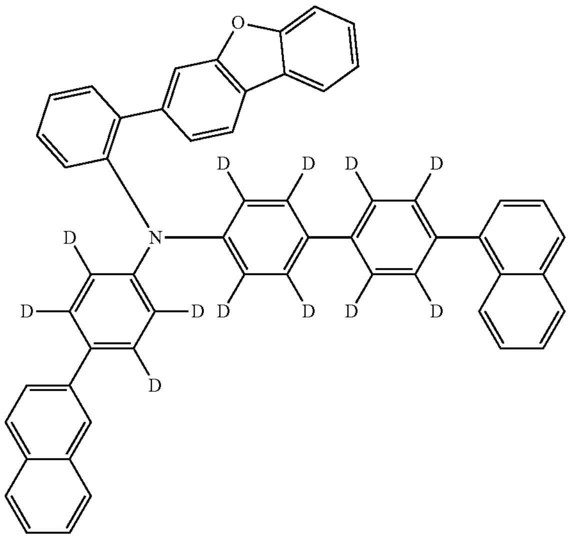
-continued
142
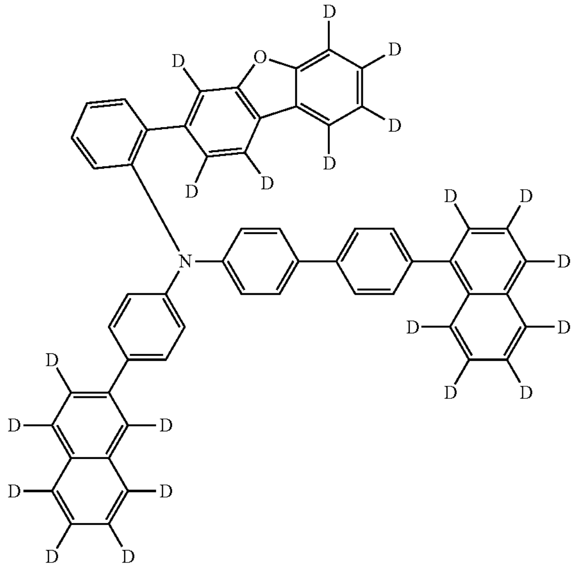
143
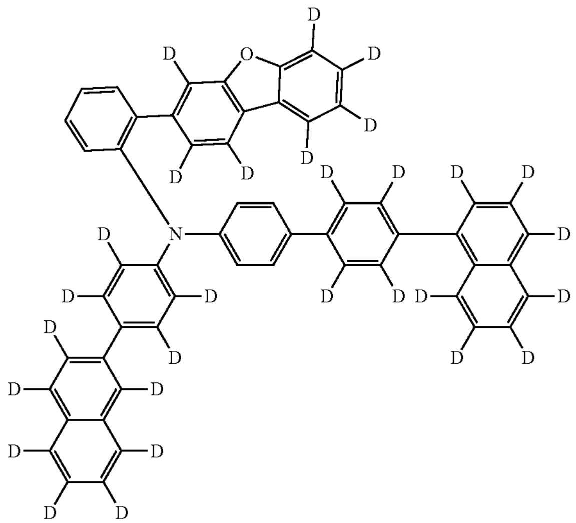
144
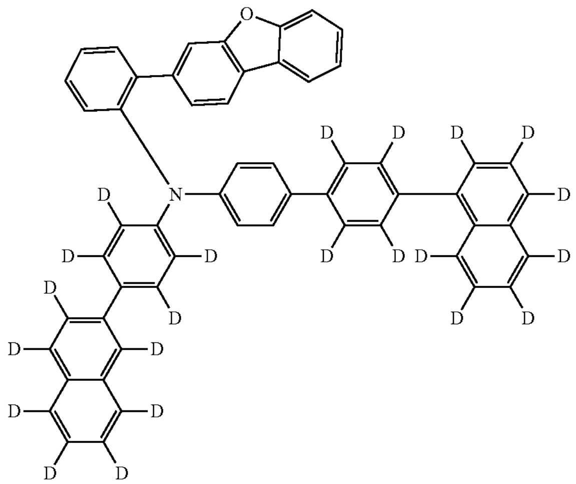

-continued
145
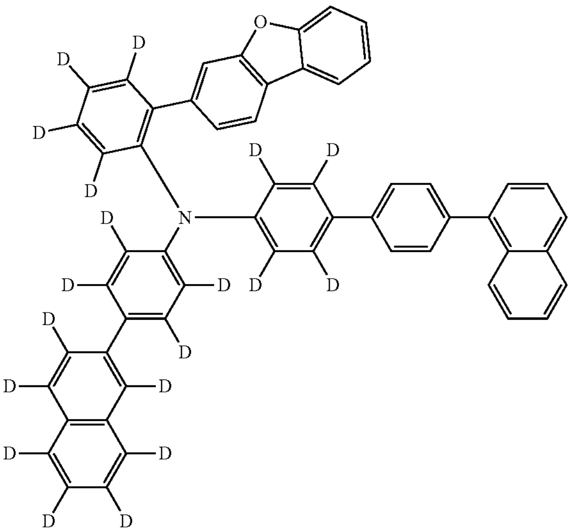
146
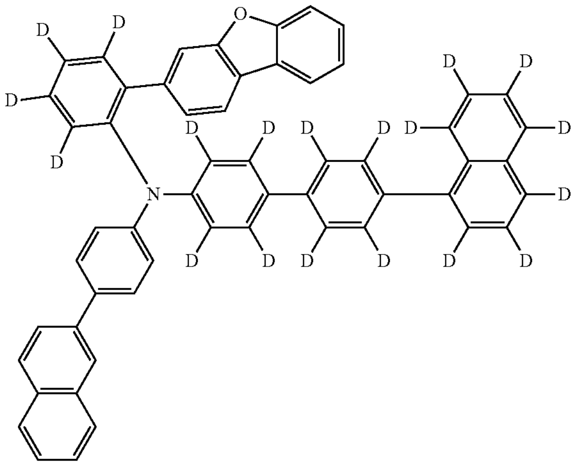
147
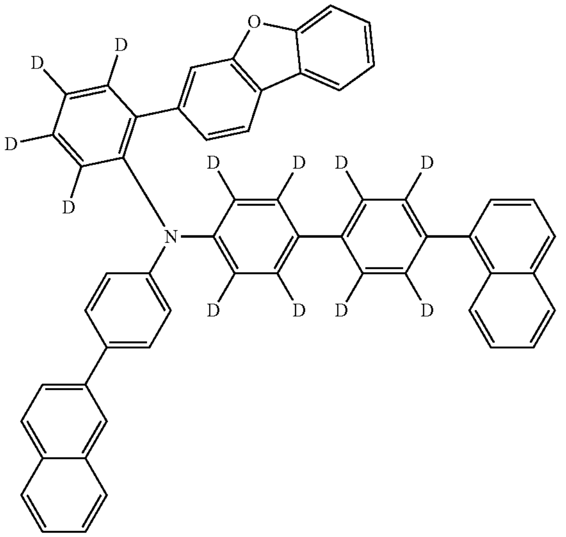
-continued
148
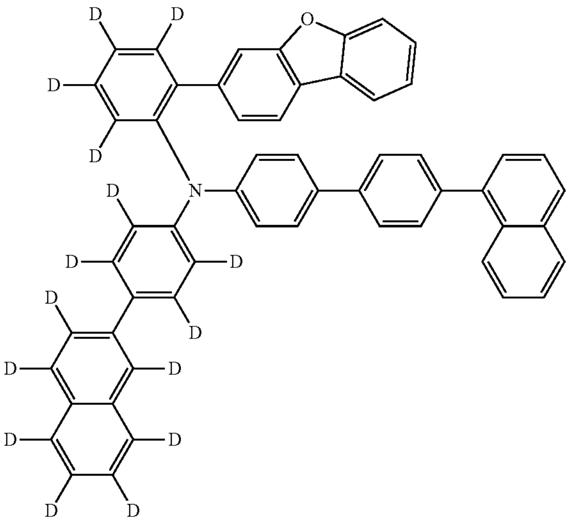
149
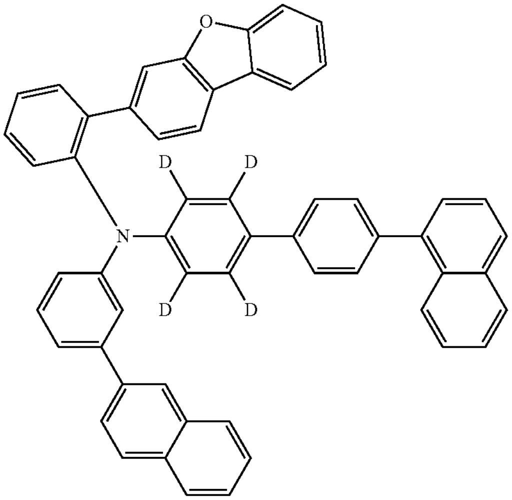
150
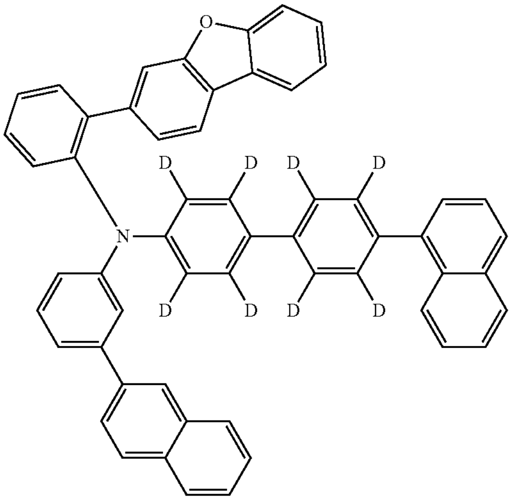

-continued
151
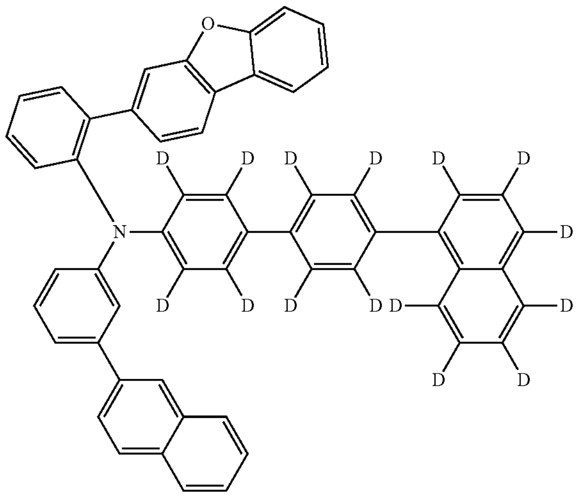
152
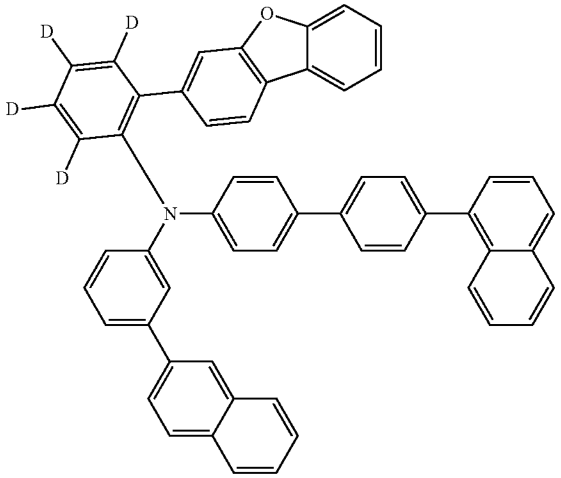
153
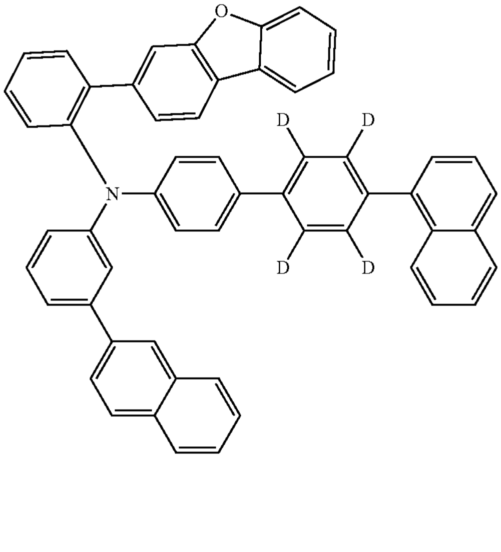
-continued
154
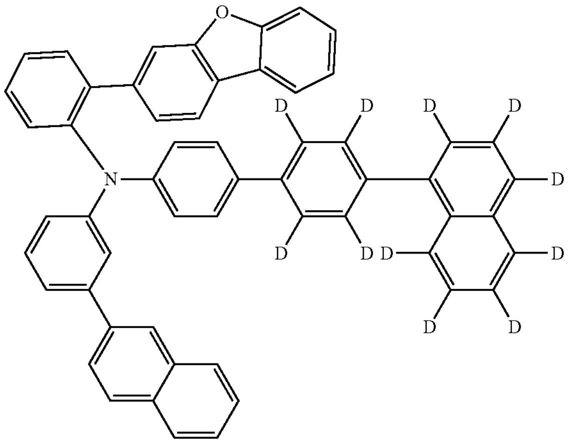
155
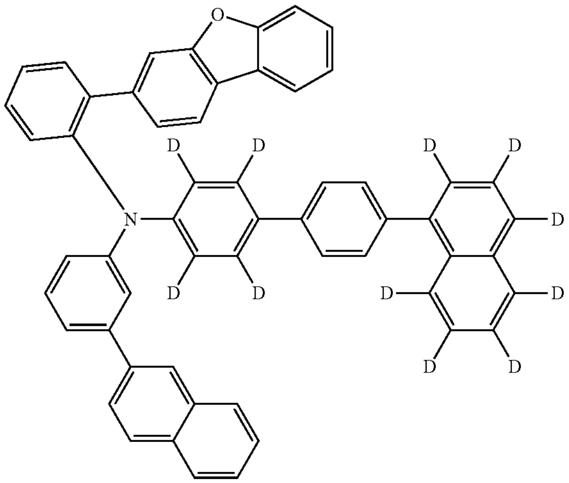
156
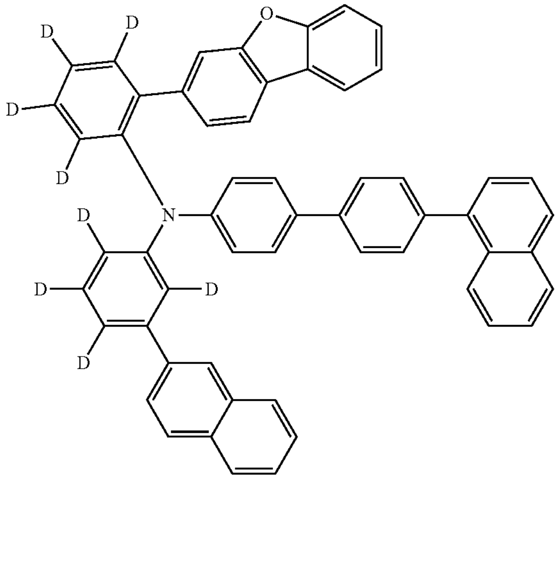

-continued
157
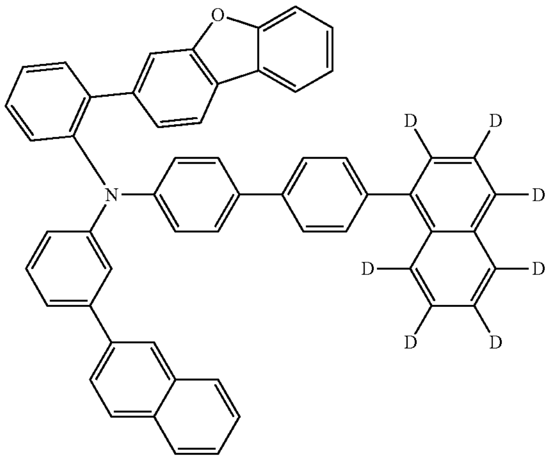
158
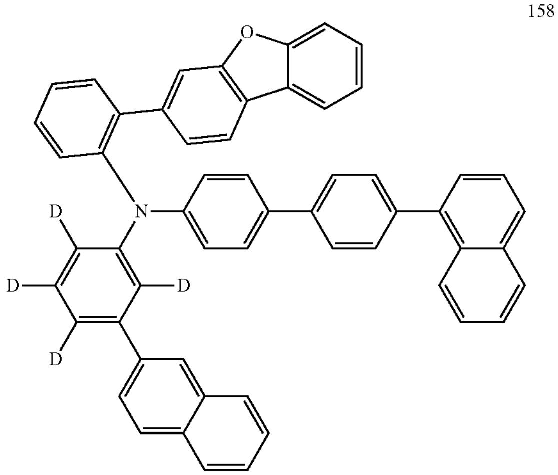
159
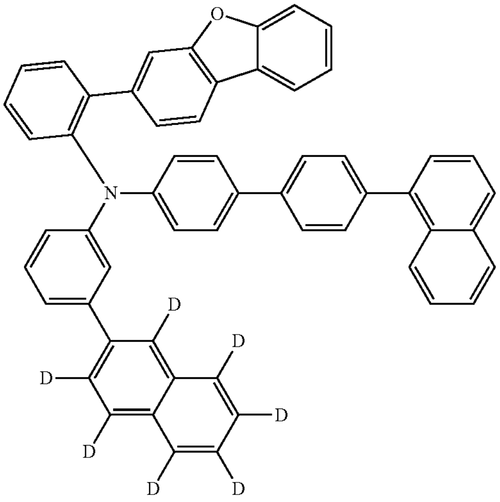
-continued
160
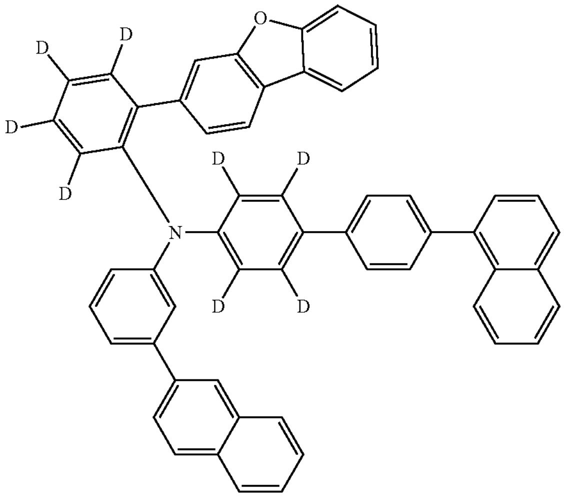
161
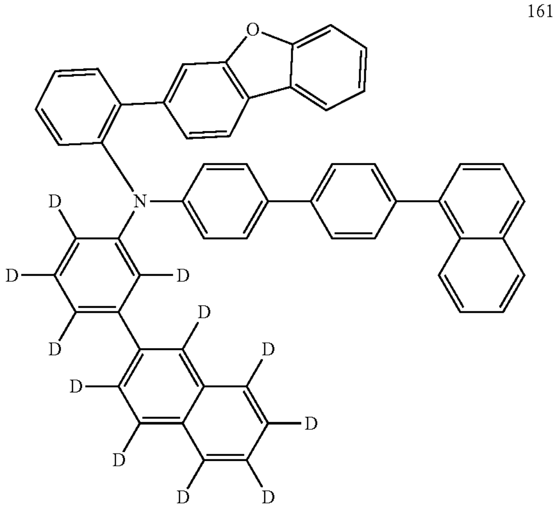
162
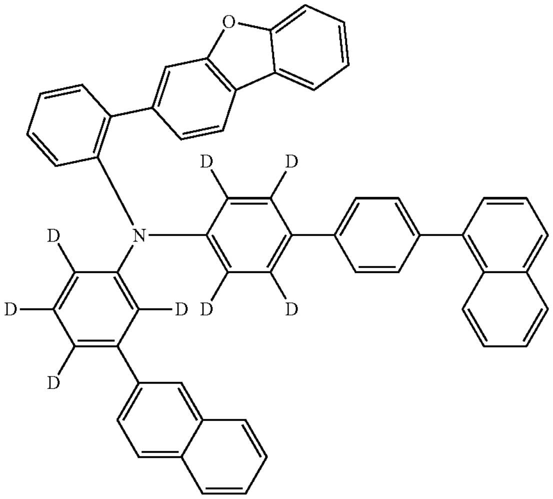

-continued
163
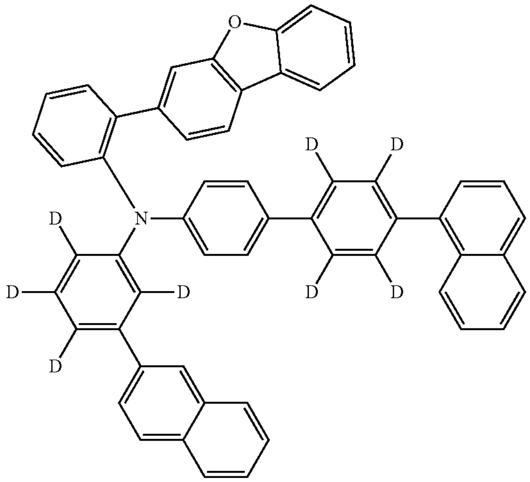
164
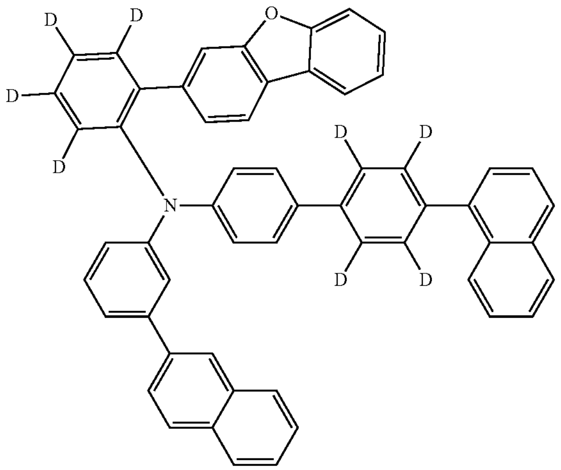
165
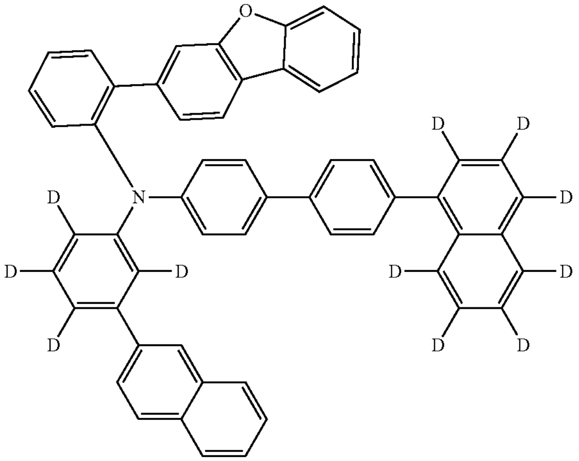
-continued
166
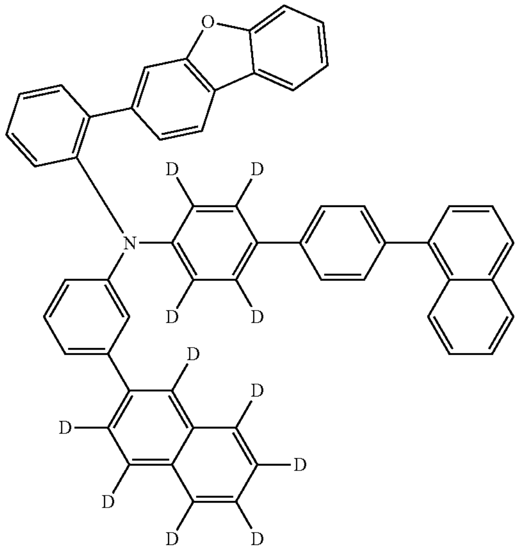
167
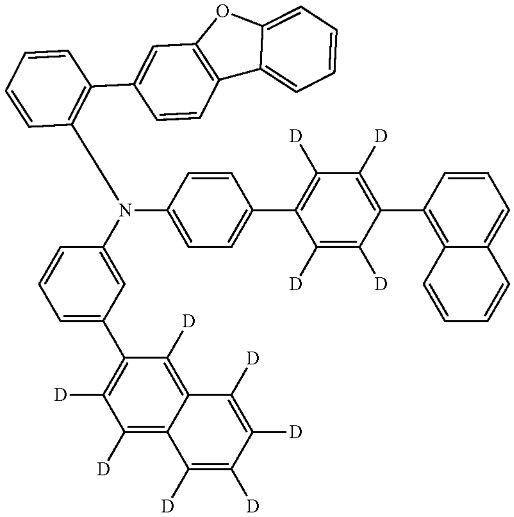
168
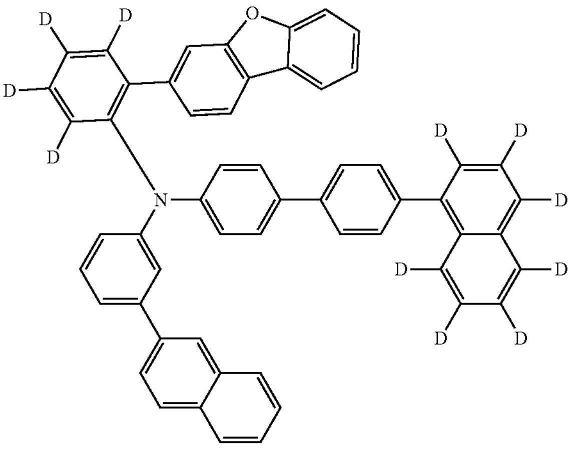

-continued
169
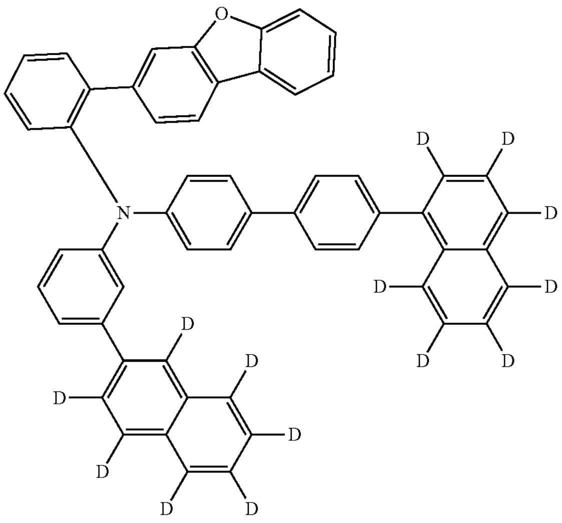
170
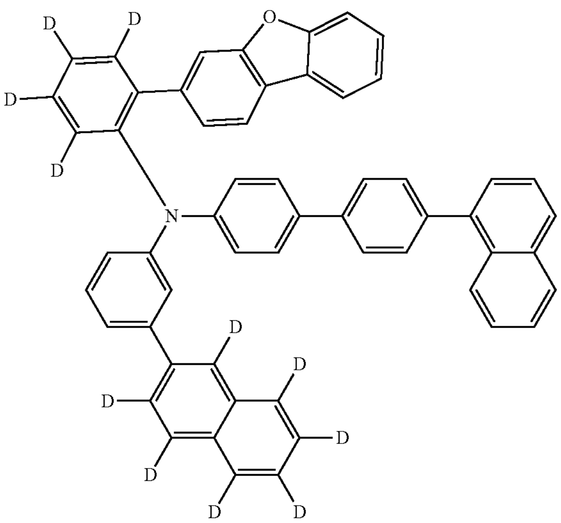
171
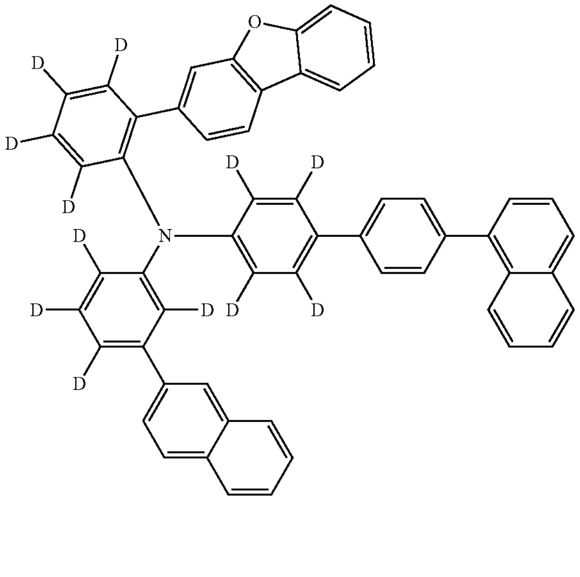
-continued
172
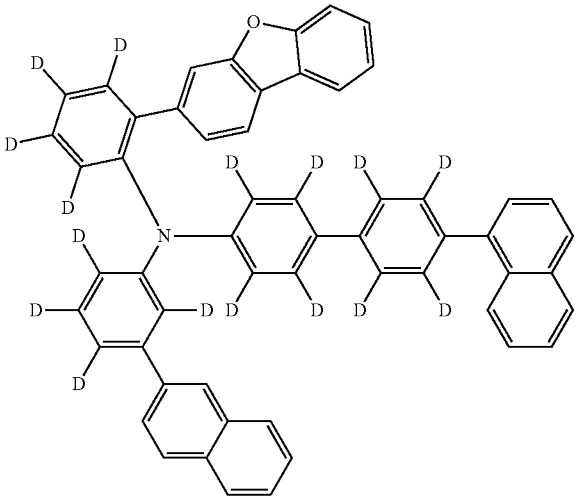
173
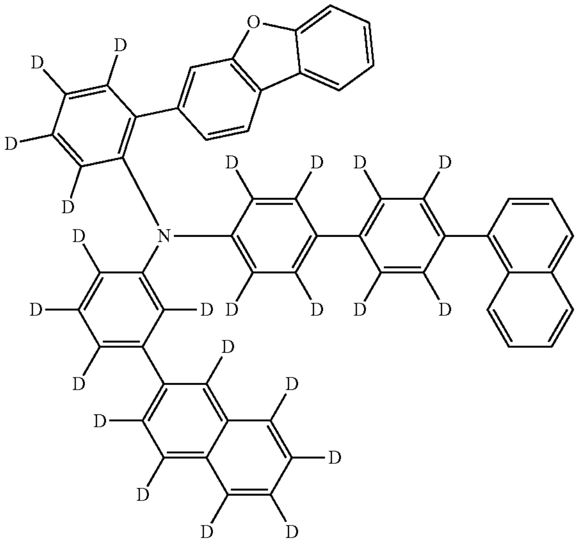
174
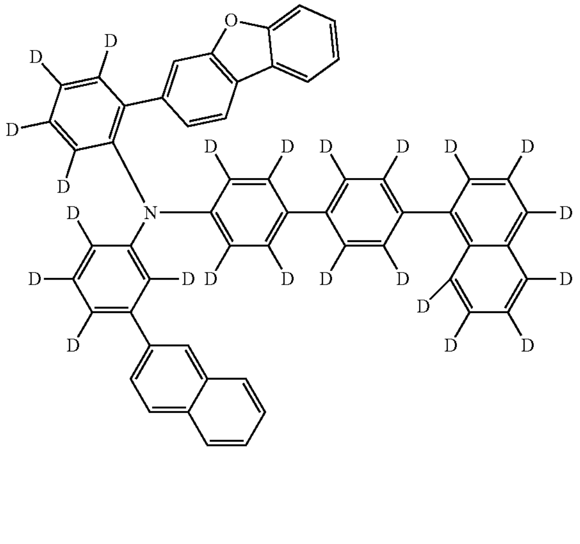

-continued
175
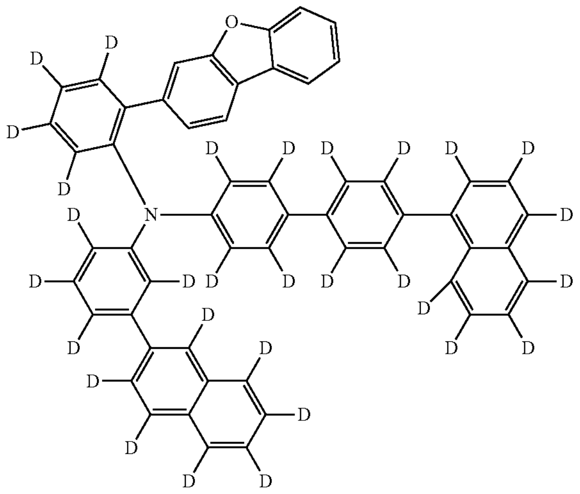
176
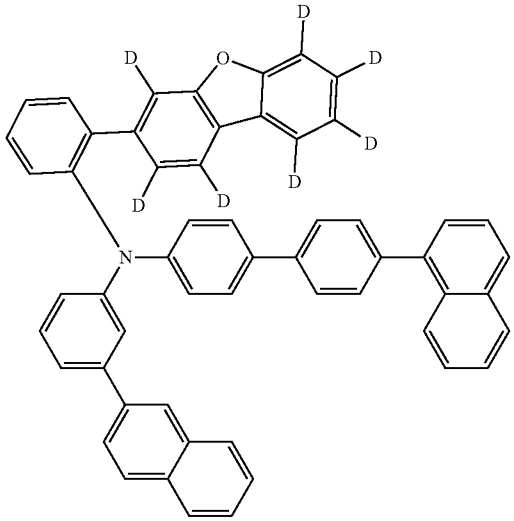
177
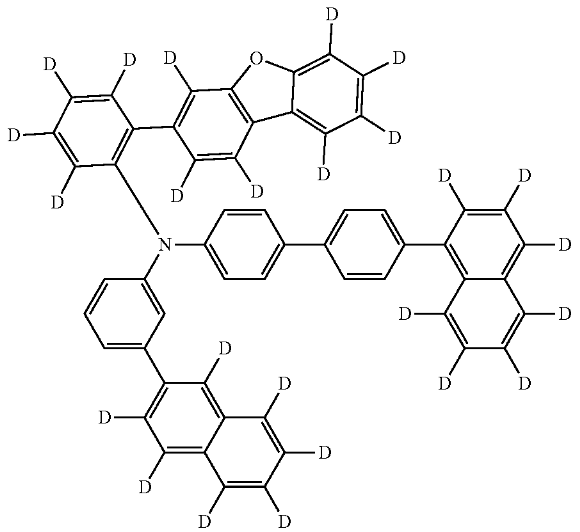
-continued
178
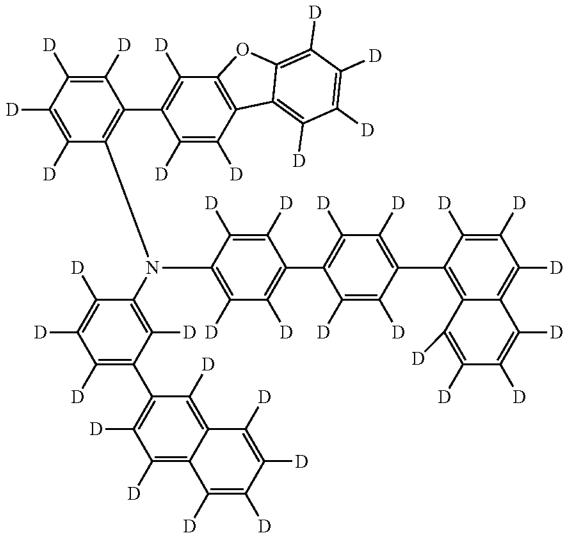
179
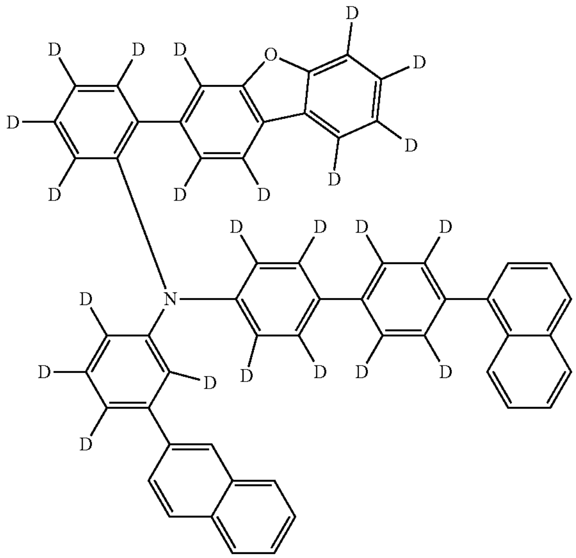

-continued
180
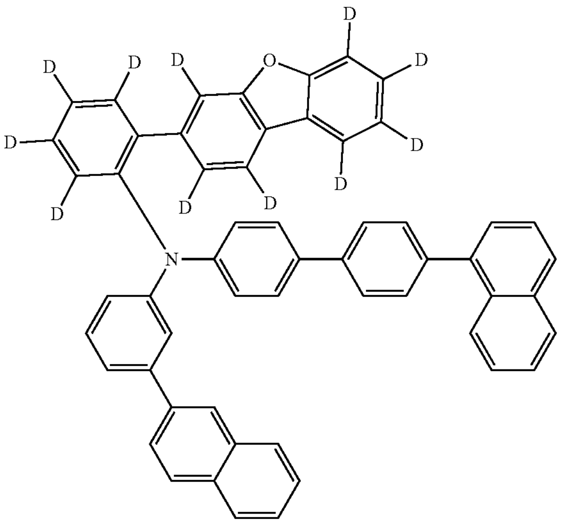
181
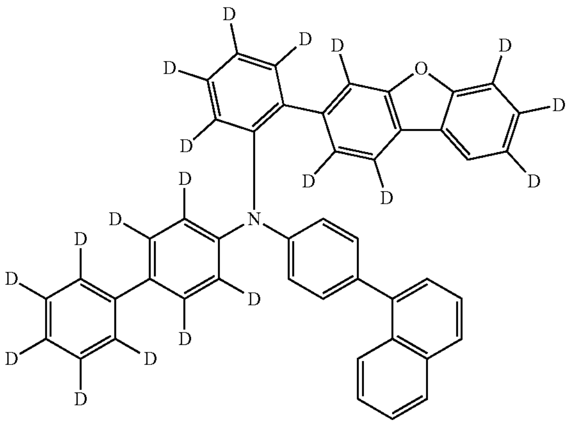
182
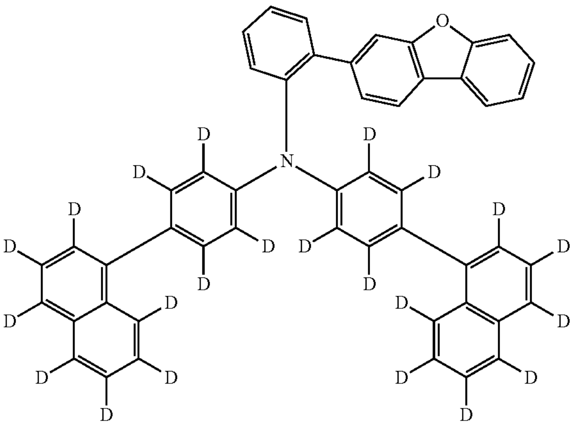
-continued
183
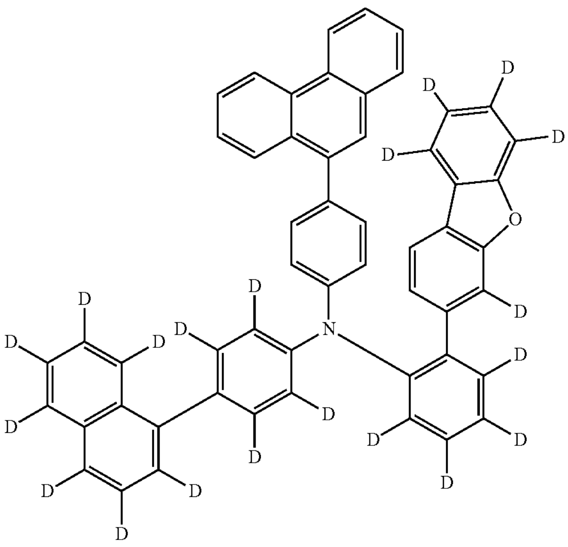
184
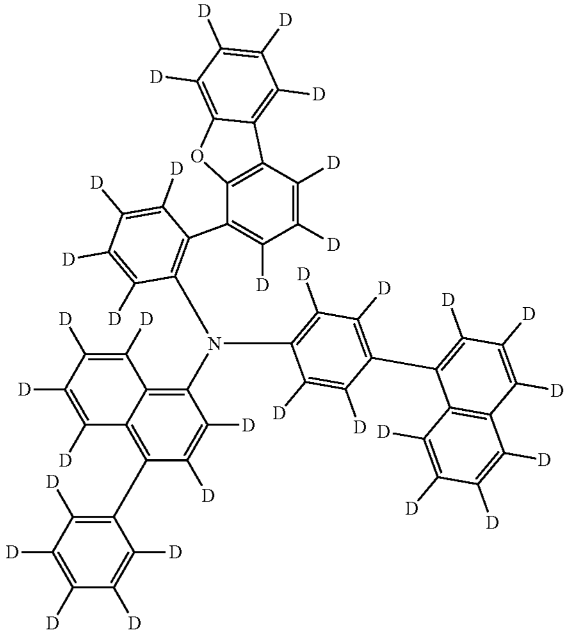
185
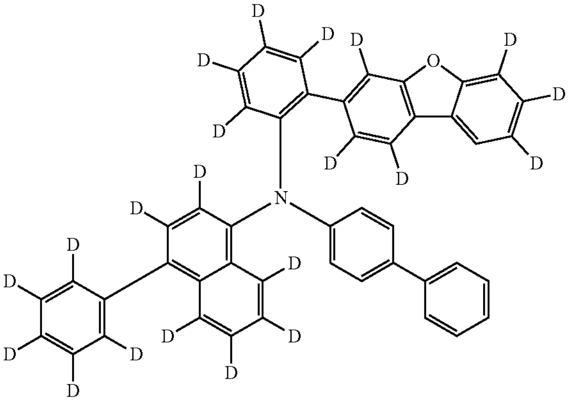

-continued
186
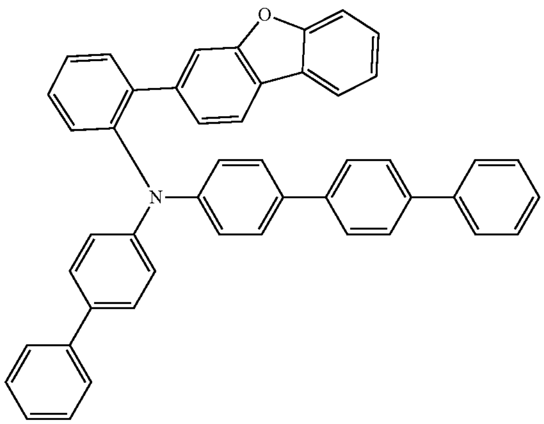
187
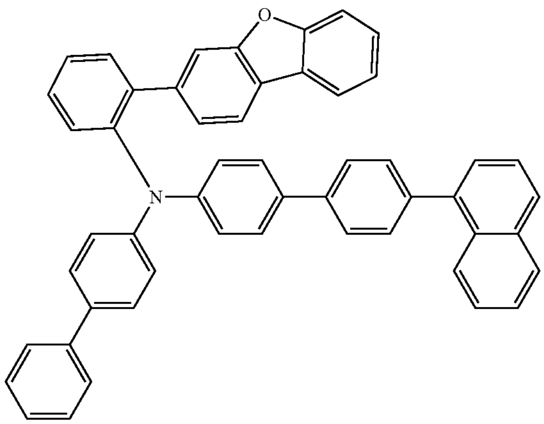
188
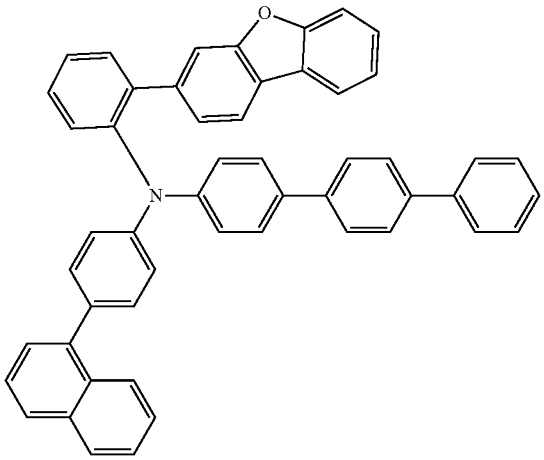
-continued
189
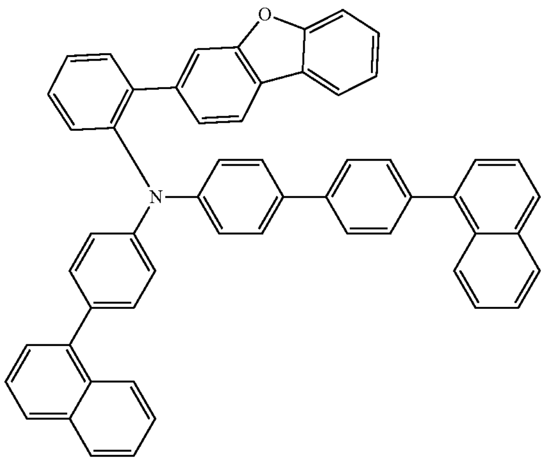
190
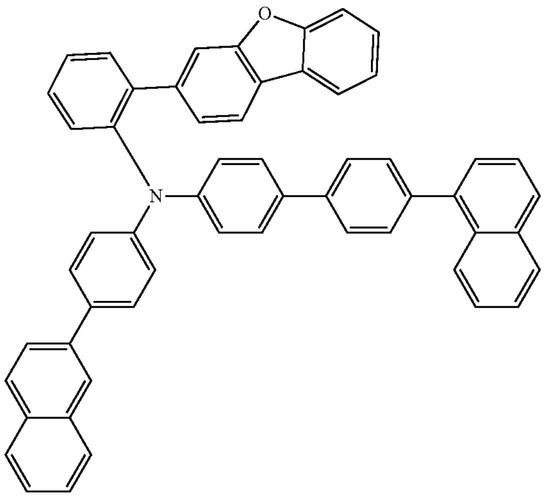
191
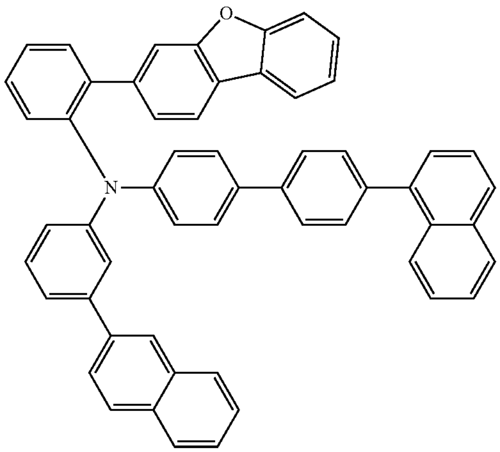

-continued
192
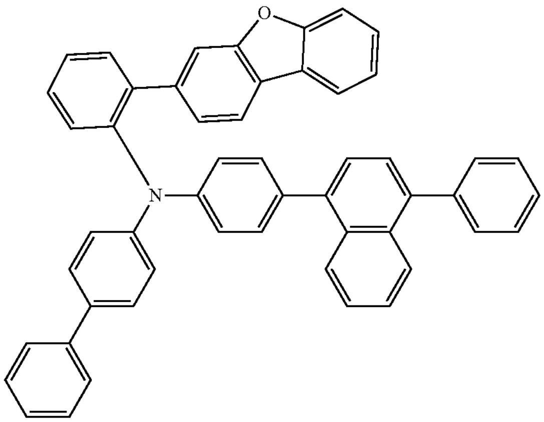
193
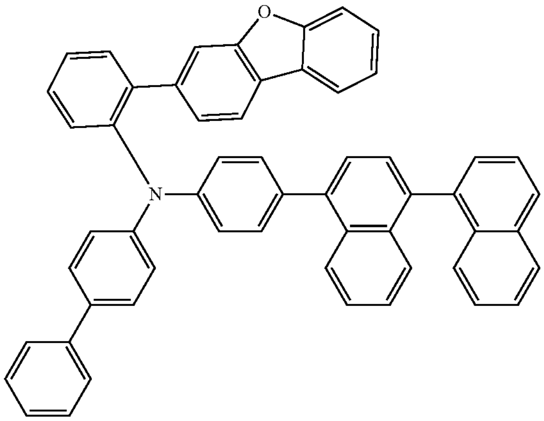
194
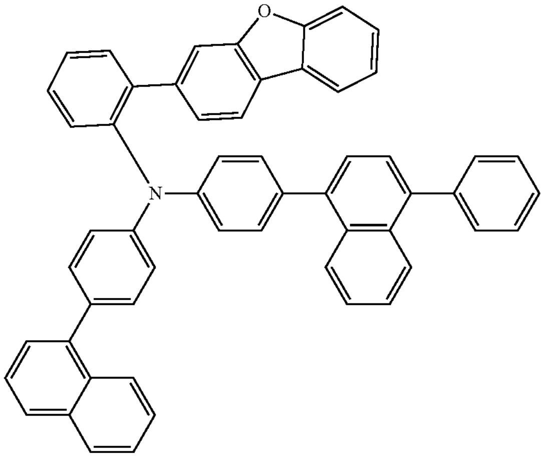
-continued
195
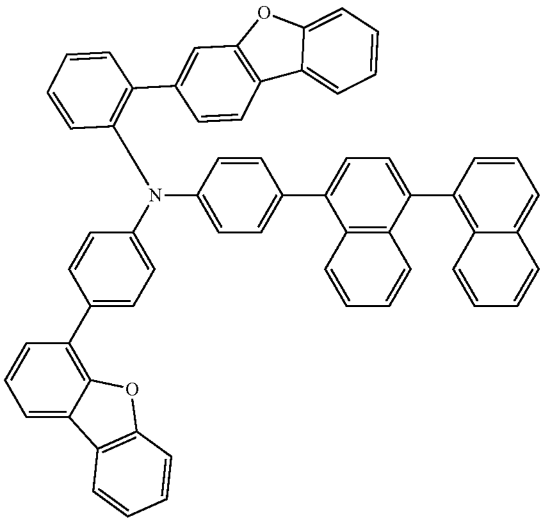
196
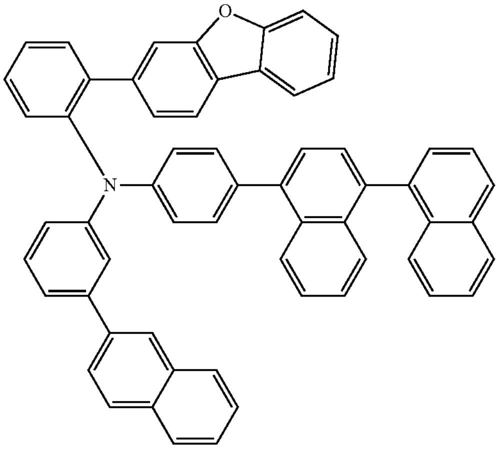
197
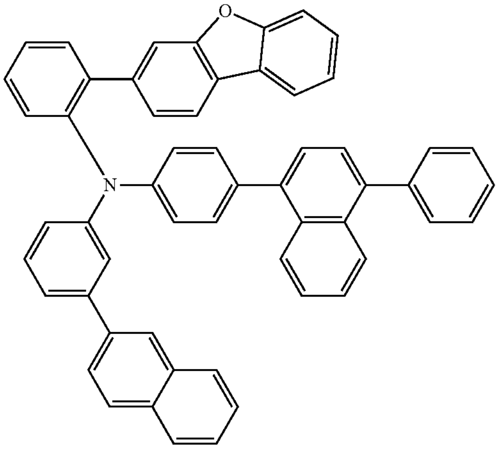

-continued
198
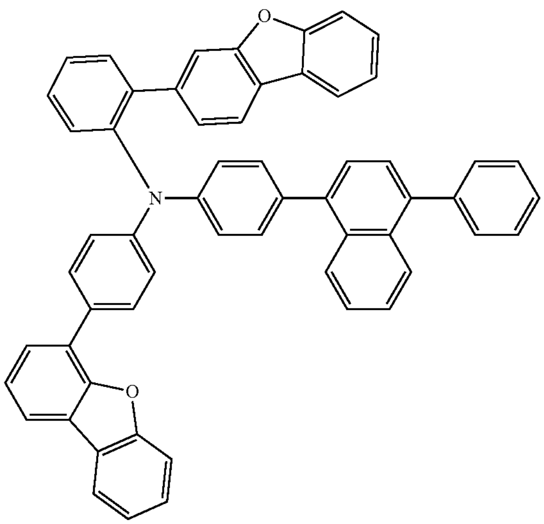
199
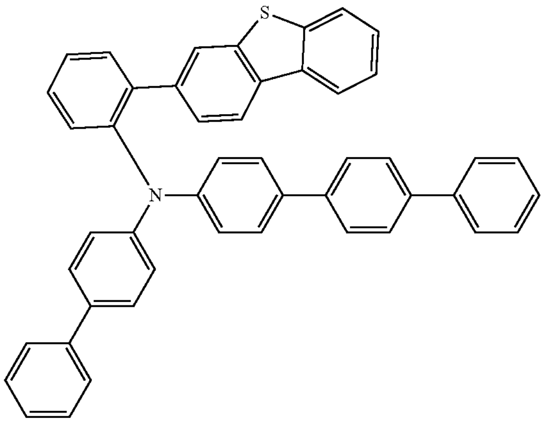
200
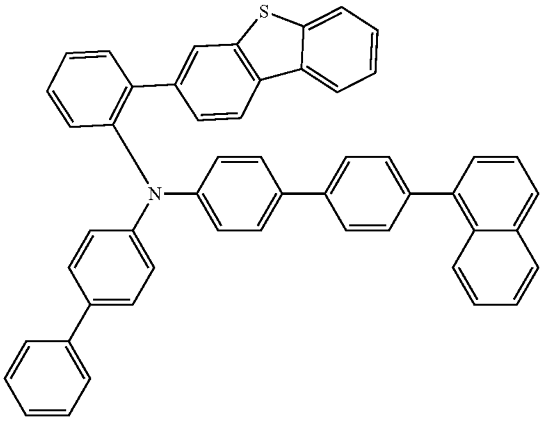
-continued
201
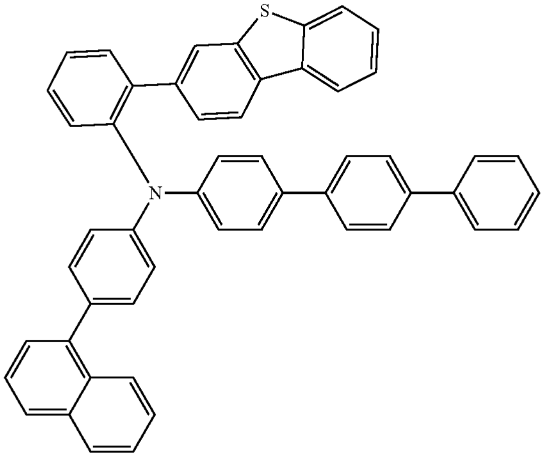
202
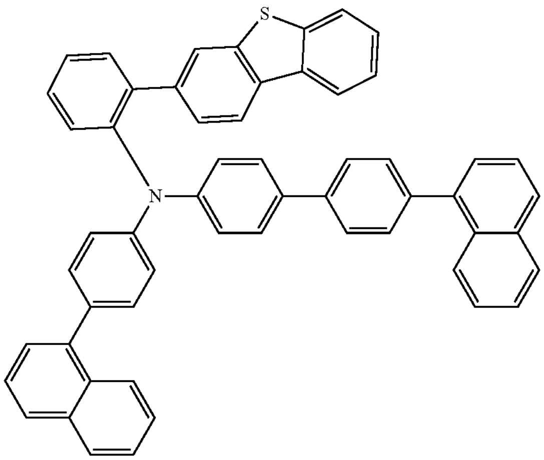
203
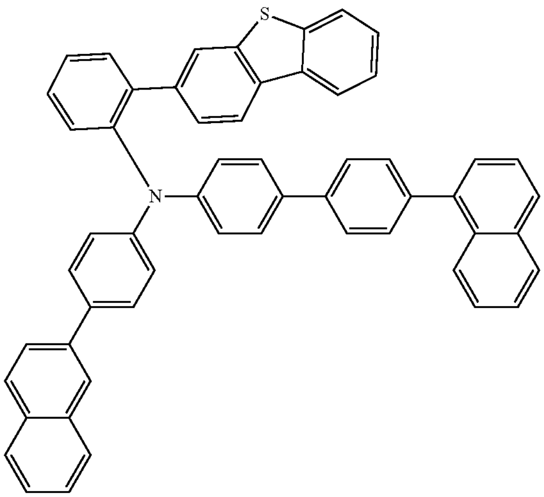

-continued
204
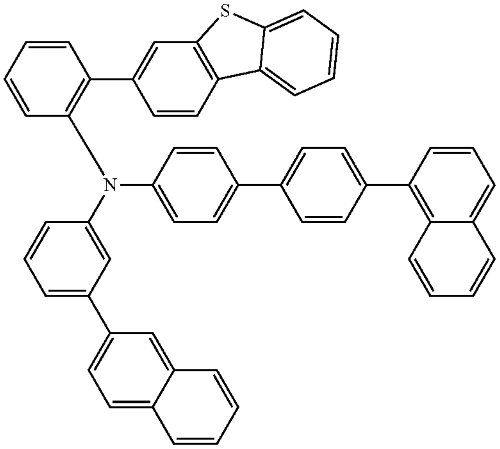
205
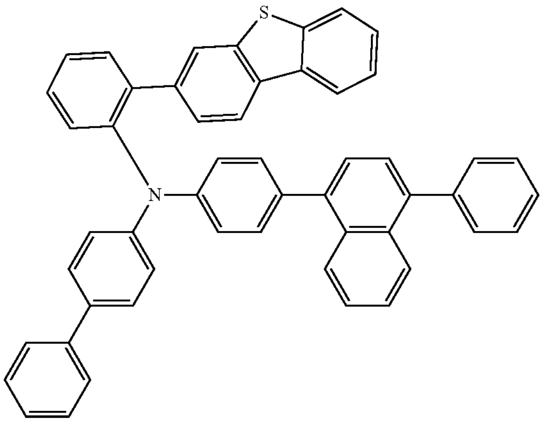
206
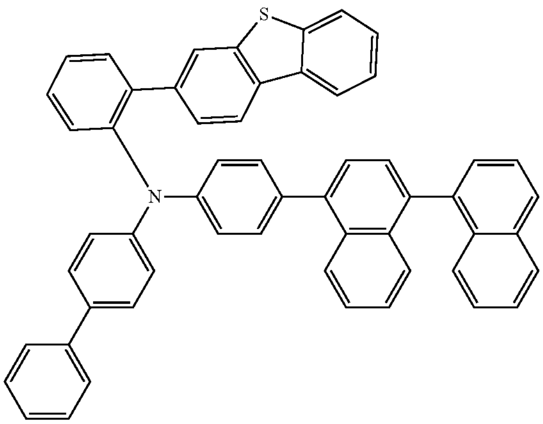
-continued
207
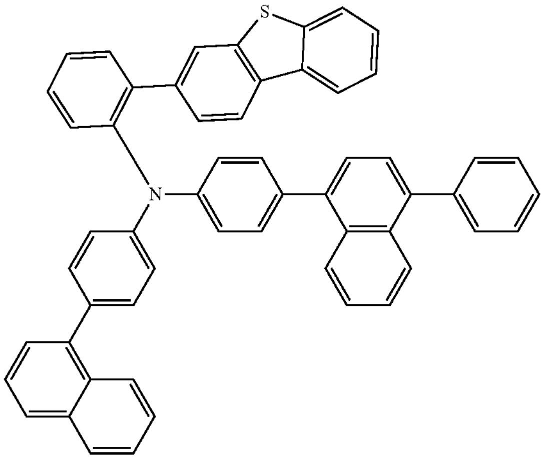
208
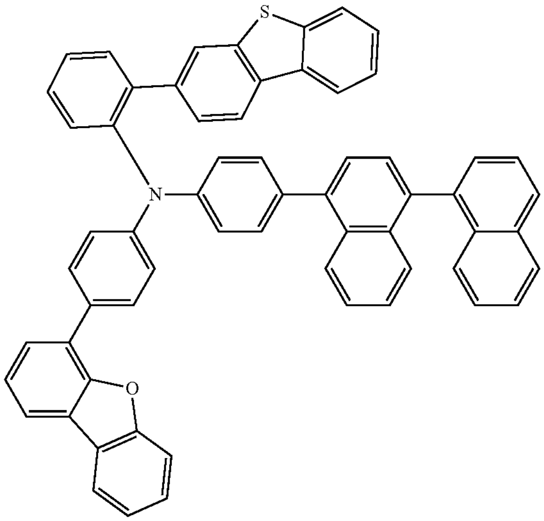
209
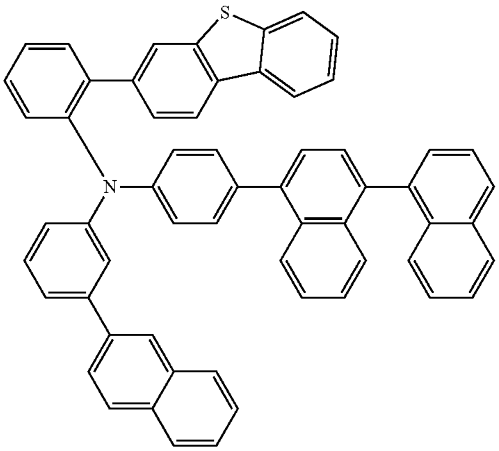

-continued
210
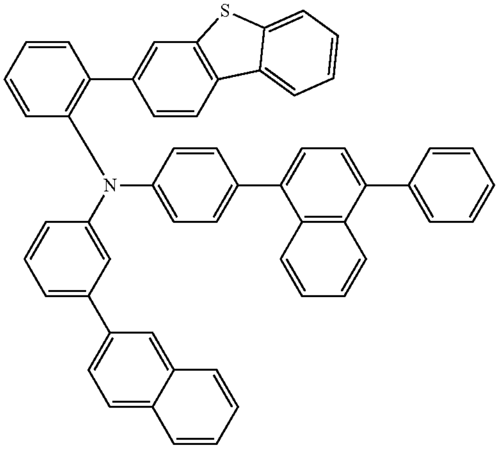
211
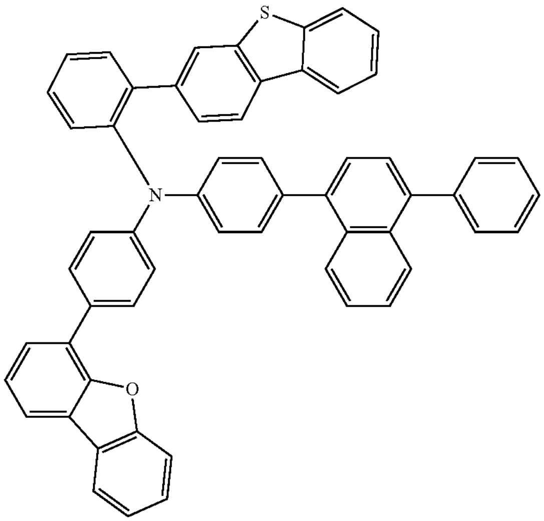
212
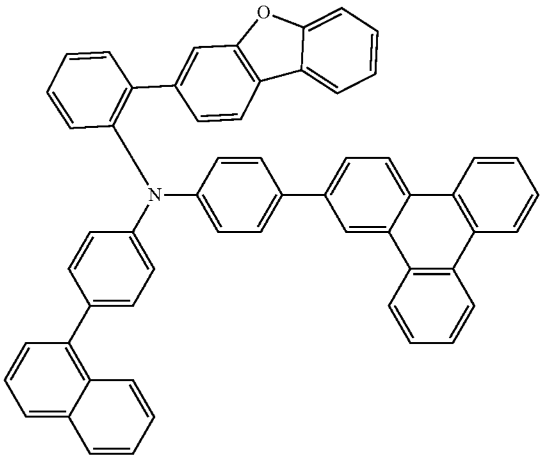
-continued
213
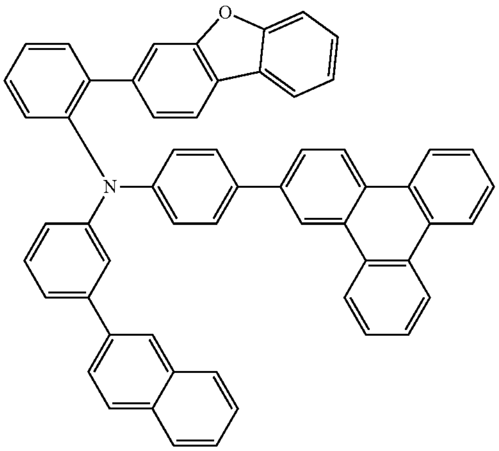
214
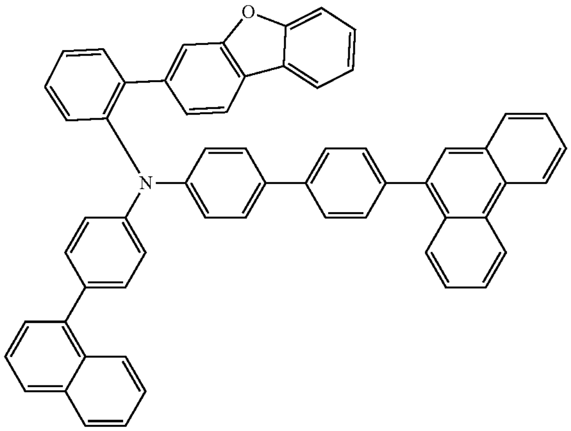
215
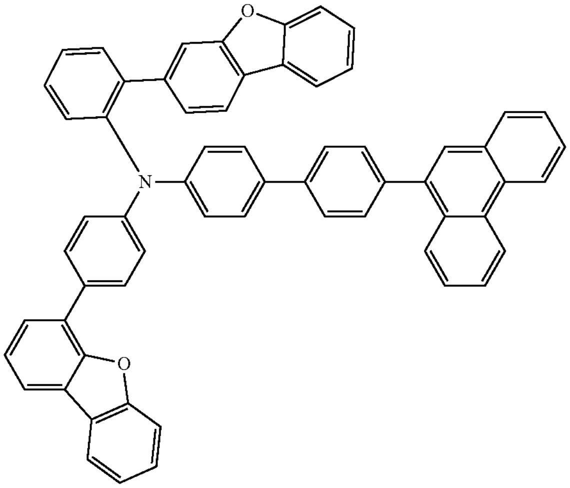

-continued
216
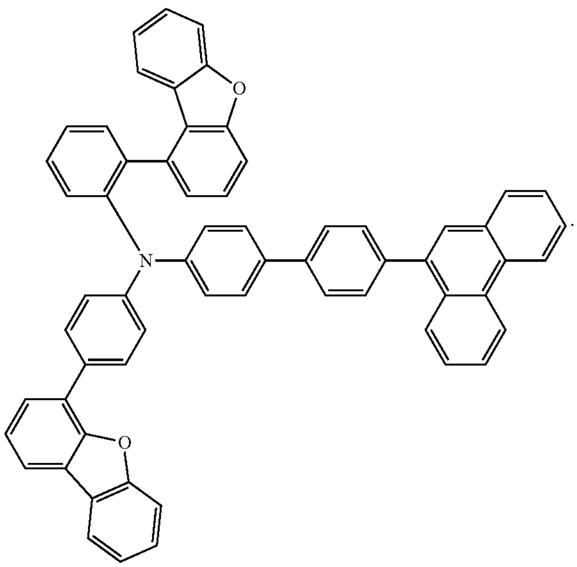
4. The organic electroluminescent device according to claim 1 for use in a display or lighting apparatus.
5. A display or lighting apparatus, comprising the organic electroluminescent device according to claim 1.
* * * * *